(12) United States Patent
Faris

(10) Patent No.: US 7,765,607 B2
(45) Date of Patent: Jul. 27, 2010

(54) PROBES AND METHODS OF MAKING PROBES USING FOLDING TECHNIQUES

(76) Inventor: Sadeg M. Faris, 24 Pocantico River Rd., Pleasantville, NY (US) 10570

(*) Notice: Subject to any disclaimer, the term of this patent is extended or adjusted under 35 U.S.C. 154(b) by 954 days.

(21) Appl. No.: 11/453,572

(22) Filed: Jun. 15, 2006

(65) Prior Publication Data

US 2007/0154354 A1 Jul. 5, 2007

Related U.S. Application Data

(63) Continuation-in-part of application No. 11/400,730, filed on Apr. 7, 2006, now abandoned, and a continuation-in-part of application No. 10/775,999, filed on Feb. 10, 2004, now abandoned, and a continuation-in-part of application No. 10/717,220, filed on Nov. 19, 2003, now Pat. No. 7,033,910, and a continuation-in-part of application No. 10/719,666, filed on Nov. 20, 2003, now Pat. No. 7,056,751, and a continuation-in-part of application No. 10/719,663, filed on Nov. 20, 2003, now Pat. No. 7,163,826, and a continuation-in-part of application No. 10/222,439, filed on Aug. 15, 2002, now Pat. No. 6,956,268, and a continuation-in-part of application No. 10/017,186, filed on Dec. 7, 2001, now abandoned, and a continuation-in-part of application No. 09/950,909, filed on Sep. 12, 2001, now Pat. No. 7,045,878.

(60) Provisional application No. 60/669,029, filed on Apr. 7, 2005, provisional application No. 60/699,619, filed on Jul. 15, 2005.

(51) Int. Cl.
*H01J 37/26* (2006.01)
*G21K 5/04* (2006.01)

(52) U.S. Cl. .............................. 850/60; 850/52; 850/56; 850/59

(58) Field of Classification Search ................... 850/52, 850/55, 56, 57, 58, 59, 60, 29, 40, 45, 48, 850/53, 54, 61; 250/306, 307, 308, 309, 250/310, 311; 438/455, 456, 457, 458; 977/721, 977/722, 723, 732, 849, 850, 860, 863, 864, 977/865, 866, 878, 881

See application file for complete search history.

(56) References Cited

U.S. PATENT DOCUMENTS 5,293,781 A * 3/1994 Kaiser et al. ........... 73/862.625

(Continued)

*Primary Examiner*—David A Vanore
*Assistant Examiner*—Nicole Ippolito Rausch

(57) ABSTRACT

Probes and methods of making probes are provided, particularly probes or nano-tools having tip active areas of extremely small dimensions, e.g., on the order of one angstrom to a few nanometers. One method of making a nano-tool includes forming a composite including a tool layer less than 10 nm thick on a substrate layer, subtracting a region of the substrate layer at least partially through the thickness of the substrate layer, thereby exposing a well surface, and folding the composite so that portions of the tool layer surface diverge and portions of the well surface converge, wherein an outer crease of the folded tool layer is a nanotool active area. Another method of making a nano-tool includes forming a composite including a tool layer less than 10 nm thick on a substrate, subtracting a region of the substrate layer at least partially through the thickness of the substrate layer, thereby exposing a well surface, and folding the composite so that portions of the tool layer surface diverge and portions of the well surface converge, wherein an outer crease of the folded tool layer is a nanotool active area, whereby the tip may be cut mechanically or altered to expose two probe active areas. The herein probes may be very useful in systems and methods that benefit from probes having resolution capabilities less than the dimensions of the objects to be analyzed.

22 Claims, 127 Drawing Sheets

U.S. PATENT DOCUMENTS

| | | | |
|---|---|---|---|
| 5,461,907 A * | 10/1995 | Tench et al. | 73/105 |
| 5,751,685 A * | 5/1998 | Yi | 369/126 |
| 5,969,345 A * | 10/1999 | Williams et al. | 250/234 |
| 6,777,637 B2 * | 8/2004 | Nakayama et al. | 219/68 |
| 6,785,445 B2 * | 8/2004 | Kuroda et al. | 385/38 |
| 6,927,400 B2 * | 8/2005 | Rasmussen | 250/442.11 |
| 2002/0168810 A1 * | 11/2002 | Jackson | 438/172 |
| 2006/0060769 A1 * | 3/2006 | Bousse et al. | 250/282 |

* cited by examiner

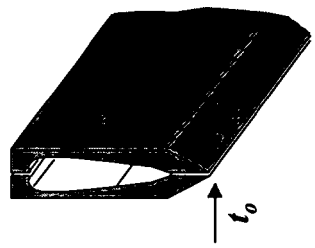
FIGURE 3E
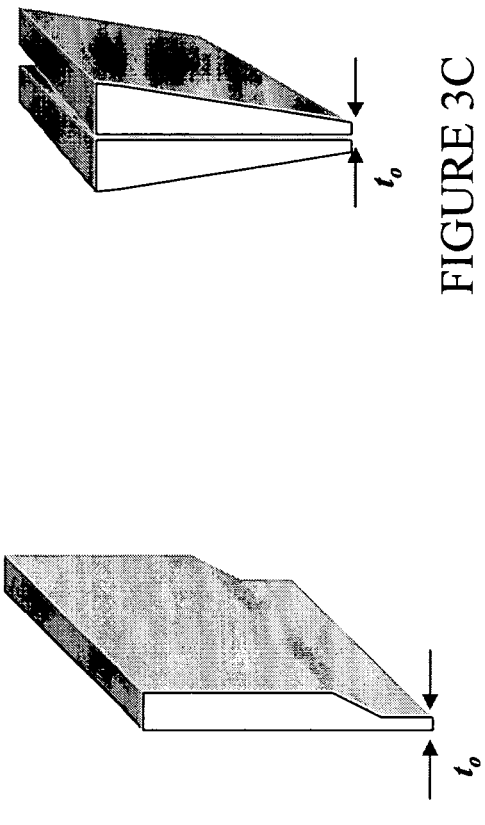
FIGURE 3C
FIGURE 3A
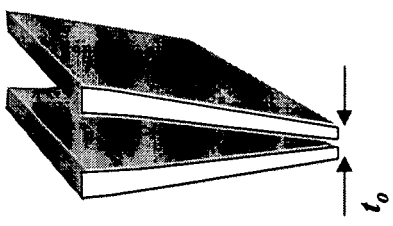
FIGURE 3D
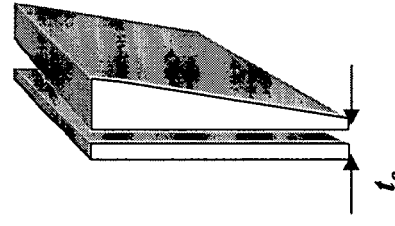
FIGURE 3B

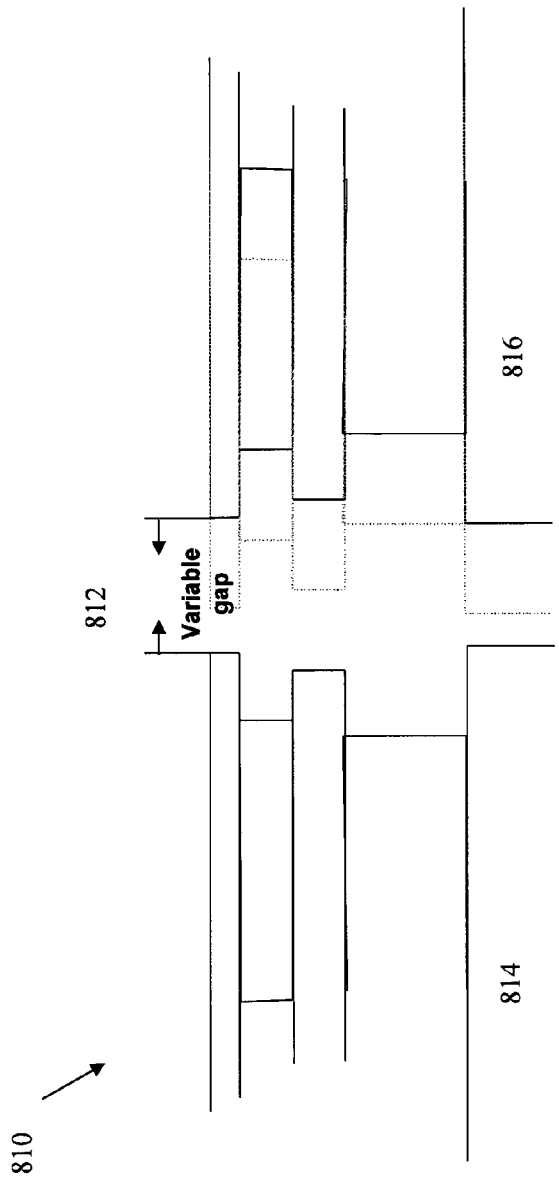
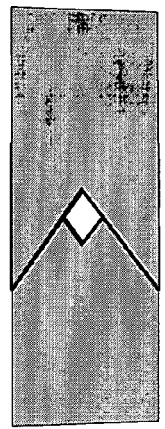
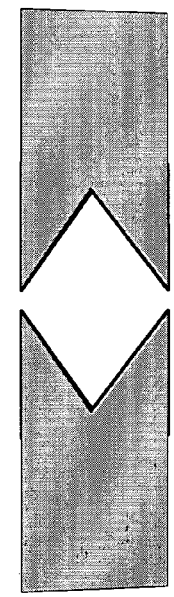
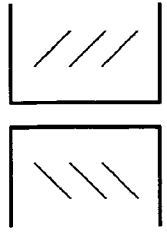
FIGURE 8A
FIGURE 8B2
FIGURE 8B1
FIGURE 8C2
FIGURE 8C1

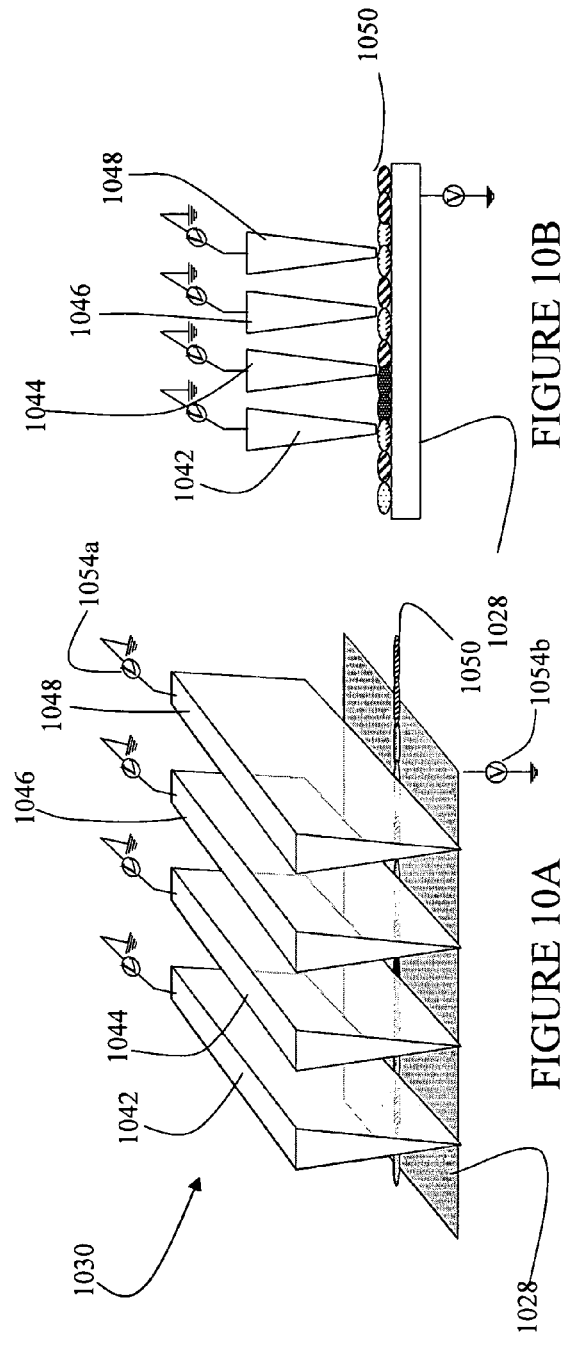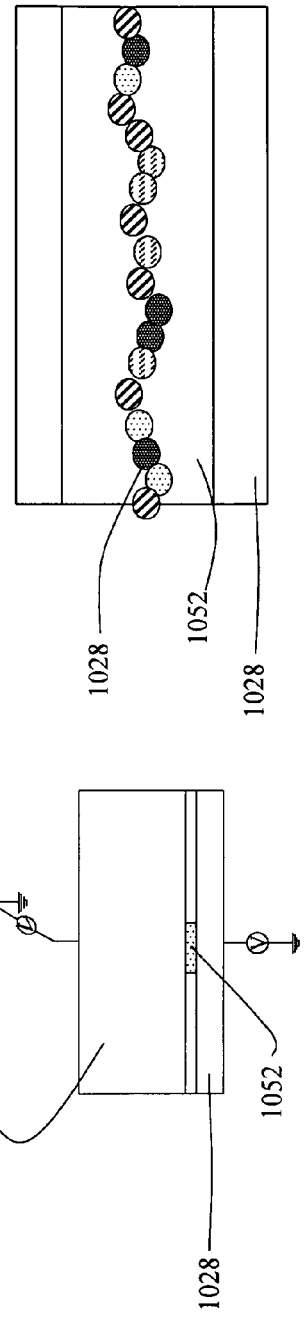

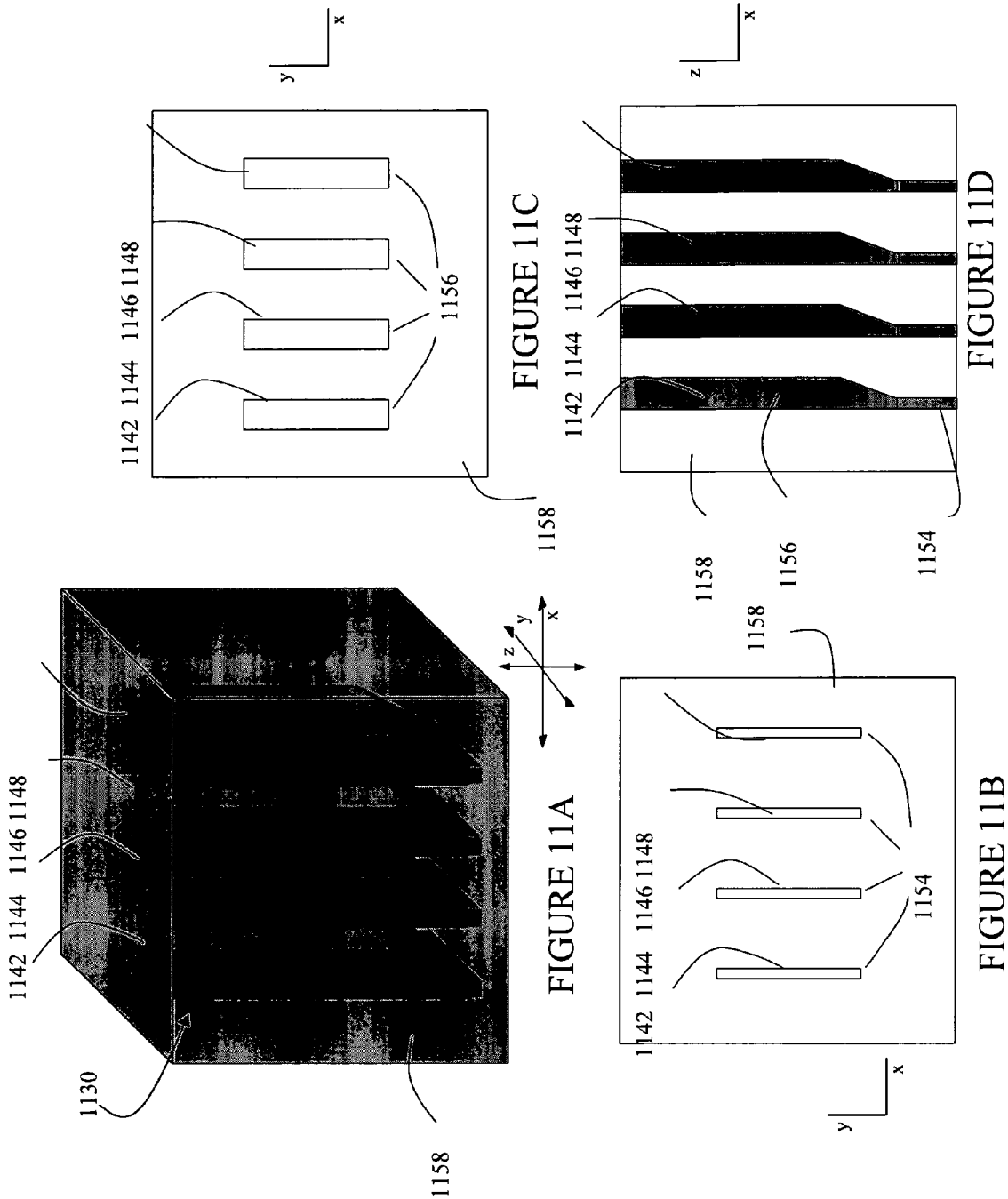

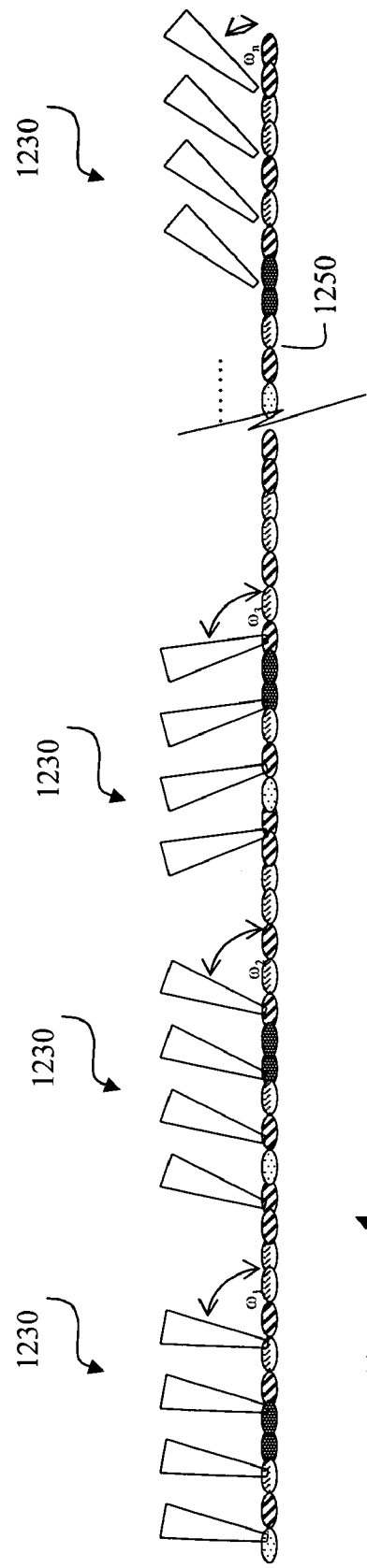
FIGURE 12D
FIGURE 12E
FIGURE 12F

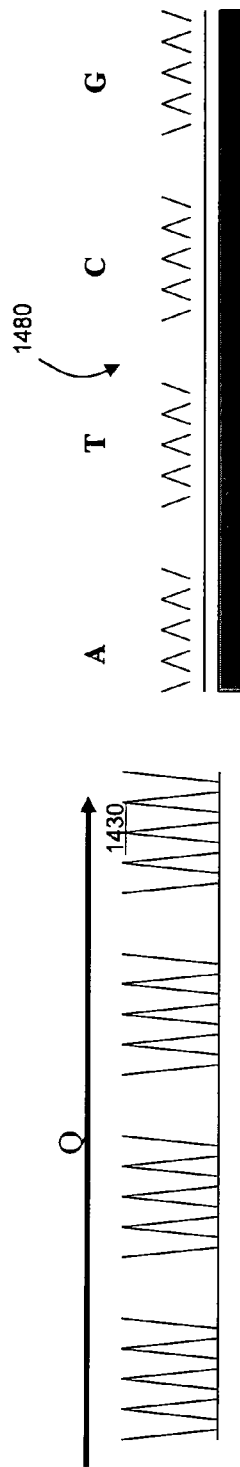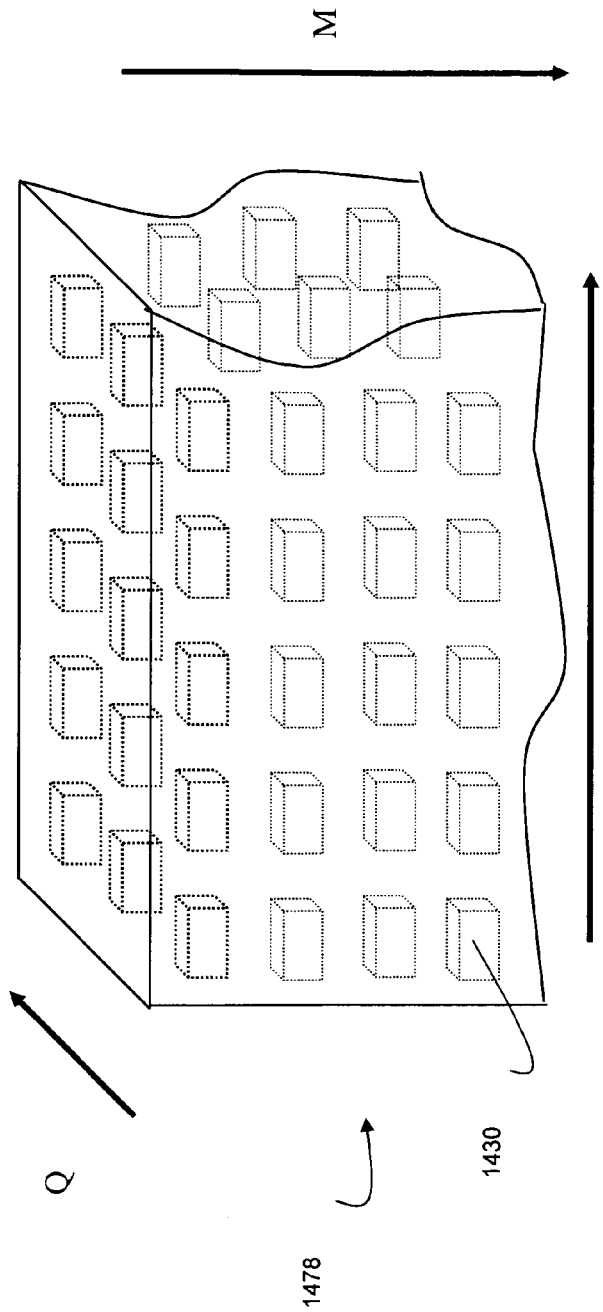

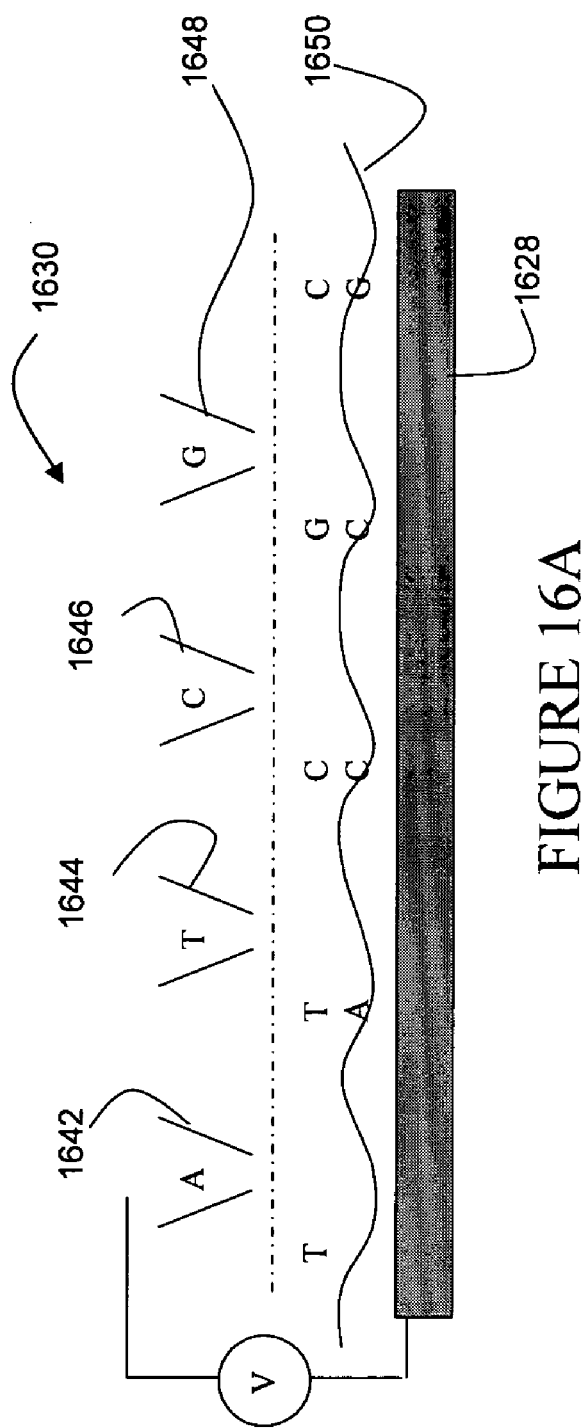
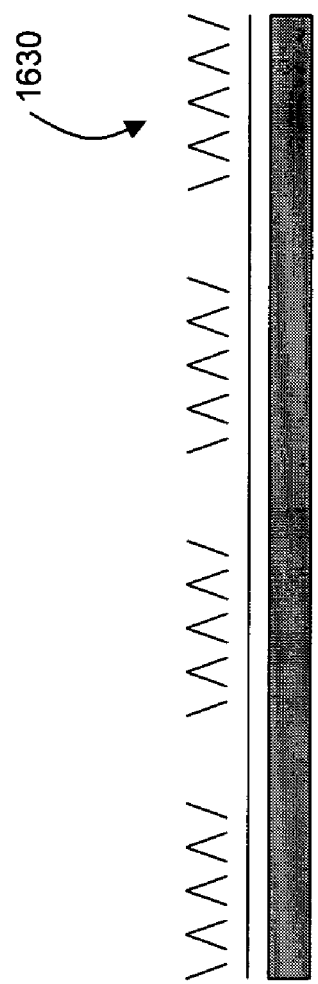
FIGURE 16A
FIGURE 16B

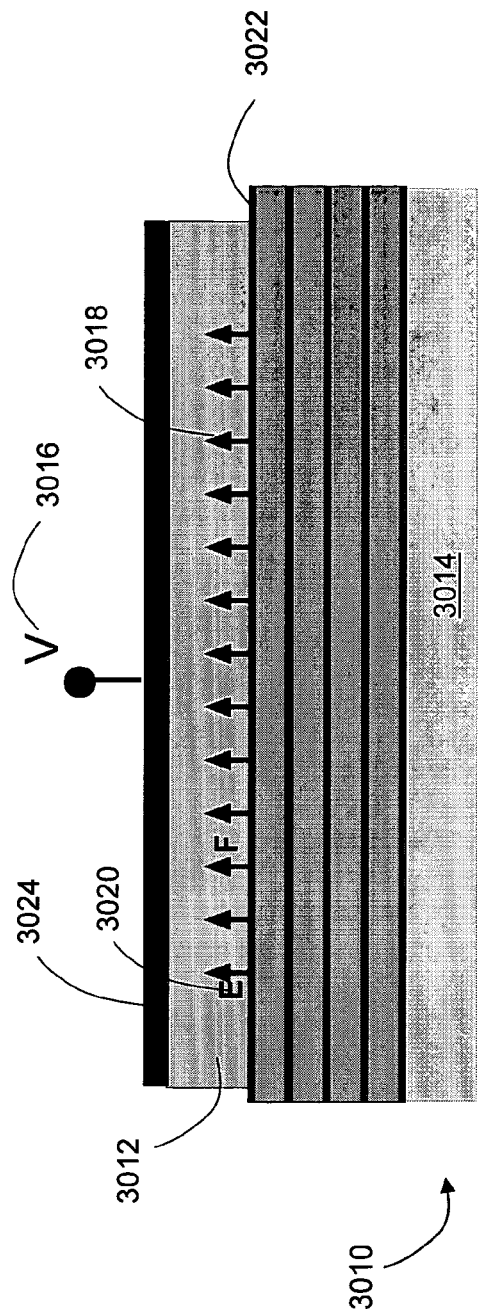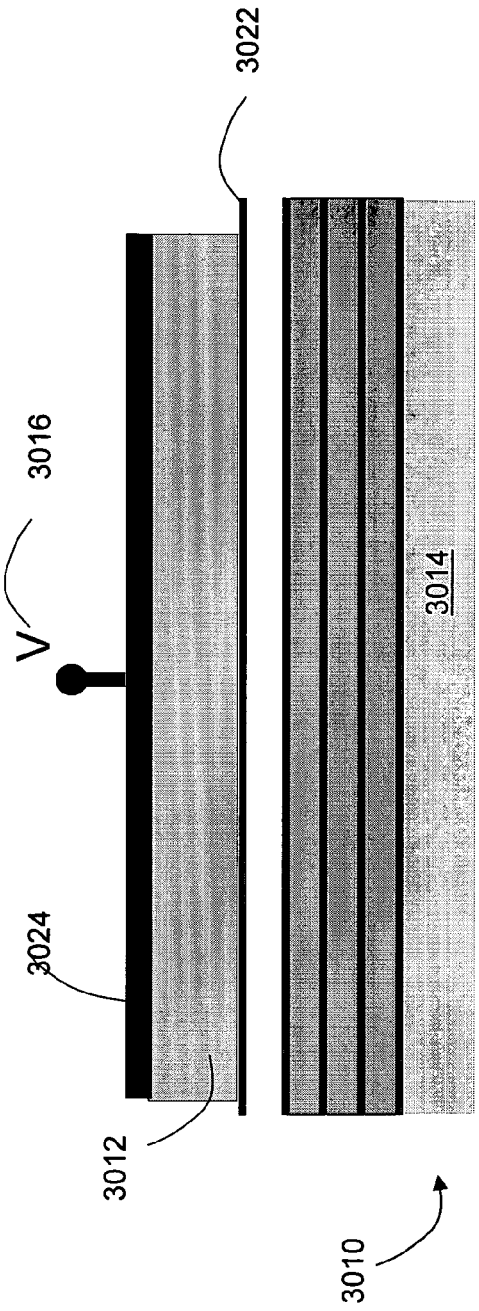
Figure 30A
Figure 30B

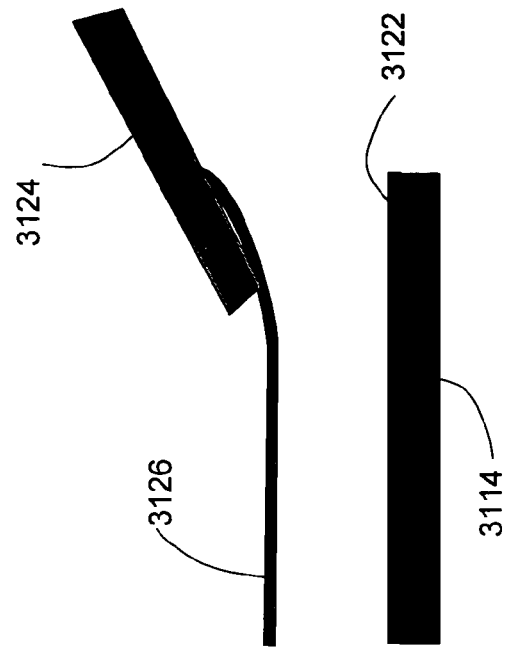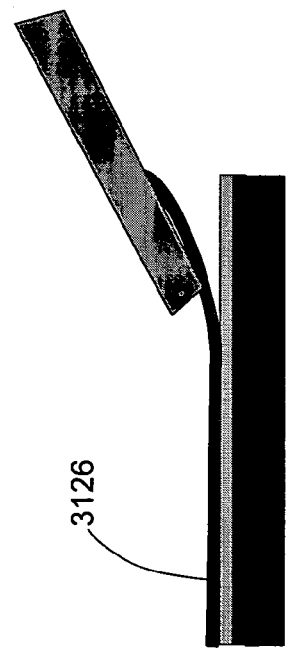
Figure 31A
Figure 31B
Figure 31C

Figure 32A
Figure 32B
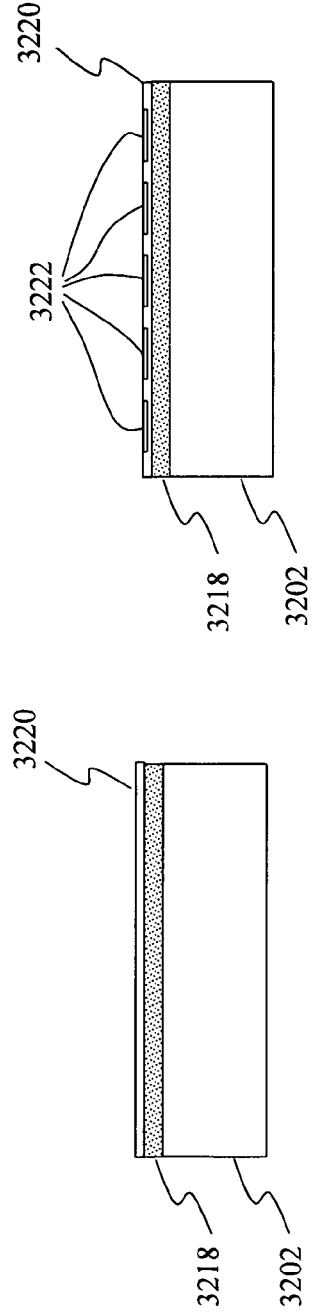
Figure 32C
Figure 32D
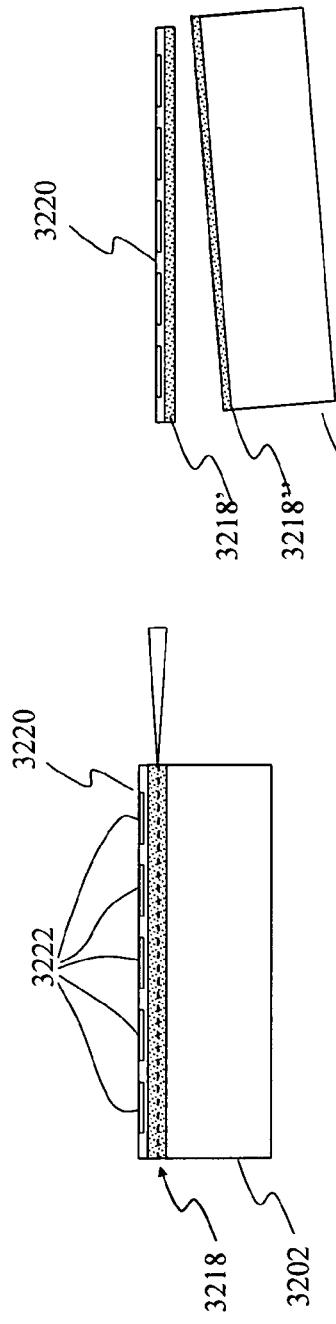
Figure 32E
Figure 32F

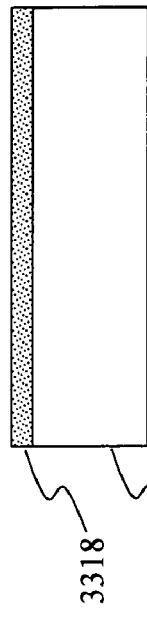
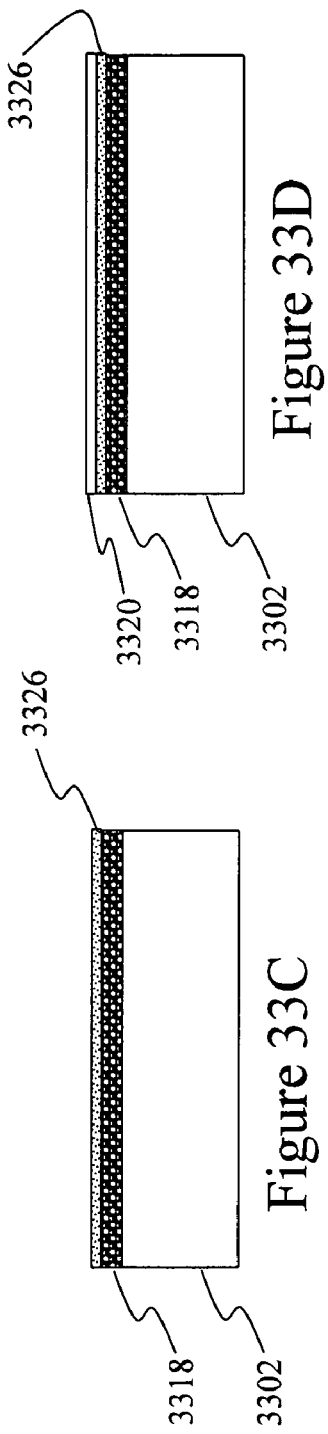
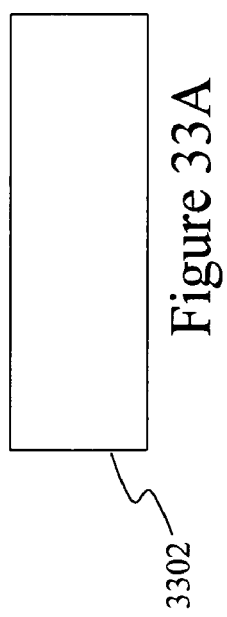
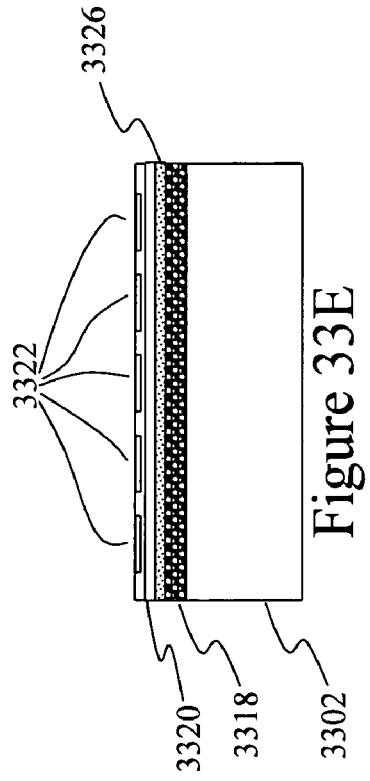

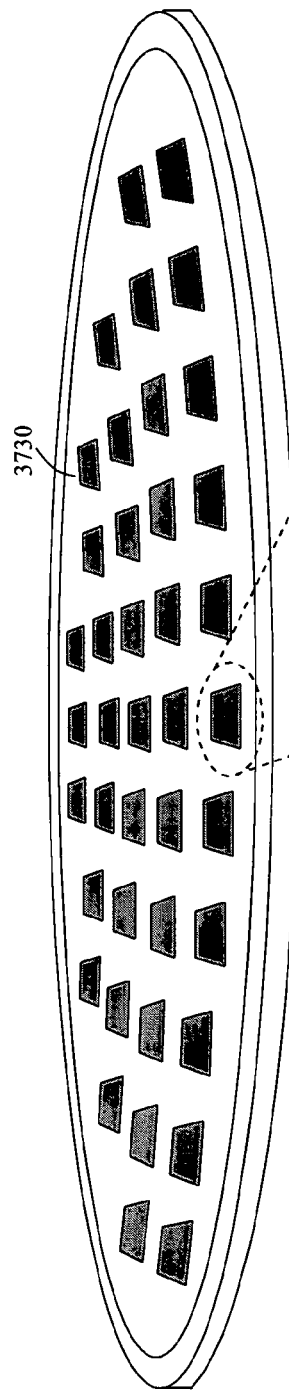
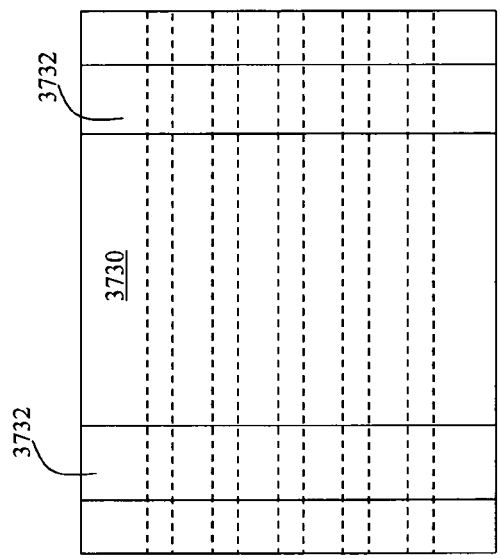
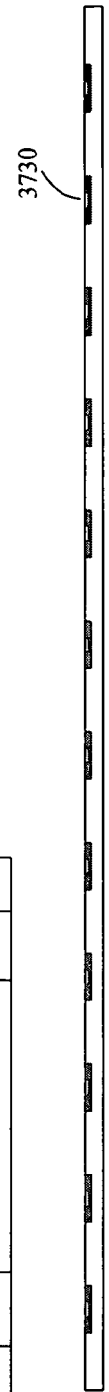
FIGURE 37A
FIGURE 37C
FIGURE 37B

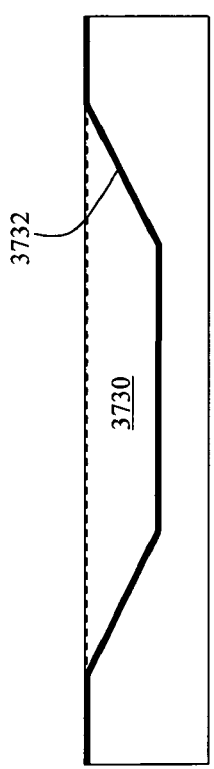
FIGURE 37D
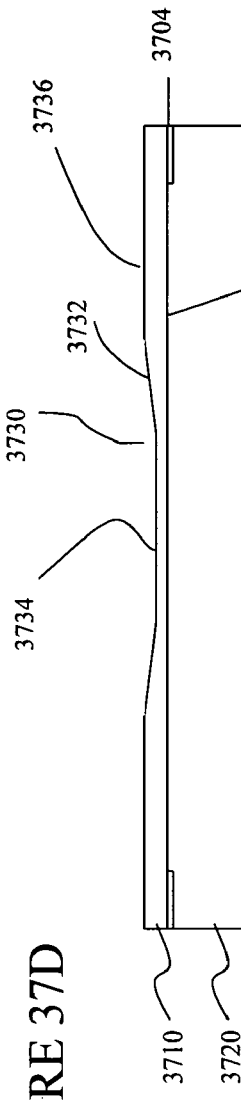
FIGURE 38
FIGURE 39A
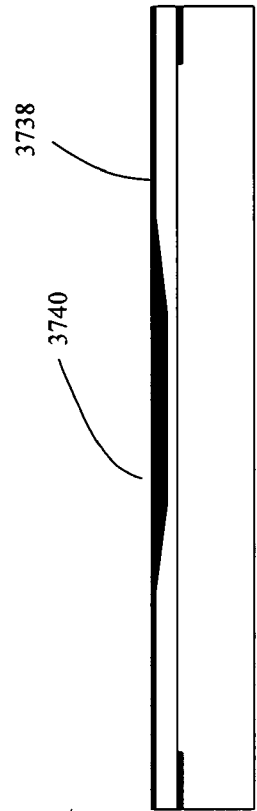
FIGURE 39B 5368
5370

5286

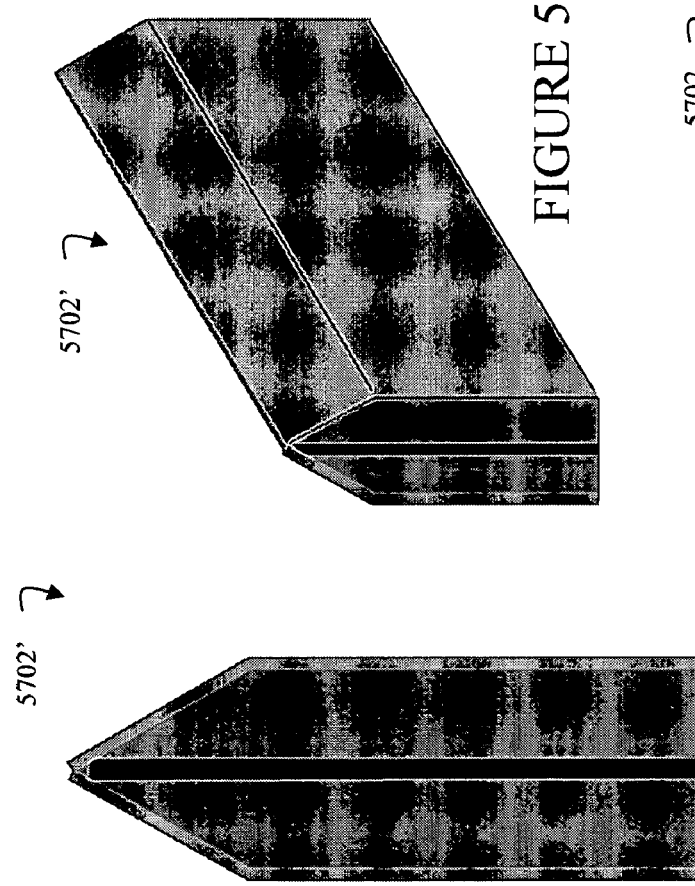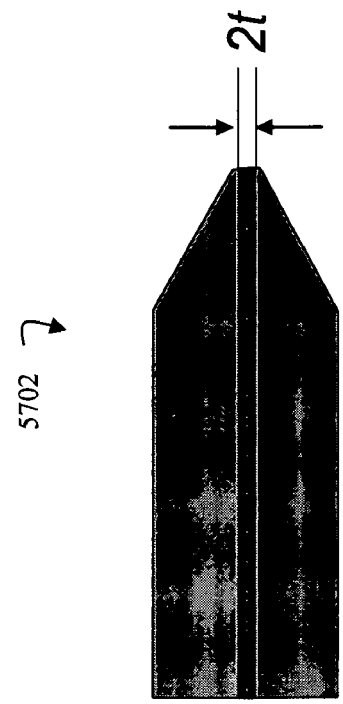
FIGURE 58B
FIGURE 59
FIGURE 58A

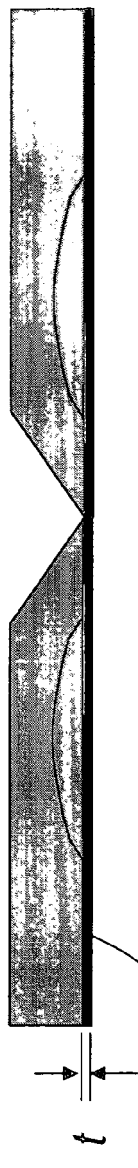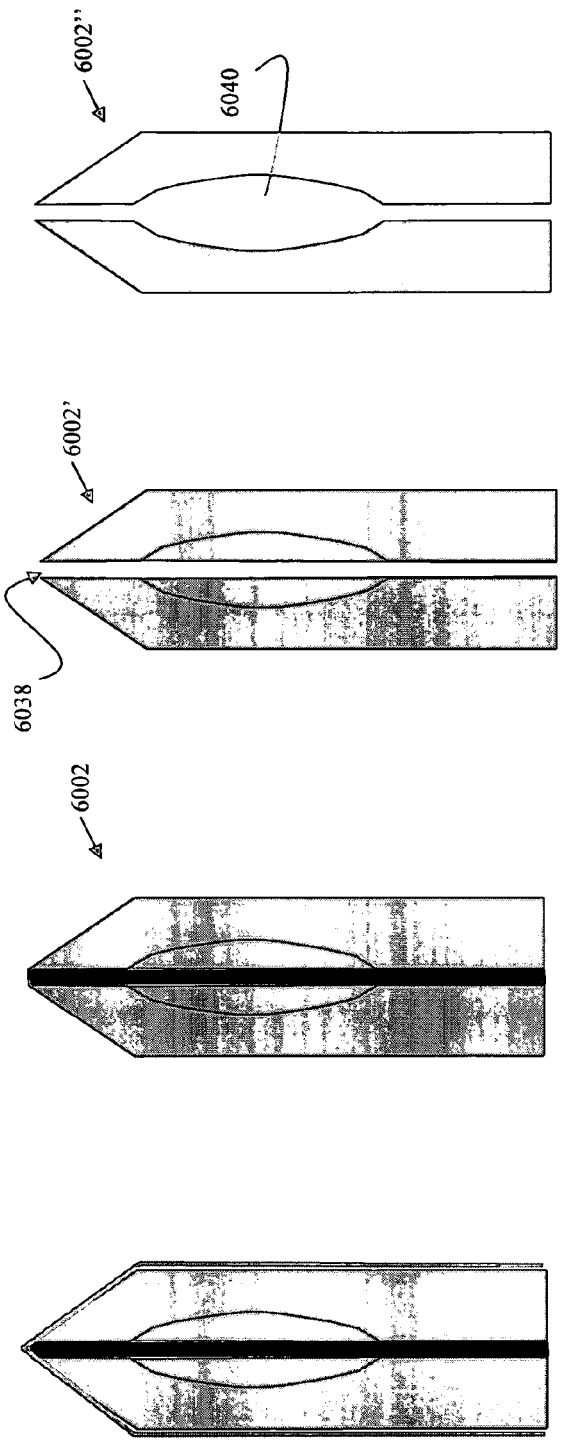
FIGURE 60E
FIGURE 60F
FIGURE 60G
FIGURE 60H
FIGURE 60I
FIGURE 60J

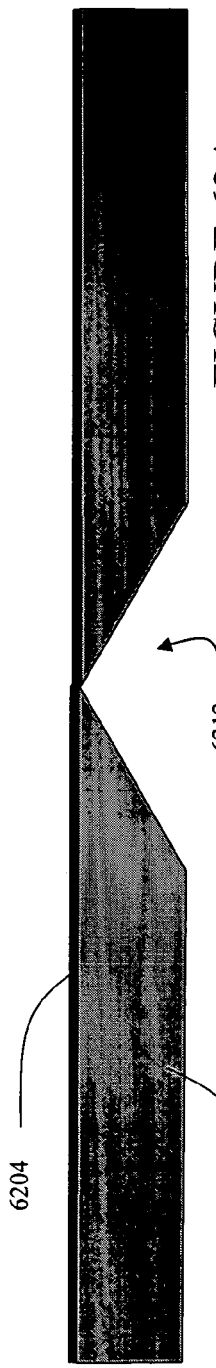
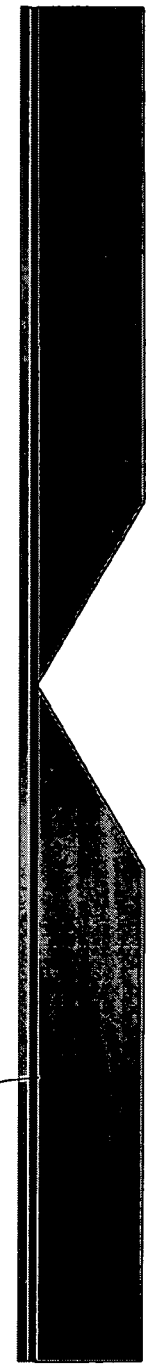
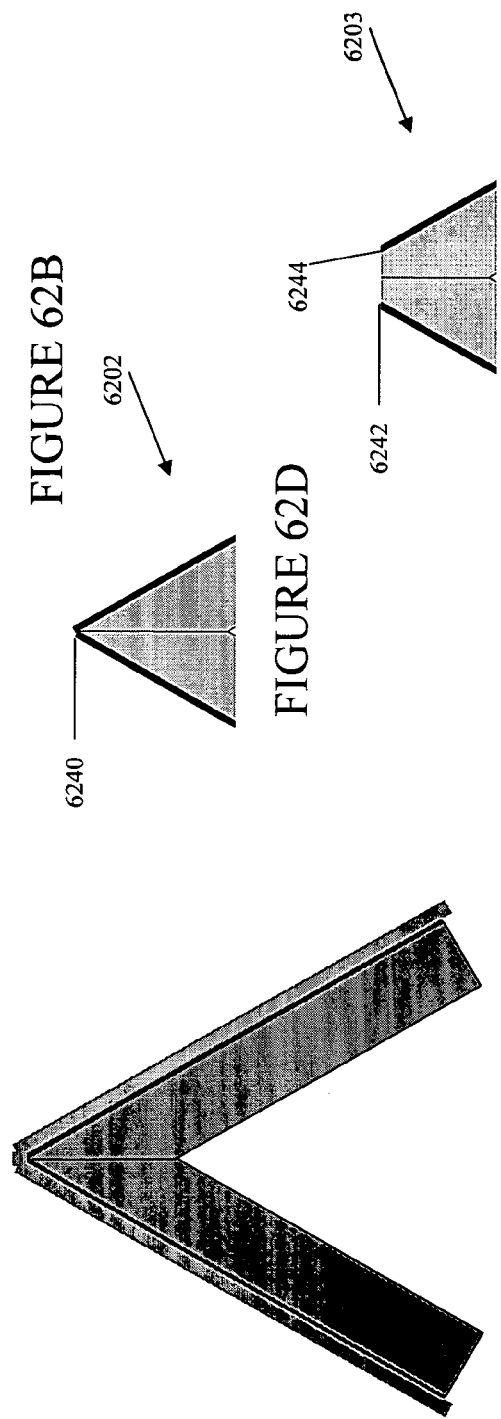
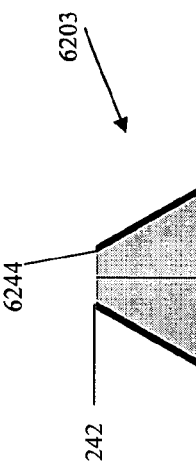
FIGURE 62A
FIGURE 62B
FIGURE 62C
FIGURE 62D
FIGURE 62E

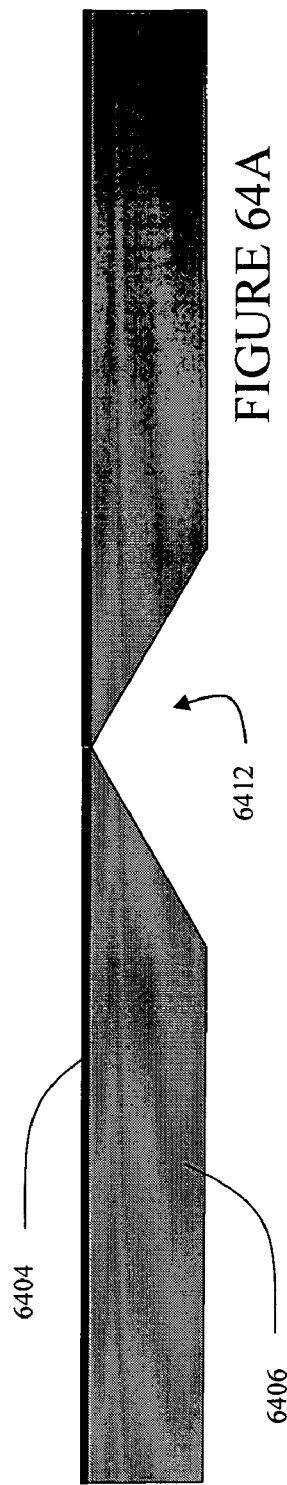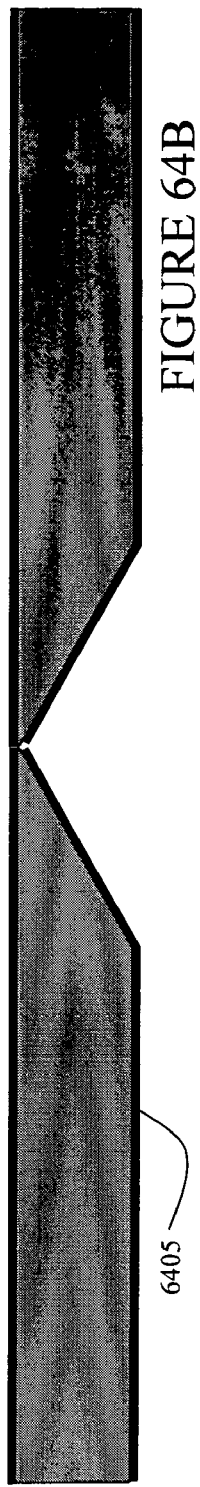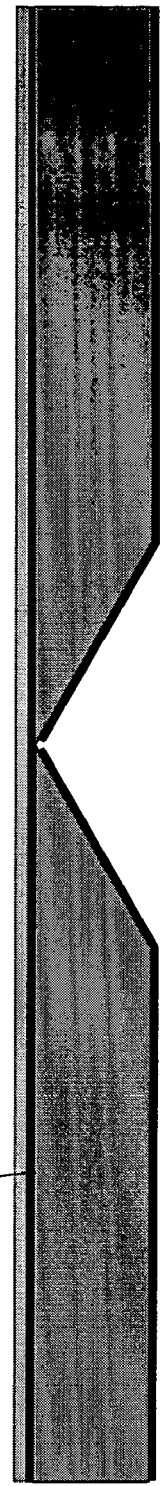

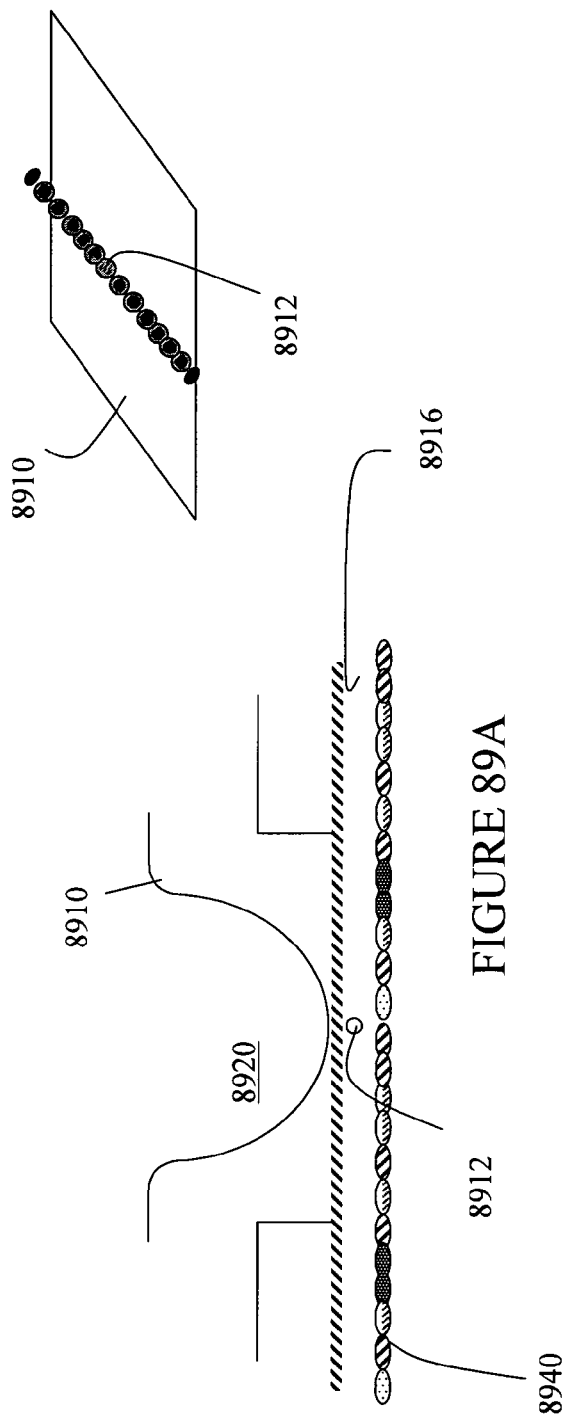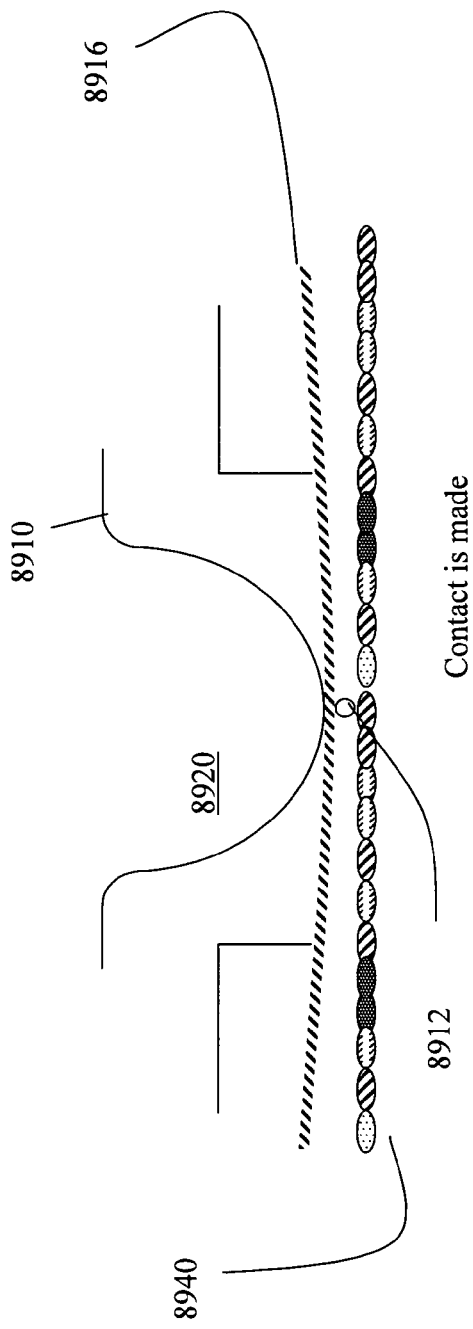
FIGURE 89A
FIGURE 89B

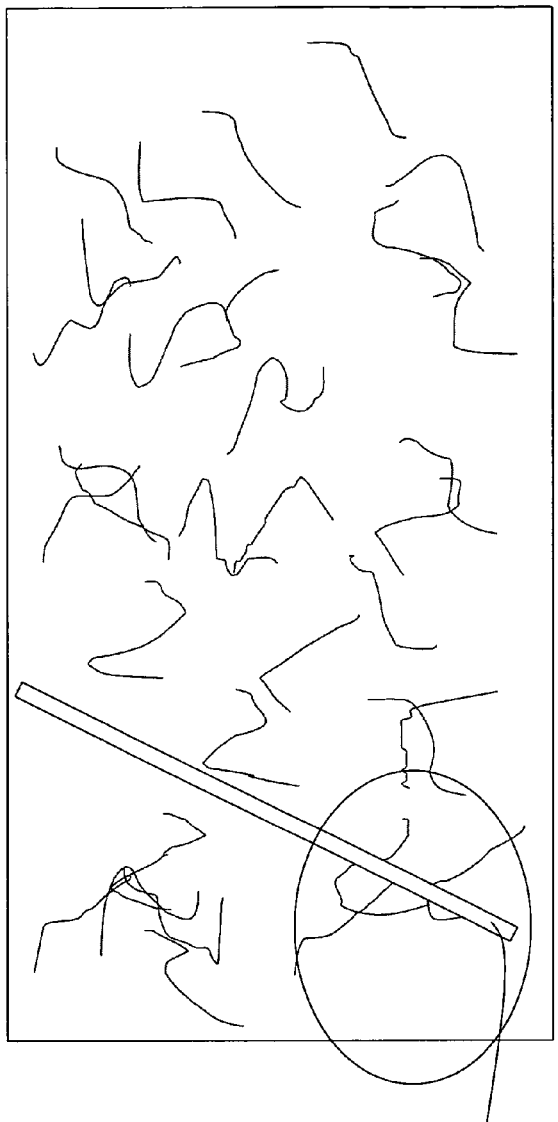
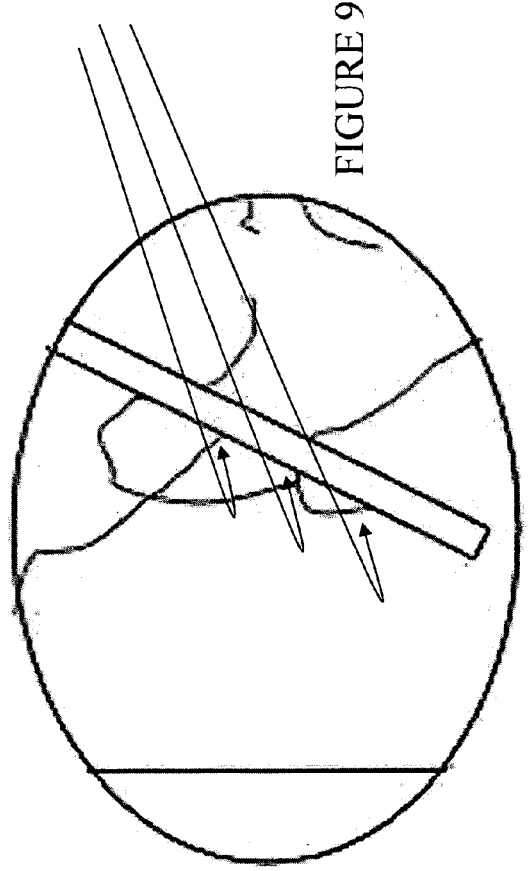
FIGURE 94B
FIGURE 94C

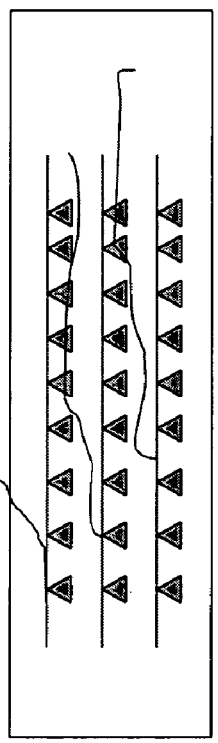
FIGURE 94E

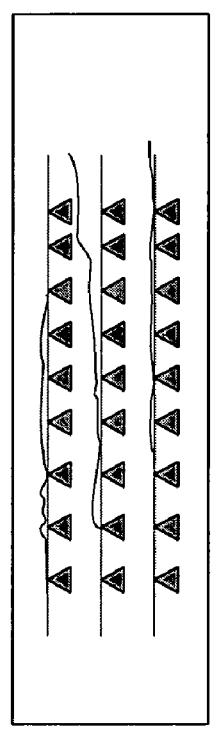
FIGURE 94F

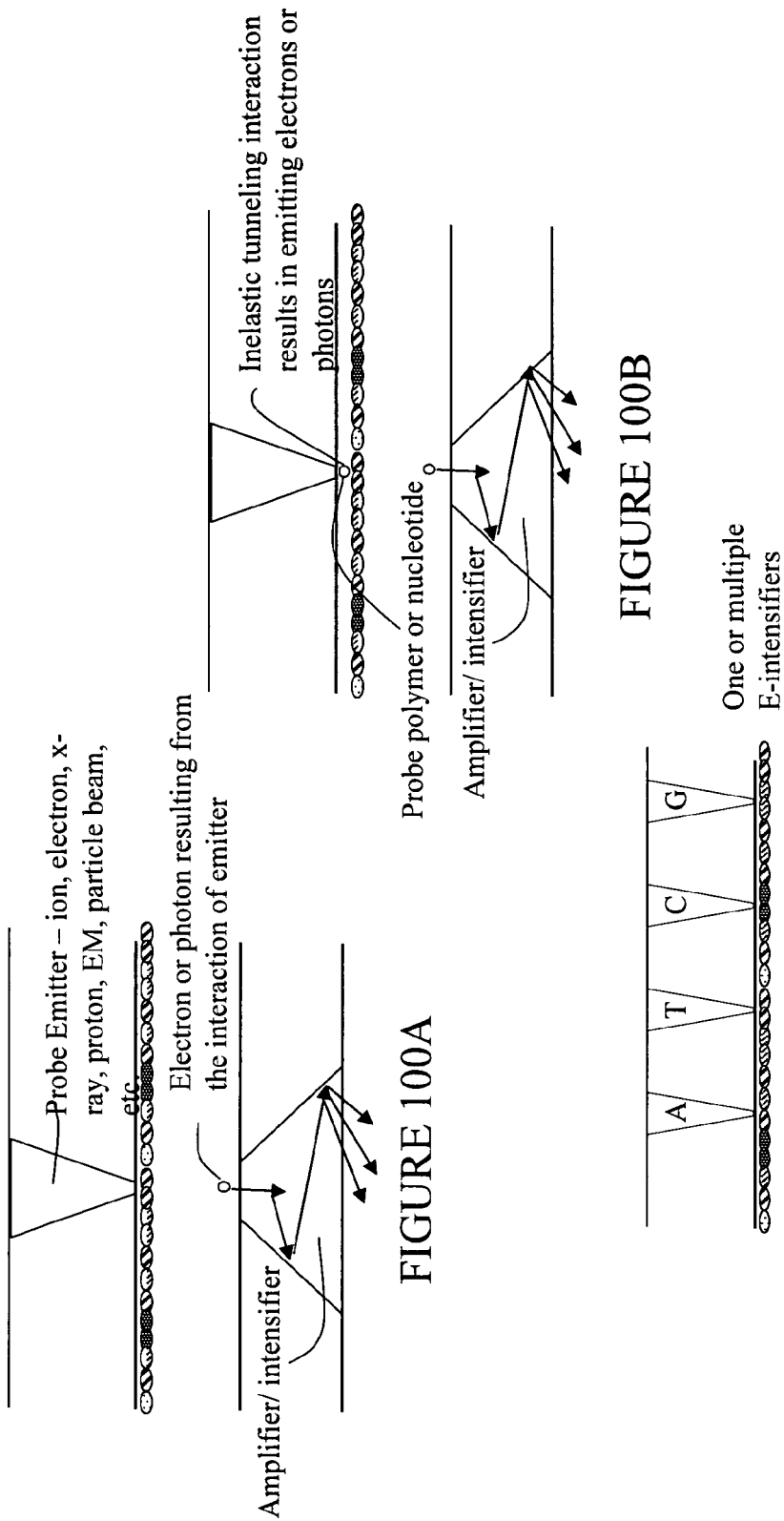

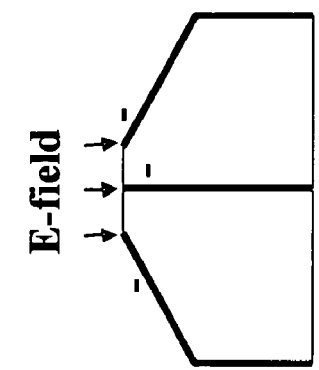
FIGURE 112A
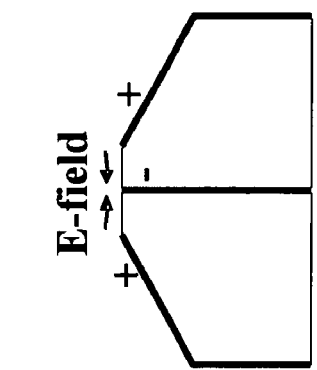
FIGURE 112B
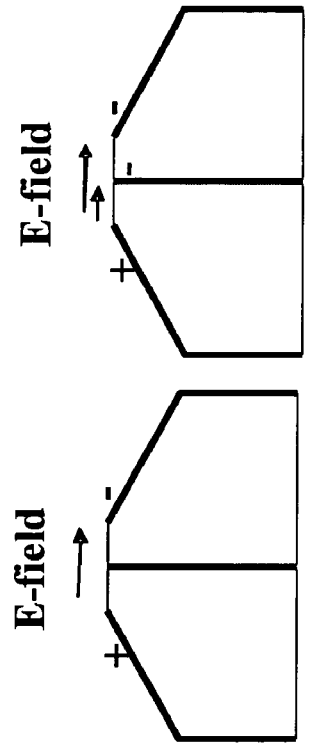
FIGURE 112C
FIGURE 112D
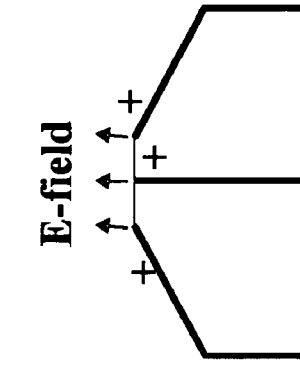
FIGURE 112E
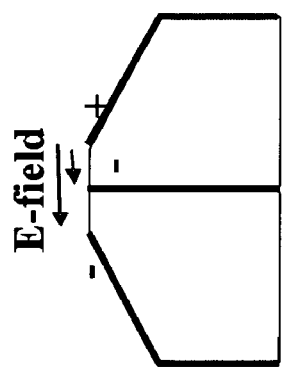
FIGURE 112F
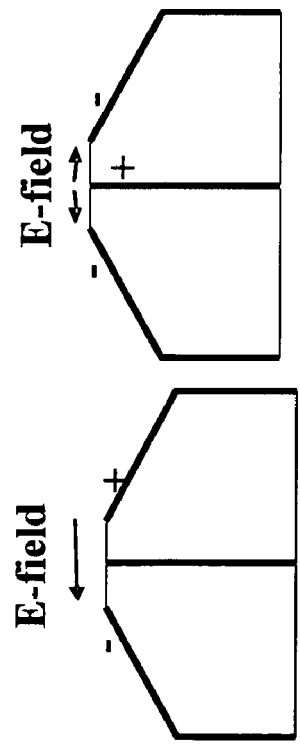
FIGURE 112G
FIGURE 112H

PROBES AND METHODS OF MAKING PROBES USING FOLDING TECHNIQUES

RELATED APPLICATIONS

This application is a continuation in part of U.S. application Ser. No. 11/400,730 file on Apr. 7, 2006 now abandoned entitled "Probes, Methods of Making Probes and Applications of Probes", which claims the benefit under 35 U.S.C. §119(e) of U.S. Provisional Application Nos. 60/669,029 filed on Apr. 7, 2005 entitled "DNA Sequencing Method and System" and 60/699,619 filed on Jul. 15, 2005 entitled "Molecular Analysis Probe, Systems and Methods, including DNA Sequencing", and is a Continuation in Part of U.S. Non-provisional application Ser. No. 10/775,999 filed on Feb. 10, 2004 now abandoned entitled "Micro-Nozzle, Nano-Nozzle, Manufacturing Methods Therefor, applications Therefore, Including Nanolithography and Ultra Fast Real Time DNA Sequencing"; Ser. No. 09/950,909, filed Sep. 12, 2001 now U.S. Pat. No. 7,045,878 entitled "Thin films and Production Methods Thereof"; Ser. No. 10/222,439, filed Aug. 15, 2002 now U.S. Pat. No. 6,956,268 entitled "MEMs And Method Of Manufacturing MEMs"; Ser. No. 10/017,186 filed Dec. 7, 2001 now abandoned entitled "Device And Method For Handling Fragile Objects, And Manufacturing Method Thereof"; U.S. Non-provisional application Ser. No. 10/717,220 filed on Nov. 19, 2003 now U.S. Pat. No. 7,033,910 entitled "Method of Fabricating Multi Layer Mems and Microfluidic Devices"; Ser. No. 10/719,666 filed on Nov. 20, 2003 now U.S. Pat. No. 7,056,751 entitled "Method and System for Increasing Yield of Vertically Integrated Devices"; Ser. No. 10/719,663 filed on Nov. 20, 2003 now U.S. Pat. No. 7,163,826 entitled "Method of Fabricating Multi Layer Devices on Buried Oxide Layer Substrates"; all of which are incorporated by reference herein.

TECHNICAL FIELD

The present invention relates to methods and apparatuses for analyzing molecules, particularly polymers, and molecular complexes with extended conformations. In particular, the methods and apparatuses are used to identify sequence information in molecules or molecular ensembles, which is subsequently used to determine structural information about the molecules. Further, the present invention relates to forming probes and films for making such probes.

BACKGROUND ART

Twenty-first century science and technology endeavors, research and development innovations that solve problems for man-kind will increasingly be dominated by the ability to make structures and objects that have sizes with length scales approaching those of atoms and molecules having dimensions of a nano-meter or less. Nano-scale matter and objects exhibit unique behaviors, some of which have yet to be unraveled in addition to the known remarkable optical, thermal, electrical and mechanical properties. These open new vistas for many beneficial applications making them suitable for many applications. For example, sequencing, imaging, nanolithography, manipulation, nano-scale self assembly, nanometer scale chemistry, and infinite other applications with benefit from nano-scale technology development.

It is envisioned and believed that being involved in the nano-size frontier of science, technology and innovation is a sure path to regional and national economic well being, and competitiveness. This is evidenced by the extraordinary investment activities by big and small countries, large and small private sector enterprises and nearly unparalleled entrepreneurial activities.

To advance in the nano-scale frontier science and technology requires access to and mastering the following:

Tools to produce nano-objects

Tools to measure sizes with sub-Angstrom precision

Substrates that have atomic smoothness with minimum contamination

Tools to see (image) nano-objects and manipulate them, grabbing, moving, gluing, etc.

Nano funnels/nozzles/probes for dispensing substances and stimuli

Tools to accurately measure all physical properties, thermal, electrical, optical, Key parameters become smaller by 10 to 20 orders of magnitude of quantities accustomed to in the macro-world.

In the last 5 years the collective achievements of the best and brightest people around the world related to the above tools have grown at astonishing rates, delivering numerous discoveries, innovations, methods, products and tools.

One area that could tremendously benefit from nanotechnology is the -development of high-throughput DNA sequencers in the 1990's have helped launched the genomic revolution of the 21st century. Almost on a monthly basis, one research group or another is announcing the complete sequencing of a biologically important organism. This has allowed researchers to cross reference species, finding shared and/or similar genes, and allowing the knowledge of molecular biologists in all the various fields to come together in a meaningful way.

However, current techniques in DNA sequencing are far too tedious, tying up the valuable time of researchers. Even the fastest, most advanced DNA sequencers can at most process a few hundred thousand base pairs a day. The Human Genome Project took over 10 years to complete, indicating that current DNA sequencing technology still has a long way to go before it can be used as a diagnostic tool. Considering that there are about 3 billion DNA base pairs in the mammalian genome, and current sequencing technology is capable of sequencing about 2 million DNA base pairs per day, it would still take over 4 years to sequence the human genome.

Known nucleic acid sequencing methods are generally based on chemical reactions that yield multiple length DNA strands cleaved at specific bases. Alternatively, other known nucleic acid sequencing methods are based on enzymatic reactions that yield multiple length DNA strands terminated at specific bases. In either of these methods, the resulting DNA strands of differing length are then separated from each other and identified in strand length order. The chemical or enzymatic reactions, and the methods for separating and identifying the different length strands, usually involve repetitive procedures. Thus, there remains significant limitations on the speed of DNA sequencing using conventional technology.

Despite these limitations, an incredible collaborative heroic effort was undertaken for the Human Genome Project. It took many years and billions of dollars to obtain the sequence to the human genome. It would be highly desirable to provide a method and system that reduces the time and effort required would represent a highly significant advance in biotechnology. Indeed, frontier advances are required to increase the efficiency and speed of DNA sequencing if we are to expand the genome databases that presently exist to include a genome library including flora and fauna. Certain flowering plants have 100 times more base pairs than the human genome, so existing sequencing technology must be leaped for a new frontier of sequencing systems.

One particular type of sequencing method relies on passing strands of DNA through pores. For example, U.S. Pat. Nos. 5,795,782, 6,015,714, 6,267,872, 6,362,002 6,428,959 6,465,193 6,617,113, 6,627,067, 6,673,615, 6,746,594 6,870,361 describe various sequencing techniques and apparatus based on pores and flow of DNA fragments through pores. In general the prior art pores have thickness that cannot directly resolve with high spatial resolution without some other indirect deconvolution of the date resulting from changes in ionic conductivities. It further cannot be used for large DNA fragments. Further, it is very time consuming. In general, for an ultra fast DNA sequencing system, there are many limitations with pore based systems.

Therefore, it would be desirable to provide an improved system and method of analyzing extended objects such as linear polymers (including proteins, DNA and other biopolymers).

OBJECTS AND BRIEF SUMMARY OF THE INVENTION

The present invention teaches new methods, devices and tools that advances the nanotechnology art listed above.

Probes and methods of making probes are provided, particularly probes or nano-tools having tip active areas of extremely small dimensions, e.g., on the order of one angstrom to a few nanometers. One method of making a nano-tool includes forming a composite including a tool layer less than 10 nm thick on a substrate layer, subtracting a region of the substrate layer at least partially through the thickness of the substrate layer, thereby exposing a well surface, and folding the composite so that portions of the tool layer surface diverge and portions of the well surface converge, wherein an outer crease of the folded tool layer is a nanotool active area. Another method of making a nano-tool includes forming a composite including a tool layer less than 10 nm thick on a substrate, subtracting a region of the substrate layer at least partially through the thickness of the substrate layer, thereby exposing a well surface, and folding the composite so that portions of the tool layer surface diverge and portions of the well surface converge, wherein an outer crease of the folded tool layer is a nanotool active area, whereby the tip may be cut mechanically or altered to expose two probe active areas.

The herein probes may be very useful in systems and methods that benefit from probes having resolution capabilities less than the dimensions of the objects to be analyzed.

BRIEF DESCRIPTION OF THE FIGURES

The foregoing summary as well as the following detailed description of preferred embodiments of the invention will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings, where:

FIGS. 3A-3E show various shapes of certain embodiments of probes according to the present invention, generally having an open tip configuration;

FIGS. 8A-8C2 show embodiments of variable tip probes according to certain embodiments of the present invention;

FIGS. 10A-10B show an enlarged isometric view and side view, respectively, of a probe set according to the present invention including probes and a specimen extended object upon a platform, FIG. 10C shows an enlarged sectional view through a probes in the system according to the present invention shown in FIGS. 10A and 10B;

FIG. 10D shows a top view of the base platform of the system according to the present invention shown in FIGS. 10A and 10B, showing an exemplary channel;

FIGS. 11A-11D show an isometric view, top view (opposite the probe tips), bottom view (viewing the probe tips) and a section view, respectively, of a probe set formed according to embodiments of the present invention;

FIGS. 12D-12E show alternative orientations of probes and probe sets with respect to the specimen at various angles (along the height direction of the probe as shown in the Figure) according to the present invention;

FIG. 12F shows a probe array of probe sets according to the present invention, whereby probe sets are oriented at different angles along the height direction of the probe as shown in the Figure;

FIG. 14A shows a serial probe array according to the present invention;

FIG. 14B shows an array of probe sets including heterogeneous probes according to the present invention;

FIG. 14C shows a parallel and serial probe array according to the present invention;

FIG. 16A shows an extended object to be analyzed upon a base being passed underneath open tip probes according to the present invention;

FIG. 16B shows an extended object to be analyzed upon a base being passed underneath an array of probe sets of open tip probes according to the present invention;

FIGS. 30A-30B show another embodiment of a system and method according to the present invention to selectively peel off a single layer from a lamellar material;

FIGS. 31A-31C show another embodiment of a system and method according to the present invention to selectively peel off a single layer from a lamellar material;

FIGS. 32A-32F show a method and system for making a thin device layer for use as a probe elements according to various embodiments of the present invention;

FIGS. 33A-33G show another method and system for making a thin layer with a useful device thereon or therein including a release layer having a sub-layer of first porosity P1 and a sub-layer of second porosity P2;

FIGS. 37A-37B are top isometric and sectional views, respectively, of a selectively bonded substrate having a plurality of wells according to various embodiments of the present invention;

FIGS. 37C-37D show plan and sectional views, respectively, of a single well according to various embodiments of the present invention formed in the device layer of the selectively bonded substrate shown in FIGS. 37A-37B;

FIG. 38 shows an ultra thin device layer removably attached to a support layer used in certain embodiments of the invention herein;

FIGS. 39A-37B show a system and method of the present invention for making a probe element upon a device layer removably attached to a support layer;

FIGS. 58A-58B show a probe precursor structure formed according to the methods of FIGS. 57A-57D;

FIG. 59 shows a probe formed based on the precursor structure of FIGS. 58A-58B;

FIGS. 60A-60J show a method according to one embodiment of the present invention for manufacturing a probe by folding a very thin layer including a cavity or well therein;

FIGS. 62A-62E show another alternative method of making various probes with additional versatility and functionality according to the present invention;

FIGS. 64A-64E show yet another alternative method of making various probes with additional versatility and functionality according to the present invention;

FIGS. 89A-89B show another embodiment of the present invention whereby a bendable membrane material having a nano-scale probe attached thereto is provided to facilitate contacting;

FIGS. 94A-94F show a method and system according to an embodiment of the present invention for coaxing strands onto a structure;

FIGS. 100A-100B show use of an electron or photon intensifier in accordance with certain embodiments of the present invention;

FIG. 100C shows an array of intensifiers/amplifier subsystems as described with respect to FIGS. 100A-100B;

FIG. 106A illustrates a system according to yet another embodiment of the present invention whereby a tool for analyzing specimens is provided;

FIG. 106B shows an exploded view of the system of FIG. 106A;

FIG. 106C shows the circuit model of the system of FIG. 106A;

FIG. 107 shows a system of the present invention including several capacitive probes integrated in a single structure to perform parallel sequencing and analysis functions;

FIG. 108 shows a system of the present invention similar to that of FIG. 107 further including nucleotide specific probes for increases specificity and including several capacitive probes integrated in a single structure to perform parallel sequencing and analysis functions;

FIG. 109 shows a schematic view of a four probe tunneling device according to the present invention;

FIG. 110 shows a schematic view of a multi-probe device in relation to a molecular structure, such as a protein;

FIGS. 111A-111C shows various conformations of a molecular structure, such as a protein, relative a multi-probe device; and FIGS. 112A-112H show various fields that may be applied to achieve various possible molecular conformations.

DETAILED DESCRIPTION OF THE FIGURES

General

Figure 1D:
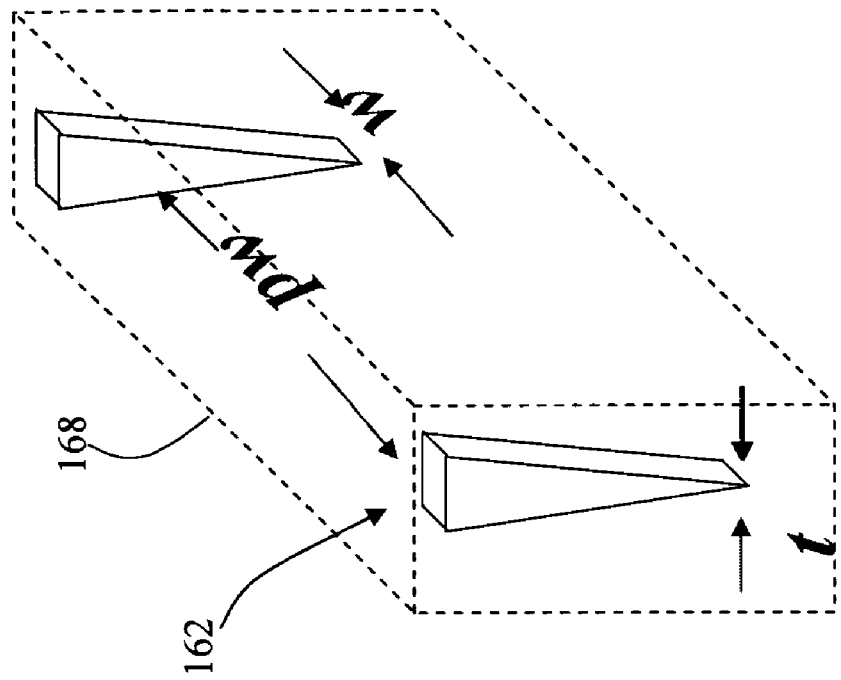
FIGS. 1A-1D are example of certain probe configurations of the present invention.

Described herein is a novel system and method for analyzing extended object specimens. The system includes analytical probes configured and dimensioned such that the edge of the probe has a thickness direction that is spatially smaller than the desired resolution. Further, in certain embodiments, the analytical probe has a width dimension that is much larger than the thickness of the extended object. In other embodiments, the analytical probe has a path in the width direction that is much larger than the thickness of the extended object.

Definitions

Extended Object

The "extended object" to be analyzed using the probes described herein may be a complex macromolecule, including complex monomers, polymers, oligomers, dentimers, or other molecules. Examples of such complex macromolecules include, but are not limited to, proteins, polypeptides, peptide-nucleic acids (PNA), having a polypeptide-like backbone, based on the monomer 2-aminoethyleneglycin carrying any of the four nucleobases: A, T, G, or C. In certain embodiments, the polymers are homogeneous in backbone composition and are, e.g., nucleic acids or polypeptides. A nucleic acid as used herein is a biopolymer comprised of nucleotides, such as deoxyribose nucleic acid (DNA) or ribose nucleic acid (RNA). In certain embodiments, the extended object is a single stranded (denatured) DNA molecule with a rigid structure. Other organic or inorganic molecular structures may also be extended objects for the purpose of the present invention whereby these extended objects may be analyzed, manipulated, physically altered or chemically altered. Further, double stranded structures may be analyzed according to certain embodiments herein, such as double stranded helical DNA strands.

It will be appreciated by one skilled in the art that the system described herein for monomer level resolution may be used for other molecular level detection, e.g., for single small molecules, single monomers, oligomers, or other nano-scale structures.

Probe

Further, as used herein, the term "probe" refers generally to any device used to interact with individual portions of the extended object including, for example, individual nucleotides of a RNA or DNA strand, atomic groups an extended object, atomic and molecular bonds and bond interactions, groups of atoms or molecules within the extended objects, and other interactive forces such as covalent bonds, hydrogen bonds, ionic bonds, and other know interactions. Probes may be formed of various configurations and materials to be described further herein.

Detectable Interaction

Further, as used herein, the term "detectable interaction" refers generally to an interaction between the probe and a portion of the extended object. The portion of the extended object with which a detectable interaction occurs may include individual atoms, molecules, or groups of atoms or molecules, and their bonds. The detectable interaction may be in the form of electric field, magnetic field, optical variations, vibration forces, gravitational forces, or other measurable events.

Probe Configurations

The probes used herein may be formed of various materials and configurations. For example, probes may be in the form of wells, nozzles or funnels (herein after "hollow probes") having a tip for dispensing or holding materials (including solids, liquids, gases and transition phases) to facilitate analysis of the specimen. Alternatively, the wells or nozzles may be provided in a system and configuration for suction or application of fluid pressure. The nozzles configured for dispensing materials may include conductive inner walls, or a conductive element disposed within a material holding region, in order to facilitate measurement and other voltage applications across the probe. In other examples, the dispensing materials are within a conductive medium to facilitate measurement and other voltage applications across the probe.

Continuous Edge Probe

Figure 1A:
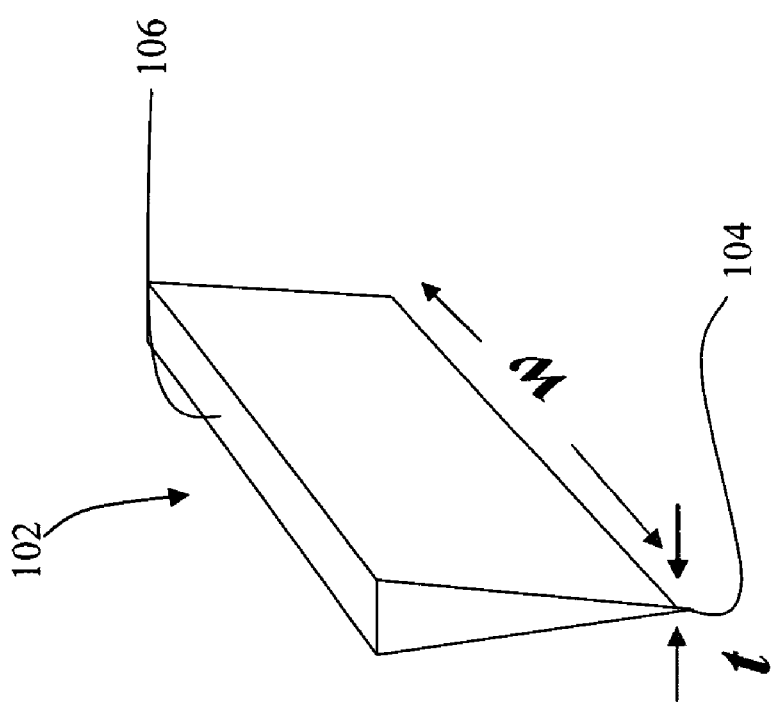

Referring now to FIG. 1A, a continuous edge probe 102 is depicted, for example, in the form of a continuous knife edge. Probe 102 is particularly well suited for analyzing extended object specimens such as biopolymers. Probe 102 is characterized by a tip 104 thickness t, a tip 104 width w, and a height (not identified in the Figure). Importantly, the tip thickness t is dimensioned to obtain the desired resolution of the system. For example, when information regarding individual monomers of a DNA strand is desired, the thickness t should be less than the nucleotide spacing on the strand (about 0.5 nm). Still further, probe 102 has a width dimension w that is preferably much greater than the tip dimension and also much greater than the width of the specimen. In certain embodiments, this width dimension that is much greater than the tip dimension minimizes or eliminates landing error associated with typical probe analysis systems as the probe passes over the specimen. The ratio of w to t may be, for example, on the order of about 5:1. 10:1, 10 s to 1, 100 to 1, 100 s to 1, 000 to 1, 10,000 to 1, or greater depending on the desired application.

These continuous edge probes may be hollow, solid or partly solid and partly hollow.

As shown, in certain preferred embodiments, the probe has a shape that provides a larger end 106 opposite the tip 104. This can, for example, reduce electrical resistance of the probe when end 106 serves as a contact region. Further, the larger end 106 serves to facilitate introduction and dispensation of materials from the probe when the probe is in the form of a nozzle filled with suitable material, as described further herein.

Discontinuous Edge Probe

Figure 1C:
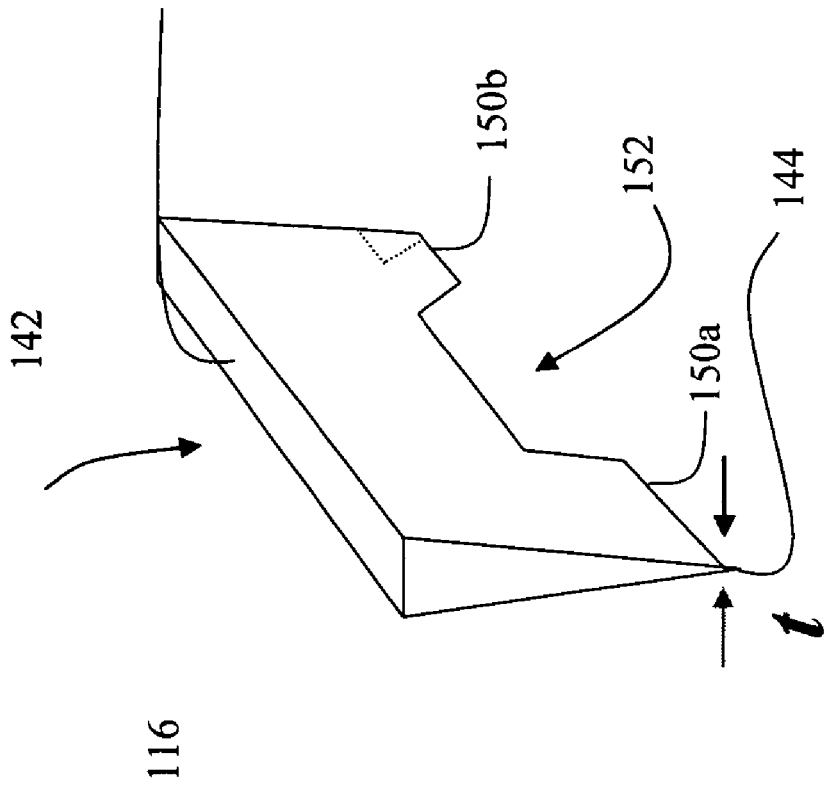
Figure 1B:
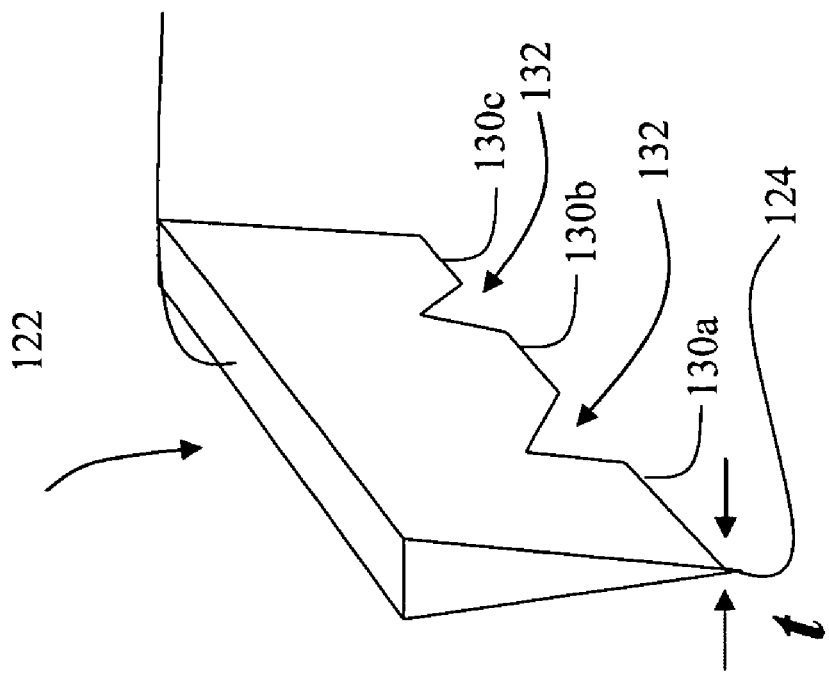

Referring now to FIGS. 1B and 1C, discontinuous probes 122, 142 are provided. Probes 122, 142 have an elongated width structure with desirably sized tip with, e.g., cutouts or discontinues edge portions. The generalized probes, 122, 142 made according to the present invention can be made in a configurations that several probe sections, 130, 150, which can be accessed independently or together as shown in FIGS. 1B and 1C. In certain embodiments, the probe sections 130, 150 serve identical functionality, for example, for redundancy, or to examine plural specimens in parallel. In further embodiments the probe sections 130, 150 serve different functionalities. For example, some applications may require that sub-probe 130a be used for analyzing or sequencing the specimen, adjacent section, 130b used for dispensing substances or stimuli, and section 130c used for imaging or reading alignment marks. In another example, probe section 150a is in the form of an edge with an elongated width as shown, while probe section 150b may be point like probe, as represented in FIG. 1C with dotted lines. The probe sections may be functionalized differently to recognize parts of a specimen under test with high degrees of specificity. These discontinuous edge probes may be hollow, solid or partly solid and partly hollow.

Scanning Probe

Referring now to FIG. 1D, a probe 162 is depicted. Probe 162 is particularly well suited for analyzing extended object specimens such as biopolymers. Probe 162 is characterized by a tip thickness t, a tip width w, and a height (not identified in the Figure). Further, probe 162 is positioned within a suitable sub-system 168 to impart motion to the probe generally in the direction of the width w along a path pw. Similar to probe 102, the tip thickness t is dimensioned to obtain the desired resolution of the system. The width dimension w of probe 162 is not critical. However, the path width pw is preferably much greater than the width of the specimen. This ensure that as the probe passes over the specimen, landing error associated with typical probe analysis systems is eliminated.

Probe Shape

The probes described herein may take on various shapes and functionalities. In certain embodiments, the probes herein have a continuous edge that is closed. In certain embodiments, the probes herein have a discontinuous edge that is closed. In certain embodiments, the probes herein have a continuous edge that is open. In certain embodiments, the probes herein have a discontinuous edge that is open. In certain embodiments, the probes herein have a continuous edge that has some portions along the width w of the probe that are closed and some portions along the width w of the probe that are open. In certain embodiments, the probes herein have a discontinuous edge that has some portions along the width w of the probe that are closed and some portions along the width w of the probe that are open.

Note that the probes herein may have a constant cross section along the width w of the probe, or in certain embodiments, it may be desirable to provide a cross section along the width w of the probe that is different therealong, for example, with a broader or narrower central portion.

Further, the probes herein may have a constant tip opening or tip active area dimension along the width w of the probe. Alternatively, in certain embodiments, it may be desirable to provide a tip opening or tip active area dimension along the width w of the probe that is different therealong, for example, with a smaller and larger sections of tip opening or tip active area dimension for different applications.

Additionally, the probes may be formed of a generally inactive body portion, and an active area that forms the tip opening, such as a conductor in the case of closed tip probes, or a tip opening. Alternatively, the body portion may incorporate some other functionality, such as thermal and electrical shielding, precise metrology spacing, or other elements such as micro- or nano-fluidic or micro- or nano-electromechanical devices. Further embodiments will be described herein.

Closed Tip

The probes described herein may be formed many different shapes that will provide the desired tip characteristics and dimensions. FIGS. 2A-2L show various shapes of certain embodiments of probes herein, generally having a closed tip configuration. However, it should be understood that these shapes may also be suitable of any tip configuration and may be incorporated in any continuous edge or discontinuous edge probe described herein.

Figure 2E:
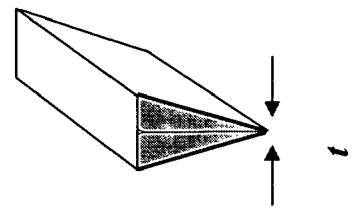
FIGS. 2A-2L show various shapes of certain embodiments of probes according to the present invention, generally having a closed tip configuration.
Figure 2D:
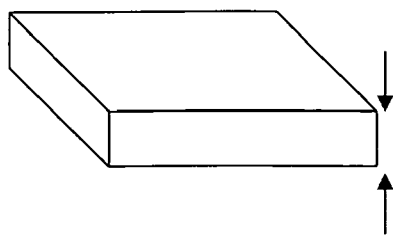
Figure 2C:
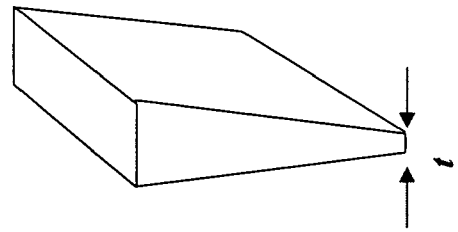
Figure 2B:
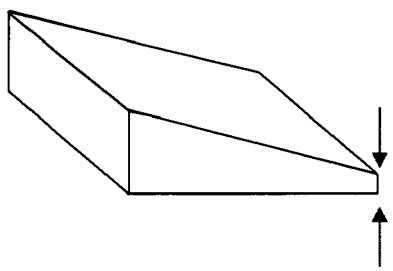
Figure 2A:
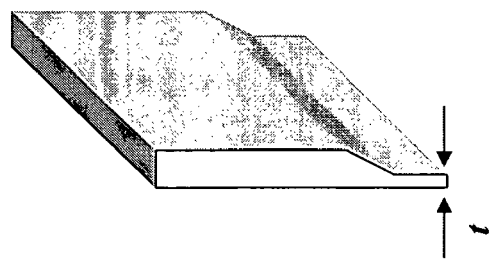

FIG. 2A shows a prismatic shaped probe having a cross section in the form of an elongated tip integral with a triangular region and an elongated rectangular portion at an end opposite the probe tip.

FIG. 2B shows a prismatic shaped probe having a cross section in the form of a right triangle, e.g., with the tip flattened.

FIG. 2C shows a prismatic shaped probe having a cross section in the form of a trapezoid.

FIG. 2D shows a prismatic shaped probe having a cross section in the form of a rectangle.

FIG. 2E shows a prismatic shaped probe having a cross section in the form of a triangle, with the tip at the adjoining end of the long sides of the triangle forming the tip for probing or other applications as described herein.

Figure 2J:
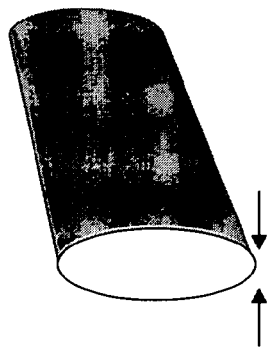
Figure 2K:
Figure 2L:
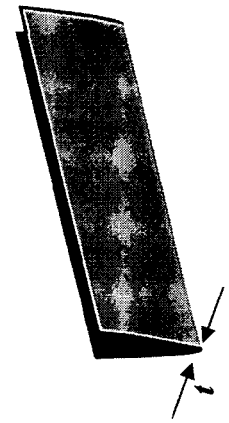
Figure 2H:
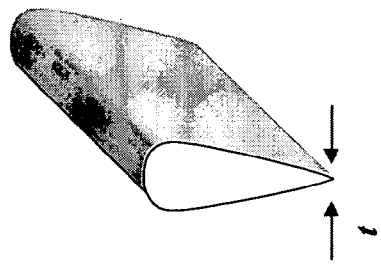
Figure 2I:
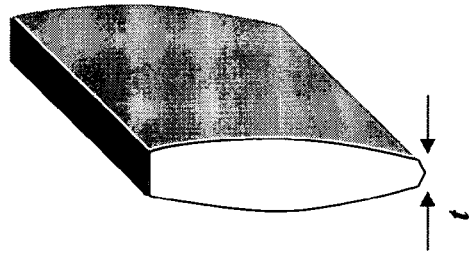
Figure 2F:
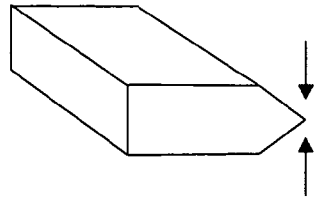

FIG. 2F shows a prismatic shaped probe having a cross section in the form of a rectangle with a triangle at the probe tip end, with the tip at the adjoining end of the long sides of the triangle forming the tip for probing or other applications as described herein.

Figure 2G:
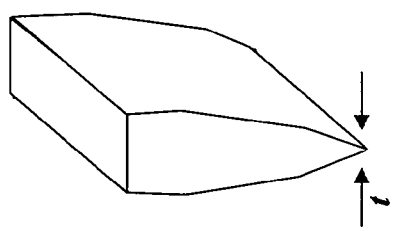

FIG. 2G shows a prismatic shaped probe having a cross section in the form of an irregular polygon, e.g., symmetrical about the height axis, with a flat end and with a tip at the adjoining end of sides of the polygon with an acute angle as shown.

FIG. 2H shows a probe having a cross section generally in the form of an inverted tear drop, with a tip t at the point of the tear drop shape.

FIG. 2I shows a probe having a cross section generally in an elongated irregular form, with a tip t at an elongated end thereof.

FIG. 2J shows a probe having a cross section generally in the form of an ellipse, with a tip t at a tangential point elliptical shape at an elongated end thereof.

FIG. 2K shows a probe having a cross section generally in the form of a nozzle, such as a "flattened" end of an elliptical or circular cross sectioned tube, with a tip t at the "flattened" end thereof.

FIG. 2L shows a probe having a cross section generally in the form of a V-shape, with a tip t at the point of the V-shape.

Open Tip

Referring now to FIGS. 3A-3E, probes are shown in various configurations having tip openings $t_o$, suitable for dispensing and/or holding materials according to the various embodiments herein.

FIG. 3A shows a probe having a cross section in the form of an elongated hollow tip integral open to a triangular well region and an elongated rectangular well portion at an end opposite the probe tip with an opening $t_o$, having a channel therein for holding and facilitating dispensing of materials.

FIG. 3B shows a probe having an asymmetrical cross section in the form a rectangle and a truncated triangle forming a probe tip with an opening to, having a channel therein for holding and facilitating dispensing of materials.

FIG. 3C shows a probe having a symmetrical cross section in the form a truncated triangles forming a probe tip with an opening to, having a channel therein for holding and facilitating dispensing of materials.

FIG. 3D shows a probe having a symmetrical cross section in the form a angled members forming a probe tip with an opening to, having a funneling channel therein for holding and facilitating dispensing of materials.

FIG. 3E shows a probe having a symmetrical cross section forming a probe tip with an opening $t_o$, having a shaped well and a channel therein for holding and facilitating dispensing of materials.

Extended Tip

Figure 5A:
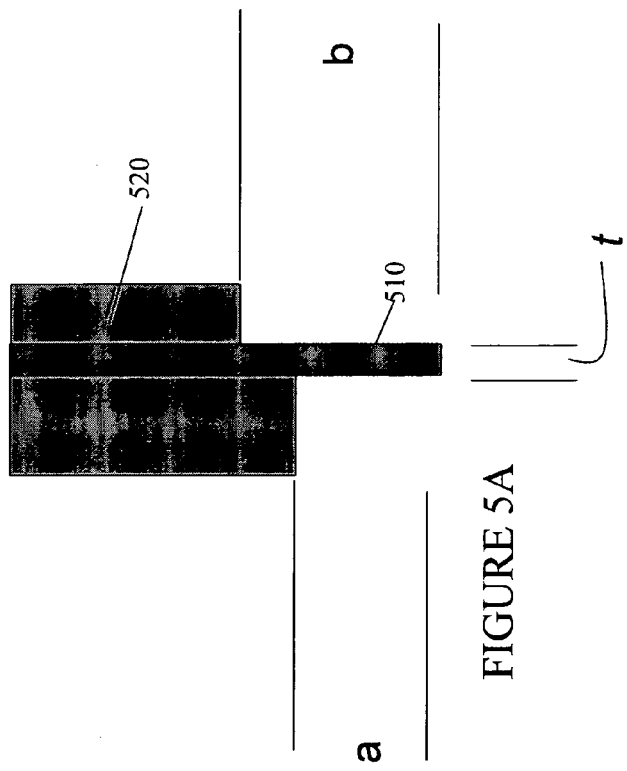
FIGS. 5A-5B show a sectional view and an isometric view of a probe of the present invention including tips that extend beyond an asymmetrical probe body.
Figure 5B:
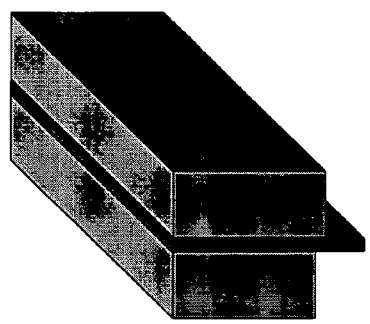
Figure 15:
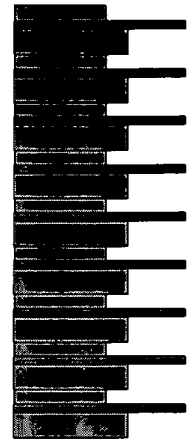
FIG. 15 shows probe set or array according another embodiment of the present invention.
Figure 4A:
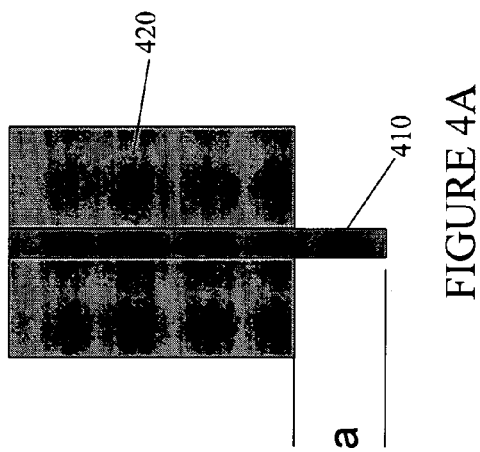
FIGS. 4A-4B show a sectional view and an isometric view of a probe of the present invention including tips that extend beyond a symmetrical probe body.
Figure 4B:
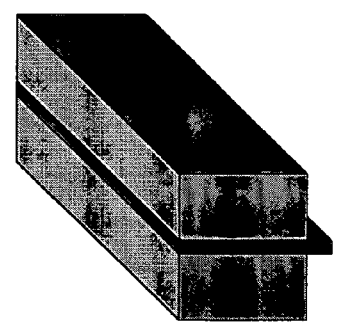

Referring now to generally to FIGS. 4A-5B, probes having tips, for example, conductive tips, with tip active area dimensions of t, are shown, whereby tips 410, 510, extend beyond the bodies 420, 520, of the structures. As shown, in FIGS. 4A-4B, a symmetrical probe is provided, and in FIGS. 5A-5B, a symmetrical probe is provided. Generally, the dimensions a FIG. 4A and the dimensions a and b in FIG. 5A are greater than the tip dimension t, preferably multiples of the tip dimension t. These embodiments advantageously provide for tips that extend sufficiently far away, for example, to minimize interaction between the probe body, for example, with the specimen or a substrate depending on the application of the probe. This avoids negative effects of substrate material such as accumulation of electrostatic charge and other interfering effects. Referring to FIG. 15, an example of an array of probes according to the embodiment of FIG. 5A-5B is shown.

Figure 109:
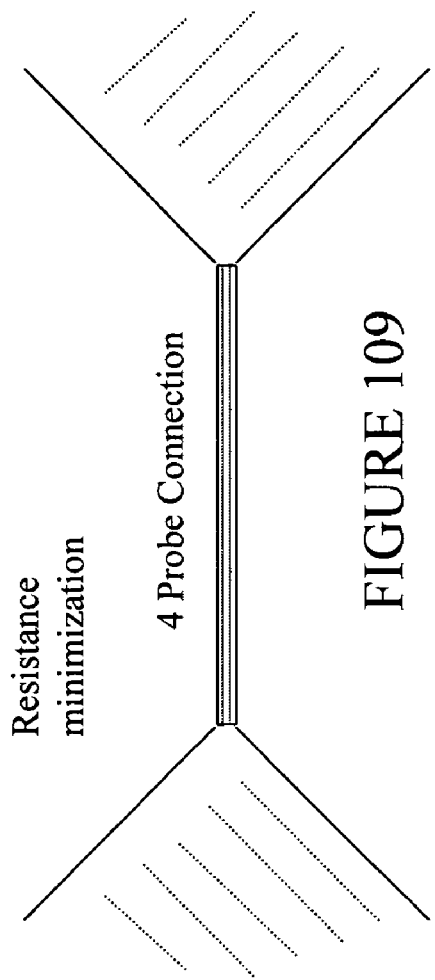

In systems herein where metal contacts or probes are used to measure currents and voltages from small structures such as the monomers of the specimen, four probe tunneling devices as are known in the art (e.g., shown in FIG. 109, are preferred to minimize contact and lead resistance.

Irregular Inner Channel

Figure 6C:
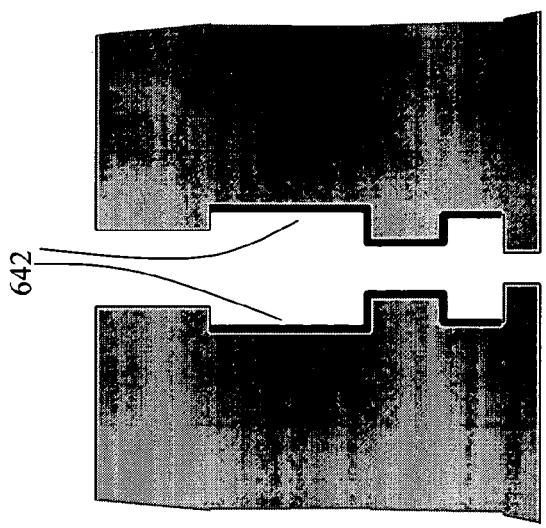
FIGS. 6A-6C show views of an open tip probe according to certain embodiments of the present invention having irregular inner channel surfaces.
Figure 6A:
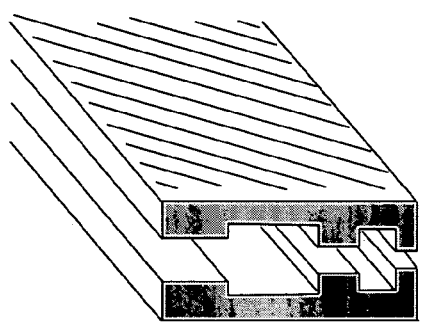
Figure 6B:
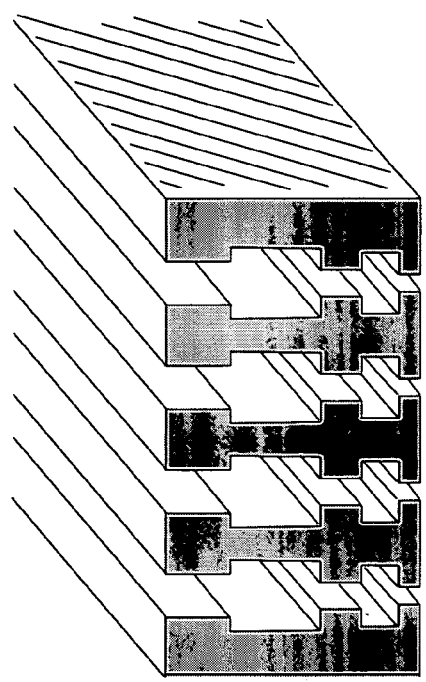

Referring now to FIGS. 6A-6C, views of an open tip probe according to certain embodiments of the present invention is shown, showing an irregular inner channel surface. FIG. 6B shows an array of such probes. FIG. 6C shows a probe generally as in FIG. 6A, wherein only a portion of the inside surface has electrodes 642 therethrough, which may be advantageously in certain applications.

Figure 7B:
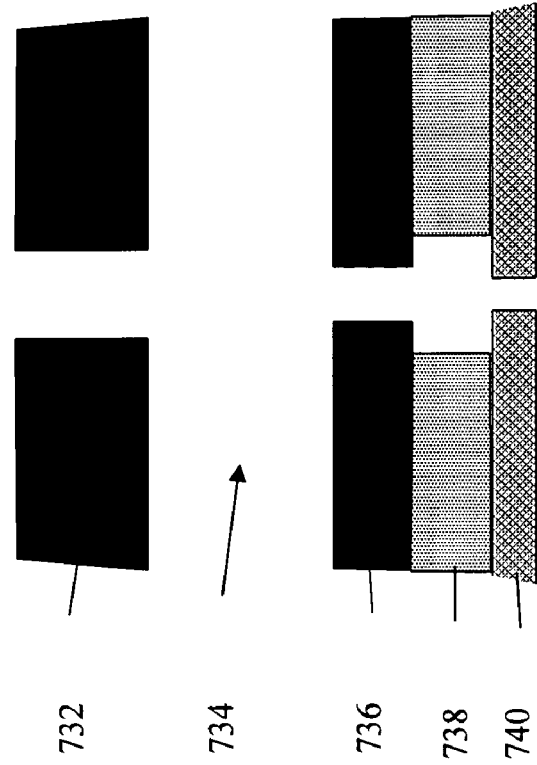
FIGS. 7A-7B show views of an open tip probe according to certain embodiments of the present invention having an irregular inner channel surface with differing sub-sections therein.
Figure 7A:
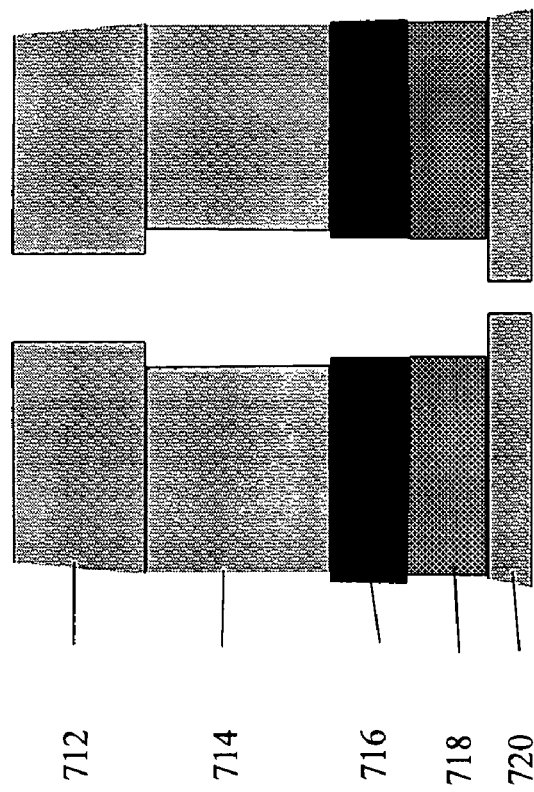

Referring now to FIGS. 7A-7B, views of an open tip probe according to certain embodiments of the present invention is shown, showing an irregular inner channel surface with differing sub-sections therein. For example, referring to FIG. 7A, a probe is shown having sub-sections that are divided generally along the height dimension of the channel, including sub-sections 712, 714, 716, 718 and 720. For example, sub-sections 712, 714, and 720 may be formed of insulating materials, sub-section 716 formed of conductive materials, and sub-section 718 formed of semiconductor materials. In a further example, and referring to FIG. 7B, a probe is shown having sub-sections that are divided generally along the height dimension of the channel, including sub-sections 732, 734, 736, 738 and 730. For example, sub-sections 732 and 736 may be formed of conductive materials, sub-sections 738 and 740 formed of insulating materials, and sub-section 734 formed as an open channel perpendicular to the channel of the probe tip, for example, for providing micro-fluidic operations or other suitable functionality.

Variable Opening Probe

In general, variable opening probes may be provided. In certain preferred embodiments, the opening tip dimension is controllable with sub-angstrom precision.

Referring now to FIG. 8A a sectional view of a variable tip probe 810 according to certain embodiments of the present invention is shown, showing an irregular inner channel surface having a fixed section 814 and a complementary movable section 816. The movable section 816 preferably are actuated with angstrom or sub-angstrom precision to define the probe opening 812. FIGS. 8B1 and 8B2 shows views looking into the probe opening according to one embodiment, and FIGS. 8B1 and 8B2 shows views looking into the probe opening according to another embodiment.

Figure 9:
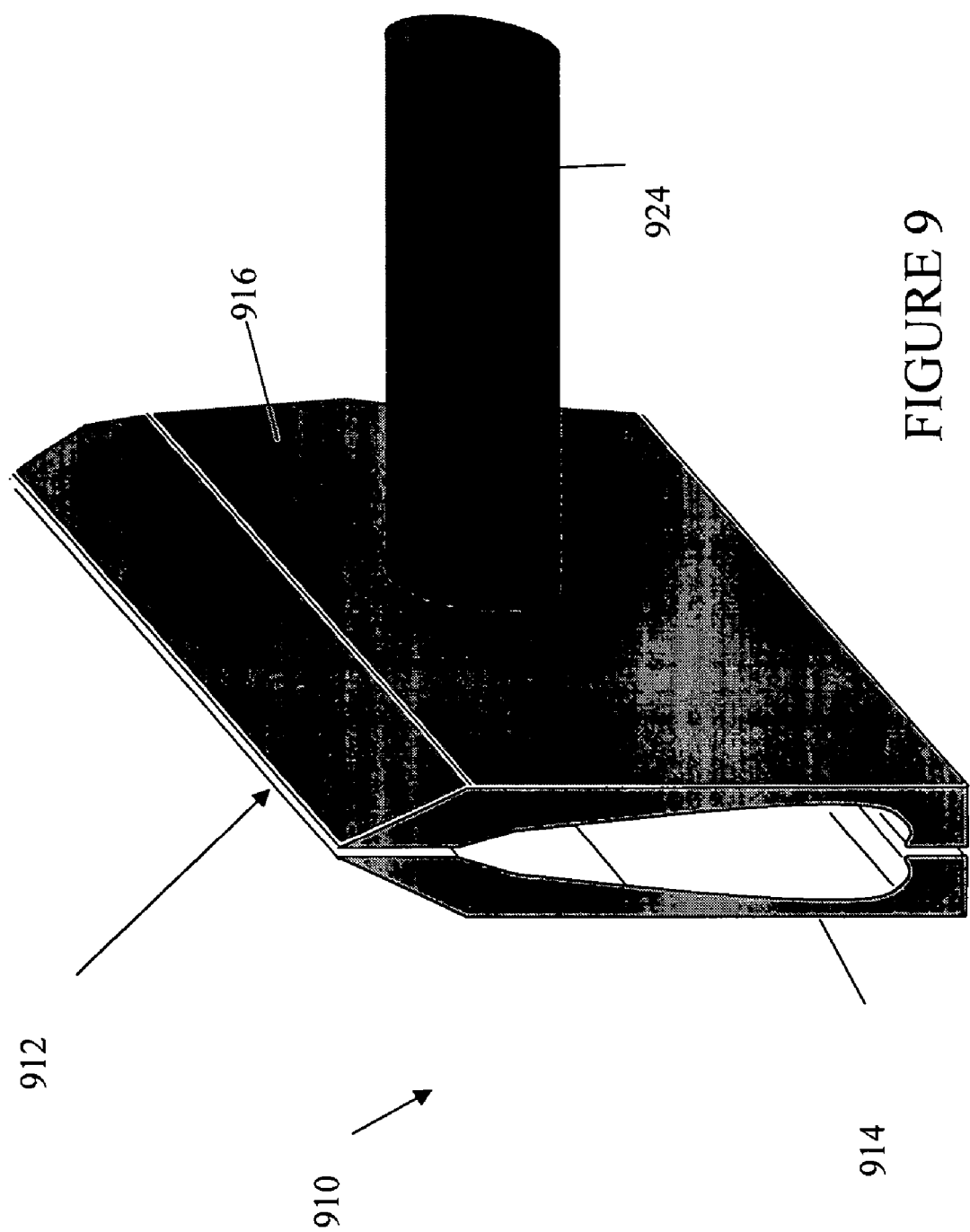
FIG. 9 shows another embodiment of a variable tip probe according to certain embodiments of the present invention.

Referring now to FIG. 9, another embodiment of a variable gap probe 910 is shown. An actuator 924 imparts motion to section 916 of the probe, thereby changing the opening dimension of the tip opening 912.

Probe Set

FIGS. 10A and 10B show an enlarged isometric view and side view, respectively, of a probe set 1030 including probes 1042, 1044, 1046, and 1048, and a specimen extended object 1050 upon a platform 1028. In certain preferred embodiments, polymer strand 1050 is a biopolymer such as a nucleic acid (e.g., DNA). FIG. 10C shows an enlarged sectional view through any one of probes 1042, 1044, 1046, or 1048. FIG. 10D shows a top view of the base platform 1028, showing an exemplary channel 1052. As shown in FIGS. 10C and 10D, in certain embodiments, a measuring voltage is applied across each probe 1042, 1044, 1046, 1048, and platform 1028, denoted by reference numerals 1054*a* and 1054*b*, respectively. As the polymer strand 1050 passes under an activated probe (e.g., a probe with a measuring voltage applied thereto), detectable interactions occur as described in further detail herein.

FIGS. 11A-11D show a probe set 1130 formed according to embodiments of the present invention. The probe set includes, e.g., a 1×4 array (although it is understood that this may be scaled to any size n×m nozzles) of probes 1142, 1144, 1146, 1148.

In certain embodiments, these probes 1142, 1144, 1146, 1148 are in the form of nozzles, e.g., having tips 1154 associated with wells 1156, as shown in FIGS. 11B and 11C. Generally, the wells having widths in the y direction greater than the widths of the nozzle tips. FIG. 11D shows a sectional view of the nozzle array.

The probe set 1130 may be embedded in a body 1158. The material for the probes or nozzles, and the body, may be the same or different materials, and may include materials including, but not limited to, plastic (e.g., polycarbonate), metal, semiconductor, insulator, monocrystalline, amorphous, noncrystalline, biological (e.g., nucleic acids or polypeptides based materials or films) or a combination comprising at least one of the foregoing types of materials. For example, specific types of materials include silicon (e.g., monocrystalline, polycrystalline, noncrystalline, polysilicon, and derivatives such as Si3N4, SiC, SiO2), GaAs, InP, CdSe, CdTe, SiGe, GaAsP, GaN, SiC, GaAlAs, InAs, AlGaSb, InGaAs, ZnS, AlN, TiN, other group IIIA-VA materials, group IIB materials, group VIA materials, sapphire, quartz (crystal or glass), diamond, silica and/or silicate based material, or any combination comprising at least one of the foregoing materials. Of course, processing of other types of materials may benefit from the process described herein to provide probes and bodies of desired composition.

Specimen/Probe Orientation

Figure 12A:
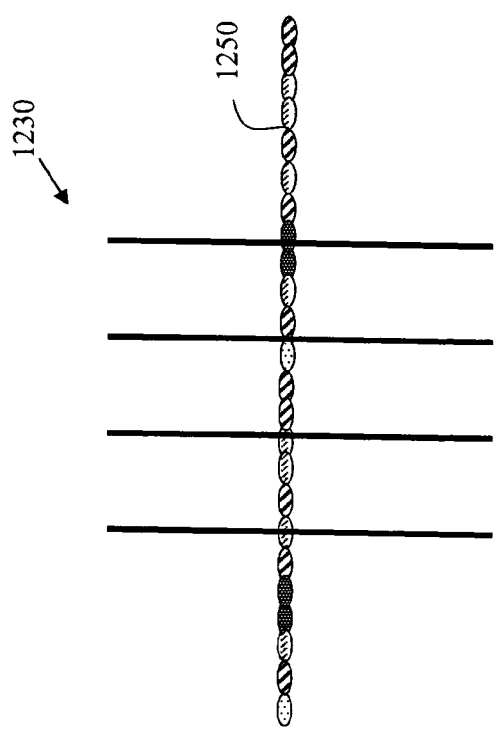
FIGS. 12A-12B show alternative orientations of probes and probe sets described herein with respect to the specimen at various angles (along the length direction of the specimen) according to the present invention.
Figure 12B:
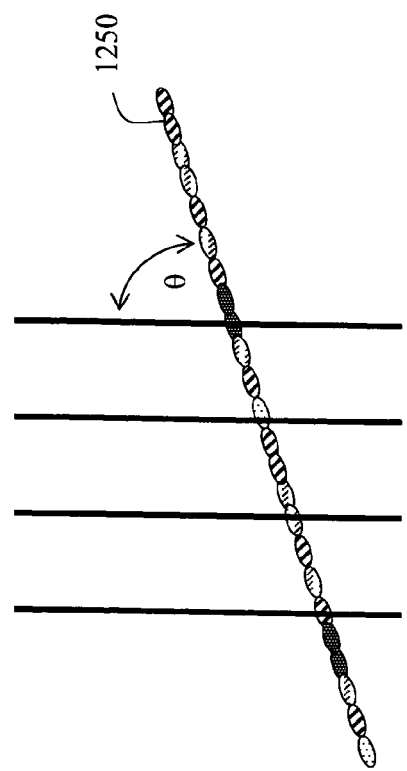

Referring now to FIGS. 12A and 12B, all probes and probe sets described herein may be configured with respect to the specimen at various angles. For example, referring to FIG. 12A, a probe set 1230 may be oriented generally perpendicular (in the length direction) to a specimen 1250. Further, referring to FIG. 12B, a probe set 1230 may be oriented (in the length direction) generally at an angle θ with respect to a specimen 1250.

Figure 12C:
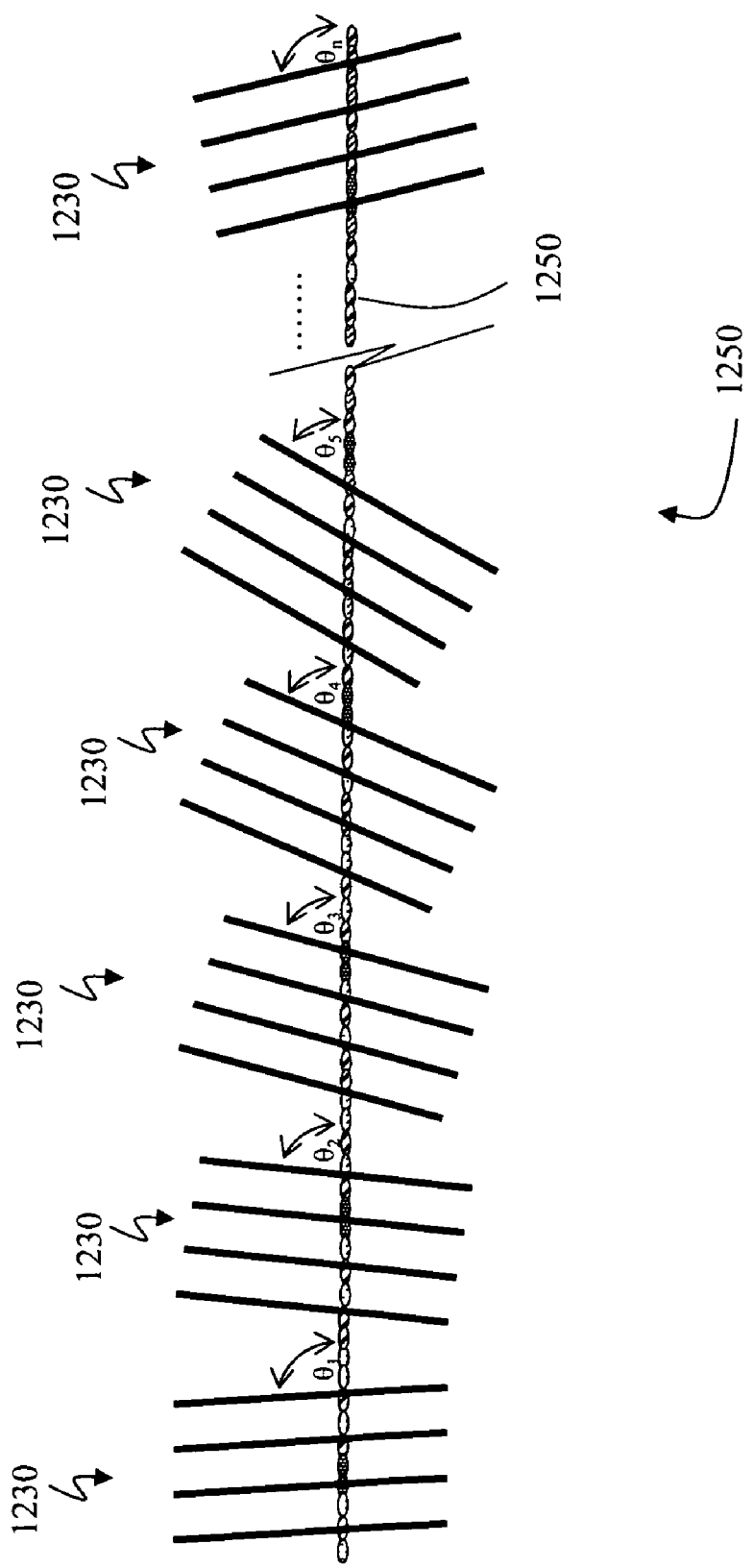
FIG. 12C shows a probe array of probe sets according to the present invention, whereby probe sets are oriented at different angles along the length direction of the specimen.

Referring to FIG. 12C, a system 1260 is presented whereby the orientation of plural probe sets 1230 relative a specimen 1250 varies. Because the objects of the specimen 1250 (e.g., bases within a DNA strand) may have different orientations, it may be desirable to sequence with a plurality of probe sets 1230. The plurality of probe sets 1230 may have different angles $\theta_1, \theta_2, \theta_3, \theta_4, \theta_5, \ldots \theta_n$ (e.g., 20° to 160° in suitable increments, arranged sequentially, randomly or in another desirable arrangement. During measurement as described further herein, a controller may determine which orientation of the probe set yields the best signal for a particular base at its inherent orientation. This allows one to measure the data from the probe sets of the array, and determine the optimum signal for certain bases or groups of bases.

In another embodiment, and referring to FIGS. 12D-12F, the angles of orientation in the height direction may also be varied. For example, referring to FIG. 12D, probe set 1230 may be oriented in the height direction generally perpendicular (90°) with respect to the specimen 1250. Further, as shown in FIG. 12E, probe set 1230 may be oriented in the height direction generally at an angle ω with respect to the specimen 1250. Referring to FIG. 12F, a system 1270 is presented whereby the orientation in a height direction of plural probe sets 1230 relative a specimen 1250 varies. Because the objects of the specimen 1250 (e.g., bases within a DNA strand) may have different orientations, it may be desirable to sequence with a plurality of probe sets 1230. The plurality of probe sets 1230 may have different angles $\omega_1, \omega_2, \omega_3, \ldots \omega_n$ (e.g., 20° to 160° in suitable increments, arranged sequentially, randomly or in another desirable arrangement.

Extended Opening Channel

Figure 13A:
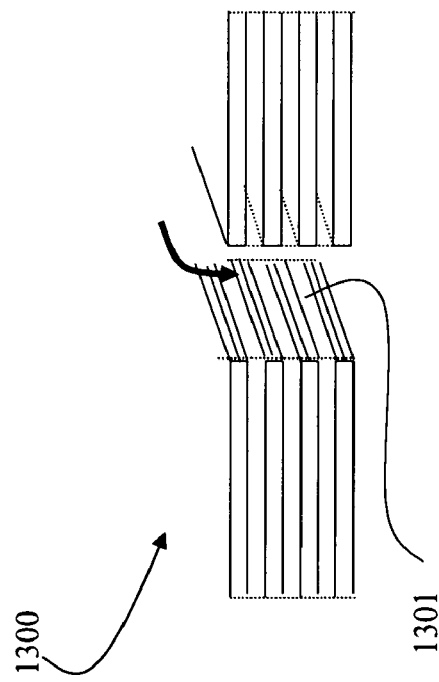
FIGS. 13A-13B show probes according to the present invention configured about more than one portion of the specimen to be analyzed, for example, in the form of an extended opening channel which interrogates from more than one side of the specimen.
Figure 13B:
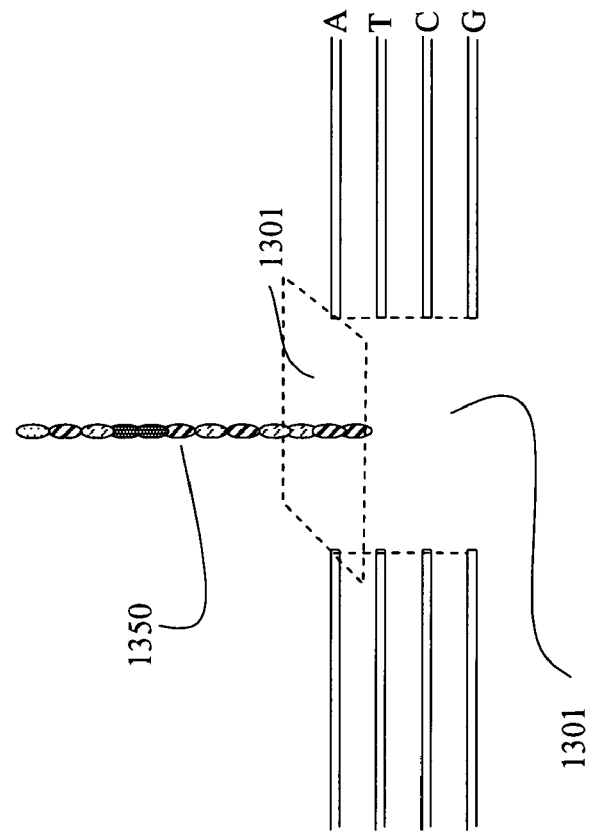

In another embodiment, and referring now to FIGS. 13A-13B, the probes according to the present invention may be configured about more than one portion of the specimen to be analyzed, for example, in the form of an extended opening channel which interrogates from more than one side of the specimen.

Presently, it is known to coax DNA fragments through a pore for the purpose of measuring a change in ionic conductivity. Challenges are posed in the consistency of motion through the holes, the resolution, and other interference. The pore is often part of a system of ionic fluids, whereby ionic conductivity change is measured across regions of ionic fluids separated by a membrane and/or layer having one or more pores. For example, as described in the background of the invention, U.S. Pat. Nos. 6,870,361, 5,795,782, 6,267,872, 6,362,002, 6,627,067 describe such pores.

However, according to the extended opening channel system 1300 of the present invention, a specimen 1350 is passed through an extended opening channel 1301. Each extended channel opening includes several probes formed according to any one or more of the various embodiments herein. The probes may be configured on one side of the opening, or multiple sides of the opening. In certain embodiments, using an extended opening channel which interrogates from more than one side of the specimen, accuracy may be enhanced, and signal is increased.

As discussed below with respect to FIGS. 14A-14C, these extended opening channels may be configured in arrays in a 2 dimensional or 3 dimension configuration, which presently known pore based sequencing systems cannot achieve.

Probe Arrays

Referring now to FIG. 14A, a serial probe array 1477 is shown. The probe array includes Q serial probe sets 1430. In general, extended objects to be analyzed may be passed through the Q serial probe sets 1430. The Q serial probe sets may be homogeneous or heterogeneous.

For example, using homogeneous probe sets 1430, each probe set may include various individual probes optimized for adenine, cytosine, guanine, and thymine.

Further, referring to FIG. 14B, an array 1480 of probe sets may comprise heterogeneous probes. For example, one probe set may be optimized for adenine (A), a second optimized for cytosine (C), a third for guanine (G) and a fourth for thymine (T).

These serial arrays would not be possible using conventional known techniques, for example, based on pores as described in the background of the invention. Importantly, redundancy is readily achievable in a serial configuration of the present invention, whether the system is formed of serial heterogeneous probe sets, serial homogeneous probe sets, or combinations thereof.

Referring now to FIG. 14C, a parallel and serial probe array 1478 is shown. The probe array includes M×N channels of Q serial probe sets 1430. This probe array 1478 may be very useful for high speed parallel processing of extended objects to be analyzed. The probe sets 1430 within the array 1478 may be homogeneous or heterogeneous. The extended objects may be the same or different. In general, extended objects to be analyzed may be passed through the Q serial probe sets. An M×N array of extended objects, which may be the same or different, are passed through the M×N arrays of Q serial probe sets 1430.

Probe Type for Various Detectable Interactions

The above described probes may be used in various configurations. Certain probes may be in the form of open tip probes. The various open tip probes described herein may be used for dispending materials, for example, as a nano-nozzle or nano-funnel. Further, various open tip probes described herein may be used to expose a specimen or a workpiece to photonic energy or stimuli, serve as a as a nano-nozzle or nano-funnel for ion or particle beam operations, or the like.

Further, various open tip probes described herein may be used to expose materials to a specimen or a workpiece, whereby a) forces are applied within the body of the probe, within the well of the probe, or by another element within the probe to keep the material from dispensing; b) operate at suitable temperature the reduces the likelihood of or prevents the material from dispensing; or c) operate at suitable pressure the reduces the likelihood of or prevents the material from dispensing).

Certain probes may be in the form of nano-electrodes for measuring detectable interactions. Certain probes may be in the form of materials that result in detectable interactions such as a system of correlating biological materials that create hybridization events with the extended object to be analyzed.

Nucleotide Filled Well

In certain embodiments, and referring now to FIGS. 16A and 16B, the basic principle is described, wherein a DNA chain (or other protein or extended object to be analyzed) 1650 upon a base 1628 is passed underneath four open tip probes 1642, 1644, 1646 and 1648 (or arrays of nozzles, e.g., as shown in FIG. 16B). The four funnels or nozzles 1642, 1644, 1646 and 1648 are filled with adenine, cytosine, guanine, and thymine molecules respectively. Due to the complementary structures of adenine and thymine, and of guanine and cytosine, a hybridization event between nucleotides on the DNA chain and the nucleotides in the nozzle will occur when the correct pairs come into contact. This hybridization results in a lower energy state and charge transfer, which can be detected via an ammeter. This is because the conductivity between the nozzles and the electrode ground plate will be affected, thereby altering the current between the nozzle and the ground plate. FIG. 16B shows an exemplary array setup, e.g., that may average out noise and increase SNR. These features will help in assuring an excellent SNR.

Note that the above described probes may also be formed with one or more conductors therein for increase signal detection capabilities. For example, the conductor may be layered within or upon an inner wall of the probe or nozzle well and tip.

Solid State Nucleotide

Figure 17A:
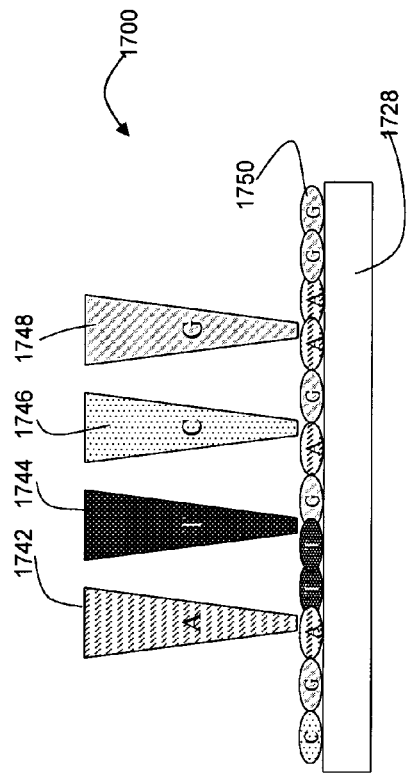
FIG. 17A shows a system having probes formed of solid state nucleotide materials according to the present invention.

Referring to FIG. 17A, an embodiment of a system 1700 having probes formed of solid state nucleotide materials is shown. A probe set 1730 is depicted wherein each probe 1742, 1744, 1746, 1748 is formed of a solid state nucleotide, e.g., adenine, cytosine, guanine, and thymine molecules respectively. A solid state nucleotide may be manufactured on thin films, and formed as probes using the various manufacturing methods described herein or other thin film manufacturing techniques. Preferably, these SSN have a single molecule thickness at the probe tip, so that a desirable monomer scale resolution is maintained. These films may be formed in the nozzle wells, e.g., by layering during the manufacturing process prior to slicing. In preferred embodiments of a DNA sequencing system herein, the nozzles are formed with a tip dimension of less than about 0.5 nanometers to resolve corresponding monomers.

Figure 17B:
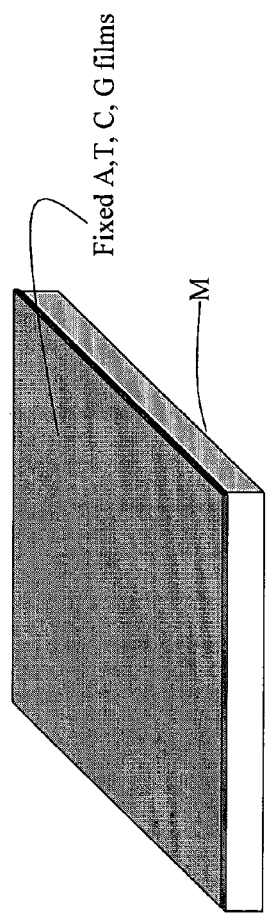
FIGS. 17B-17C show certain aspects of making probes formed of solid state nucleotide materials according to the present invention.

It is known that DNA strands may be condensed on substrates. In the herein probes, single species nucleotide strands may be condensed in the form of lines or films. Referring to FIG. 17B, these may be formed on a substrate (M), such as a conductive substrate, Referring to FIG. 17C, condensed single species nucleotide strands may be sandwiched between substrates (M).

Figure 17C:
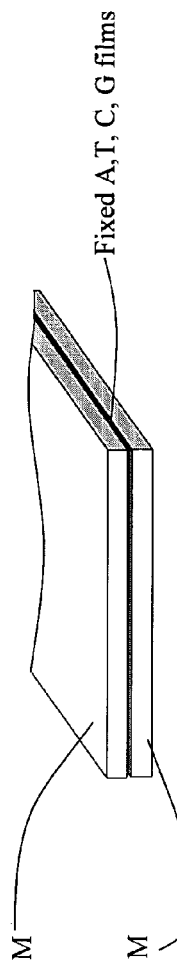

The films resulting from FIG. 17B or 17C may be used directly as the probes. Alternatively, these films may be slices and attached to metallic "knife blades". In a further alternatively, they may be folded, whereby exposed condensed single species nucleotides serve as the probe.

Metal Conductor

Figure 18:
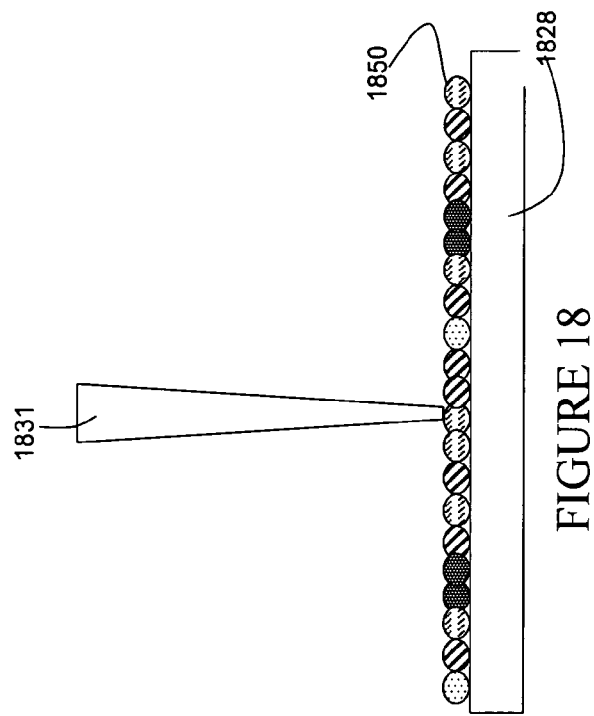
FIG. 18 shows a system using metal conductors as probes according to the present invention.

Referring now to FIG. 18, a system 1800 is shown using metal conductors as probes 1831. The probe may be formed of a suitable conductor material. Further, probes in the form of nozzles may be filled or layered with metal conductor material. The metal may be platinum, gold, or other suitable metal or non metal conductor. In preferred embodiments of a DNA sequencing system herein, the conductor probes formed to a tip dimension of less than about 0.5 nanometers to resolve corresponding monomers.

Figure 19:
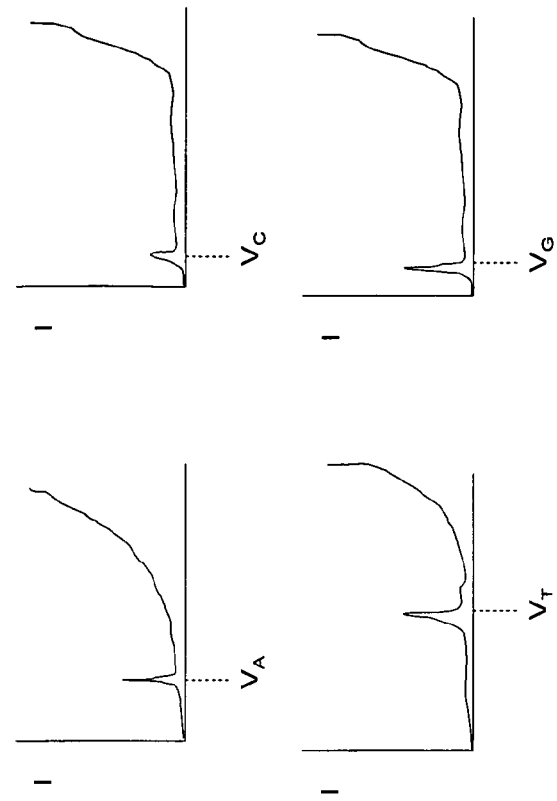
FIG. 19 shows exemplary representations of characteristic curves for various species in a system according to the present invention such as that in FIG. 18.

In one method of using a probe 1831, stimuli (e.g., a voltage) is applied across the subject nucleotide within the subject strand, and a characteristic I vs. V curve may be obtained. For example, FIG. 19 shows an exemplary representation of characteristic curves for various monomers adenine, cytosine, guanine, and thymine (A, C, G and T).

In certain embodiments, a single probe 1831 may be used as described in FIG. 18. In other embodiments, a probe set may be used, whereby bias waveforms across different electrodes may be varied to adjust sensitivity for expected specimen portions or monomers. For example, a four-probe probe set may be used for identifying A, C, T, G components of biopolymers such as DNA strands. Further, identical waveforms may be applied whereby multiple probes are used for redundancy. These may be gated or un-gated, depending on the application.

Probe with Attached Functionalized Group

Figure 20:
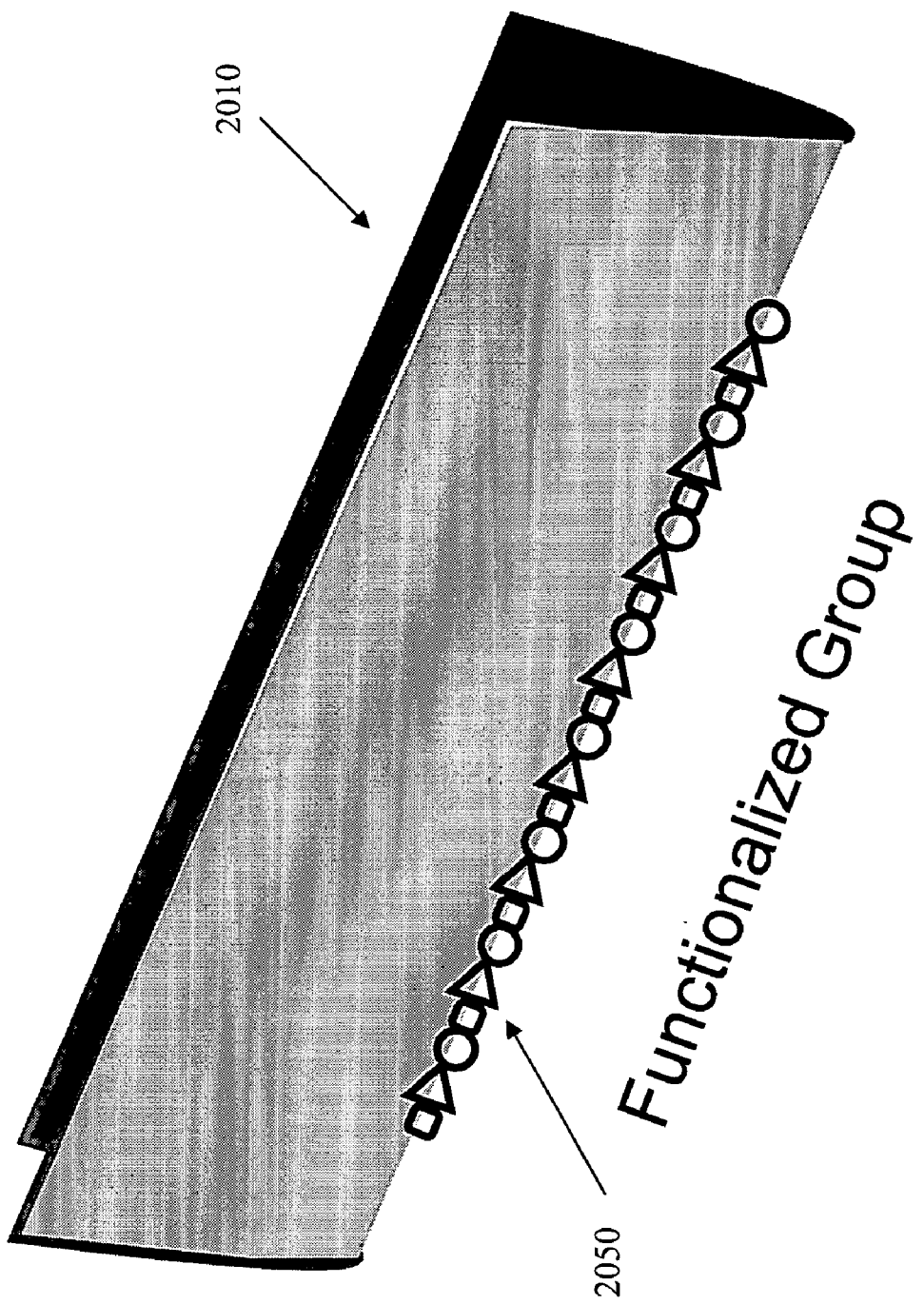
FIG. 20 shows an exemplary probe having a functionalized group attached thereto according to the present invention.

Referring now to FIG. 20, a functionalized group 2050 (FG) is mounted onto probe 2010. The 2050 may include known nucleotide strands, oligomers, peptides, single molecules, or other known species. The 2050 is selected to have a known specific sensing capability, for example, electrostatic, magneto-static, chemical, and other interactions with a specimen under analysis.

Figure 21:
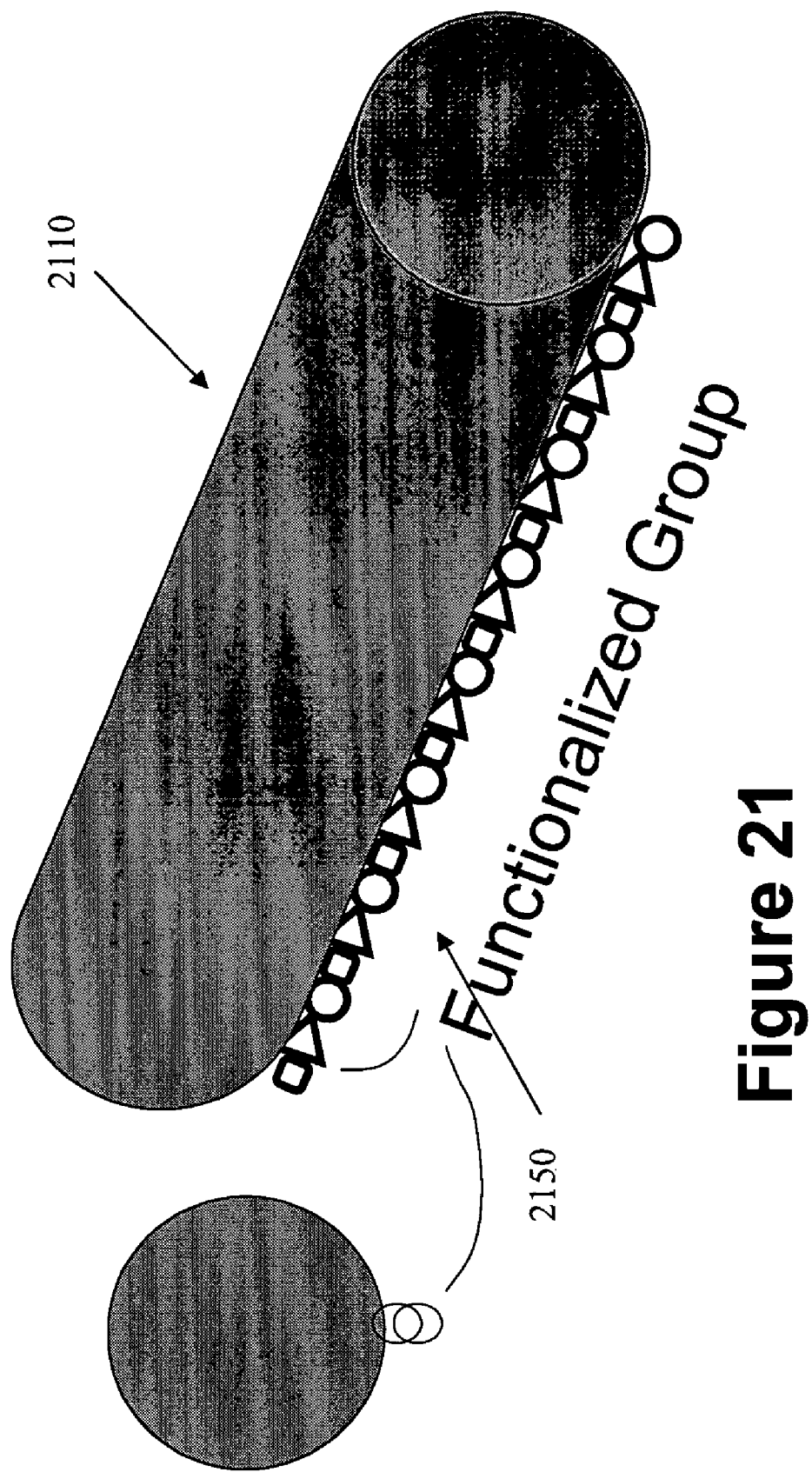
FIG. 21 shows an exemplary probe having a functionalized group attached to a cylindrical shaped structure according to the present invention.

Referring now to FIG. 21, a functionalized group 2150 may be attached to cylinders of micrometer diameters which may then be attached to a larger structures. The cylinders may be coated glass, metal, or organic or inorganic.

Figure 22:
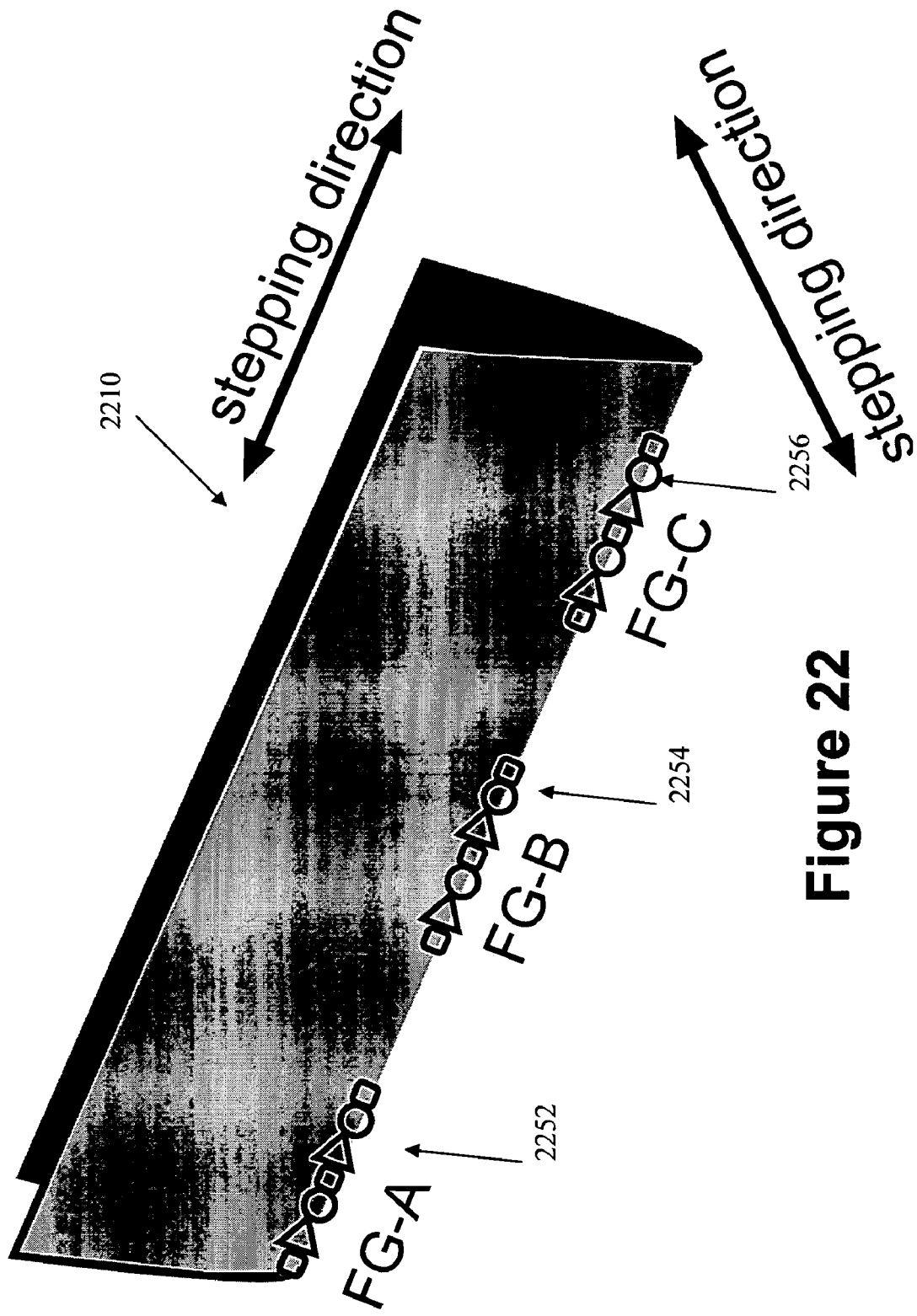
FIG. 22 shows plural functionalized groups attached to a probe according to the present invention.

Referring now to FIG. 22, plural functionalized groups 2252, 2254, 2256 are mounted onto a probe 2210. In this embodiment, stepping operations, either of the probe or the specimen, is in two directions. By stepping in a direction substantially normal to the width w of the probe 2210 and in a direction substantially parallel to the width w of the probe 2210, analysis may be simplified. For example, functionalized group 2252 interacts with the specimen, the observation is recorded, then the probe is stepped so that functionalized group 2254 interacts with the specimen, the observation is recorded, and then the probe is stepped so that functionalized group 2256 interacts with the specimen, the observation is recorded. Then, the entire probe may be stepped in a direction substantially normal to the width w of the probe 2210 to continue analyzing the specimen.

Metal Plus Known Nucleotide Stand, Preferably Same Species

Figure 23A:
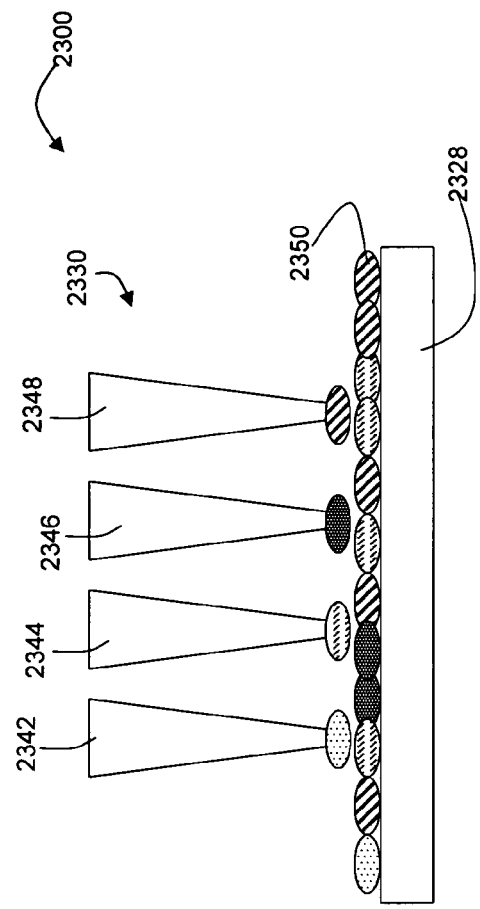
FIG. 23A shows a system according to the present invention having probes formed of a conductor with a known material strand attached to the edge of the probe.

Referring now to FIG. 23A, an embodiment of a system 2300 having probes formed of a conductor with a known material strand attached to the edge of the probe, particularly the "knife edge" probe, e.g., described above with respect to FIGS. 2 and 3. For example, a probe set 2330 is depicted wherein each probe 2342, 2344, 2346, 2348 has a known nucleotide strand, e.g., adenine strand, cytosine strand, guanine strand, and thymine strand respectively.

In a preferred embodiment, a single strand/single species nucleotide strand is provided. It is stretched and attached to the tip of a conductor probe.

The known nucleotide strand may be attached to the tip if the conductor probe by various nano- or micro-manipulation means.

Figure 23B:
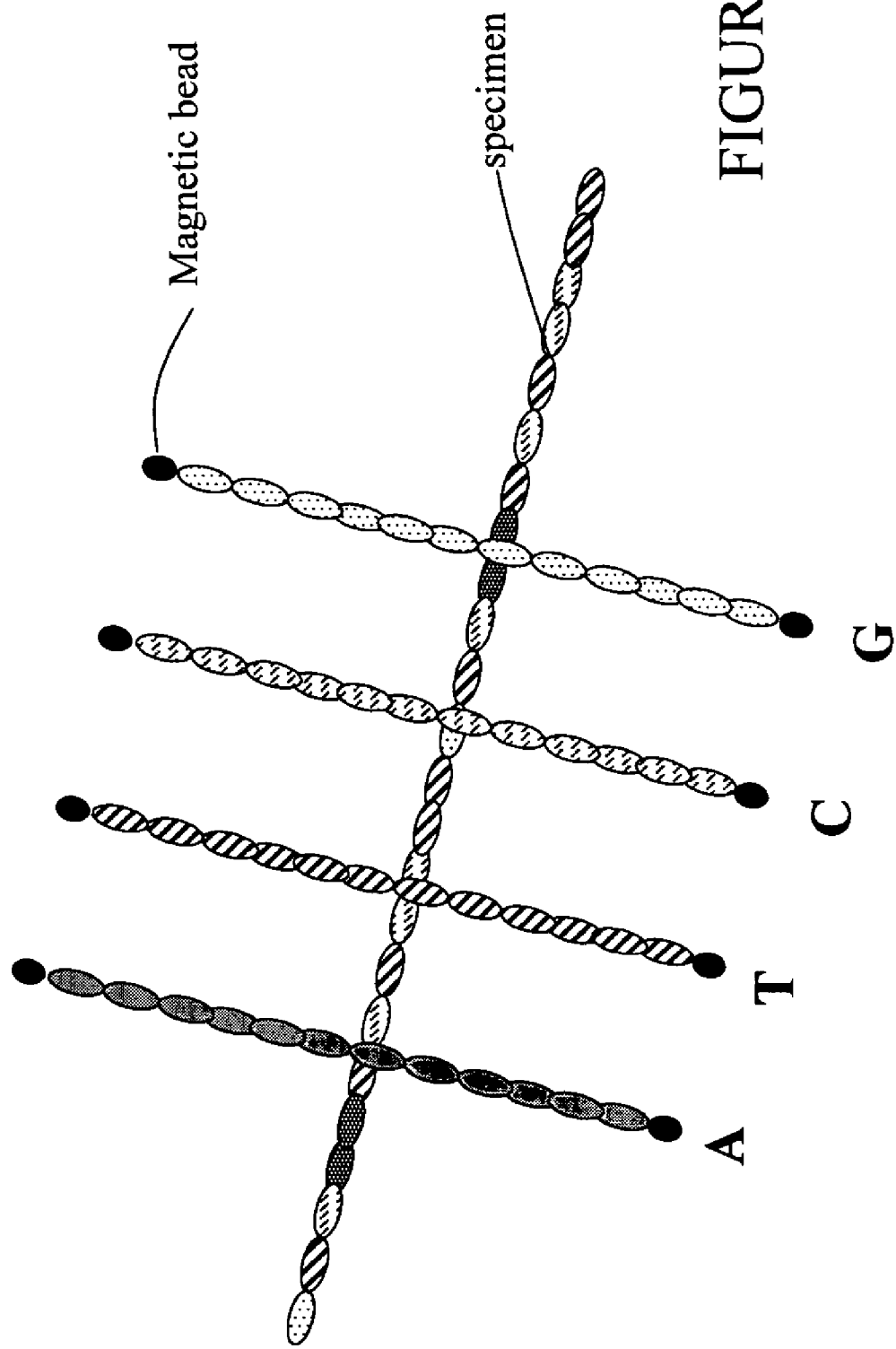
FIG. 23B shows a system according to the present invention using magnetically attractive molecules attached at opposing ends of a known strand to facilitate manipulation.

In one embodiment, magnetically attractive molecules, referred to as "magnetic beads", may be attached at opposing ends of the known strand to facilitate manipulation. A nano-manipulator magnet system may be used to stretch the strands for attachment to the probe set. For example, this is shown with respect to FIG. 23B. Further, this configuration ensure that as the probe passes over the specimen, landing error associated with typical probe analysis systems is eliminated.

With a single-strand, single-species chain attached at the probe tip, when the tip encounters a specimen portion or monomer that is capable of forming a hybrid pair with the probe species, bond energies associated with the hybridization event enhances the resonance activity being measuring.

Open Well or Funnel

Figure 24:
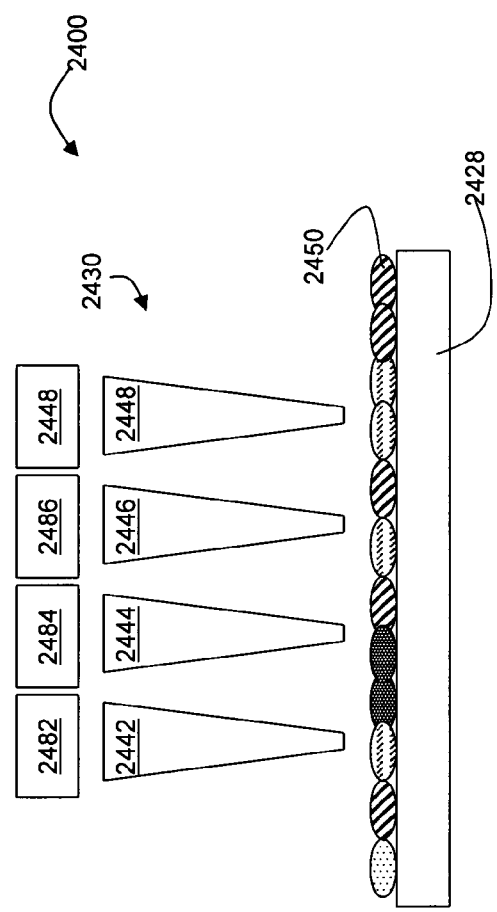
FIG. 24 shows a system according to the present invention having probes formed as open wells or funnels.

Referring to FIG. 24, an embodiment of a system 2400 having probes formed as open wells or funnels is shown. A probe set 2430 is depicted wherein each probe 2442, 2444, 2446, 2448 is formed as an open well or funnel. This open well or funnel may be used as a path for various probe activities, for example, generated by sources 2482, 2484, 2486, 2488.

Particle Beam

Particle beam emitters can be made directly into nano probes or indirectly through the funnel described herein. They include ion beam and electron beam emitters.

Photon Beam

Photon beam emitters such as x-ray emitters, ultraviolet emitters, IR emitters, visible emitters, and terahertz emitters can be formed with the herein probes or trough funnels as described herein. In the event that the excitation photon beams have wavelengths large than the probe diameter, the use of evanescent fields that extend only to the width scale of the beam (probe) will be utilized.

Electron Beam Emission

In another embodiment, an electron beam emitter is focused and shaped to provide a nano-scale resolution beam. They can be tuned in energy. This tunability can give one selectivity in directly interacting with the specimen to be analyzed. Electron beams may be used as the probe for the systems of the present invention.

It is known in the electron optics art that atomic scale resolution may be achieved with SEM, TEM, and STEM since the beams themselves can be made nano-scale as the probing beams. In preferred embodiments of a DNA sequencing system herein, the electron beams are focused to a sectional dimension of less than about 0.5 nanometers to resolve corresponding monomers. The electron beam may be a line beam (analogous the probe of FIG. 1A), or electron beam scanning may be employed (analogous the probe of FIG. 1B, although it is to be understood that the funnel need not be moved, only the beam).

Referring to FIG. 24, the electron beam may be inserted through the funnel. This minimized the need for nano-scale resolution electron optics required for direct electron beam formation at the atomic scale.

It should be appreciated that the funnel walls for x-ray, electron beams and ion beams will be constructed appropriately to be able to propagate from the funnel opening to the funnel end to achieve nano-scale resolution. In the case of electron beams, electric fields appropriately placed may cause these beams to bend toward the funnel tip. Alternately, secondary electron emission may be created from inner funnel wall surfaces which lead to the creation of a beam that exits the funnel tip.

Ion Beam

In another embodiment, a focused ion beam emitter with nano-scale resolution known in the art may be used as the probe to interact with the specimen. They can be tuned in energy. This tunability can give one selectivity in directly interacting with the specimen to be analyzed. Further, the ion beams may be based on H+, He+, Ge+, Ga+, or other suitable ions of substances that may be formed into beams that have specific selective interaction with the specimen to be resolved.

Referring to FIG. 24, the ion beam may be inserted through the funnel. This minimized the need for nano-scale resolution electron optics required for direct electron beam formation at the atomic scale.

It should be appreciated that the funnel walls for x-ray, electron beams and ion beams will be constructed appropriately to be able to propagate from the funnel opening to the funnel end to achieve nano-scale resolution. In the case of electron beams, electric fields appropriately placed may cause these beams to bend toward the funnel tip. Alternately, secondary electron emission may be created from inner funnel wall surfaces which lead to the creation of a beam that exits the funnel tip.

X-Rays

X-ray beams, such as an x-ray laser beam, may be used as the probe for the systems of the present invention. In preferred embodiments of a DNA sequencing system herein, the x-ray beams are focused to a sectional dimension of less than about 0.5 nanometers to resolve corresponding monomers. For example, the electron beam system described above may be used to generate nano-scale x-ray beams in a manner known in the art.

Further, referring to FIG. 24, an x-ray beam (directly or indirectly) may be inserted through the funnel. This minimized the need for nano-scale resolution x-ray and electron optics required for direct electron beam formation at the atomic scale.

It should be appreciated that the funnel walls for x-ray, electron beams and ion beams will be constructed appropriately to be able to propagate from the funnel opening to the funnel end to achieve nano-scale resolution. In the case of x-ray, the inner surfaces of the funnel may be made of multi-surface to achieve interference reflection, or may be of single crystal using Bragg reflection properties, or may be grazing incidence angle rejection until the rays reach the funnel end.

To avoid stray x-rays that may interfere with excitation and/or measurement and increase noise, the inner and outers surfaces of the funnel as appropriate may be coated with x-ray absorbers.

Scanning Tunneling Microscopy (STM) and Atomic Force Microscopy (AFM)

Scanning tunneling microscopy (STM) or atomic force microscopy (AFM) probe tips may be arranged into arrays and utilized according to the teachings of the present invention.

Probe Type for Other Applications

The above described probes may be used in various configurations. Certain probes may be in the form of wells with dispending tips. Certain probes may be in the form of nano-nozzles. Certain probes may be in the form of nano-funnels. Certain probes may be in the form of electrodes for lithography.

Variable Gap Probe—Manipulator and Other Applications

As described herein, for example, with respect to FIGS. 8 and 9, probes may be provided herein with variable dimensioned or actuate-able tip openings. This type of variable gap probe may be very useful for many applications, including but not limited to controlled dispensation of materials, controlled vacuum or fluid pressure, manipulation of nanometer sized structures, and other applications.

Hollow Probe for Suction/Fluid Pressure

Figure 25:
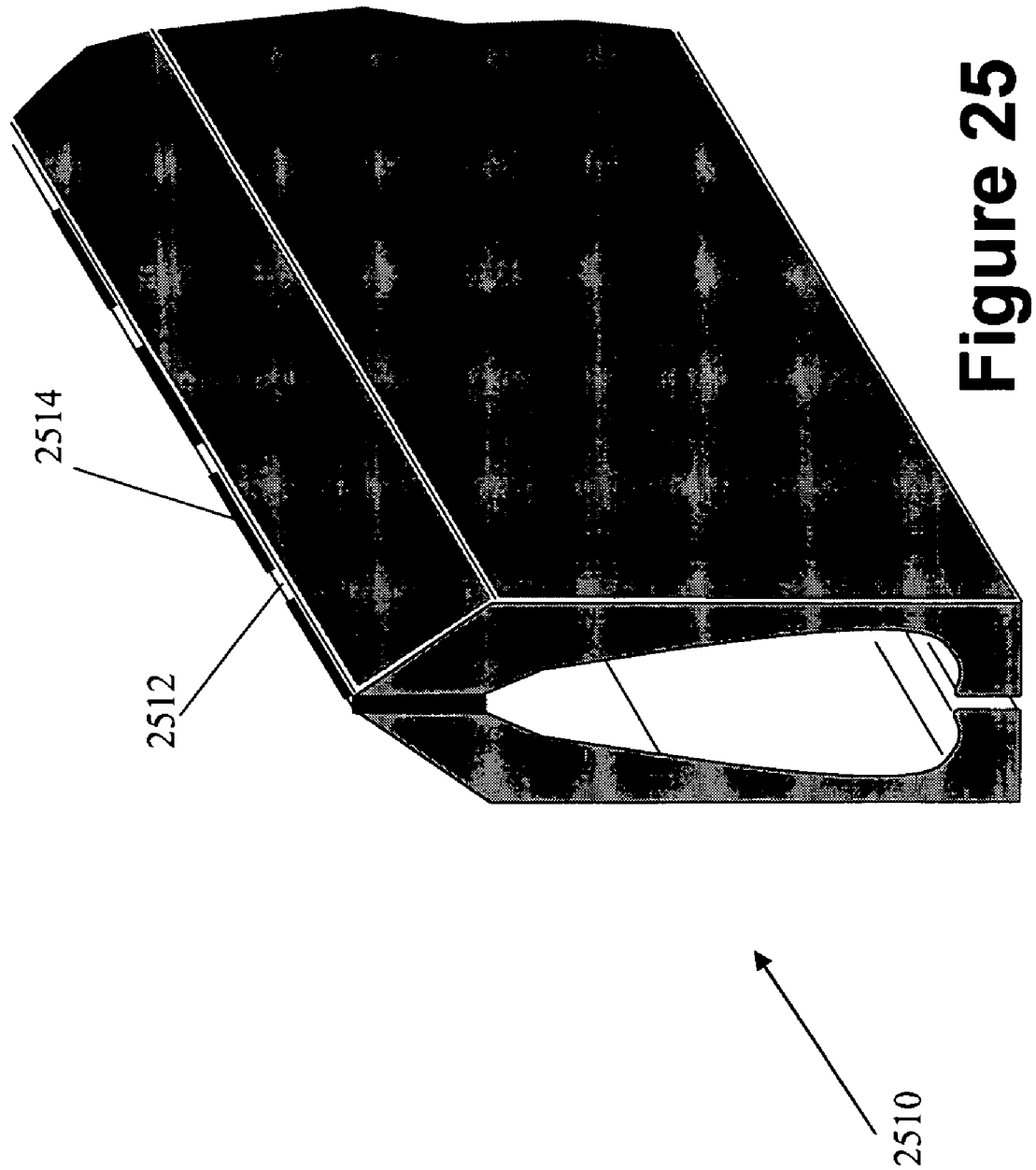
FIG. 25 shows a probe according to the present invention suitable to impart vacuum or fluid pressure.

Various configurations of the open tip probes herein may be useful for vacuum or fluid pressure. For example, certain embodiments of the open tip probes described herein may be used to impart vacuum or fluid pressure. In another embodiment, and referring now to FIG. 25, a probe 2510 is provided having a plurality of openings 2512 along the length of the extended width probe tip, with other regions 2514 plugged with suitable plug material. The vacuum or fluid source may further be divided, or alternatively, the plural openings 2512 may share a common vacuum or fluid source.

Methods of Making the Probes

Herein disclosed are probes, nano-probes and methods of manufacturing probes and nano-probes. With the disclosed methods, it is possible to create probes with tip active area dimension, such as opening dimensions in the cases where the probe has an open tip, on the order of about 0.1 nanometers to about 10 nanometers, 10 nanometers to about 100 nanometers, or 100 nanometers to 1000 nanometers. Further, it is possible to make such probes in arrays with exact spacing therebetween, and with additional supporting functionality such as stimuli providing structures, metrology structures, micro- and nano-fluidic structures or devices, micro- and nano-electromechanical structures, or other supporting features. Such features enable molecular level dispersion, precise material deposition, molecular level detection, and other nano-scale processes.

Furthermore, the herein described analytical systems including sequencing of extended objects such as DNA or RNA strands or fragments is enabled by creating a probe having tip dimensions on the order of about 5 Angstroms, for example, utilizing the herein referenced and described probe and nozzle manufacturing methods. There are various methods of making the probes, probe sets and probe arrays described herein. Co-pending U.S. Non-provisional application Ser. No. 10/775,999 filed on Feb. 10, 2004 (and corresponding PCT Application PCT/US04/03770) entitled "Micro-Nozzle, Nano Nozzle and Manufacturing Methods Therefor", incorporated herein by reference, describe various techniques for manufacturing probes in the form of nozzles or funnels are described. These techniques may be modified to provide other probe configurations and probe types described herein.

Further, in certain embodiments, it may be desirable to conduct various fabrication, handling and assembly steps in clean room environments. In other embodiments, it may be desirable to conduct various fabrication, handling and assembly steps in a negative pressure environment and/or in ultra-pure inert gas environments.

In general, in certain embodiments of the herein described methods of making the films, the probe tip active area has relevant tip dimensions (e.g., tip width t as shown in the above FIG. 1A) that is a function of a very thin film that is layered, deposited, or otherwise formed either on a portion of a probe body or on intermediate structures between plural probes.

Making Film

Prior art teaches how sub-micron objects and features can be produced by means of conventional optical, UV, e-beam, X-ray and lithography. These tools are being extended to produce sizes below 30 nanometers. As they are stretched to produce even smaller sizes, their limitations become more and more apparent, in terms of cost, foot-print, etc. Indeed, at high electron and ion beam accelerating voltages >100 KV features smaller that 10 nm have been demonstrated. The preparation steps and the cost of the equipment and ancillary components make these prior art methods cumbersome and slow.

The present invention shows ways to produce similar or better results faster, and more convenient by departing from using lithography based photon, ion and e-beams to produce the smallest features. Instead, ultra-thin films are used for this purpose.

There are many known methods of producing films with atomic precision. These include, deposition by sputtering, electron beam, ion beam, molecular beam epitaxy, CVD, MOCVD, plasma, laser deposition, pyrolitic deposition, electrochemical, thermal evaporation, sputtering, electro-deposition, molecular beam epitaxy, adsorption from solution, Langmuir-Blodgett (LB) technique, self-assembly and many other related methods collectively referred to as Thin Film Deposition Methods. Accurate metrology enables the production and control of thicknesses with Angstrom precision. Producing free standing films by peeling is possible as taught in copending U.S. patent application Ser. No. 09/950,909 filed on Sep. 12, 2001 and U.S. patent application Ser. No. 10/970,814 filed on Oct. 21, 2004 and manipulation taught in applicant's co-pending U.S. Non-provisional application Ser. No. 10/717,220 filed on Nov. 19, 2003 entitled "Method of Fabricating Multi Layer Mems and Microfluidic Devices" and other related applications. The films produced by the conventional deposition methods need atomically flat substrates.

The advent of scanning tunneling microscopy (STM), atomic force microscopy, AFM, scanning probe microscopy, SPM, and related tools have enabled the imaging of surfaces and structures with atomic resolution. This opened new vistas to advance our understanding of many physical and chemical phenomena that are being exploited in numerous practical applications in the fields of medicine, nanotechnology, nano-electronics, genomics, proteomics, nano-electrochemistry, and destined to make even more contributions in other fields in the futures.

To achieve nano-scale resolution and nanofabrication accuracy and to properly interpret physical and chemical phenomena, it necessary to use atomically flat, atomically smooth substrates over a large area preferably in the range of several square microns to several square centimeters. To produce such substrates, prior art relies of unsophisticated and inaccurate techniques of attaching an adhesive tape to the surface of mica or graphite to peel the top most atomic layers to reveal a fresh atomically smooth surface of a piece of mica or graphite of size and tetchiness. In almost all situations the atomic surface is the desired result while the lateral shape or size or thickness is of little importance. Prior art techniques could not teach methods of producing, handling and manipulating samples having a single layer graphite (also called graphene) or mica of a predetermined desired number of mono-atomic of mica or graphite.

Figure 26A:
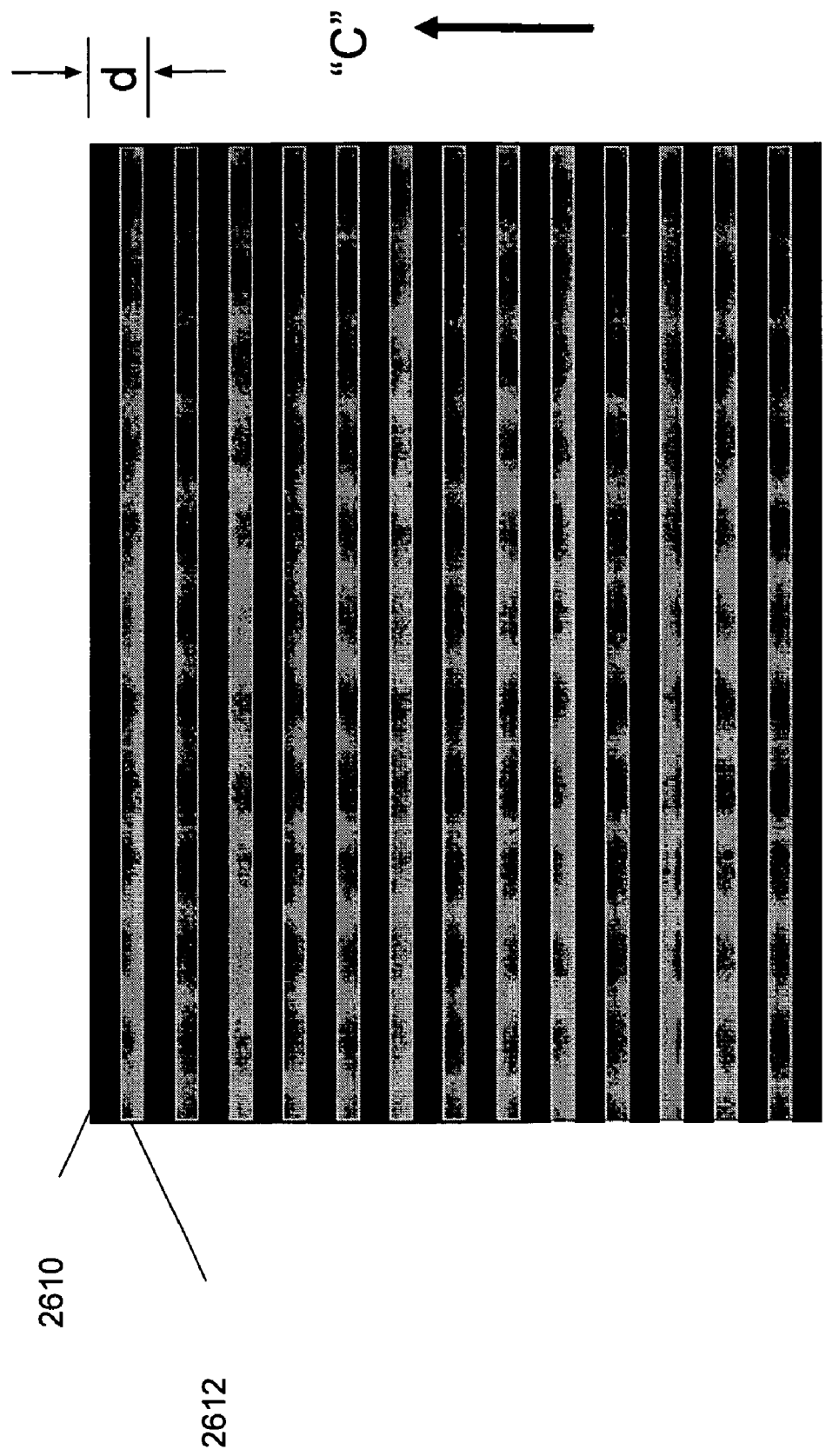
FIG. 26A shows a representation of a lamellar or multilayer material such as graphite.
Figure 26B:
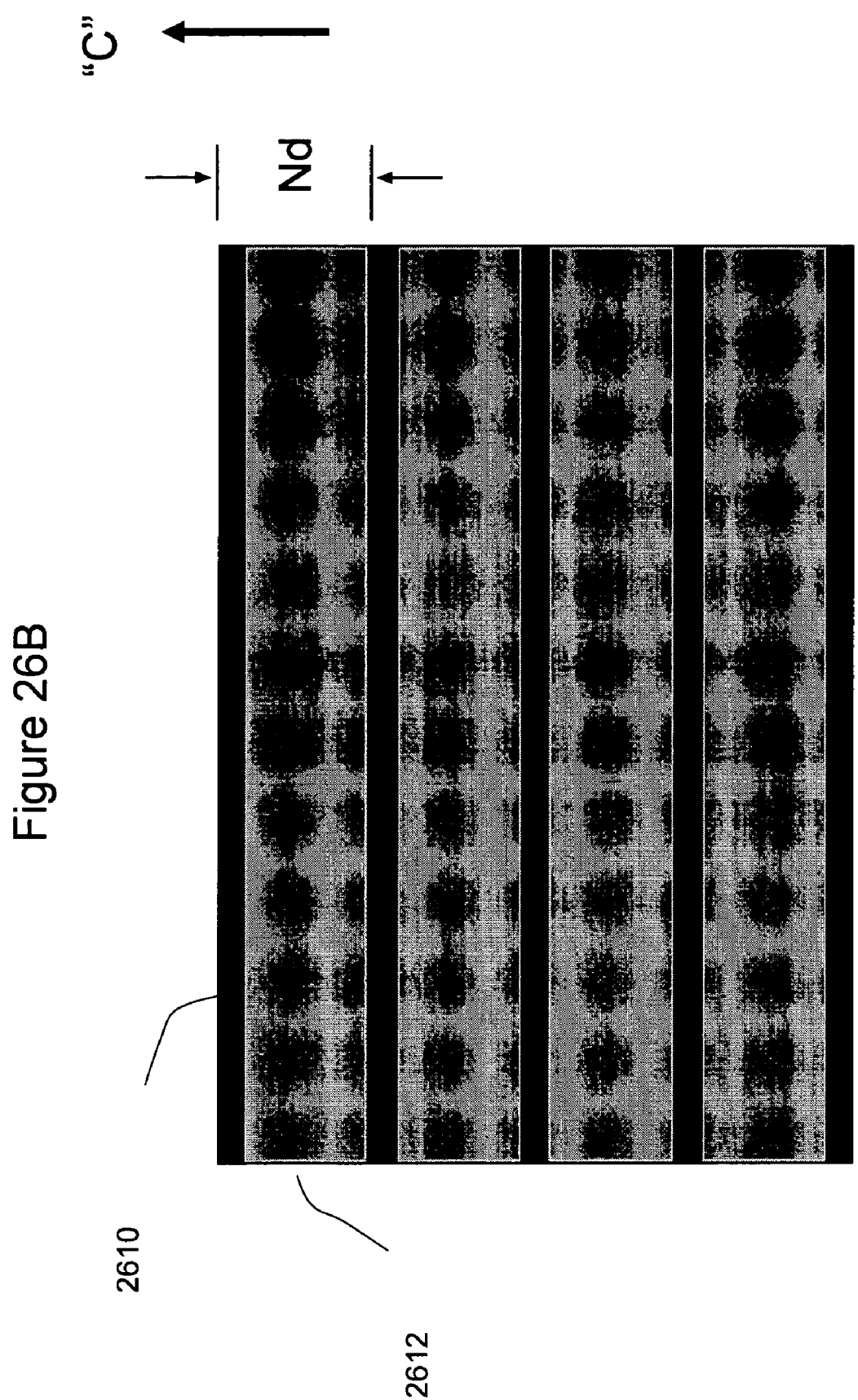
FIG. 26B shows a representation of a lamellar or multilayer material such as graphite whereby spacing between layers are expanded.

Graphites are well known and are widely used materials. For example U.S. Pat. No. 6,538,892 exploits its good mechanical and anisotropic thermal properties for the construction of heat sinks. Graphites according to the description in U.S. Pat. No. 6,538,892, are made up of layer planes of hexagonal arrays or networks of carbon atoms. These layer planes of hexagonally arranged carbon atoms are substantially flat and are oriented or ordered so as to be substantially parallel and equidistant to one another, as shown in FIG. 26. The substantially flat, parallel equidistant sheets or layers of carbon atoms, 2610, usually referred to as graphene layers or basal planes, are linked or bonded together and groups thereof are arranged in crystallites. Highly ordered graphites consist of crystallites of considerable size: the crystallites being highly aligned or oriented with respect to each other and having well ordered carbon layers. In other words, highly ordered graphites have a high degree of preferred crystallite orientation. It should be noted that graphites possess anisotropic structures and thus exhibit or possess many properties that are highly directional e.g. thermal and electrical conductivity and fluid diffusion.

Briefly, graphites may be characterized as laminated structures of carbon, that is, structures consisting of superposed layers of carbon atoms joined together by weak van der Waals forces 2612. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

The bonding forces holding the parallel layers of carbon atoms together are only weak van der Waals forces. In a process referred to as exfoliation of graphite, natural graphites can be treated so that the spacing 2612, d, in FIG. 26A between the superposed carbon layers 2610 can be appreciably opened up so as to provide a marked expansion of Nd, as in FIG. 26B, the direction perpendicular to the layers, that is, in the "c" direction, and thus forms an expanded graphite structure in which the laminar character of the carbon layers is substantially retained. It has been shown that N can be in the range of 100 to 1000 according to the treatment process. The graphite layers are referred to as graphene layers possess very high electrical and thermal conductivities exceeding those of copper, while retain high temperatures and exceedingly Young modulus.

Recently, Andrei Geim and colleagues of the University of Manchester isolated a single sheet of graphene and measured its remarkable properties which include conductivity 100 higher than copper and astonishing Quantum Hall Effect behavior. These and other results are described in January, 2006, Physics Today. These results could be made possible only after successful isolation of a single 1 Angstrom graphene layer, a feat that was not previously possible. Geim's team succeeded in isolating a single graphene layer by random and tedious and unpredictable method. According to the Physics Today Article: "Their method is astonishingly simple: Use adhesive tape to peel off weakly bound layers from a graphite crystal and then gently rub those fresh layers against an oxidized silicon surface. The trick was to find the relatively rare monolayer flakes among the macroscopic shavings. Although the flakes are transparent under an optical microscope, the different thicknesses leave telltale interference patterns on the SiO2, much like colored fringes on an oily puddle. The patterns told the researchers where to hunt for single monolayers using atomic force microscopy.

The work confirmed that graphene is remarkable-stable, chemically inert, and crystalline under ambient conditions."

From the above and other recent investigations on graphene as well as from commercial supplier of graphite substrate, one concludes that there is a need for inventing convenient, low cost, and fast methods for isolating single layers of graphene and predictable stacks of selected number of graphene layers. There is further the need for general methods for isolating single layer or predictable number of layers from lamellar or multilayer materials which include but not limited to mica, Super lattices $MoS_2$, $NbSe_2$, $Bi_2Sr_2CaCu_2O_x$, graphite, mica, Boron nitride, dichalcogenides, trichalcogenides, tetrachalcogenides, pentachalcogenides and Hydrotalcite-like materials.

Therefore, many aspects of the present invention involve production of single and multiple layers of lamellar material. Many of the inventive features and certain embodiments of the present invention rely on the ability to make ultra-thin, nano-scale films. In further embodiments, it is desirable that these films are atomically flat films. These enable the fabrication of all the probe configurations that perform a variety of functions necessary to advance the frontier of nano-science and technology including but not limited to imaging, analysis, sequencing, nano-lithography, and nano-manipulation as well a variety of other applications. Thin film deposition methods describe above may be used to produce thing films with Angstrom precision. Alternatively, even more precisely define thickness can be produced the controlled peeling of one or more predetermined number of layers from lamellar material as taught herein. These embodiments described herein apply to graphite to produce graphene layers, to producing layers of mica, $MoS_2$ and lamellar materials.

Figure 27A:
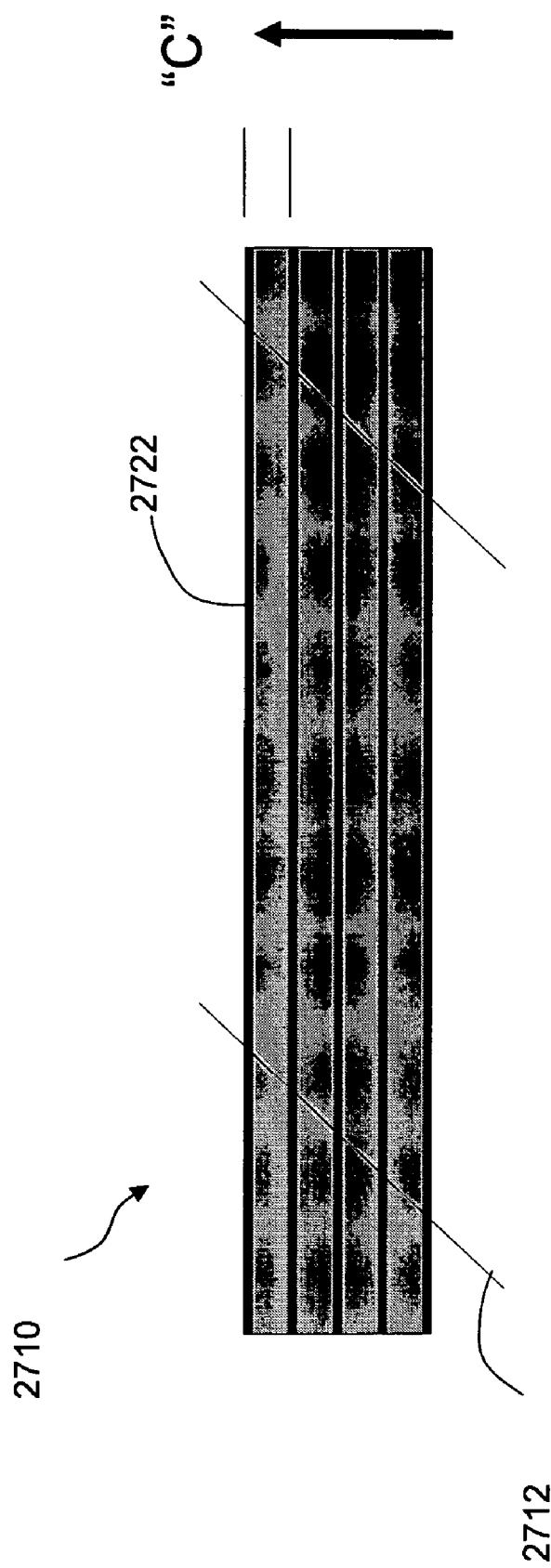
FIG. 27A shows one embodiment of a method step according to the present invention to selectively peel off a single layer from a lamellar material
Figure 27B:
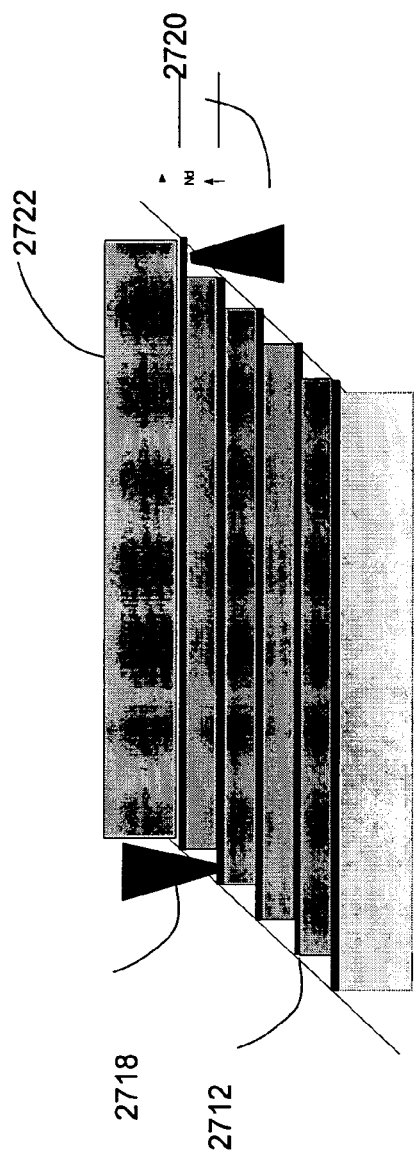
- FIGS. 27B-27C show one embodiment of a system and method according to the present invention to selectively peel off a single layer from a lamellar material.
Figure 27C:
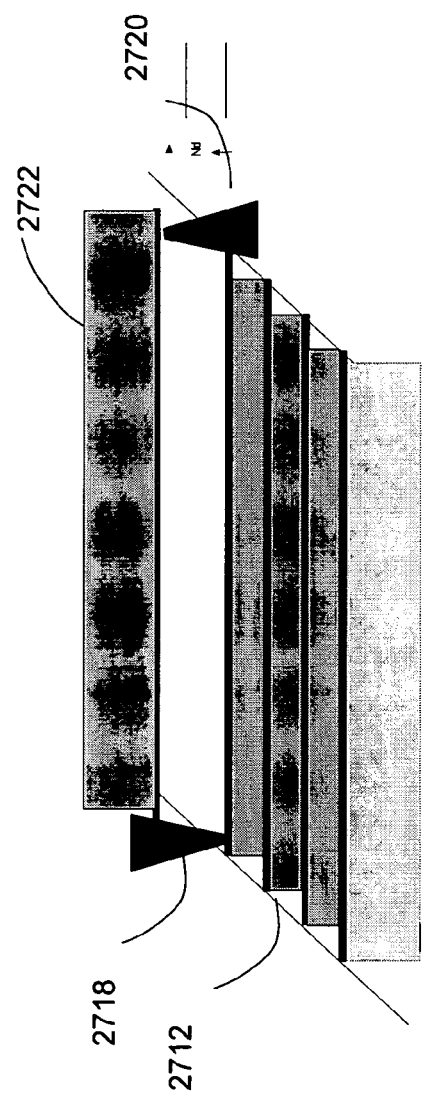
Figure 27D:
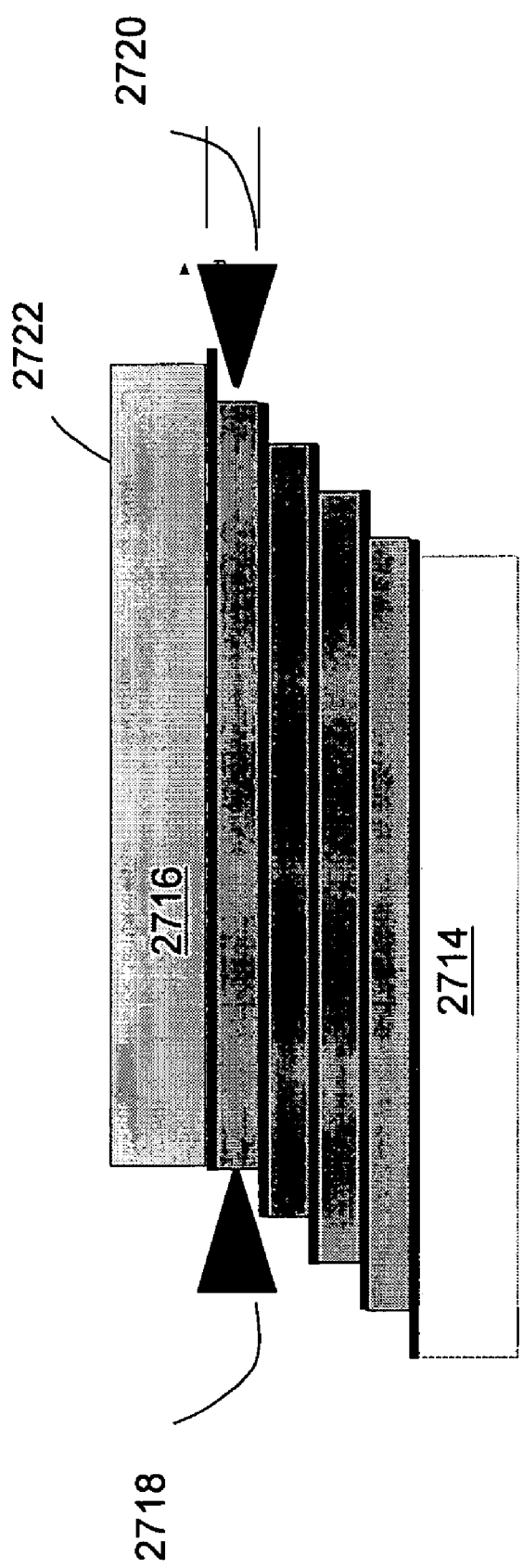
FIGS. 27D-27F show another embodiment of a system and method according to the present invention to selectively peel off a single layer from a lamellar material.
Figure 27E:
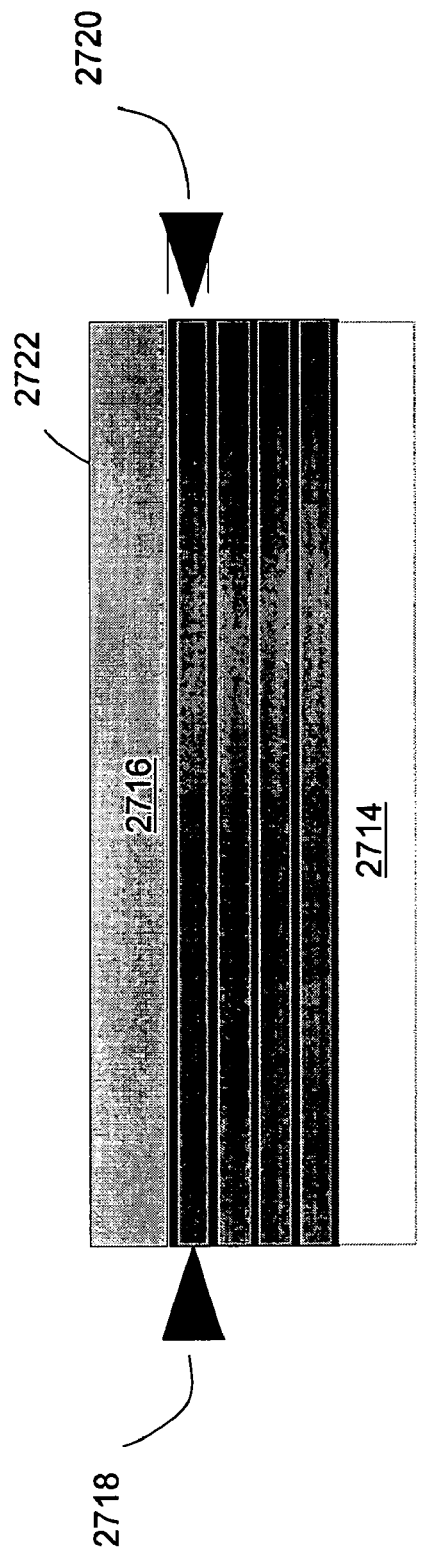
Figure 27F:
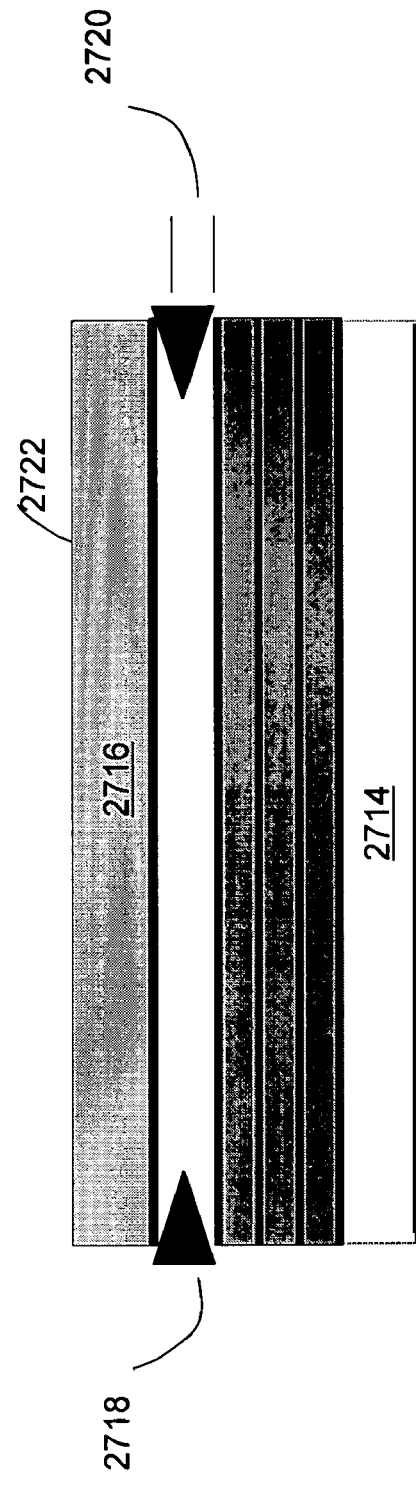

One embodiment to selectively peel off a single layer from a lamellar material, 2710, is illustrated in FIG. 27A. The material is cut along the line 2712, at an angle of, for example, 20 degrees or more relative the "c" axis. The goal is the have access to the top most layer 2722, as each layer is sequentially removed according to FIG. 27B. Two knife edge probes, as described herein, having tip opening dimensions small enough to access individual layers or groups of layers that are revealed due to the angular cut, are use to facilitate the peeling process. Knife edge probe 2718 pushes down on the second layer against the first substrate 2714 while knife edge probe 2720, pushes up the first layer against a second substrate 2716, attached to the desirable first layer. FIG. 27C shows the complete separation of the first layer that is attached to the substrate 2716 which is being pulled vertically to facilitate the separation process.

In another embodiment, knife edges 2718, 2720, are applied in the horizontal directions pushing on both sides pry loose the first layer while the substrate 2716 is pulling upward. This method illustrated in FIGS. 27A-B, is facilitated with the knowledge of the exact separation between layers by known imaging techniques such as AFM and STM. This information, along with well know tools to move the knife edges with sub-angstrom precision, allows for reliable separation of the layers.

Figure 28A:
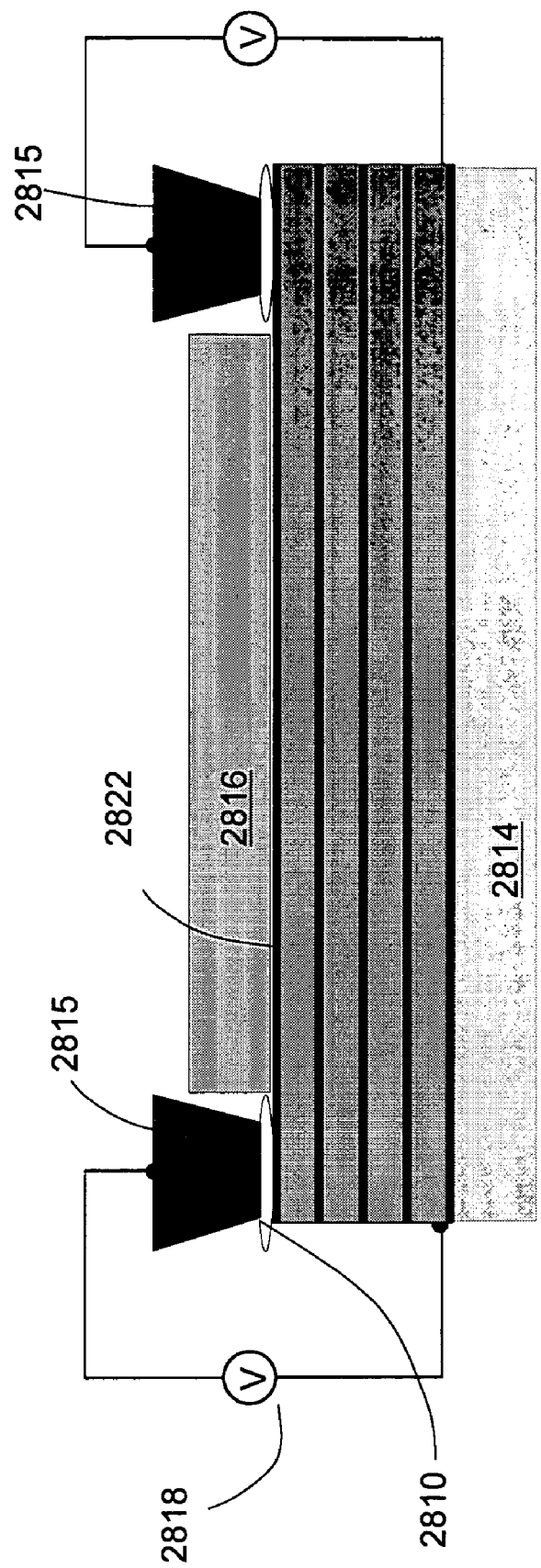
FIGS. 28A-28C show another embodiment of a system and method according to the present invention to selectively peel off a single layer from a lamellar material.
Figure 28B:
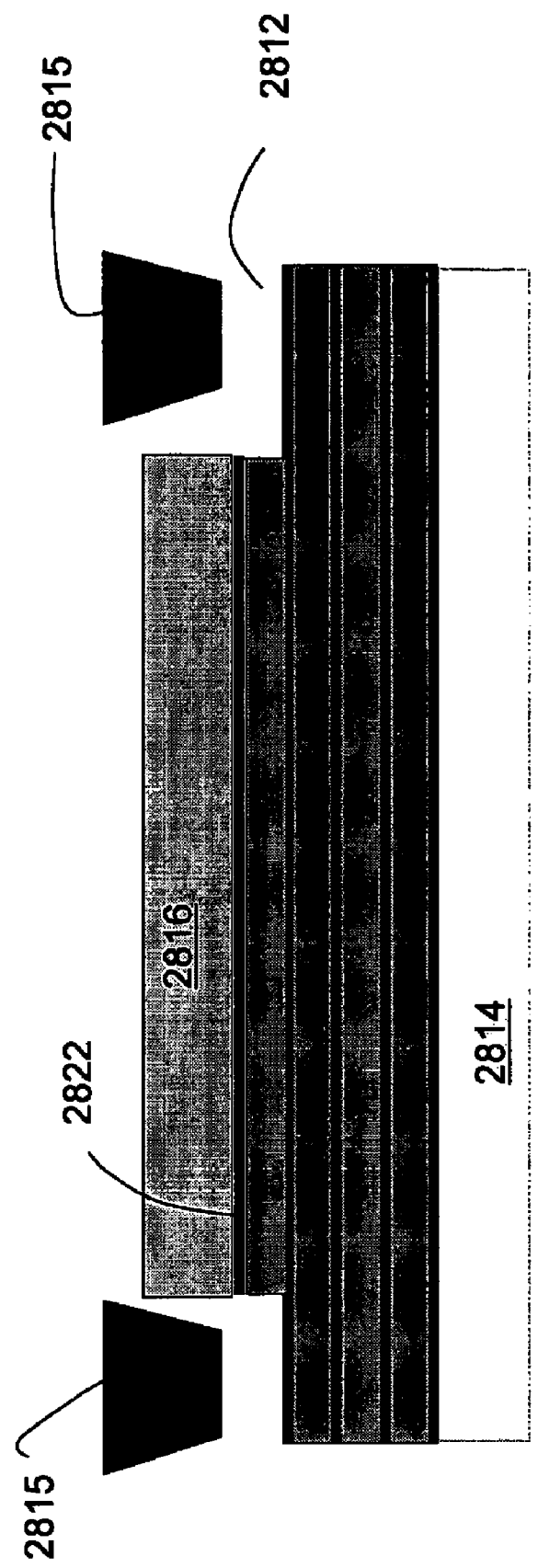
Figure 28C:
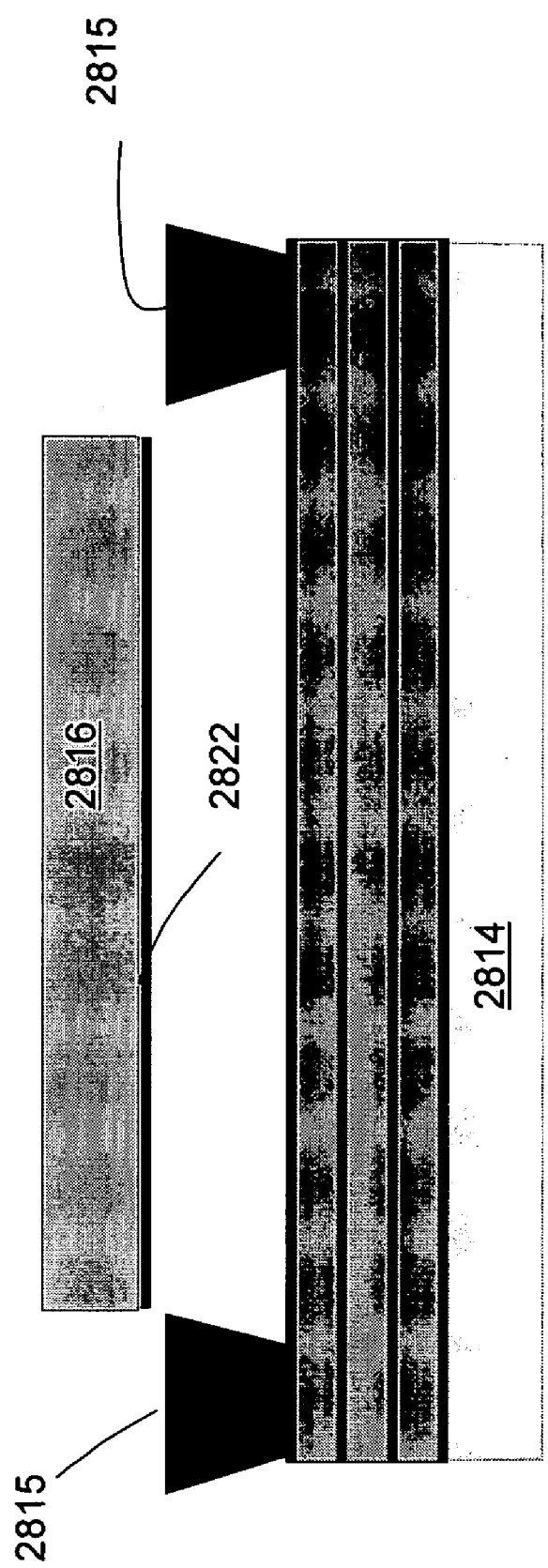

FIG. 28A-C illustrates yet another embodiment to reliably separate single layers. It exploits etching the peripheral regions of the first layer to expose the second layer by known etching techniques including electrochemical etching as shown in FIG. 28A. Here, a voltage source 2818 is applied across electrodes 2815, that are contacting the peripheral regions 2810, of the first layer 2822.

The exposed second layer 2812 is pushed as in FIG. 28B. After the etching is complete, the electrodes 2815 push down on the second layer against the substrate 2814 while the top substrate 2816 is pulling upward the selected first layer 2822. Thus a single layer is conveniently and inexpensively removed and transferred to a third substrate, optionally. The substrate 2816 is removably bonded to the first layer 2822 by many bonding techniques including but not limited to adhesives, waxes, vacuum, etc. The final result in 28C is repeated for all the other layers of the lamellar material until all layers are removed with minimum of waste. This method can also be combined with method described in FIG. 27A-F above to allow for the selection and the removal of more than a single layer. For instance, in the graphene case, it may be desirable to have a single layer of 1 Ang, 2 layers of 2 Ang, N layers of multiple Ang, depending on how the graphite is exfoliated to swell the interlayer spacing by factors of 10-1,000. (See exfoliated graphite description presented above with respect to FIGS. 26A and 26B).

Figure 29A:
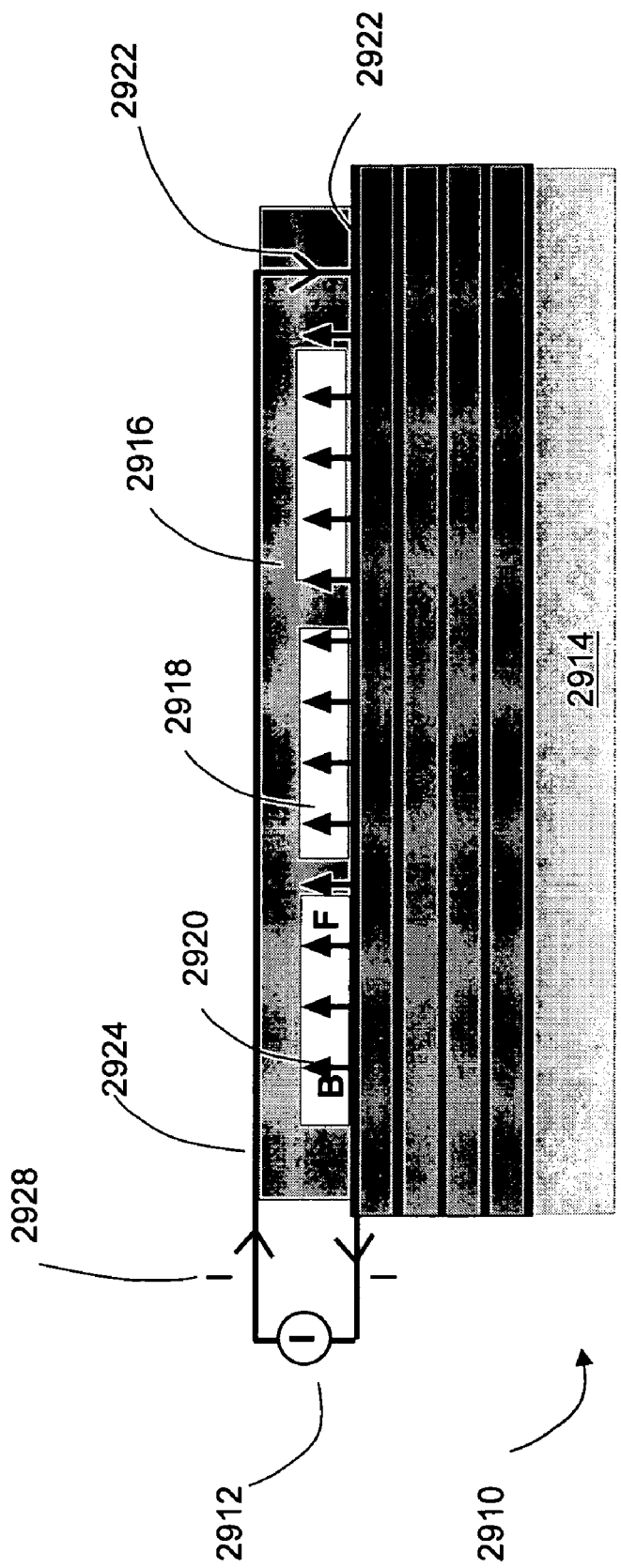
FIGS. 29A-29B show another embodiment of a system and method according to the present invention to selectively peel off a single layer from a lamellar material.
Figure 29B:
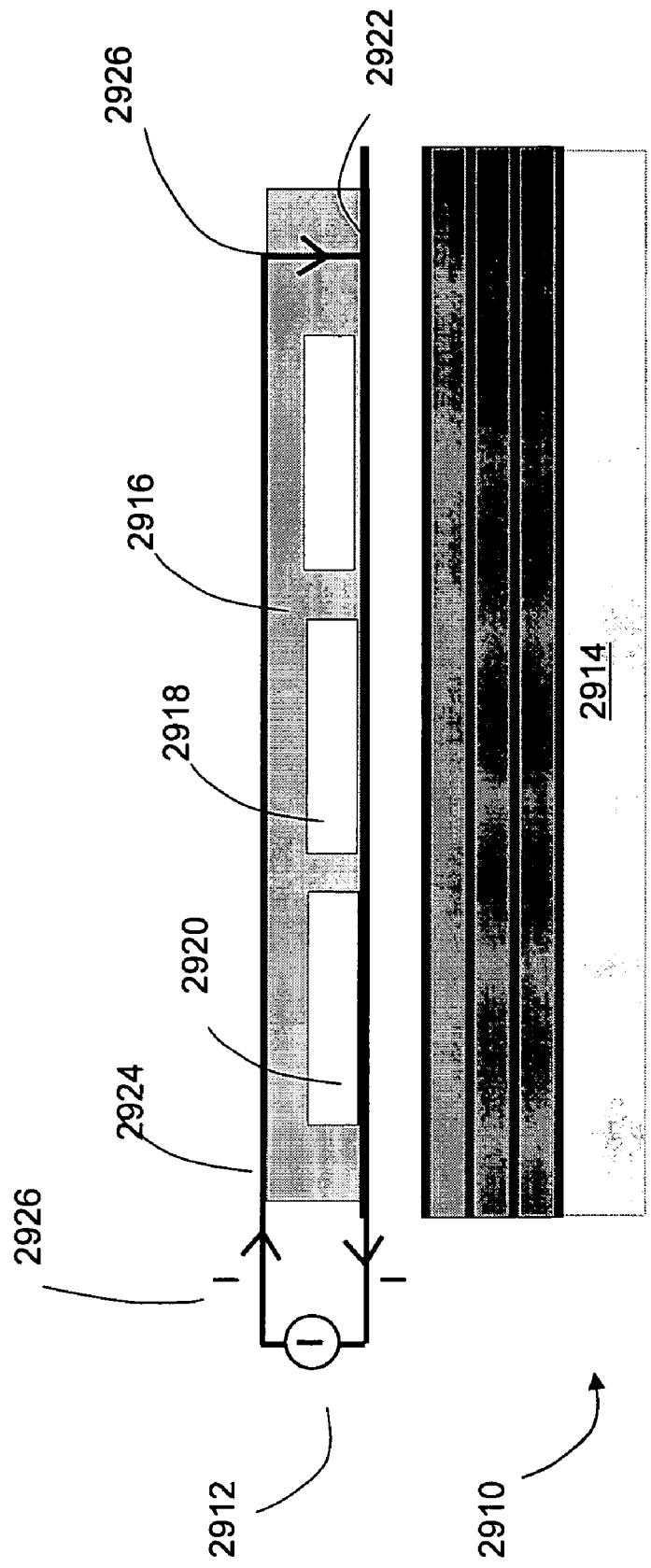

Another embodiment that takes advantage of the unique properties of graphene and metallically coated other lamellar materials is described in FIG. 29A-B. A special substrate 2916 is provided and is removable attached to the first layer 2922 we intend to peel. Current source 2912 is applied to the first graphene layer 2922 and electrode 2924 deposited on top of substrate 2916. The current 2928 flowing in electrode 2924 and flowing out (in the opposite direction) of single layer 2922 result in a magnetic force 2920 that selectively pulls upward in the upward direction 2918, only the first layer 2922. By further applying a mechanical force upward to substrate 2916, the combination of magnetic and mechanical forces allows peeling with ease 2922. Since no such forces are influencing second and third layers, they are left intact. Separation process is illustrated in 29A-B.

Instead of exploiting the magnetic force in the aforementioned embodiment, it is possible to use instead electrostatic force as illustrated in 30A-B. In this case a voltage source 3016 is applied to electrode 3024, deposited on substrate 3012 and a revealed portion of the first layer 3022. The electric field 3020 is applied and causes an electrostatic force in the upward direction 3018, and along with a mechanical force applied to a substrate upward in a pulling selection, the first layer is selectively removed from the entire multi layer structure 3010.

Another embodiment of peeling layers of lamellar material is shown in FIGS. 31A-C. Here the multilayer lamellar structure 3110 is attached to a substrate 3114 to the bottom while at the top implement substrate 3112 is removably attached to the top of the specimen. Said substrate 3112 may be a vacuum handler, adhesive tapes or other films with removable adhesives. The first step is to lift substrate 3112 which will pull or peel a random number of layers 3116, shown in FIG. 31A. This process is repeated as necessary until the last few layers remain as in FIG. 31B. In FIG. 31C the second to last layer is finally removed, leaving the last layer 3122 bonded to substrate 3114. Note that the shavings, or the peelings of random number of layers are in turn attached to substrate 3114 and the process is repeated until the desired number of single layers are removed and utilized.

The above embodiments of methods to selectively remove single layers, or predetermined number of layers from lamellar could be combined as appropriate to achieve most advantageous, practical and economical way to produce the desired results.

Probe Thickness Defined By Thickness of a Layer

As discussed herein, in certain embodiments of the herein described methods of making the films, the probe tip active area has relevant tip dimensions (e.g., tip width t as shown in the above FIG. 1A) that is a function of a very thin film that is layered, deposited, or otherwise formed either on a portion of a probe body or on intermediate structures between plural probes.

Probe Thickness Defined By Thickness of a Layer

As discussed herein, in certain embodiments of the herein described methods of making the films, the probe tip active area has relevant tip dimensions (e.g., tip width t as shown in the above FIG. 1A) that is a function of a very thin film that is layered, deposited, or otherwise formed either on a portion of a probe body or on intermediate structures between plural probes.

Using various film processing techniques invented by the inventor hereof and incorporated by reference herein above and below, ultra thin layers of materials are deposited to form a stack of layers. The probes areas may be formed as openings, whereby a series of probes may be readily formed by creating a stack of layers alternating between insulator or semiconductor materials and selectively removable materials, whereby the geometry and dimensions of the selectively removable materials defines the opening geometry and dimensions. Note the selectively removable materials may also be placed adjacent a conductor, or between a pair of conductors, to, e.g., allow for controllable dispensing or other functionality.

In other embodiments, the probes areas may be a suitable conductors, whereby a series of probes may be readily formed by creating a stack of layers alternating between insulator or semiconductor materials and conductive material, whereby the geometry and dimensions of the conductive material defines the probe or electrode geometry and dimensions.

MFT

Certain methods to make the probes, probe sets, and probe arrays may utilize the processing techniques and various tools invented by applicants hereof suitable for processing thin layers and forming vertically integrated devices. Various probes and configurations thereof may be manufactured with the use of Applicant's multi-layered manufacturing methods, as described in U.S. Non-provisional application Ser. No. 09/950,909, filed Sep. 12, 2001 entitled "Thin films and Production Methods Thereof"; Ser. No. 10/222,439, filed Aug. 15, 2002 entitled "MEMs And Method Of Manufacturing MEMs"; Ser. No. 10/017,186 filed Dec. 7, 2001 entitled "Device And Method For Handling Fragile Objects, And Manufacturing Method Thereof"; PCT Application Serial No. PCT/JUS03/37304 filed Nov. 20, 2003 and entitled "Three Dimensional Device Assembly and Production Methods Thereof"; U.S. Pat. No. 6,857,671 granted on Apr. 5, 2005 entitled "Method of Fabricating Vertical Integrated Circuits"; U.S. Non-provisional application Ser. No. 10/717,220 filed on Nov. 19, 2003 entitled "Method of Fabricating Multi Layer MEMs and Microfluidic Devices"; Ser. No. 10/719,666 filed on Nov. 20, 2003 entitled "Method and System for Increasing Yield of Vertically Integrated Devices"; Ser. No. 10/719,663 filed on Nov. 20, 2003 entitled "Method of Fabricating Multi Layer Devices on Buried Oxide Layer Substrates"; all of which are incorporated by reference herein. However, other types of semiconductor and/or thin film processing may be employed.

MFT—Formation of MFT Layer

Referring now generally to FIGS. 32A-32F, a method and system for making a thin device layer 3220 that may be used as a probe or probe precursor, or may be used as a substrate for a probe, probe precursor, probe set, or probe array thereon or therein (generally referred to herein as "probe elements") according to various embodiments of the present invention. FIG. 32A shows a bulk substrate 3202 as a starting material for the methods and structures of the present invention. Referring to FIG. 32B, a release inducing layer 3218 is created at a top surface of the bulk substrate 3202. This release inducing layer 3218 may include a porous layer or plural porous layers. The release inducing layer 3218 may be formed by treating a major surface of the bulk substrate 3202 to form one or more porous layers 3218. Alternatively, the release inducing layer 3218 in the form of a porous layer or plural porous layers may be derived from transfer of a strained layer to the bulk substrate 3202.

Further, the release inducing layer 3218 may include a strained layer with a suitable lattice mismatch that is close enough to allow growth yet adds strain at the interface. For example, for a single crystalline silicon substrate 3202, the release inducing layer in the form of a strained layer may include silicon germanium[1], other group III-V compounds, InGaAs, InAl, indium phosphides, or other lattice mismatched material that provides for a lattice mismatch that is close enough to allow growth, in embodiments where single crystalline material such as silicon is grown as the device layer 3220, and also provide for enough of a mismatch to facilitate release while minimizing or eliminating damage to probes or probe precursors formed in or upon the device layer 3220. The release inducing layer 3218 may be formed by treating (e.g., chemical vapor deposition, physical vapor deposition, molecular beam epitaxy plating, and other techniques, which include any combination of these) a major surface of the bulk substrate 3202 with suitable materials to form a strained layer 3218 with a lattice mismatch to the device layer 3220 (e.g., silicon germanium when the device layer 3220 and the substrate 3202 are formed of single crystalline Si). One key feature of the release layer, particularly in the form of the strained layer, is that at least a portion of the release layer comprises a crystalline structure that is lattice mismatched compared to the bulk substrate and the device layer to be formed or stacked atop the release layer. Alternatively, the release inducing layer 3218 in the form of a strained layer may be derived from transfer of a strained layer to the bulk substrate 3202.

[1]For example, U.S. Pat. No. 6,790,747 to Silicon Genesis Corporation, incorporated by reference herein, teaches using a silicon alloy such as silicon germanium or silicon germanium carbon, in the context of forming SOI; S.O.I.Tec Silicon on Insulator Technologies S.A. U.S. U.S. Pat. No. 6,953,736, incorporated by reference herein, discloses using a lattice mismatch to form a strained silicon-on-insulator structure with weak bonds at intended cleave sites.

In other preferred embodiments, the release inducing layer comprises a layer having regions of weak bonding and strong bonding (as described in detail in Applicant's copending U.S. patent application Ser. No. 09/950,909 filed on Sep. 12, 2001 and U.S. patent application Ser. No. 10/970,814 filed on Oct. 21, 2004, both entitled "Thin films and Production Methods Thereof" incorporated by reference herein, and further referenced herein as "the '909 and '814 applications").

Still further, the release inducing layer may include a layer having resonant absorbing material (i.e., that absorbs certain exciting frequencies) integrated therein. For example, when certain exciting frequencies are impinged on the material such as during debonding operations, resonant forces cause localized controllable debonding by heating and melting of that material Referring to FIG. 32C, a device layer 3220 is formed on top of or within the release layer 3218. In certain preferred embodiments, the device layer 3220 is epitaxially grown, e.g., as an epitaxial single crystal silicon layer. In still further alternative embodiments, the device layer may be attached to the release layer and placed atop the substrate layer or bulk substrate 3202. For example, a suitable vacuum handler (such as one formed as described in 10/017,186 filed Dec. 7, 2001 entitled "Device And Method For Handling Fragile Objects, And Manufacturing Method Thereof", incorporated by reference herein, or other vacuum handlers) may be used to hold and transfer a thin layer as mentioned above.

A buried oxide layer may optionally be provided below the device layer 3220. For example, after the step described with respect to FIG. 32B, a portion of the release layer 3218 may be formed into an oxide layer or region. Alternatively, portions of the release layer 3218 may be treated to form buried oxide regions. Further, in another example, after the step described with respect to FIG. 32C, a portion of the release layer 3218 may be formed into an oxide layer or region, e.g., with suitable implantation treatment, or treated to form buried oxide regions. In a further alternative, where the device layer is attached to the release layer, the surface of the device layer intermediate the release layer may be treated to form an oxide layer, or an oxide layer may be deposited on the surface of the device layer intermediate the release layer.

Referring to FIG. 32D, one or more probes and/or probe precursors 3222 may be formed in or upon the device layer. In certain embodiments, the device layer has wafer scale dimensions, whereby plural probes and/or probe precursors are formed on the wafer. The release layer 3218 allows the device layer 3220 to be sufficiently bonded to the bulk substrate 3202 such that during processing of the probes and/or probe precursors 3222, overall structural stability remains.

Referring now to FIG. 32F, the device layer 3220 having probes and/or probe precursors 3222 thereon or therein may easily be separated from the bulk substrate 3202. As shown in FIG. 32G, the device layer may optionally include a portion 3218' of the release layer. This may be kept with the device layer, or removed by conventional methods such as selective etching or grinding. This allows one to have a very thin device layer that may be used alone, e.g., for probes according to certain embodiments hereof. Alternatively, the thin device layer may be stacked to form a probe (e.g., in the case where the probe precursor is a portion of a probe that is stacked with another probe precursor, for example, stacked halves of a probe), or to form an array of probes. Further, the remaining substrate 3202 (which may have a portion 3218" of the release layer) remains behind, which may be recycled and reused in the same or similar process after any necessary polishing.

Accordingly, a method to make thin device layer utilizing the release layer described above with respect to FIGS. 32A-32F includes providing a structure A with 3 layers 1A, 2A, 3A, wherein layer 1A is a device layer, layer 2A is a release layer, and layer 3A is a support layer. In this manner, layer 1A is releasable from layer 3A. One or more probes and/or probe precursors are fabricated on the device layer 1A. Then, device layer 1A may be released from support layer 3A. The support layer 3A may be reused for subsequent processes, e.g., as a support layer or as a device layer.

As shown in FIGS. 32A-32F, release layer 3218 may comprise a layer of porous material, such as porous Si. In a further alternative embodiment, and referring now generally to FIGS. 33A-33G, a method and system for making a thin layer with a useful device thereon or therein is provided, wherein the release layer comprises a sub-layer 3318 of first porosity P1 and a sub-layer 3326 of second porosity P2. Thus, the release layer comprises a porous release layer having a sub-layer region of relatively large pores P1 proximate the substrate and a sub-layer region of relatively small pores P2 proximate the device layer. In certain embodiments, sub-layer region P1 is formed directly on said substrate. In other embodiments, sub-layer region P2 is grown on said sub-layer region P1. Note that although these representations show distinct sub-layers 3318 of first porosity P1 and sub-layers 3326 of second porosity P2, other porosity gradients across the thickness of the overall release layer may be used.

FIG. 33A shows a bulk substrate 3302 as a starting material for the methods and structures of the present invention. Referring to FIG. 33B, a porous layer P1 (3318) is created at a top surface of the bulk substrate 3302.

Referring to FIG. 33C, a second porous layer P2 (3326) may be formed on the first porous layer P1 (3318). In certain embodiments, a layer 3326 may be stacked and bonded to layer 3318. In certain other embodiments, a layer 3326 may be grown or deposited upon layer 3318.

Referring to FIG. 33D, a device layer 3320 is formed on top of the porous layer P2 (3326). In certain embodiments, the device layer 3320 is epitaxially grown, e.g., as a single crystal silicon layer. In still further alternative embodiments, the device layer may be attached to the release layer, e.g., transferred to the release layer.

A buried oxide layer may optionally be provided below the device layer 3320. For example, after the step described with respect to FIG. 33B or 33C, a portion of the layer 3318 or 3326 may be formed into an oxide layer or region. Alternatively, portions of the layer 3318 or 3326 may be treated for form buried oxide regions. Further, in another example, after the step described with respect to FIG. 33D, a portion of the layer 3318 or 3326 may be formed into an oxide layer or region, e.g., with suitable implantation treatment, or portions of the layer 3318 or 3326 may be treated to form buried oxide regions. Alternatively, where the device layer is attached to the layer 3326, the surface of the device layer intermediate the release layer may be treated to form an oxide layer, or an oxide layer may be deposited on the surface of the device layer intermediate the release layer.

Referring to FIG. 33E, one or more probes and/or probe precursors 3322 may be formed on the device layer. In certain embodiments, the device layer has wafer scale dimensions, whereby plural probes and/or probe precursors are formed on the wafer. The layer 3318 or 3326 allows the device layer 3320 to be sufficiently bonded to the bulk substrate 3302 such that during processing of the probes and/or probe precursors 3322, overall structural stability remains.

Figure 33F:
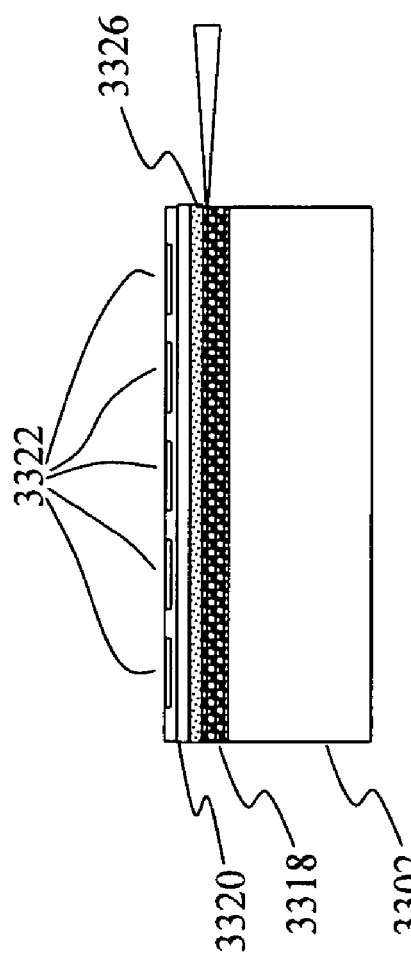
Figure 33G:
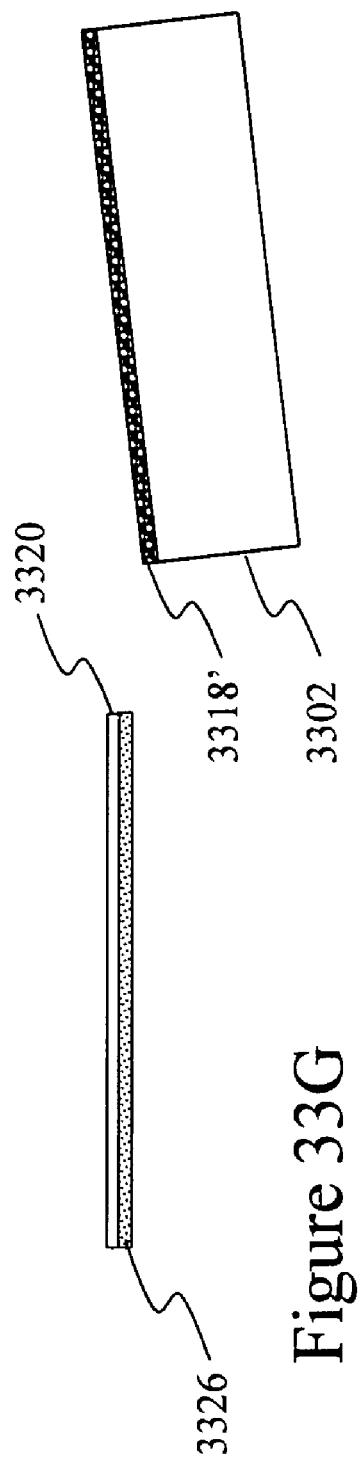

Referring now to FIG. 33F, the device layer 3320 having probes and/or probe precursors 3322 thereon or therein may easily be separated from the bulk substrate 3302. As shown in FIG. 33G, the device layer may optionally include a portion 3326 of the porous layer P2. This may be kept with the device layer 3320, or removed by conventional methods such as selective etching or grinding.

As shown in FIGS. 32A-32F and 33A-33G, release layer 3218 may comprise a layer of strained material, such as a layer of silicon-germanium (SiGe). For example, a layer of SiGe may be grown on a the substrate layer. Since germanium has a larger lattice constant than Si, the SiGe layer is compressively strained as it grows.

Figure 34A:
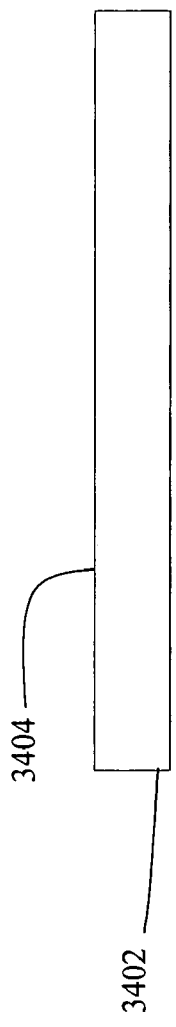
FIGS. 34A-34F show another method of making a thin device layer for use as a probe elements according to various embodiments of the present invention.
Figure 34B:
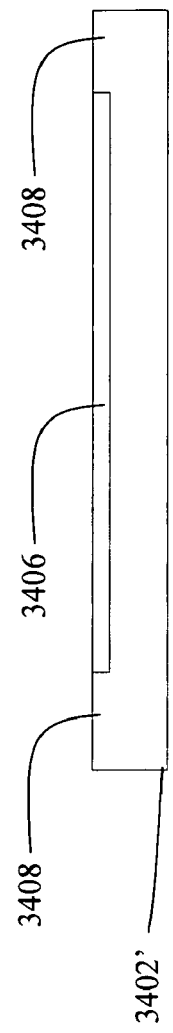

Referring now to FIGS. 34A-34F, another method of making a thin layer including one or more probes and/or probe precursors therein or thereon is provided. A bulk substrate 3402 is provided (FIG. 34A). Referring to FIG. 34B, all or a portion of a surface 3404 of the bulk substrate 3402' is treated to form a region 3406. In this embodiment, as described below, region 3406 is formed of a material and/or having material characteristics to allow growth of a layer on top thereof, and also serve as a portion of the release layer, wherein portion 3406 represents a weak bond region as described above and described in further detail in Applicant's copending the '909 and '814 applications incorporated by reference herein. In the embodiment shown with respect to FIGS. 34A-34F, a portion of the surface 3404 of the bulk substrate 3402' is treated, whereby portions 3408 of the surface 3404 remain as the original bulk substrate which (shown in FIGS. 34B-34F as the periphery, but it is to be understood that other patterns may be created as described in Applicant's copending the '909 and '814 applications incorporated by reference herein). These portions represent strong bond regions as described in the '909 and '814 applications.

Figure 34C:
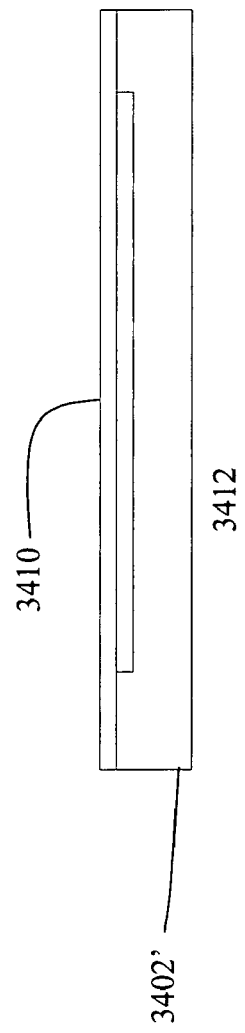
Figure 34D:
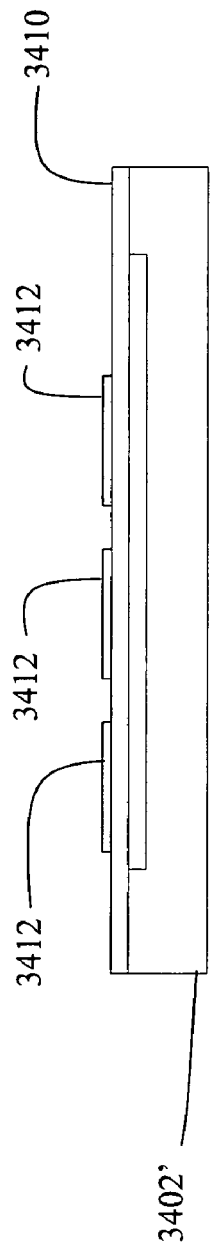
Figure 34E:
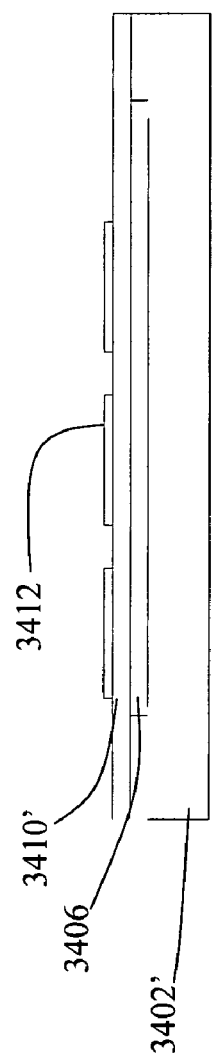
Figure 34F:
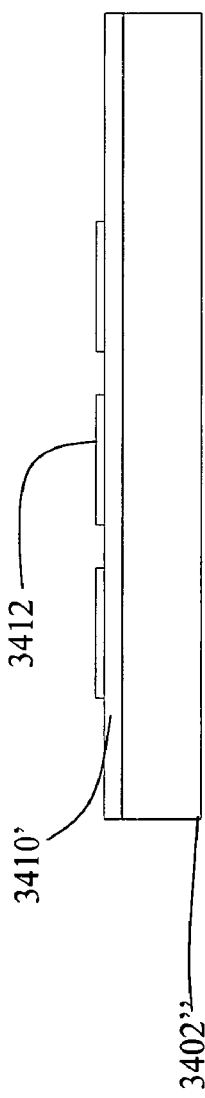

Referring now to FIG. 34C, a single crystalline material layer 3410 such as single crystalline silicon is epitaxially grown on top of the weak and strong regions 3406, 3408. FIG. 34D shows probes and/or probe precursors fabricated upon or within the single crystalline material layer 3410. Referring to FIG. 34E, portions of the single crystalline material layer 3410 are removed corresponding to the regions of the portions 3408, and the portions 3408 are removed, for example by chemical etching, mechanical removal, hydrogen or helium implantation and heating of the portions 3408, or providing a material containing a resonant absorber at the portions 3408 for subsequent heating and melting of that material. Accordingly, a modified single crystalline material layer 3410' on the portion 3406 remains. FIG. 34F shows the portion 3406 removed, thereby leaving single crystalline material layer 3410' with probe elements 3412 thereon or therein. Alternatively, single crystalline material layer 3410' with probe elements 3412 thereon or therein may be removed from the portion 3406, for example, by mechanical cleavage (parallel to the plane of the layers), peeling, or other suitable mechanical removal, whereby some residue of the portion 3406 may remain on the back of the single crystalline material layer 3410' with probe elements 3412 thereon or therein and some residue of the portion 3406 may remain on the top of the bulk substrate 3402" left behind. In this manner, the bulk substrate 3402" may be recycled and reused with minimal polishing and/or grinding, thereby minimizing waste of the single crystalline material of the bulk substrate 3402. The single crystalline material layer 3410' with probe elements 3412 thereon or therein may be used as is, diced into individual devices or structures, or aligned and stacked (on a probe or probe array scale, or on a wafer scale) to form a probe, probe array, or plurality of probes and/or probe arrays.

In certain embodiments, the strong bond portions 3408 may be formed by starting with a uniform layer. For example, the surface 3404 may comprise a strained material, such as silicon germanium. Utilizing zone melting and sweeping techniques, the germanium swept away from the desired strong bond regions 3408. When a layer 3410 is grown or formed on the layer having portions 3406, 3408, layer 3410 will be strongly bonded at the regions of portions 3408 and relatively weakly bonded at the regions of portions 3406.

Figure 35A:
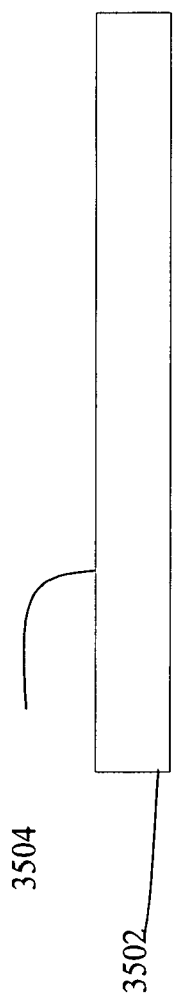
FIGS. 35A-35F show another method of making a thin device layer for use as a probe elements according to various embodiments of the present invention.
Figure 35B:
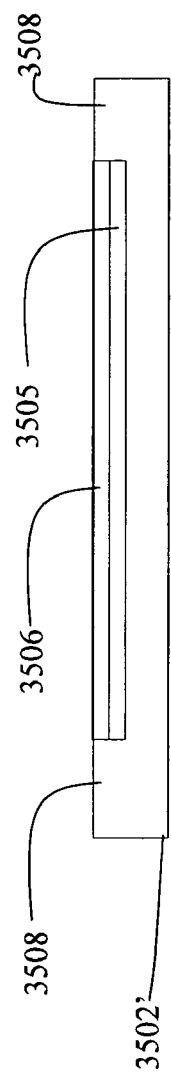

Referring now to FIGS. 35A-35F, another method of making a thin layer including one or more useful devices or structures therein or thereon is provided. A bulk substrate 3502 is provided (FIG. 35A). Referring to FIG. 35B, all or a portion of a surface 3504 of the bulk substrate 3502' is treated to form porous sub-regions 3505 and 3506. In this embodiment, as described below, region 3506 is formed of a material and/or having material characteristics to allow growth of a layer on top thereof, and also serve as a portion of the release layer, wherein porous sub-regions 3506/3505 represent a weak bond region as described above and described in further detail in the '909 and '814 applications incorporated by reference herein. In the embodiment shown with respect to FIGS. 35A-35F, a portion of the surface 3504 of the bulk substrate 3502' is treated (forming sub-regions 3505/3506), whereby portions 3508 of the surface 3504 remain as the original bulk substrate which (shown in FIGS. 35B-35F as the periphery, but it is to be understood that other patterns may be created as described in Applicant's copending the '909 and '814 applications incorporated by reference herein). These portions represent strong bond regions as described in the '909 and '814 applications.

Thus, the release layer comprises sub-regions 3505/3506 and portions 3508. Sub-region 3505 has relatively large pores P1 proximate the substrate and sub-region 3506 has of relatively small pores P2 proximate the device layer to be described below. In certain embodiments, sub-region 3505 is formed directly on said substrate, and sub-region 3506 is grown on said sub-region 3505. In certain embodiments, sub-region 3506 may be stacked and bonded to sub-region 3505. In certain other embodiments, sub-region 3506 may be grown or deposited upon sub-region 3505.

Figure 35C:
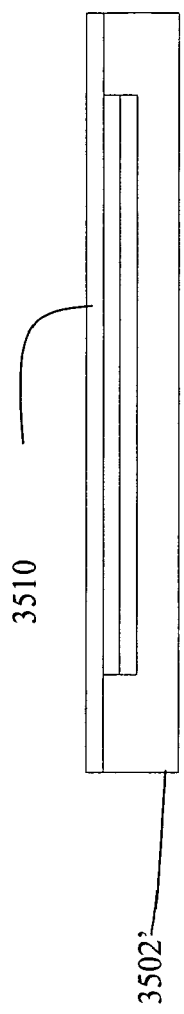
Figure 35D:
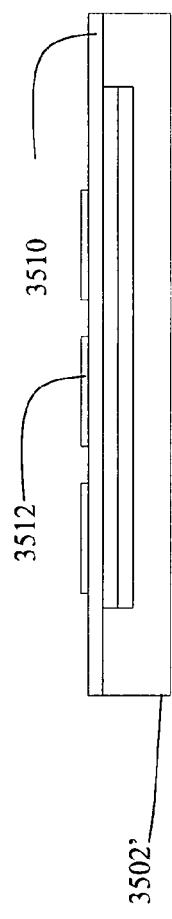
Figure 35E:
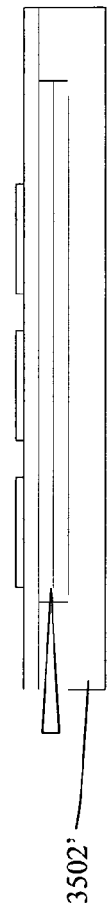
Figure 35F:
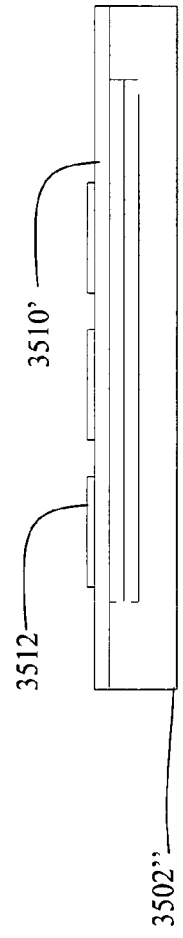

Referring now to FIG. 35C, a single crystalline material layer 3510 such as single crystalline silicon is epitaxially grown on top of the weak and strong regions 3506, 3508. FIG. 35D shows devices or structures fabricated upon or within the single crystalline material layer 3510. Referring to FIG. 35E, portions of the single crystalline material layer 3510 are removed corresponding to the regions of the portions 3508, and the portions 3508 are removed, for example by chemical etching, mechanical removal, hydrogen or helium implantation and heating of the portions 3508, or providing a material containing a resonant absorber at the portions 3508 for subsequent heating and melting of that material. Accordingly, we are left with a modified single crystalline material layer 3510' on the portion 3506. FIG. 35E shows an exemplary cleaving device, for example a knife edge device, water jet, or other device, used to cut between the sub-regions 3505 and 3506. FIG. 35F shows the bottom portion of sub-region 3506 removed (with a portion of sub-region 3506 remaining on the bottom of the single crystalline material layer 3510), and the top portion of sub-region 3505 removed (with a portion of sub-region 3505 remaining on the bulk substrate 3502"). Accordingly, the single crystalline material layer 3510' is left with devices or structures 3512 thereon or therein. In this manner, the bulk substrate 3502" may be recycled and reused with minimal polishing and/or grinding, thereby minimizing waste of the single crystalline material of the bulk substrate 3502. The single crystalline material layer 3510' with devices or structures 3512 thereon or therein may be used as is, diced into individual devices or structures, or aligned and stacked (on a device or structure scale, or on a wafer scale) to form a vertically integrated device.

Figure 36:
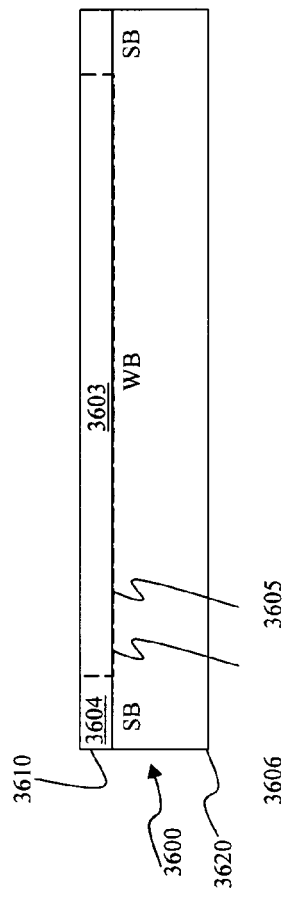
FIG. 36 shows a starting multiple layered substrate according to various embodiments of the present invention, for example, in the form of a wafer for processing thousands or even millions of probe elements, or be used to derive a very thin layers for use as probes and/or probe precursors.

Referring to FIG. 36, a starting multiple layered substrate 3600 is shown. The substrate 3600 may be, in certain preferred embodiments, a wafer for processing thousands or even millions of probe elements, or be used to derive a very thin layers for use as probes and/or probe precursors.

The multiple layered substrate 3600 includes a first device layer 3610 selectively bonded to a second substrate layer 3620, having strongly bonded regions 3603 and weakly bonded regions 3604. Using the techniques described in the above-mentioned patent applications, or other suitable wafer processing and handling techniques, the first layer 3610, intended for having one or more probe elements therein or thereon, or used as a probe or probe precursor as a very thin layer, may readily be removed from the second substrate layer 3620 (which serves as mechanical support during device processing) with little or no damage to the structure(s) formed (including material deposited or otherwise incorporated, or wells or other subtractions to the layer 3610) in or on the device layer 3610.

Accordingly, according to the methods of FIGS. 32 and 33, a layered structure is formed generally includes a first layer suitable for having a useful element formed therein or thereon releasably attached or bonded to a second layer, e.g., a substrate. A method to form a layered structure generally comprises releasably adhering a first layer to a second layer. Further, according to the methods of FIGS. 34A-35F, a layered structure is formed generally includes a first layer suitable for having a useful element formed therein or thereon selectively attached or bonded to a second layer, e.g., a substrate, with regions of weak bonding and regions of strong bonding. The layered structure may be used for production of various devices including probes and/or probe precursors as provided for herein. Alternatively, a layered structure may be used as a source of one or more probes and/or probe precursors, for example, when the device layer is used as the probe, whereby the capability to produce and remove with little or no damage allows for ultra thin layers that may be used for ultra high resolution probes.

The separation, for example, shown at steps of FIGS. 32E, 33F, 34E and 35E, may comprise various separation techniques. These separation techniques includes those described in further detail in Applicant's copending the '909 and '814 applications, incorporated by reference herein. The separation may be multi-step, for example, chemical etching parallel to the layers followed by knife edge separation. The separation step or steps may include mechanical separation techniques such as peeling, cleavage propagation; knife edge separation, water jet separation, ultrasound separation or other suitable mechanical separation techniques. Further, the separation step or steps may be by chemical techniques, such as chemical etching parallel to the layers; chemical etching normal to the layers; or other suitable chemical techniques. Still further, the separation step or steps may include ion implantation and expansion to cause layer separation.

The material for the layers used herein, as the device layer, the release layer and the substrate layer, may be the same or different materials, and may include materials including, but not limited to, any of the lamellar materials described above, plastic (e.g., polycarbonate), metal, semiconductor, insulator, monocrystalline, amorphous, noncrystalline, biological (e.g., DNA based films) or a combination comprising at least one of the foregoing types of materials.

Further, the release layer may comprise a material layer having certain amounts of dopants that excite at known resonances. When the resonance is excited, the material may locally be heated thereby melting the areas surrounding the dopants. This type of release layer may be used when processing a variety of materials, including organic materials and inorganic materials.

The device layer and the substrate layer may be derived from various sources, including thin films described herein, wafers or fluid material deposited to form films and/or substrate structures. Where the starting material is in the form of a wafer, any conventional process may be used to derive the device layer and/or the substrate layer. For example, the substrate layer may consist of a wafer, and the device layer may comprise a portion of the same or different wafer. The portion of the wafer constituting the device layer may be derived from mechanical thinning (e.g., mechanical grinding, cutting, polishing; chemical-mechanical polishing; polish-stop; or combinations including at least one of the foregoing), cleavage propagation, ion implantation followed by mechanical separation (e.g., cleavage propagation, normal to the plane of the layers, parallel to the plane of the layers, in a peeling direction, or a combination thereof), ion implantation followed by heat, light, and/or pressure induced layer splitting), chemical etching, or the like. Further, either or both the device layer and the substrate layer may be deposited or grown, for example by chemical vapor deposition, epitaxial growth methods, or the like.

The dimensions of the device layers may also vary in thickness and surface area. For example, fabrication of probes having ultra high resolution may benefit from the methods and embodiments herein, whereby probes may be formed on layers that are a few tenths of a nanometer to a few nanometers.

The surface areas for the methods and embodiments of the present invention may be die-scale, wafer scale, or in larger sheets; accordingly, surface areas may be on the order of nanometer(s) squared to a few microns squared for die-scale; on the order of a centimeters squared for wafer-scale; and on the order of centimeters squared to a meters squared for sheet scale.

MFT—Probe as Device on Device Layer

Referring now to FIGS. 37A and 37B, top isometric and sectional views, respectively, are provided of a selectively bonded substrate 3700 having a plurality of wells 3730 formed in the weakly bonded regions of the selectively bonded substrate 3700. The wells may be formed by etching, mechanical subtraction methods, ion or particle beam etching, or other suitable methods. Note that the pattern of weak bond regions and strong bond regions may vary, as described in the '909 and '814 applications. However, in certain preferred embodiments, all of the wells 3730 are formed at the weak bond regions of the device layer 3710 and supported during processing by the support layer 3720.

FIGS. 37C and 37D show plan and sectional views, respectively, of a single well 3730 formed in the device layer 3710 described above. Referring to FIG. 37C, the intersecting region between the dashed lines and the walls 3732 of the wells 3730 shows regions wherein probe elements may be processed in certain embodiments, as described hereinafter. In other embodiments, there may be only one intended region for processing nozzles (e.g., on the left or right sides as shown in FIGS. 37C and 37D).

In further embodiments, the wells may be formed only at the intended probe element region, e.g., resembling grooves having the thickness shown by the dashed lines.

Referring also to FIG. 38, the well 3730 generally has angular walls 3732, the function of which will be readily apparent. Further, the center recessed portion 3734 of the well will become part of a reservoir of the probes. At the top surface of the device layer 3710 adjacent the outer ends of the angular walls 3732 are plateau regions, which ultimately may be part of the inside wall of the probes as described herein.

Referring now to FIG. 38, a layer 3710 (e.g., having thickness on the order of about 0.1 nanometers to about 10 nanometers, 10 nanometers to about 100 nanometers, or 100 nanometers to 1000 nanometers) is selectively bonded to a support layer 3720 as described with respect to FIGS. 32-36 and in the '909 and '814 applications. A region of reservoir 3730 is etched away or otherwise removed from a region of the device layer in the weak bond region 3703. Suitable nano-scale material subtraction methods may be used.

Referring now to FIG. 39A, a layer 3738 (e.g., having thickness on the order of about 0.1 nanometers to about 10 nanometers, 10 nanometers to about 100 nanometers, or 100 nanometers to 1000 nanometers) of material, preferably material that is easily removable by etching or other subtractive methods, is deposited on the wafer. This material may be conductive, such as copper, silicon oxide, aluminum, or other suitable materials. This space will later become the opening for the nozzle.

Referring to FIG. 39B, a fill material 3740 may optionally be incorporated, also of easily removable material in certain embodiments. The material optionally used to fill the wells during processing and stacking may be the same or different from the material used at the plateaus (that will form nozzle walls).

Figure 40:
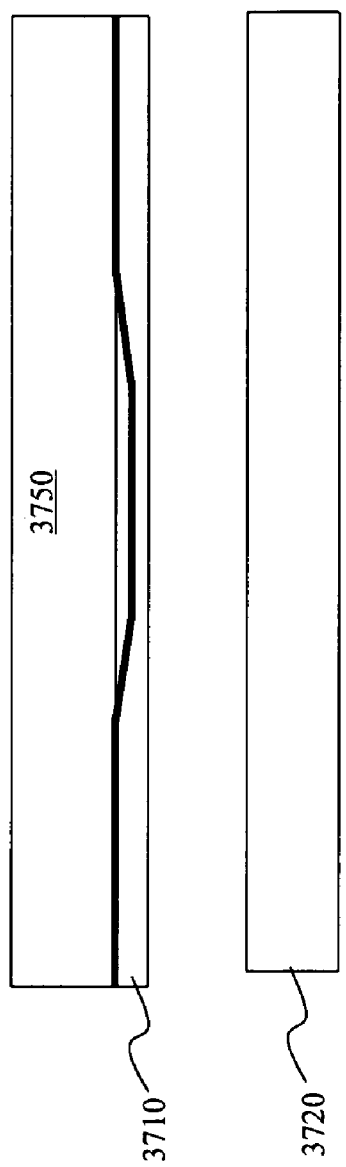
FIG. 40 shows a device layer according to the present invention removed using a handler.

In certain embodiments, since the device layer including the etched well having suitable material deposited thereon is generally positioned over the weak bond region 3703 of the multiple layered substrate 3700, the device layer 3710 may readily be removed from the support layer 3720. For example, the strong bond regions 3704 may be etched away by through etching (e.g., normal to the surface through the thickness of the device layer in the vicinity of the strong bond region), edge etching (parallel to the surface of the layers), ion implantation (preferably with suitable masking of the etched well and deposited material to form the nozzle, or by selective ion implantation), or other known techniques. Since the above techniques are generally performed at the strong bond regions 3704 only, the etched well and material deposited in the weak bond regions 3703 are easily released form the substrate, as schematically shown in FIG. 40, for example with a handler 3750.

Figure 41:
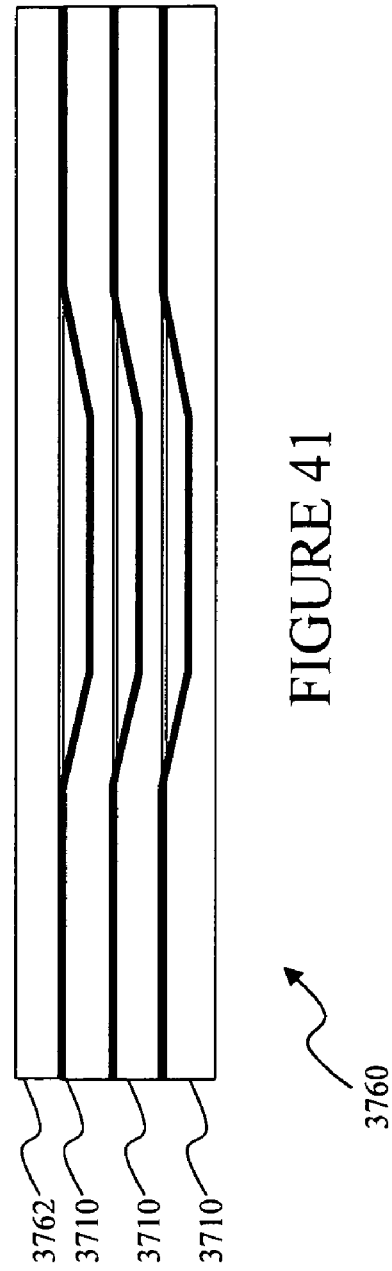
FIG. 41 shows a several layers being stacked upon one another according to the present invention to form a probe set or probe array.

Referring now to FIG. 41, several layers 3710 including etched wells 3730 having material deposited 3738 thereon (and optionally fill 3740) may be stacked to form a structure 3760. The structure 3760 may further include a solid layer 3762, e.g., to form a wall for the top-most nozzle as shown in FIG. 41. Although in certain embodiments precise alignment may be desired at this point, certain embodiments may use relaxed alignment standards at this point, as will be apparent from the further described steps.

Figure 42:
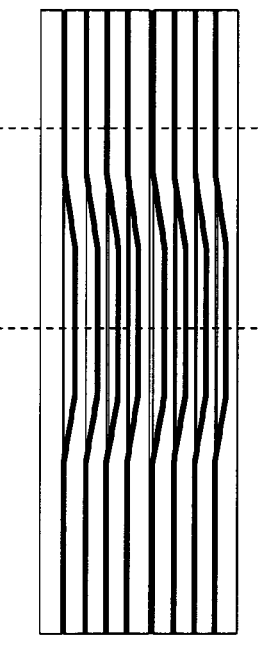
FIG. 42 shows a wafer stack formed as in FIG. 41 sliced along a cut line thereby creating two portions with exposed reservoirs.

As shown in FIG. 42, the wafer stack 3760 can now be sliced along a cut line 3764, creating two portions with exposed reservoirs. From the opposing side, these devices can also be sliced along the line 3766. The end may be grinded and polished until it is very close to the etched away reservoir, but no less than the desired nozzle length.

Figure 43:
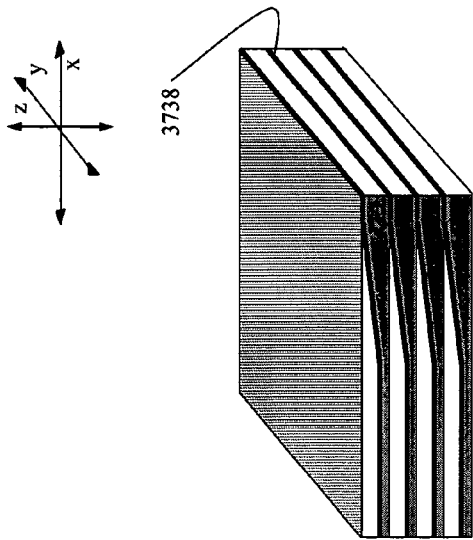
FIGS. 43-44 show material from a portion of the wafer stack FIG. 42 etched away, thereby exposing an etched channel.
Figure 44:
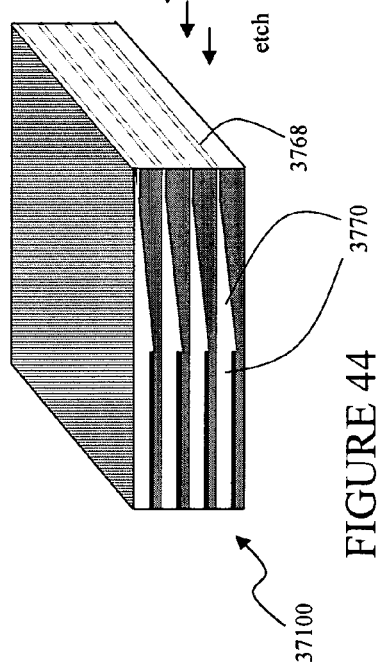

Referring now to FIGS. 43 and 44, the deposited material 3738 may be etched away, exposing an etched channel 3768 (e.g., 5 nm opening when the material deposition layer is 5 nm). A material reservoir 3770 (or region 3770 for other purposes, depending on the desired use of the nozzle structure) remains behind the opening 3768. Each etched channel 3768 is generally spaced apart by approximately the thickness of the device layer 3710. Thus, a nozzle device 10 having plural openings 3768 each associated with regions 3770 is provided. Accordingly, when the thickness of the material to be removed is extremely small, e.g., on the order of about 0.1 nanometers to about 10 nanometers, 10 nanometers to about 100 nanometers, or 100 nanometers to 1000 nanometers, the extended edge probe tip as described above is created at the openings 3768.

Figure 45:
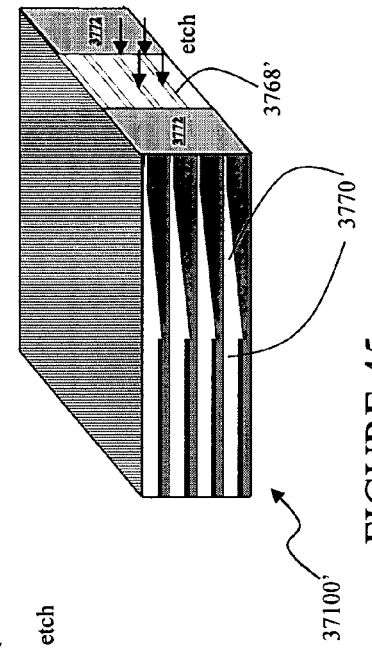
FIG. 45 shows outside portions being masked prior to etching the deposited material to form openings less than the width of the entire edge.

Alternatively, and referring to FIG. 45, to form an opening less than the width of the entire edge, the outside portions may be masked 3772 prior to etching the deposited material 3738 to form openings 3768'. Thus, a nozzle device 3710' having plural openings 3768' is provided. Accordingly, the width (i.e., the y direction as shown in FIGS. 43-45) of the probes may be the same or different from the width of the wells. In certain embodiments, it may be desirable to provide wells having widths larger than that of the nozzle to increase the material capacity of the well while maintaining the nozzle dimensions as small as possible.

Figure 46:
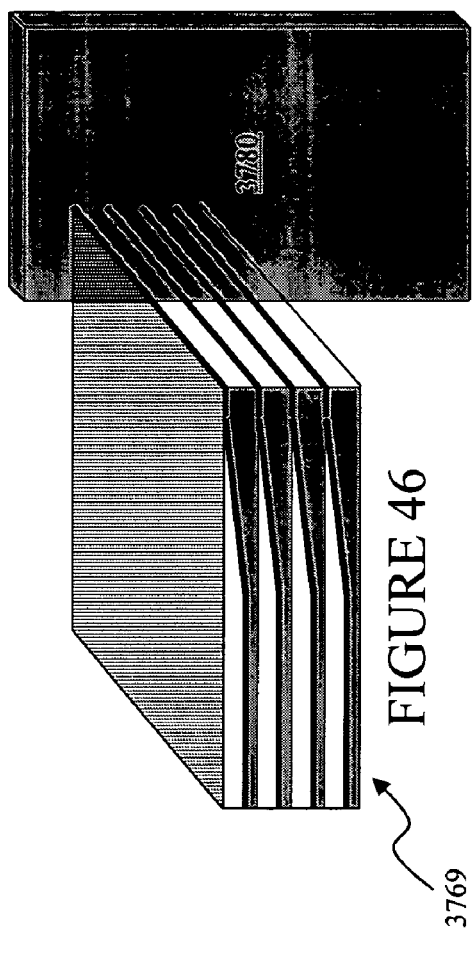
FIGS. 46-47 show steps of forming probes, e.g., in the form of nozzles, from a stack of layers as shown in FIG. 43 a according to one embodiment of the present invention.
Figure 47:
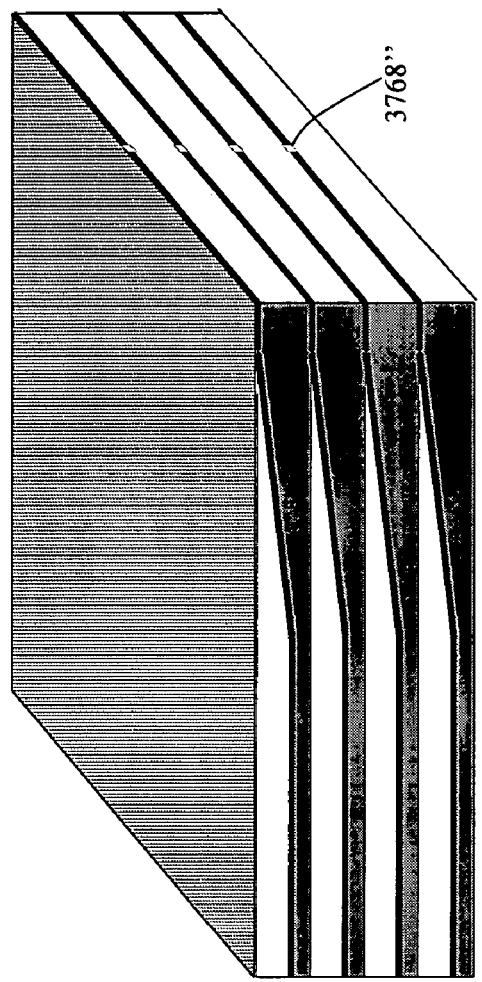

In a further embodiment, and referring now to FIGS. 46 and 47, a nozzle device 3780 (e.g., as describe herein), of a single layer, may be rotated approximately 90° with respect to the stack of layers 3760 having layers 3738 deposited therein at the locations of the nozzles. Etchant may be filled in the reservoir of the rotated nozzle structure 3780, and the openings 3782 of the nozzles may be formed. Using this technique, it is possible to create nozzles having approximately the same width and height with extremely small dimensions as provided for herein. Thus, a nozzle device 3710" having plural openings 3768" is provided.

Figure 48:
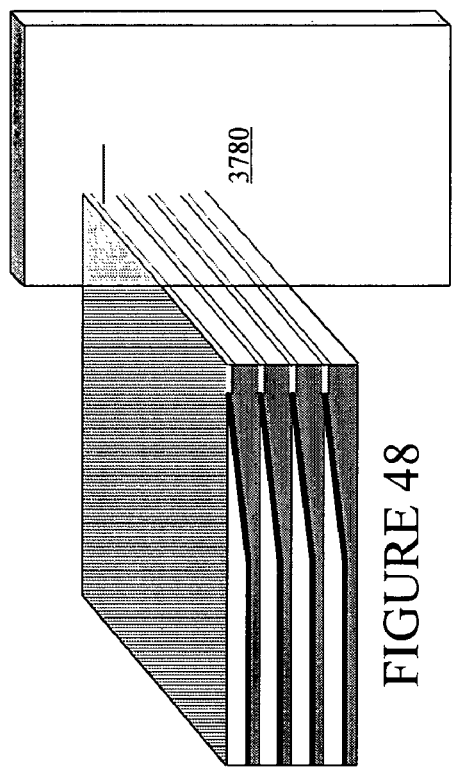
FIGS. 48-49 show steps of forming probes, e.g., in the form of nozzles, from a stack of layers as shown in FIG. 44 according to another embodiment of the present invention.
Figure 49:
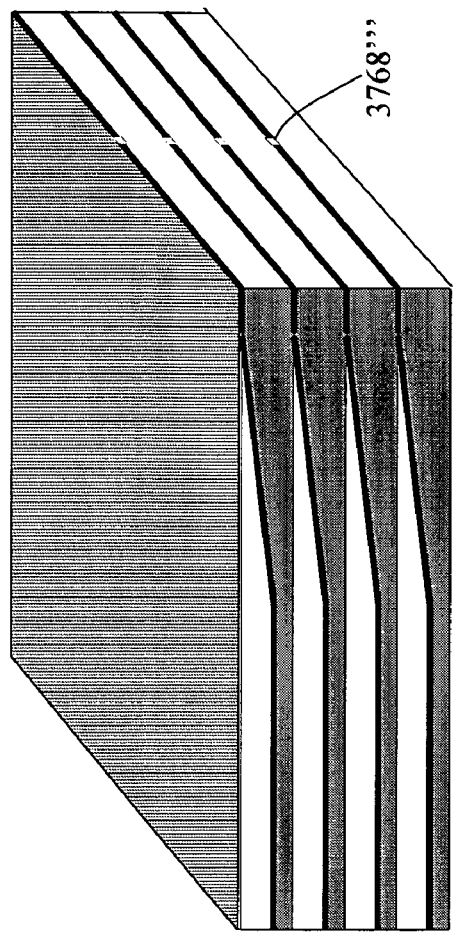

Referring now to FIGS. 48 and 49, another embodiment of a method of forming very small width nozzle diameters. As described with reference to FIGS. 43 and 44, the deposited material between layers may be etched away, exposing an etched channel spaced apart by approximately the thickness of the device layer.

These etched channels 3768 may then be filled with an etchable material. For example, a nozzle device 3780 as describe herein, of a single layer, may be rotated approximately 90° with respect to the stack of layers having material etched away at the locations of the nozzles. An etchable material may be filled in the reservoir of the rotated nozzle structure, which is filled at the regions where the nozzles on the stack of layers are to be formed. The surrounding areas between the layers are then filled with a plug material. Then the etchable material in the nozzle region is etched away, exposing the nozzles 3768'''. Using this technique, it is possible to create nozzles having approximately the same width and height of extremely small dimensions. Thus, a nozzle device 3710''' having plural openings 3768''' is provided.

Note this etchable material should be selectively removable by an etchant (e.g., not removing the bulk material).

Figure 50B:
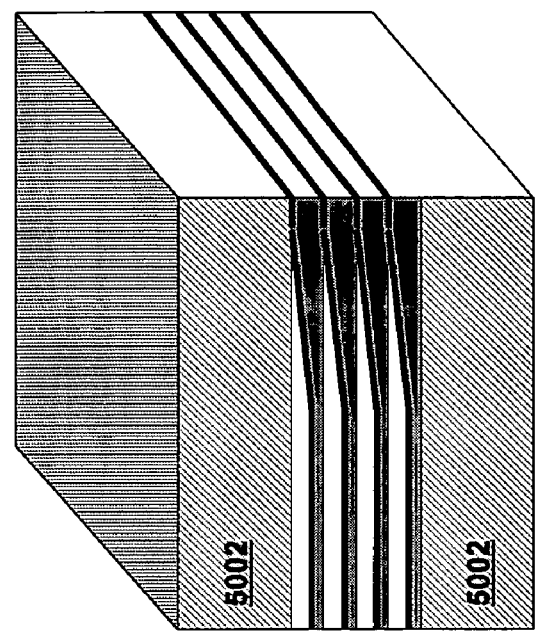
FIGS. 50A-50B depict a sectional view and a cut isometric view, respectively, of a nozzle array of the present invention.
Figure 50A:
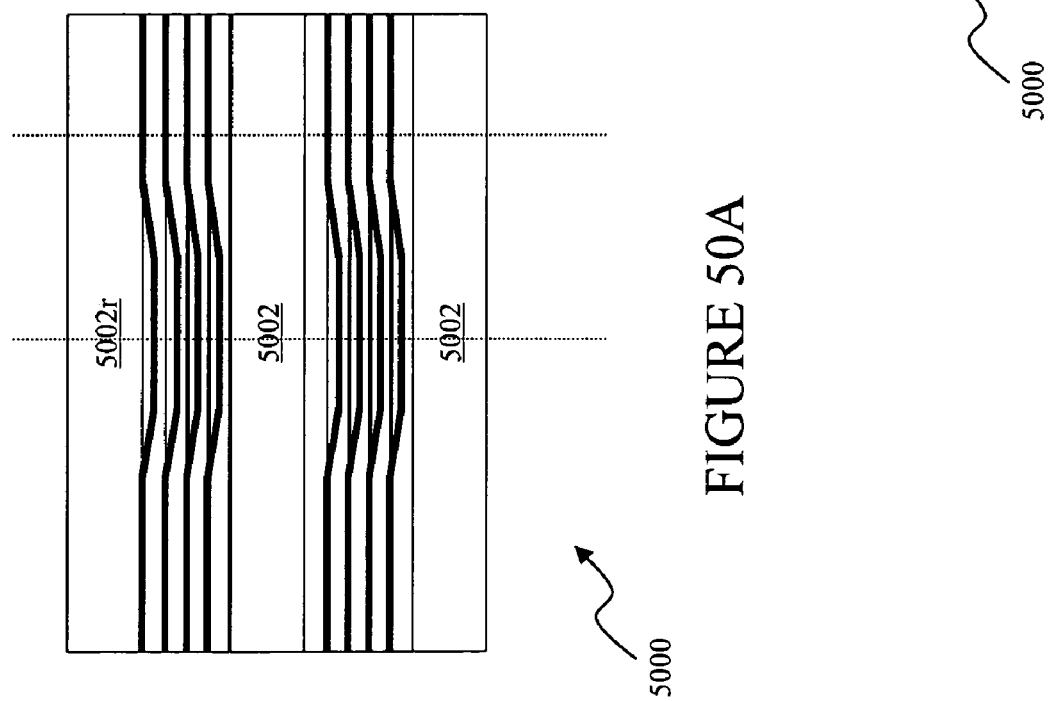

Referring now to FIGS. 50A and 50B, a nozzle array 5000 of the present invention is shown. Therein, one or more spacer layers 5002 may be positioned between a desired number of to-be-formed channels, e.g., during stacking of the well structures.

Figure 51:
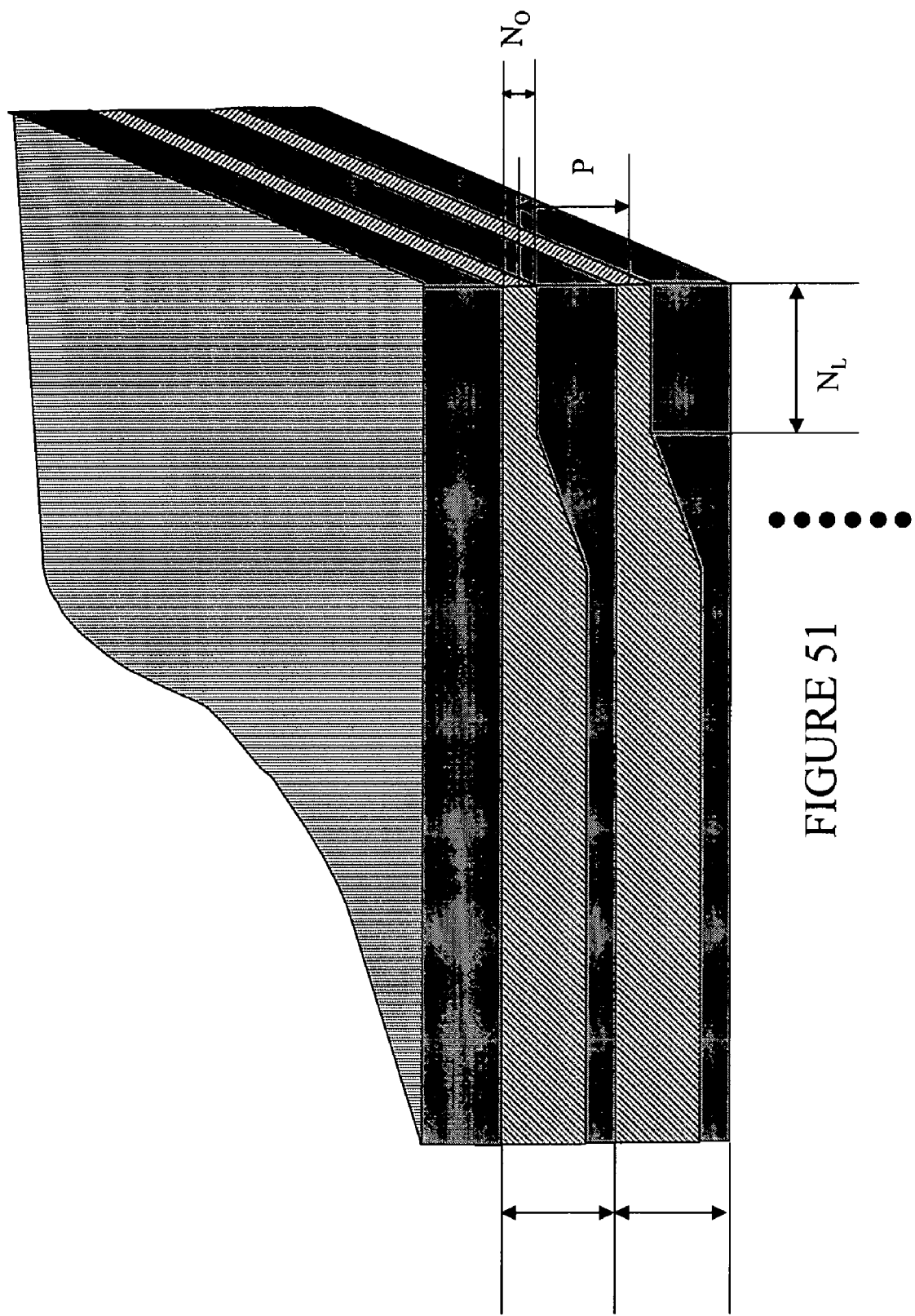
FIG. 51 shows an enlarged isometric section of stacked layers used to form the probes of the present invention whereby probe characteristics are featured.

Referring to FIG. 51, an enlarged cross section of stacked layers used to form the probes such as nano-probes having wells and tip portions with tip active area dimensions equal or less than the sub-objects being analyzed by the specimen, or of a nanometer or sub-nanometer scale for other applications as described herein. These tip portions are also formed to desired tip length, is shown. As described above, the layers 3738 have been processed to form the wells 3730 and nozzle tip regions generally by deposition of a layer 3738 of material capable of being selectively removed (e.g., etched) therein (the well) and thereon (the shelf at the top of the well), as described herein. The materials capable of being selectively removed for the plateau and and/or the well may be the same or different. The wells and plateaus have various dimensions that will characterize the nozzle array ultimately formed. The nozzle has a tip length NL, a tip opening height NO, and a period P.

Note that the dimensions of such nozzles may be on the order of a less than a nanometer (e.g., less than 0.1 nm) to 10 or 10 s of nanometers, on the order of 10 or 10 s of nanometers to 100 or 100 s of nanometers, or on the order of a tenth of a microns or tenths of a micron to a micron or a few microns, depending on the desired application. Further, the arrays may be spaced apart by a few nanometers to several micros apart.

Figure 52:
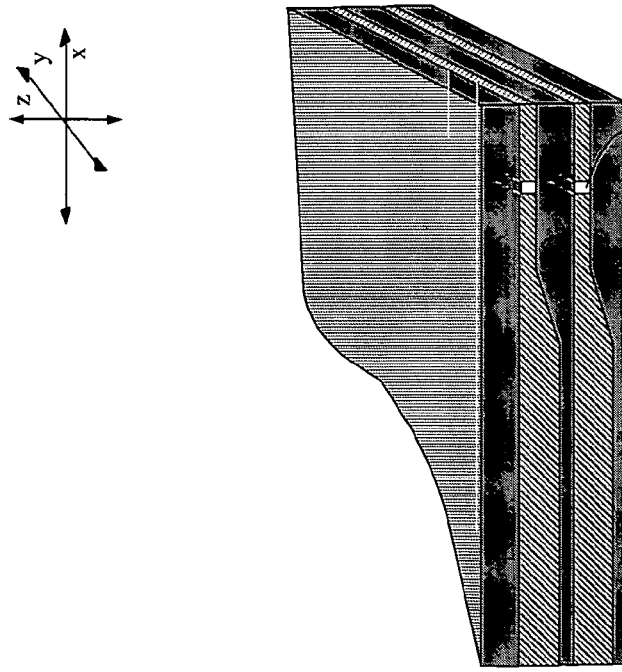
FIG. 52 shows an enlarged isometric section of stacked layers used to form the probes of the present invention whereby grind stops are provided.

Referring to FIG. 52, an enlarged cross section of stacked layers used to form the micro and nano nozzles herein is shown, detailing grind stops 5286 provided to enhance the ability to control the nozzle length NL. In certain embodiments, it is desirable to minimize the nozzle length. A grind stop 5286 is provided proximate the desired nozzle length. The grind stop may be provided during processing of the wells on the device layer. Further, the grind stops may further serve as alignment marks, e.g., as described in aforementioned U.S. patent application Ser. No. 10/717,220, incorporated by reference herein.

Figure 53A:
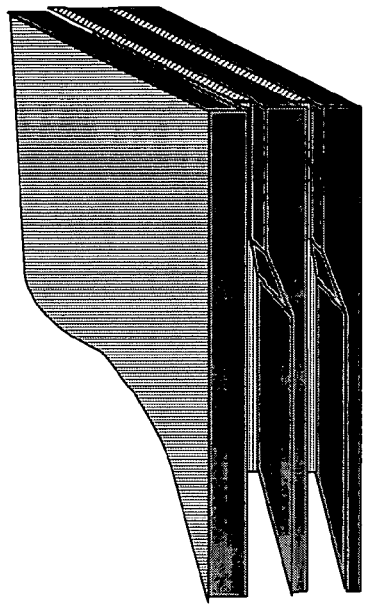
FIGS. 53A-53B depict an enlarged cross section of stacked layers used to form the micro and nano probes, and a front view of the open tip of the prove, respectively.
Figure 53B:
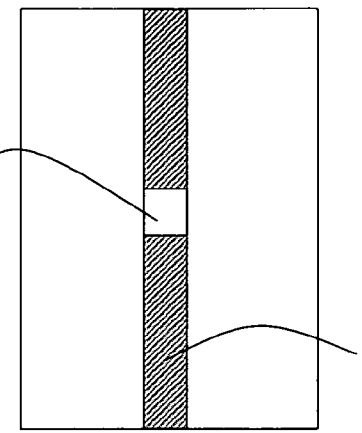

Referring to FIGS. 53A and 53B, an enlarged cross section of stacked layers used to form the micro and nano probes, and a front view of the open tip of the prove, respectively, are shown. Note that in certain embodiments, the well 5370 has a width (y direction) greater than that of the nozzle tip 5368.

Note that in any of the herein described probe elements, associated structures may be provided. For example, in certain embodiments, one or more electrodes may be provided to facilitate material discharge, detection capabilities, etc. Further, one or more processors, micro or nano fluidic devices, micro or nano electromechanical devices, or any combination including the foregoing devices may be incorporated in a nozzle device. In certain preferred embodiments, electrodes are provided at the nozzle openings and/or wells, and an electrode controller and/or a microfluidic device (e.g., to feed or remove material from the nozzles) is associated with an array of nozzles.

Figure 54A:
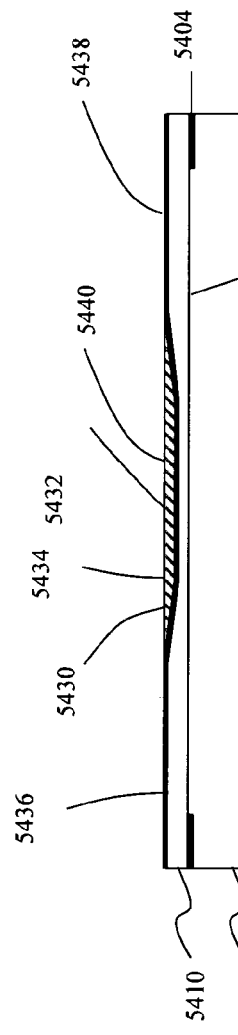
FIGS. 54A-54D show an exemplary method according to the present invention of making probes with open tips and having various conductors within an open region in the body of the probe.

Further, and referring now to FIGS. 54A-54D, an exemplary method of making probes with open tips and having various conductors (e.g., serving as electrodes) within an open region in the body of the probe is depicted. FIG. 54A shows a starting section of a multiple layer substrate with layers 5410 and 5420 as described hereinabove. An well 5430 generally has angular walls 5432 and a center recessed portion 5434, although other shapes may be provided. Plateau regions 5436 form the opening walls or supports.

Figure 54B:
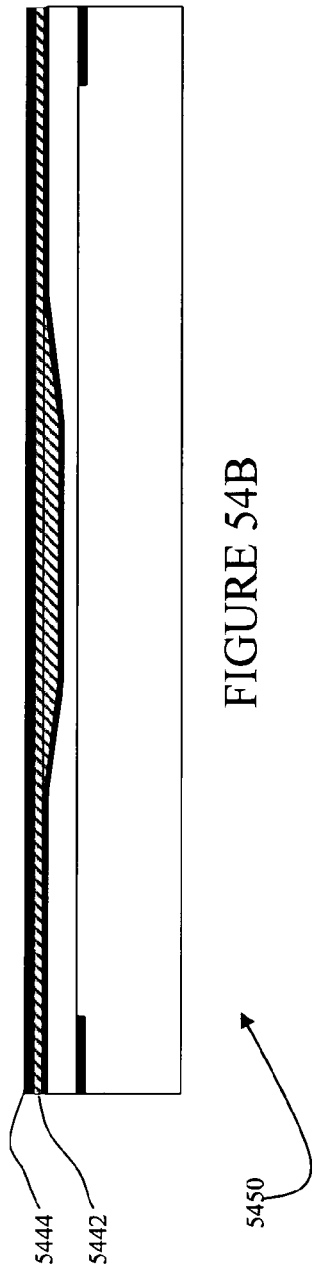

A layer 5438 of conductive material is deposited on the wafer. A removable fill material 5440 may be provided in the well to facilitate layering. Referring to FIG. 54B, a removable fill layer 5442 is provided on the surface having the conductive layer 5438 and the optionally fill material 5440. In this embodiment, the opening of the probe will be formed at the fill layer 5442. Further, a conductive layer 5444 is deposited or layered on the fill layer 5442, forming a nozzle sub-structure 5450.

Figure 54C:
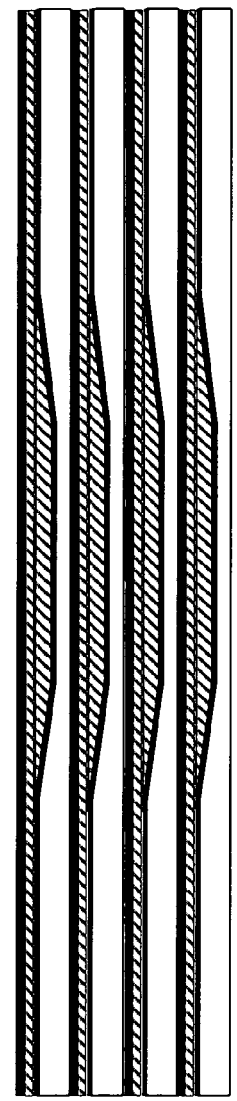
Figures 54D, 55:
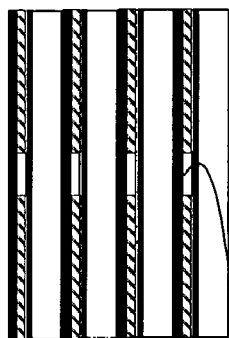
FIG. 55 show an enlarged view of an opening of a probe according to certain embodiments of the present invention.

Referring now to FIG. 54C, a plurality of nozzle sub-structures 5450 are aligned and stacked (e.g., as described above with respect to FIG. 41). Referring to FIG. 54D, nozzle openings 5460 may be formed, e.g., according to one of the methods described above with respect to FIGS. 43-49, or other lithography or oxidation methods. Note that the plug material may be conductive or insulating, depending on the desired properties of the probe.

Referring now to FIG. 55, an enlarged view of a nozzle structure 5500 is provided, viewing a nozzle opening 5502. Nozzle opening 5502 is generally positioned on a nozzle layer "N" between a top portion "A" and a bottom portion "B" (although top and bottom are considered to be relevant for the purpose of description herein only). To describe various embodiments of possible configurations, sections N, A and B have been divided into descriptive sections. These descriptive sections may be actual discrete regions of different material, or in certain embodiments multiple descriptive sections may be of the same material and thus actually a uniform region, as will be apparent from the various embodiments herein.

AA and BB may be the same or different materials, such as insulator or semiconductor materials to provide the structure of the nozzle 200, electrically insulate the nozzle openings from one another, fluidly seal the openings from one another, or other functionality.

In certain embodiments, the descriptive sections AL, AC, AR, NL, NR, BL, BC and BR are all of the same materials as AA and BB.

Any combination of AL, AC, AR, NL, NR, BL, BC and/or BR may be provided in the form of conductors. For example, referring back to FIG. 45, upon removal of the mask after etching the nozzle opening, a structure may be provided having AL, AC, AR, BL, BC and BR of the same materials as AA and BB, and NL, NR of conductive material.

Further, one or more conductors (e.g., electrodes) may be included inside within the probes, thereby enabling creation of fields across the nozzle opening. For example, NL and NR, AC and BC, AL and BR, AR and BL, AL, AR and BL, BR may all be electrode pairs to provide any desired functionality.

Additionally, one or more conductive electrodes may be within the well regions, e.g., to provide electromotive forces to move materials.

Figure 56A:
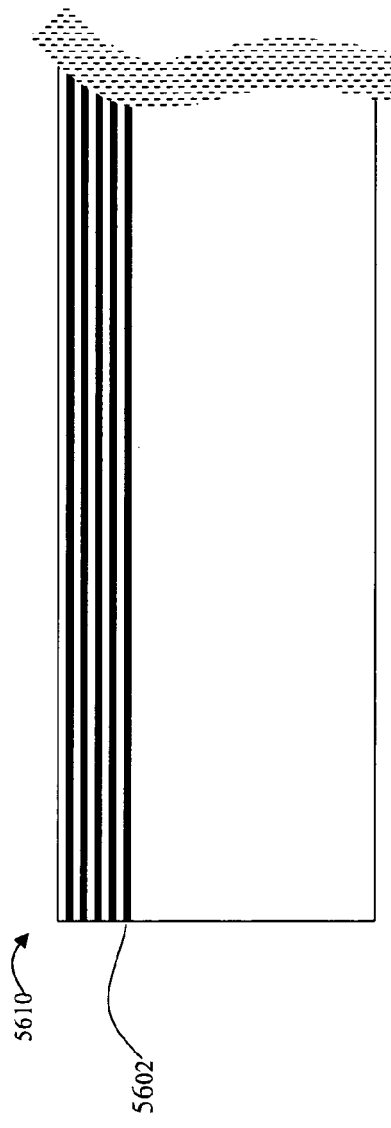
FIGS. 56A-56C show an exemplary method according to the present invention for manufacturing a probe including a plurality of sub-layers.
Figure 56B:
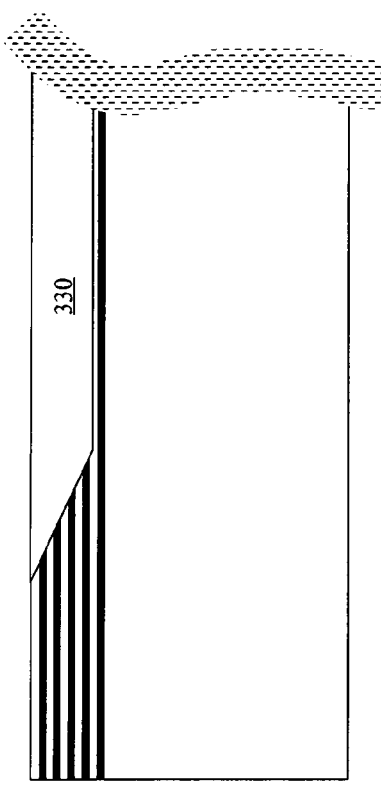
Figure 56C:
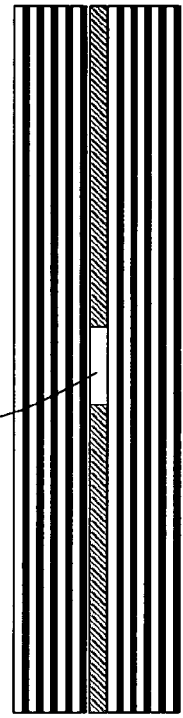

Referring now to FIGS. 56A-56C, an example of a method of manufacturing the herein described nozzles is shown whereby a plurality of sub-layers 5602 form each layer 5610. Wells 5630 are processed through the layer 5610 as shown in FIG. 56B. FIG. 56C shows nozzle openings 5660 having plural sub-layers 5602 therearound. These sub-layers may be very useful, for example, where precise metrology is desired.

For example, in certain embodiments, the sub-layers 5602 are formed to very precise tolerances, e.g., having thicknesses on the order of 0.1 to about 5 nanometers. When these sub-layers 5602 are formed of differing materials (e.g., alternating between insulator and semiconductor, semiconductor and conductor, or conductor and insulator), precise step motion may be enabled in the nozzle structures based on known dimensions of the nozzle sub-layers.

Traditional Lithography Methods to Make Micro and Nano-structures, Photon Beam, Ion Beam, Electron Beam, Other Particle Beams While it is possible to use conventional lithographic tools such as electron beams, particle beams, UV, X-ray, etc., to define certain features herein, extending them to the nano-scale becomes very cumbersome and expensive. In the present invention, certain embodiments may benefit from the use of applicants nanolithography tools described in applicants U.S. patent application Ser. No. 11/077,542 filed on Mar. 10, 2005 and entitled "Nanolithography and Microlithography Devices and Method of Manufacturing Such Devices" incorporated by reference herein. This is advantageous in that a compact, easy to use and inexpensive tool may be provided. Further, use of applicants nanolithography tools described in above referenced U.S. patent application Ser. No. 11/077,542 may advantageously provide extremely small future sizes down to angstrom scale.

Various probes and configurations thereof may be manufactured with the use of Applicant's microlithography and nanolithography tools and methods, as described in U.S. Non-provisional application Ser. No. 11/077,542 filed on Mar. 10, 2005 entitled "Nanolithography and Microlithography Devices and Method of Manufacturing Such Devices".

Folding

In certain embodiments herein, a probe or nano-tool may be formed by folding a very thin layer to expose a point at the outside of the fold angle, thereby creating a probe tip with a very small active area suitable for the various applications provided for herein including ultra high resolution analyses of the specimen at the sub-object level (e.g., nucleotide level of a DNA or RNA strand or fragment). Furthermore, in certain embodiments herein, a probe or nano-tool device may be formed with multiple probe tips that may be useful in various applications.

One benefit of the methods of making probe or nano-tool device may be formed with multiple probe tips of nano-scale dimensions as described herein related to folding of various composite structures is that the probes are at angles relative one another, such that the back end (opposite the tip active areas) are spaced apart at distances greater than the spacing of the tip active areas. This allows for molecular scale active areas at the probe tips, while maintaining greater distances at the back end, e.g., to facilitate interconnection or other form of interface to various energy sources, detection circuitry, other interconnecting or integrated functionality.

For example, and referring now to FIGS. 57-59, a method of manufacturing a probe 5702 is shown. FIG. 57A shows an ultra thin layer 5704 bonded to a first surface 5708 of a base layer 5706. The base layer 5706 may comprise any suitable material, for example, that will form a portion of the probe body, or that may be further processed for additional features and/or functionality. The ultra-thin layer 5704 may comprise any suitable material that may be deposited, laminated or otherwise formed on the surface 5708 of base layer 5706. For example, to form a conductive probe, a conductive material may be deposited, laminated or otherwise formed on the surface 5708.

Figure 57A:
FIGS. 57A-57D show one exemplary method according to the present invention for manufacturing a probe by folding a very thin layer to expose a point as a probe tip.
Figure 57B:

Referring now to FIG. 57B, a well 5712 of suitable geometry is etched or otherwise created on surface 5710 of base layer 5706. In certain embodiments, it may be desirable to configure the well such that the deepest portion is very close (e.g., on the order of about 0.1 to about 1 nanometer, or about 1 to about 10 nanometers, or on the order of 10 s of nanometers) to the thin layer 5704. In other embodiments, it may be desirable to configure the well such that the deepest portion exposes the back surface (i.e., the surface attached to surface 5708 of base layer 5706) of the thin layer 5704.

Figure 57C:
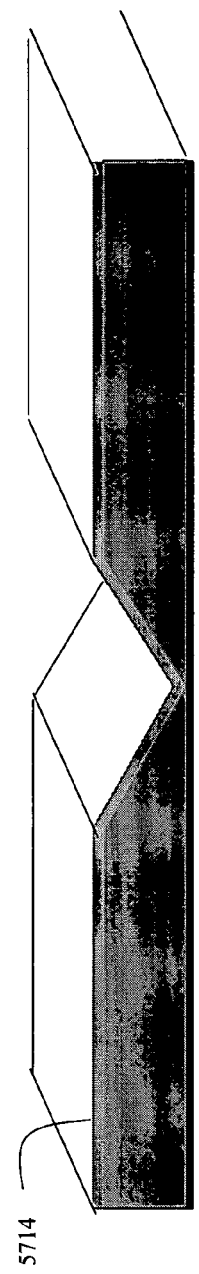

Referring now to FIG. 57C, surface 5710 may optionally be coated with a bending layer 5714 formed of a material that has flexible characteristics, including but not limited to polyvinyl alcohol, silicone, or other suitable flexible and stretchable polymeric or other materials.

Figure 57D:
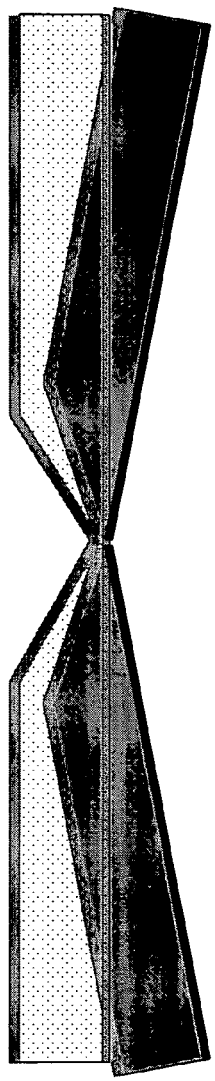

Referring now to FIG. 57D, the composite of layer 5704 and base layer 5706 is folded to diverge opposing angled portions of the well 5712. Folding is completed to provide a probe precursor structure 5702', shown in FIGS. 58A and 58B. As shown, the probe precursor structure 5702' has a cross section in a substantially pentagonal shape resembling a triangle adjacent a rectilinear polygon. Of course, one may alter this shape by changing the shape of the well 5712. Further, the shape may be symmetrical as shown, or asymmetrical. One of the benefits of the present folding techniques is that certain alignment requirements may be relaxed.

The bending layer 5714 may be removed. Further, to expose the probe tip active area 5720, the tip edge 5716 of the structure 5702' may be mechanically altered, e.g., cut, grinded, polished, subject to water or other fluid jet, or otherwise removed to expose the folded thin layer of material. Alternatively, the tip may be exposed by chemical etching, e.g., to remove a portion of the substrate material. Mechanical or chemical removal may also be used to provide a tip that extends beyond the substrate material, for example, as shown in FIGS. 4A-5B.

Notably, the dimension of the probe tip active area 5720 is defined by a multiple of the thickness of the layer 5704, in this case 2t. With the methods of making and manipulating thin films as described above, extremely small tip dimensions for the probe tip active area are possible. For example, if the layer 5704 is a single two dimensional layer of graphene, then the tip dimension 2t as shown in FIG. 59 may be on the order of 2 angstroms, and is highly conductive.

Alternatively, the layer 5704 may be formed of a material that can be selectively removed (either completely or partially) to open a channel or path. Nonetheless, in either embodiment, the tip dimensions for the tip active area 5720 are a multiple of the thickness of the layer 5704 deposited, layered, or otherwise formed on the base layer 5706.

Figure 60A:
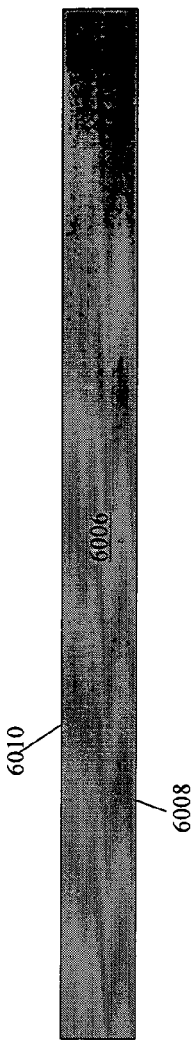
Figure 60B:
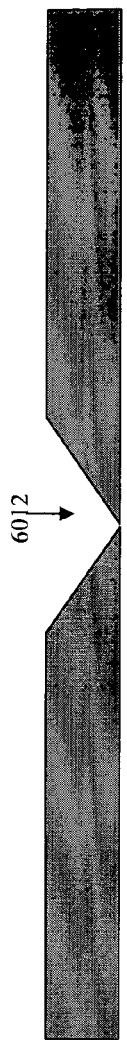

In another embodiment, and referring now to FIGS. 60A-60J, methods of manufacturing a probe 6002, 6002' or 6002" are shown. FIGS. 60A and 60B show a base layer 6006 having a well 6012 of suitable geometry is etched or otherwise created on surface 6010 of base layer 6006. In certain embodiments, it may be desirable to configure the well such that the deepest portion is very close to the thin layer described below.

In other embodiments, it may be desirable to configure the well such that the deepest portion exposes the back surface (i.e., the surface attached to surface 6008 of base layer 6006) of the thin layer described below.

The base layer 6006 may comprise any suitable material, for example, that will form a portion of the probe body, or that may be further processed for additional features and/or functionality.

Figure 60C:
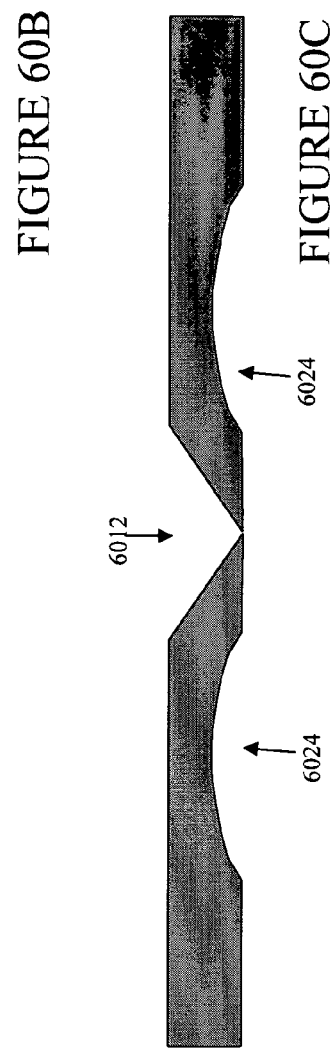
Figure 60D:
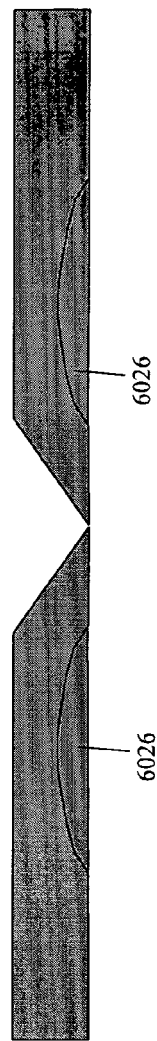

Referring now to FIG. 60C, portions 6024 are removed from the base layer 6006, generally from the side of surface 6008. Referring now to FIG. 60D, portions 6024 are filled with a suitable material 6026. This material 6026 may be an insulating or conducting plug material (if a probe in the configuration of FIG. 60H or 601 is desired), or the material 6026 may comprise a removable substance (if a probe in the configuration of FIG. 60J is desired).

Referring now to FIG. 60E, an ultra thin layer 6004 bonded to the surface 6008 of base layer 6006 having material portions 6026 to form a flat surface. Known techniques may be applied to smooth the surface formed by both the surface 6008 of base layer 6006 having material portions 6026. Alternatively, the methods for forming atomically smooth surfaces described herein may be employed.

The ultra-thin layer 5704 may comprise any suitable material that may be deposited, laminated or otherwise formed on the surface 5708 of base layer 5706. In certain preferred embodiments, thin films formed according to the embodiments herein are used, such as one or more layers of graphene, thereby allowing for extremely small (e.g., 0.1 nanometers to 10 nanometers) tip dimensions.

Notably, with the methods of making and manipulating thin films as described above, extremely small tip dimensions for the probe tip active area are possible. For example, if the layer 6004 is a single two dimensional layer of graphene, then the tip dimension 2t as shown above in FIG. 59 is on the order of about 0.2 nanometers.

Alternatively, the layer 6004 may be formed of a material that can be selectively removed (either completely or partially) to open a channel or path. Nonetheless, in either embodiment, the tip dimensions for the tip active area 6020 are a function of the thickness of the layer 6004 deposited, layered, or otherwise formed on the base layer 6006.

Referring now to FIG. 60F, surface 6010 may optionally be coated with a bending layer 6014 formed of a material that has flexible characteristics, including but not limited to polyvinyl alcohol or other suitable polymeric or flexible metallic material.

The composite of layer 6004 and base layer 6006 having material portions 6026 is folded to diverge opposing angled portions of the well as described above with respect to FIG. 57. A probe or probe precursor structure 6002 is provided as shown in FIG. 60H (after the material of the optional bending layer 6014 is removed as shown in FIG. 60G). If a probe 6002' is desired, the selectively removable material is used as the material for layer 6004, and may be removed at this stage, whereby a gap 6028. Further, if probe 6002" is desired, the selectively removable material is used as material 6026 and may be removed at this stage, whereby a cavity 6040 is created.

Figure 61B:
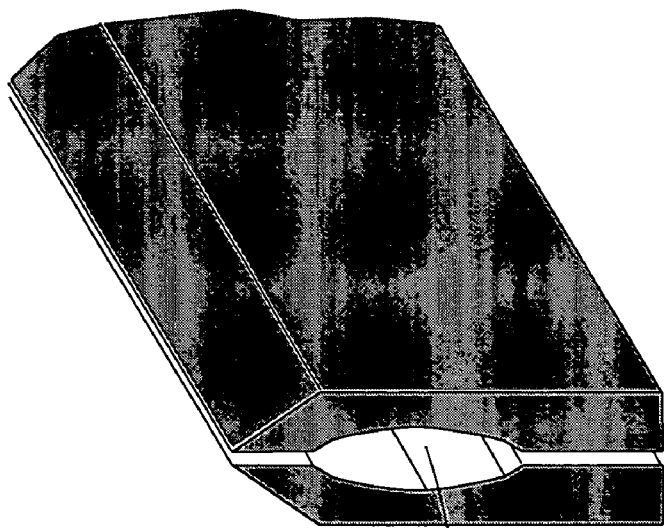
FIGS. 61A-61B show cavities of various configurations and dimensions.
Figure 61A:
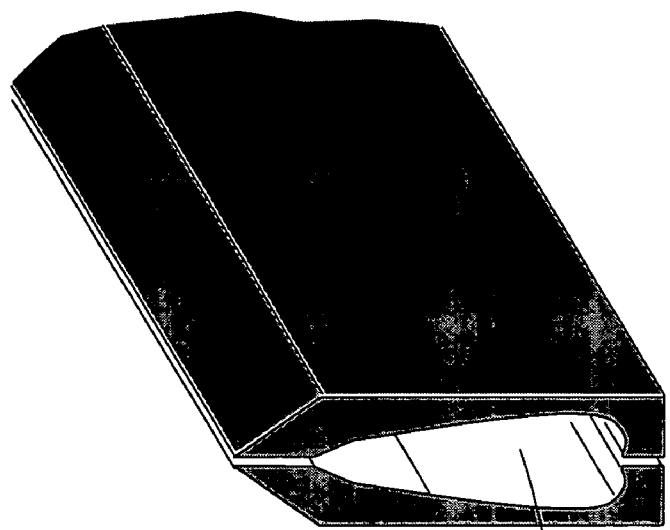

Referring to FIGS. 61A-61B, note that cavities of various configurations and dimensions 6140', 6140" may readily be created by varying the configurations and dimensions of portions 6024 described above with reference to FIGS. 60A-60J.

Referring now to FIG. 62A-62D, another alternative method of making various probes with additional versatility and functionality according to the present invention is provided. In this case, the structure having a thin layer 6204 on a base layer 6206 with a well 6212 at the surface opposite the thin layer 6204 is folded so that angled portions of the well 6212 converge as shown. The bending layer or material 6214 may be removed, resulting in probe 6202 having a tip 6240. The tip 6240 includes portions of thin 6204 on both sides of the structure.

In a further embodiment, and referring now to FIG. 62E, a probe 6203 is shown, which includes isolated dual probe elements including tips 6242, 6244. Such a probe may be useful in various applications, such as "real time" imaging (e.g., STN, AFM, stereoscopic imaging), for applying plural energy sources, or, e.g., using one probe for applying stimuli and another for detecting variations.

Figure 63A:
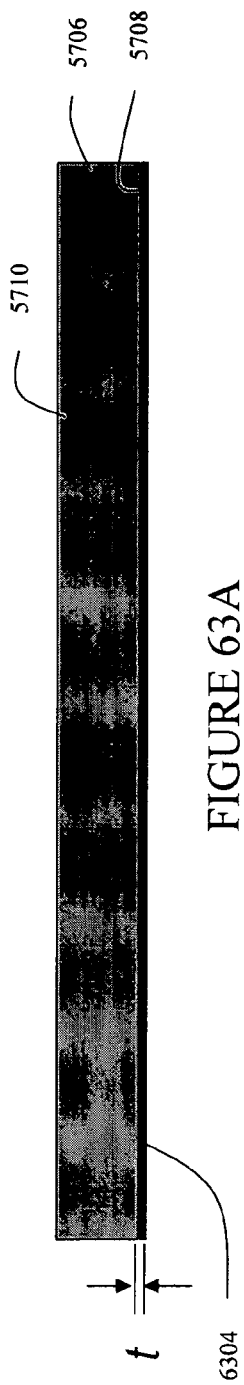
FIGS. 63A-63F show still another alternative method of making various probes with additional versatility and functionality according to the present invention.

For example, and referring now to FIG. 63A through FIG. 63, a method of manufacturing a probe 6302 is shown. FIG. 63A shows an ultra thin layer 6304 of thickness t bonded to a first surface 6308 of a base layer 6306. The base layer 6306 may comprise any suitable material, for example, that will form a portion of the probe body, or that may be further processed for additional features and/or functionality. The ultra-thin layer 6304 may comprise any suitable material that may be deposited, laminated or otherwise formed on the surface 6308 of base layer 6306. For example, to form a conductive probe, a conductive material may be deposited, laminated or otherwise formed on the surface 6308.

Figure 63B:
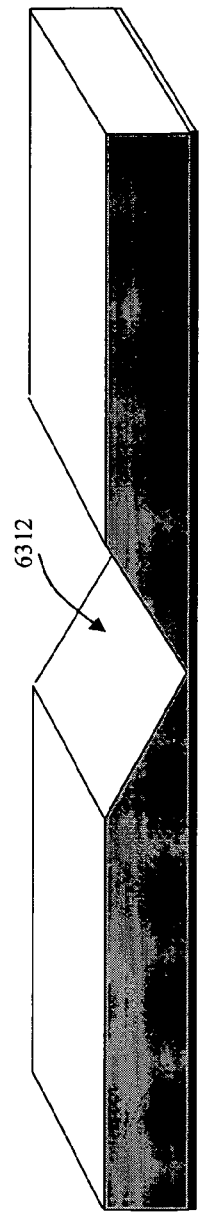

Referring now to FIG. 63B, a well 6312 of suitable geometry is etched or otherwise created on surface 6310 of base layer 6306. In certain embodiments, it may be desirable to configure the well such that the deepest portion is very close (e.g., on the order of about 0.1 to about 1 nanometer, or about 1 to about 10 nanometers, or on the order of 10 s of nanometers) to the thin layer 6304. In other embodiments, it may be desirable to configure the well such that the deepest portion exposes the back surface (i.e., the surface attached to surface 6308 of base layer 6306) of the thin layer 6304.

Alternatively, the layer 6304 may be formed of a material that can be selectively removed (either completely or partially) to open a channel or path.

Figure 63C:

Referring now to FIG. 63C, another ultra-thin layer 6305 of thickness t' may be deposited, laminated, or otherwise formed on surface 5710. Note that this layer may be the same or different material as the material of layer 6304. Furthermore, layer 6305 may be formed of plural sections, or a layer that is cut or notched, for example, along an intended fold line as described herein, or at the deepest portion of the well 6312.

Figure 63D:

Now referring to FIG. 63D, the layer 6305 may optionally be coated with a bending layer 6314 formed of a material that has flexible characteristics, including but not limited to polyvinyl alcohol, silicone, or other suitable flexible and stretchable polymeric or other materials.

Figure 63E:
Figure 63F:
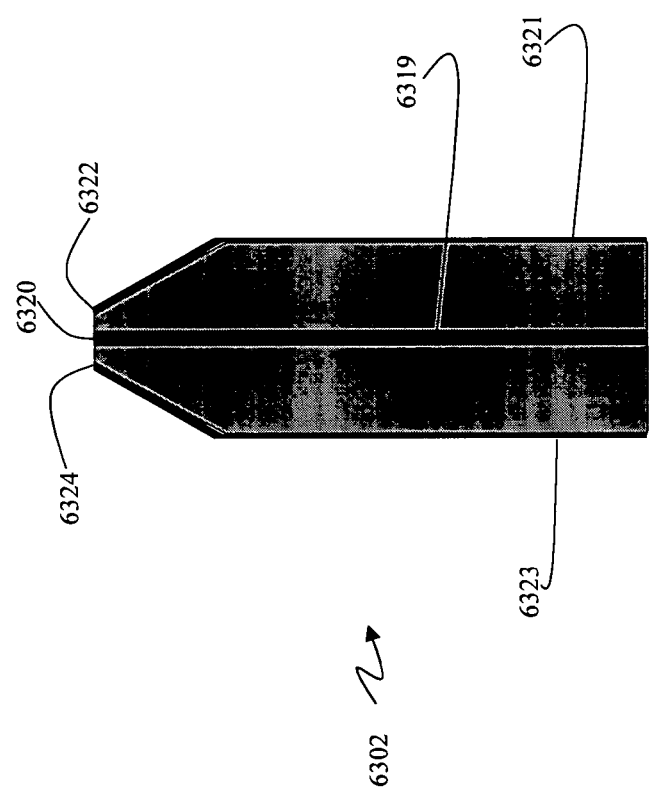

Referring now to FIG. 63E, the composite of layer 6304, base layer 5706 and layer 6305 is folded to diverge opposing angled portions of the well 6312. Folding is completed to provide a probe precursor structure, e.g., similar to that described above with respect to FIGS. 58A and 58B, and further including the layer 6305 folded about the structure. The bending layer 6314 may be removed. As shown in FIG. 63F, the tip region of the folded structure may be cut, grinded, polished, or otherwise removed to expose the probe tip active area 6320 of probe 6319 (derived from folded layer 6304) and probe tip active areas 6322, 6324 of probes 6321, 6323 (derived from layer 6305). The dimension of the probe tip active area 6320 is defined by a multiple of the thickness of the layer 6304, in this case 2t, and the dimensions of probe tip active area 6322, 6324 are defined by the thickness of the layer 6305, in this case t'.

Notably, with the methods of making and manipulating thin films as described above, extremely small tip dimensions for the probe tip active area are possible. For example, if the layer 6304 is a single two dimensional layer of graphene, then the probe tip active area 6320 may be on the order of 2 angstroms, and the dimensions of probe tip active area 6322, 6324 may be on the order of 1 angstrom. Furthermore, when a material such as graphene is used, the probes may be extremely conductive. Furthermore, the spacing between tip active areas 6320, 6322 and between tip active areas 6320, 6324 may be controlled by, e.g., the thickness of the layer 6306, the angle of the walls of well 6312 and the degree of folding (i.e., at step 63E). Additionally, the angle allows for greater distances between the conductors at the end opposite the tip regions as compared to the distances between the conductors at the tip regions. This allows for molecular scale active areas at the probe tips, while maintaining greater distances at the back end, e.g., to facilitate interconnection or other form of interface to various energy sources, detection circuitry, other interconnecting or integrated functionality.

Figure 64E:
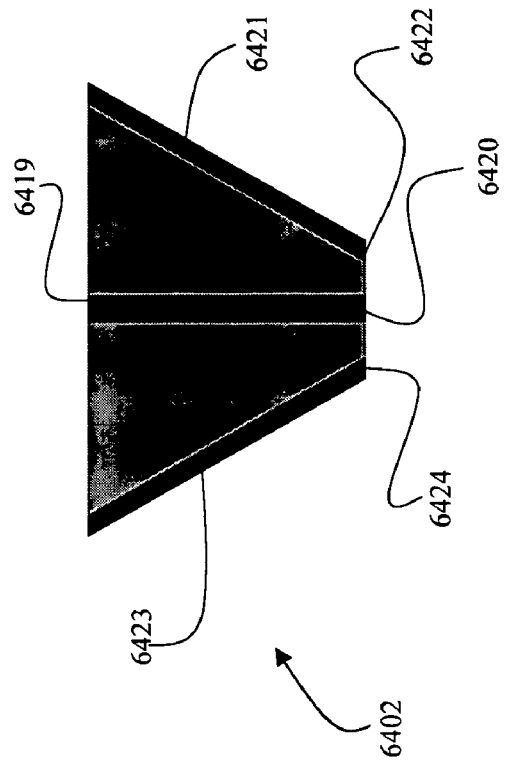

Referring now to FIG. 64A-64E, another alternative method of making various probes with additional versatility and functionality according to the present invention is provided. A structure is provided having a thin layer 6404 having a thickness t on a base layer 6406 with a well 6412 at the surface opposite the thin layer 6404. Referring now to FIG. 64B, another ultra-thin layer 6405 of thickness t' may be deposited, laminated, or otherwise formed on the surface of layer 6406 having the well 6412 therein. Note that this layer may be the same or different material as the material of layer 6404. Furthermore, layer 6405 may be formed of plural sections, or a layer that is cut or notched, for example, along an intended fold line as described herein, or at the deepest portion of the well 6312. Now referring to FIG. 64C, the layer 6405 may optionally be coated with a bending layer 6414 formed of a material that has flexible characteristics, including but not limited to polyvinyl alcohol, silicone, or other suitable flexible and stretchable polymeric or other materials.

Figure 64D:
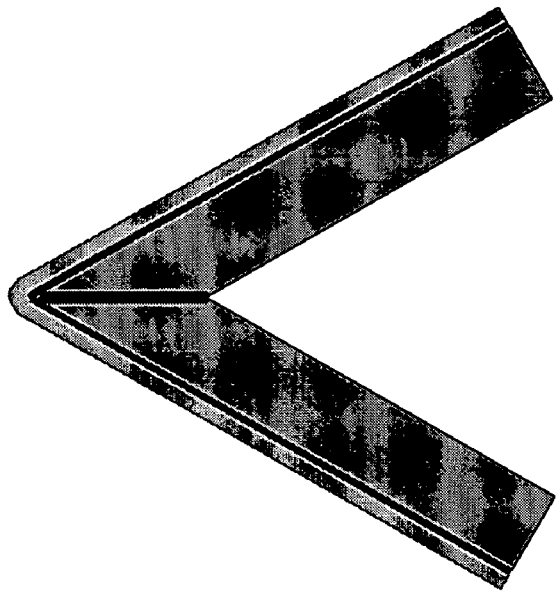

Referring to FIG. 64D, the structure is folded so that angled portions of the well 6412 converge as shown. The bending layer or material 6414 may be removed. Referring to FIG. 64E, the tip edge the folded structure may be cut, grinded, polished, or otherwise removed to expose the probe tip active area 6420 of probe 6419 (derived from folded layer 6405) and probe tip active areas 6422, 6424 of probes 6421, 6423 (derived from sections of layer 6404). The dimension of the probe tip active area 6420 is defined by a multiple of the thickness t' of the layer 6405, in this case 2t', and the dimensions of probe tip active area 6422, 6424 are defined by the thickness of the layer 6404, in this case t. Furthermore, the spacing between tip active areas 6420, 6422 and between tip active areas 6420, 6424 may be controlled by, e.g., the thickness of the layer 6406, the angle of the walls of well 6412 and the degree of folding (i.e., at step 64D). Additionally, the angle allows for greater distances between the conductors at the end opposite the tip regions as compared to the distances between the conductors at the tip regions. This allows for molecular scale active areas at the probe tips, while maintaining greater distances at the back end, e.g., to facilitate interconnection or other form of interface to various energy sources, detection circuitry, other interconnecting or integrated functionality.

In the multiple probe embodiments of FIG. 63F and FIG. 64E, one key benefit is the ability to form the probes 6319, 6321, 6323, and 6419, 6421, 6423, with tips at one set of distances apart from one another and back ends of the probe at an end opposite the probe tip end suitable for convenient connection to various sources, inputs and/or outputs. For example, in one embodiment, multiple probe devices may be formed with tips having active area dimensions t on the order of about 0.1 to about 10 nm, that are spaced apart by distances one the order of about 1 nm to about 100 nm, and further having back ends opposite the ends having the tip active areas that are spaced apart by distances on the order of about 10 nm to about 1000 nm. In particular, back ends opposite the ends having the tip active areas may be spaced apart by distances on the order of about 45 nm to about 300 nm, conventional semiconductor processing technology may be used to interconnect conventional line widths, with greater or less spacing possible depending on the desired line width of the electronics and/or photonics used for source, inputs and/or outputs.

Figure 65:
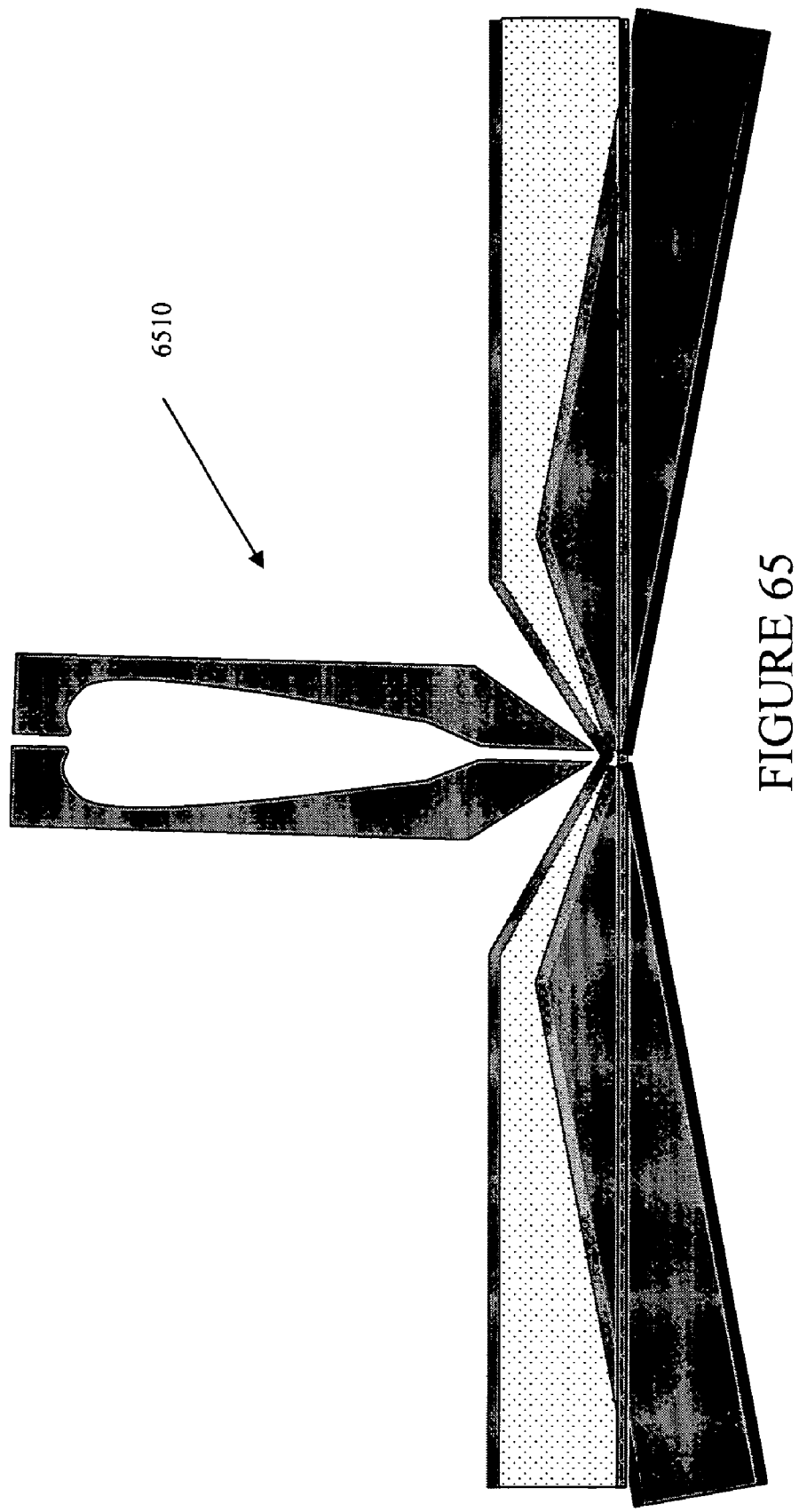
FIG. 65 shows a probe as formed by various aspects of this invention utilized to assist in the folding of certain method to make probes described herein.

Referring now to FIG. 65, a probe 6510 as formed by various aspects of this invention may be utilized to assist in the folding. For example, probe 6510 may be used to contact within the well, whereby the mechanical forces assist in the folding processes. In further embodiments, vacuum suction may be applied through the probe 6510 to assist in the folding processes.

Figure 66:
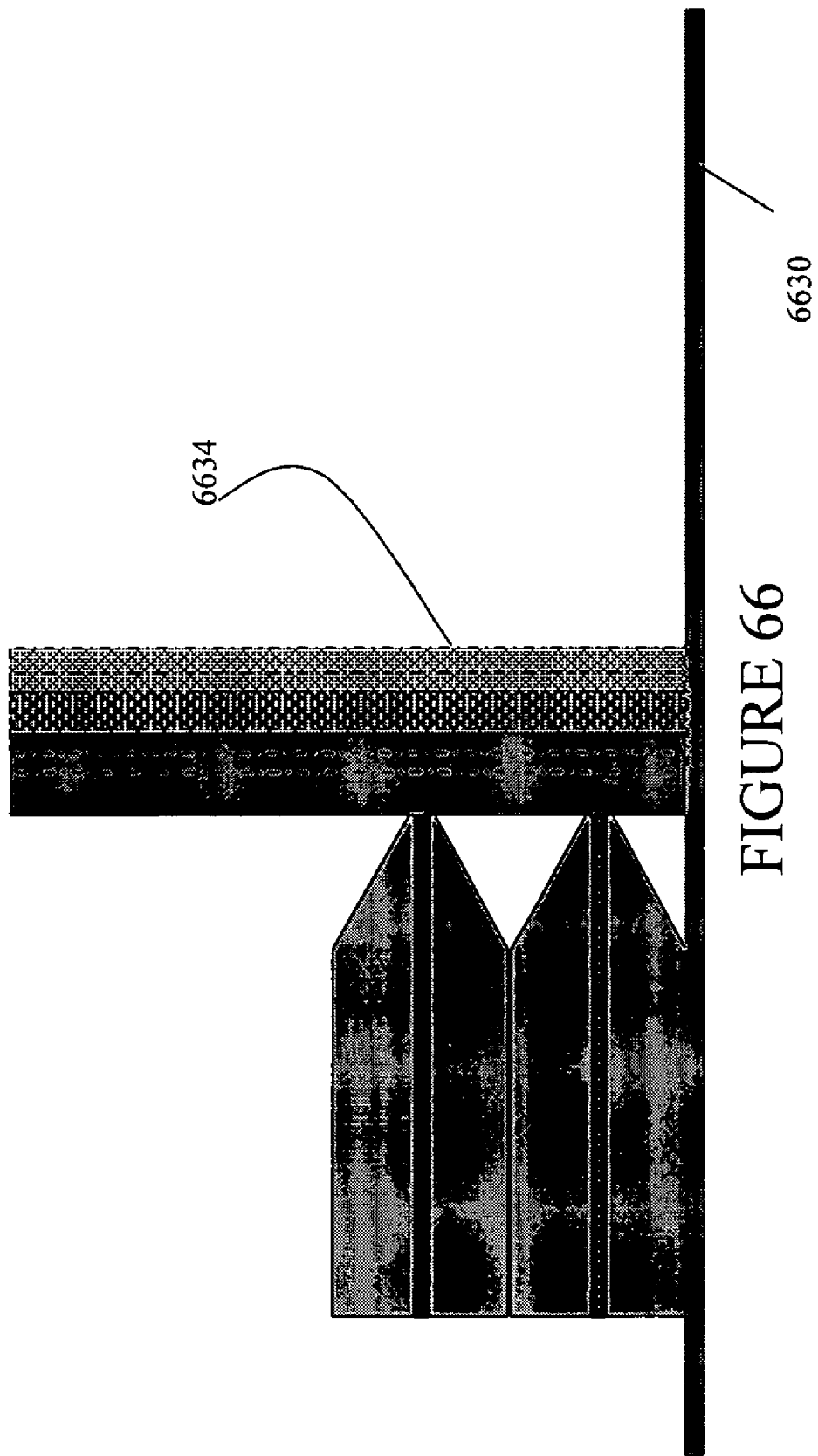
FIG. 66 shows a plurality of probes aligned and stacked to form probe sets or probe arrays.

Referring now to FIG. 66, a plurality of probes 5702 may be aligned and stacked, for example, by stacking edgewise on a platform 6630 and aligning by stacking the tips of the probes 5702 adjacent an alignment device 6634, or stacking the probes 5702 and displacing misaligned probes 5702 by pushing them into alignment with the alignment device 6634, thereby forming probe sets or probe arrays. In certain preferred embodiment, alignment device 6634 has a surface that contacts the tips and provides for sub-angstrom resolution motion to precisely displace and align the tips of the probes in an array or probe set. Note this may be adapted to form virtually any desired shape nano-tool by using a conforming form or other nano-manipulation methods. In certain embodiments, particularly advantageous if the surface that contacts the tips is atomically flat and smooth, for example, as may be produced by various methods described herein.

Spacers or Particles

Referring now to FIGS. 67A-67D and FIGS. 68A-68B, another method of forming probes according to the present invention is shown, particularly open tip probes. In particular, the tip opening dimensions t are defined by use of spacers such as particles, tubes, spheres, molecules, or other structures having precisely defined heights when disposed on a substrate. These spacers may have extremely small defined dimensions (e.g., a diameter of a sphere or tube that provides the height), such as in the ranges of 0.1 nanometers to about 10 nanometers, 10 nanometers to 100 nanometers, and 100 nanometers to 1000 nanometers.

Figure 67A:
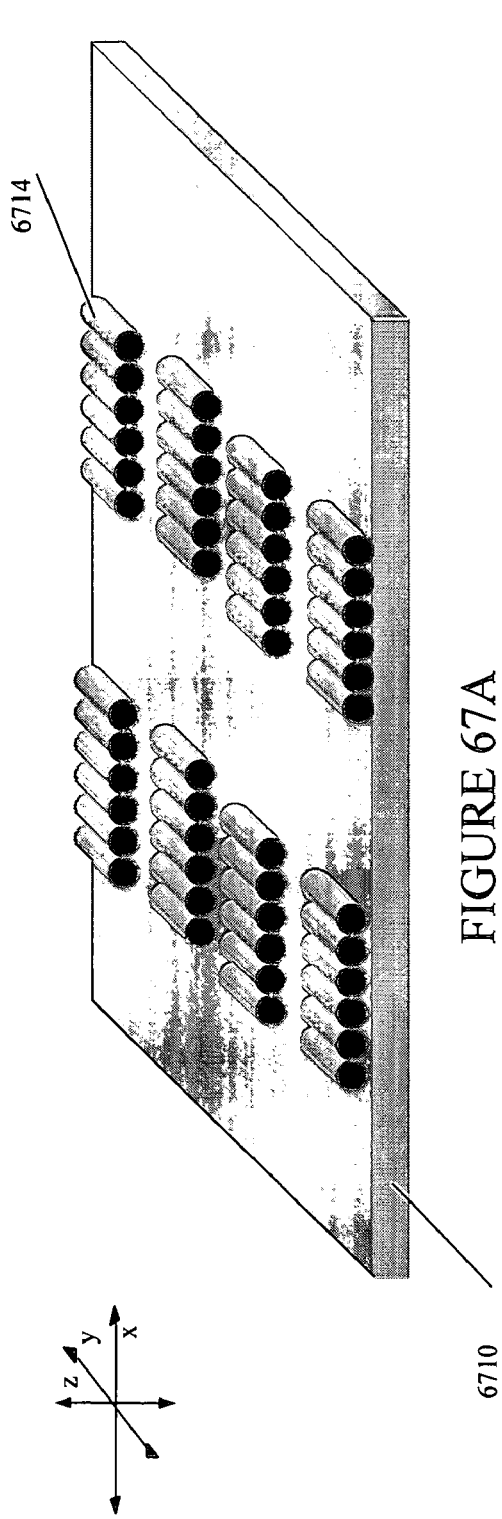
FIGS. 67A-67D show a method according to one embodiment of the present invention for manufacturing a probe using spacers to define a tip opening.

In one example, and referring to FIG. 67A-67D, a plurality of spacers 6714 are disposed generally in an orderly fashion upon the surface of a substrate 6710. As shown in FIG. 67A, the spacers 6714 may, for example, be aligned in groups along the x direction and spaced apart from one another in the y direction. Alternatively, the spacers 6714 may be in a contiguous form.

Figure 67B:
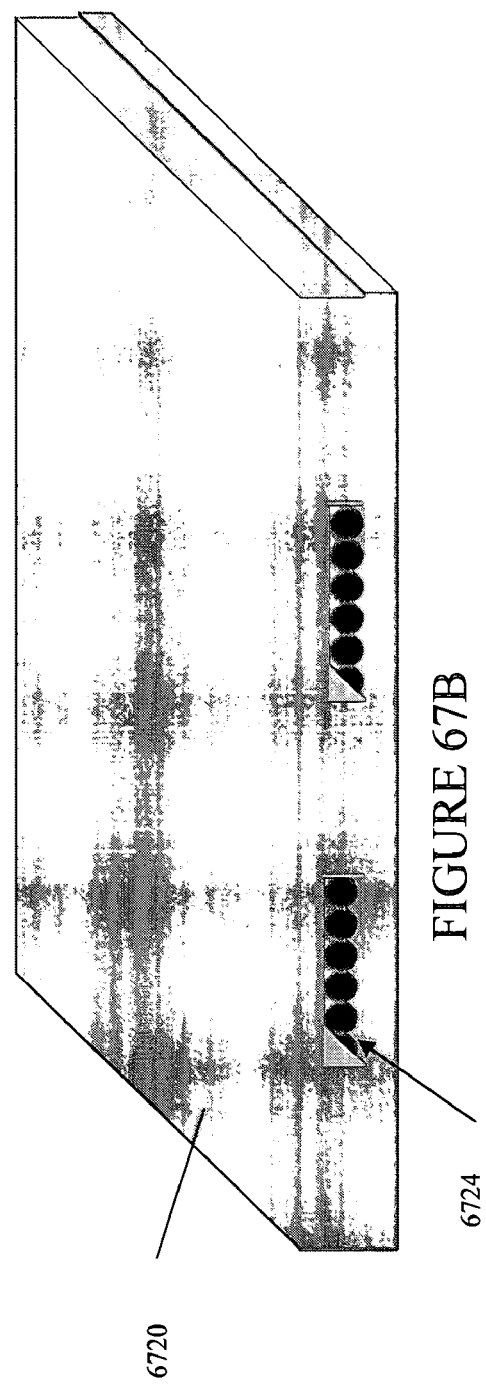
Figure 67C:
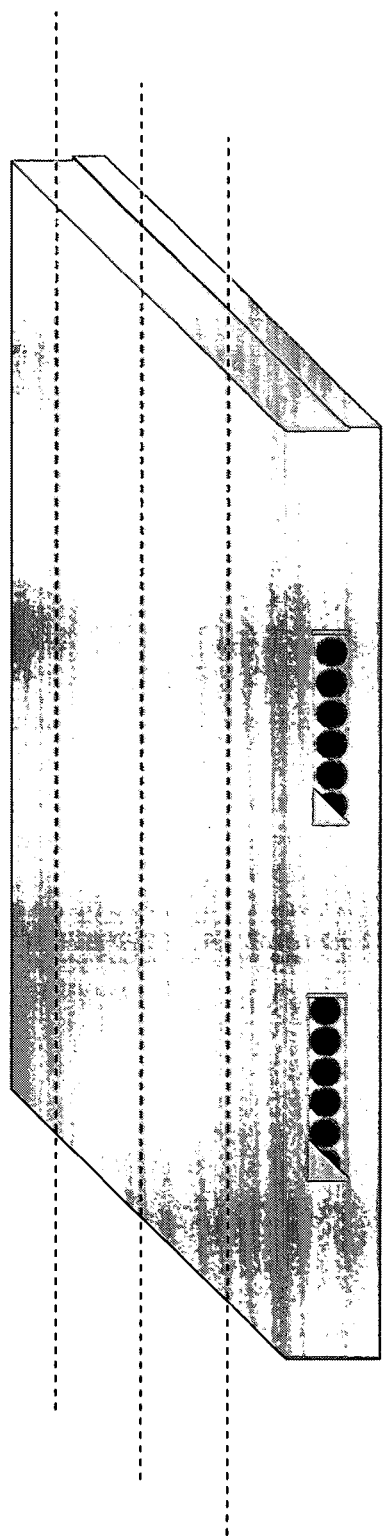
Figure 67D:
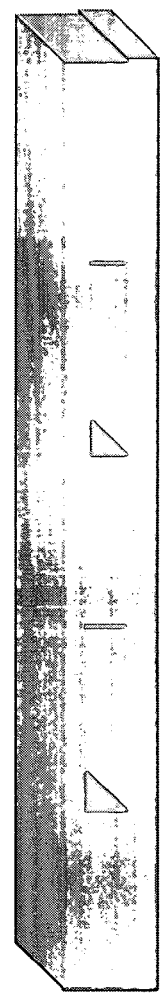

Referring now to FIG. 67B, a superstrate 6720 is provided on the spacers 6714 to complete the probe or probe precursor by defining an opening 6724. Alternatively, and referring to FIGS. 67C and 67D, the probe may be cut into segments as shown by dashed lines in FIG. 67C.

Figure 68A:
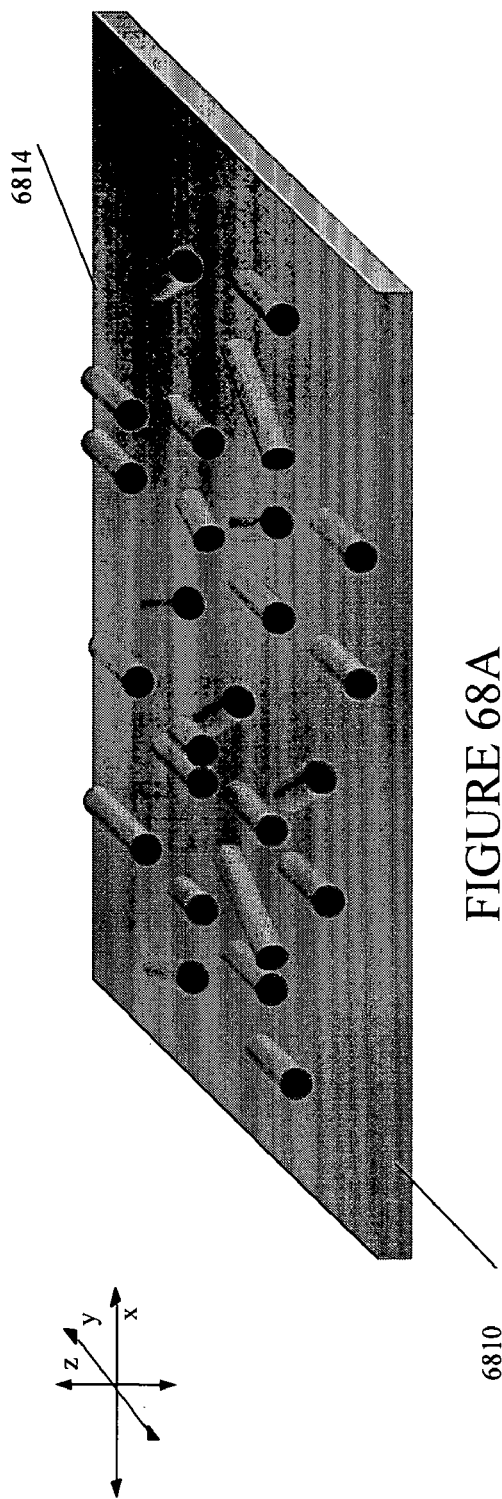
FIGS. 68A-68B show a method according to another embodiment of the present invention for manufacturing a probe using spacers to define a tip opening.
Figure 68B:
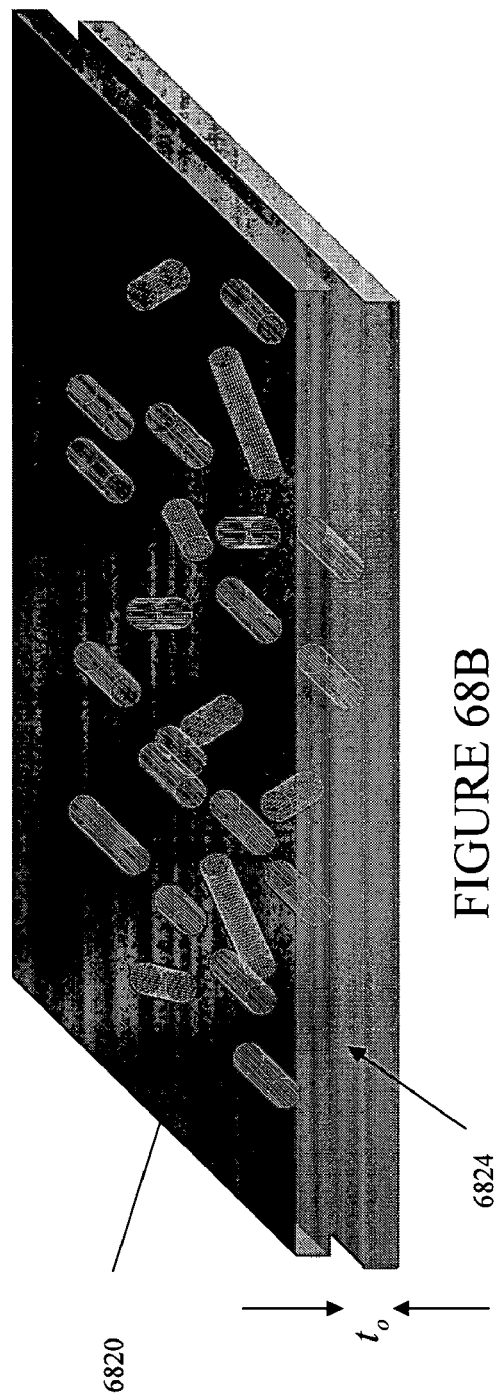

In another example, and referring to FIGS. 68A-68B, a plurality of spacers 6814 are disposed generally in a random fashion upon the surface of a substrate 6810. Referring now to FIG. 68B, a superstrate 6820 is provided on the spacers 6814 to complete the probe or probe precursor by defining an opening 6824.

System Overview

General System

Figure 69:
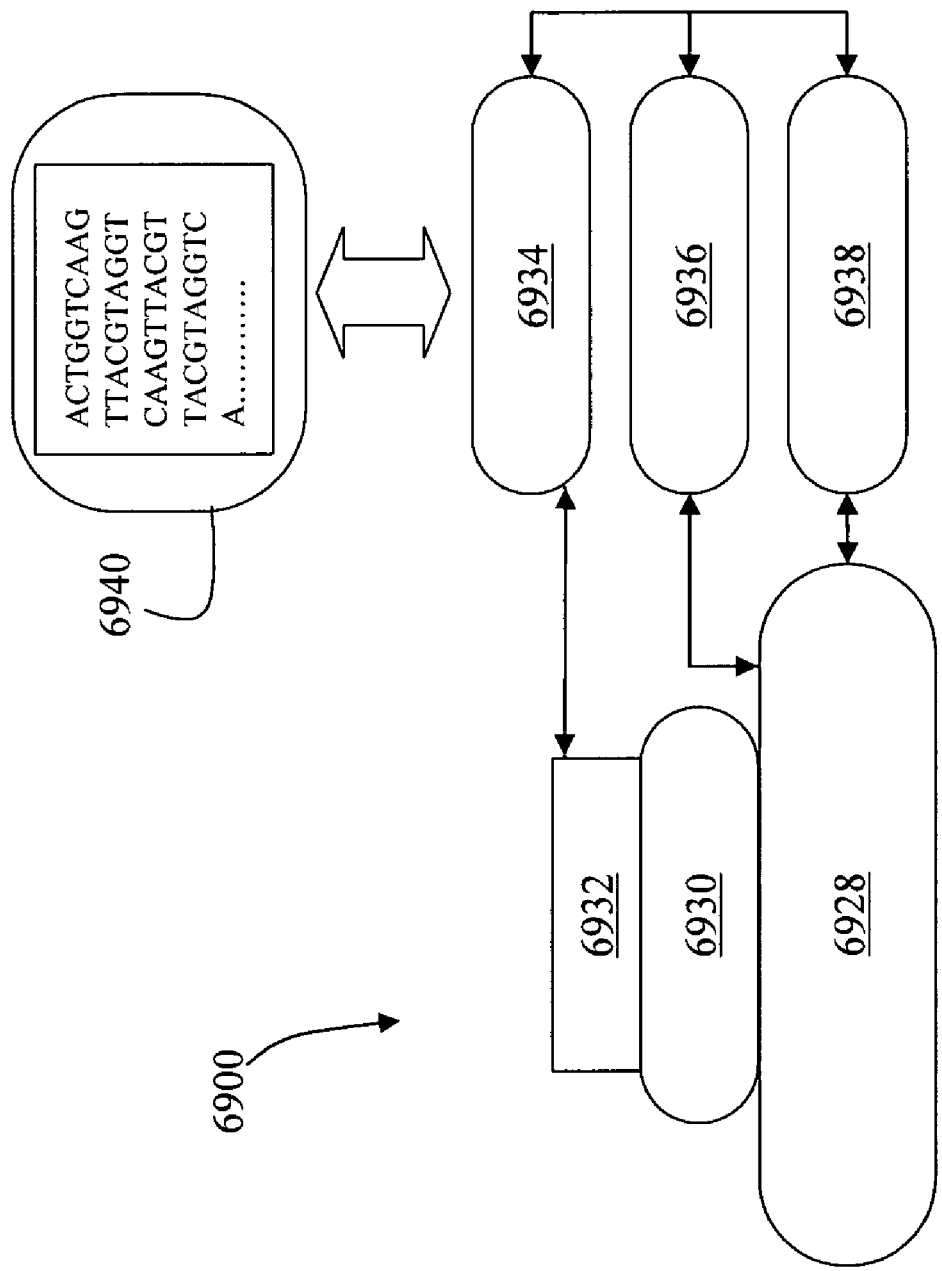
FIG. 69 is a schematic overview of a system according to the present invention for analyzing extended object specimens.

Referring now to FIG. 69, a schematic overview of a system of the present invention for analyzing extended object specimens is shown. The system 6900 generally includes a specimen platform 6928, a probe set 6930 and a detector sub-system 6932. The platform 6928 is operably coupled to a motion controller 6938, for controlling motion of the platform. Alternatively, the specimen may be moved within the platform. In a further alternative, the probe set (and optionally the associated detector sub-system) may be moved relative to the platform with the specimen. Further, the system 6900 includes a bias sub-system 6936 for control of field application (voltage applied across base and probe) and optionally other stimuli. In general, in certain systems described herein, when a hybridization event occurs, a measurable increase in current is detected.

In certain embodiments, a low detection voltage may be applied in a constant manner across the probe set and the platform. However, biased voltage application may be utilized to minimize or eliminate noise.

Data regarding the specimens is collected and processed by a processor sub-system 6934, which is coupled to an output sub-system (e.g., a display, data port, etc.) 6940.

In operation, a specimen such as a single stranded polymer (e.g., a denatured strand of DNA) is directed through a path or channel in the platform. The probe set detects characteristic features of the polymer specimen, preferably detecting characteristic about each sequential monomer in the specimen polymer. The specimen is moved relative the probe set in a controlled manner, e.g., by step motion to allow the probe set to obtain characteristic information about each monomer or group of monomers. The sequence information is collected, processed and outputted.

In certain embodiments, high resolution is attainted by utilizing a probe having a tip dimension, or an active tip area, that is equal to or less than a characteristic sub-object of the extended object, such as a nucleic acid within a DNA or RNA strand or fragment. In further embodiments, the width dimension of the probe is much larger than the width of thickness of the extended object, for example, having width w of about 10 nanometers to about 100 nanometers, 100 nanometers to 1000 nanometers, or several microns for analyzing specimens such as typical DNA strands or fragments. Further, the enlarged width dimension as compared to the tip or active area is useful in that additional tolerance is provided for the path of channel of the specimen and/or the stretching procedures.

Figure 70:
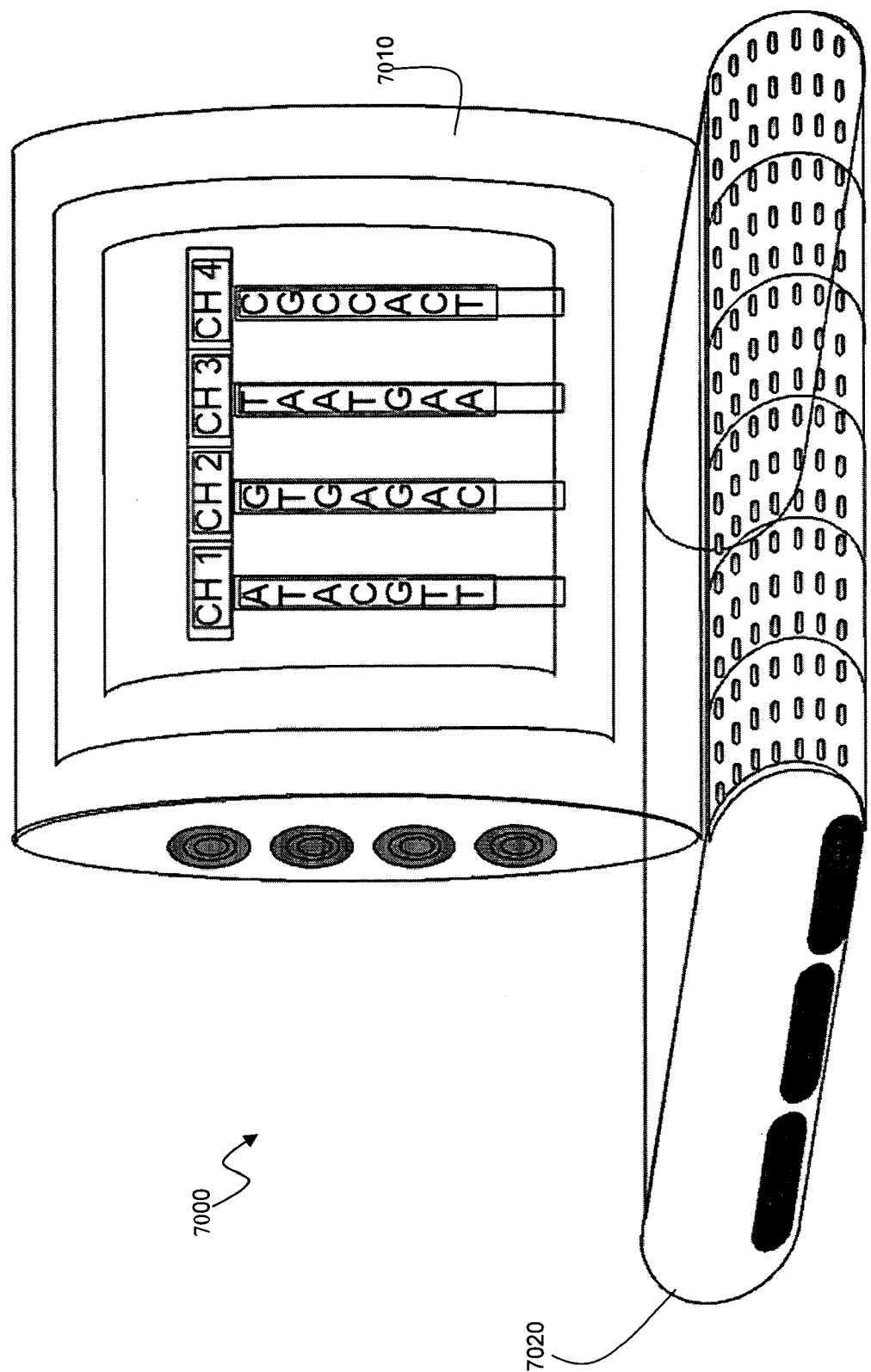
FIG. 70 is a schematic overview of another system according to the present invention for analyzing extended object specimens.

Referring now to FIG. 70, an embodiment of an ultra-fast DNA sequencing system 7000 is shown. The sequencing system uses a nozzle array 7010, as described herein. Further, the sequencing system uses a nano-metrology system 7020 to precisely guide denatured DNA strands across the individual nozzles in the nozzle array.

Figure 71:
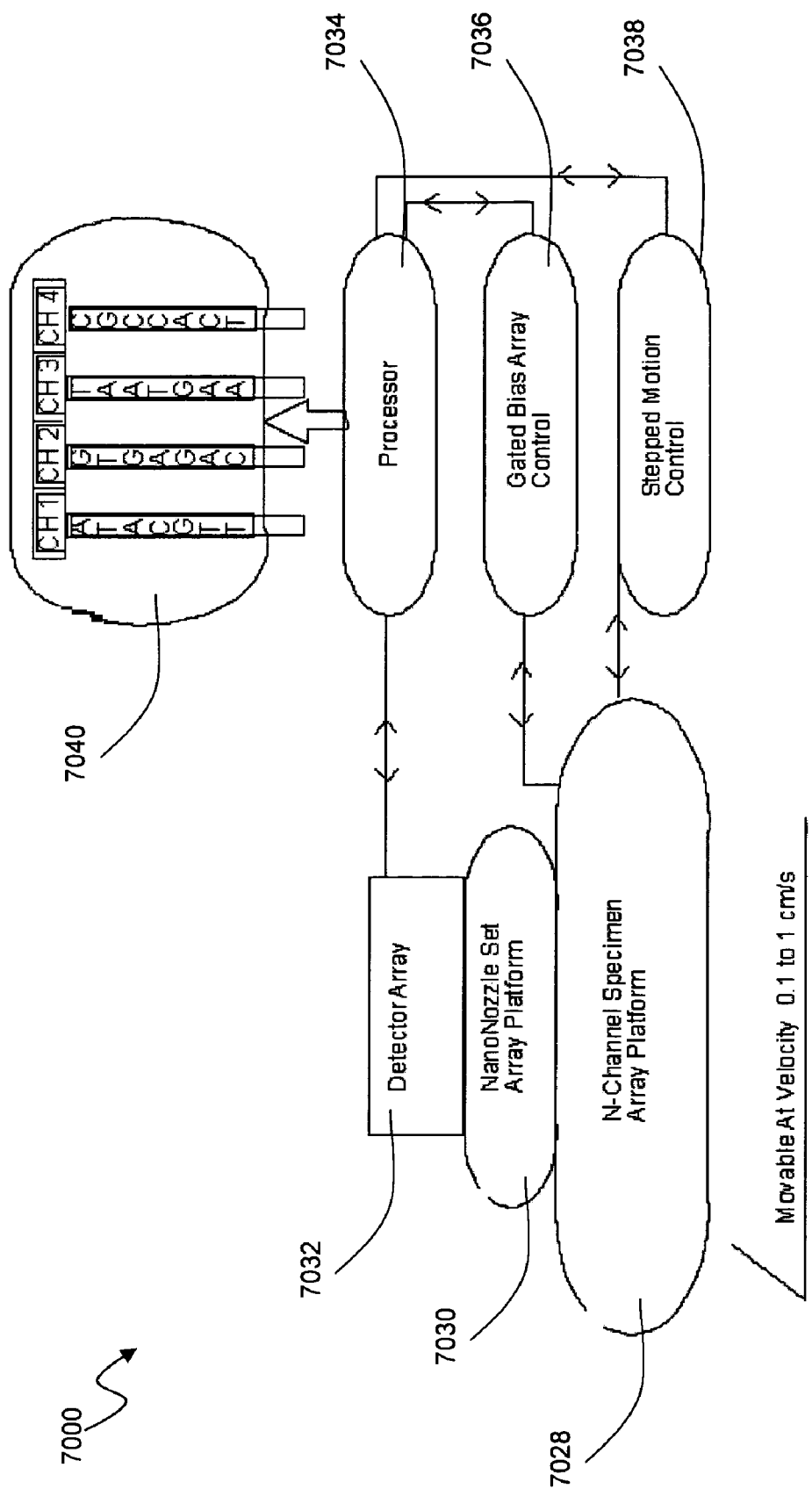
FIG. 71 is a schematic overview of major components of a system according to the present invention for analyzing extended object specimens.

Referring now to FIG. 71, a schematic of major components of the ultra-fast DNA sequencing system 7000 are shown. A nano-nozzle set array platform 7030 upon an N-channel specimen array platform 7028 is operably connected to a detector array 7032 associated with a processor 7034, generally for determining instances of hybridization events induced by the biases applied via a gated bias array control 7036. The DNA specimens are maintained and displaced in relation to the array with a stepped motion control 7038, which is also operably connected to the processor 7034. The array platform 7028 is movable at a velocity of about 0.1 to about 1 cm/s. Preferably, as shown, the motion is in a stepped manner, as described herein. The sequencing results are shown on a sequence display 7040.

The stepped motion is important in preferred embodiments, as the motion and number of steps helps maintain knowledge of position on the ssDNA, and ultimately the position of hybridization events. The stepped motion may be from about 5% to about 100% of the nozzle opening dimension, preferably about 10% to about 25% of the nozzle opening dimension.

The gating is also important in preferred embodiments, as extremely synchronized current measurements, bias, motion steps, or other excitations are crucial to ultra-fast real time DNA sequencing.

Figures 72, 73A, 73B:
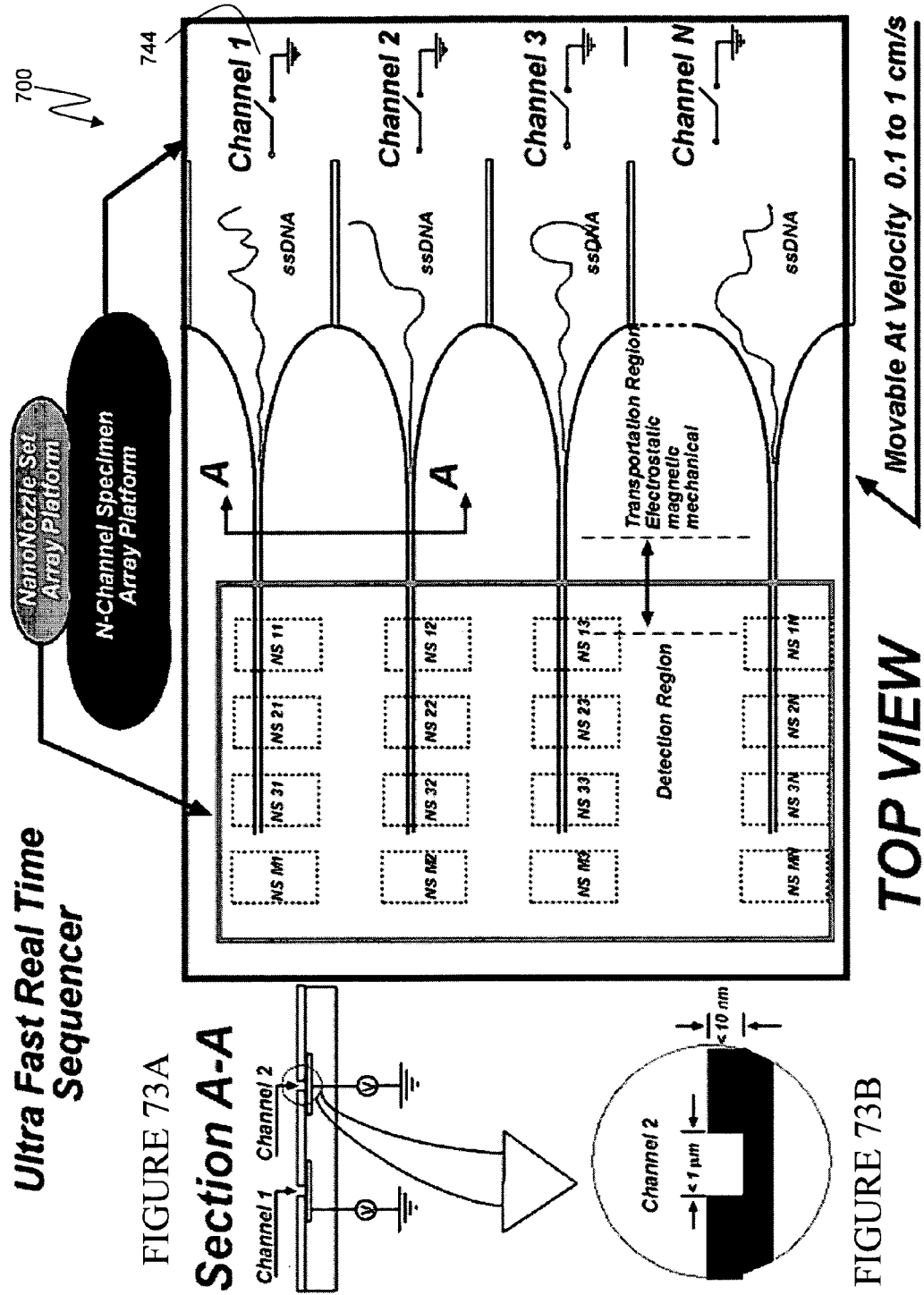
FIG. 72 shows a top view of a system according to the present invention for analyzing extended object specimens.
FIGS. 73A-73B show detailed views of a channel in the system of FIG. 72.

Referring now to FIG. 72, a top view of the ultra-fast DNA sequencing system 7000 is shown. The DNA specimens are denatured and maintained within channels 7044.

Referring now to FIGS. 73A-73B (wherein FIG. 73A is a section along line A-A of FIG. 72), each channel 7044 includes biasing systems for applying voltages across the DNA samples. As described in more detail herein, hybridization events induce measurable current variations across each of the nanonozzles within the nanonozzle set array platform. Preferably, the alignment between the nanonozzles and the channels is extremely precise.

Figure 74A:
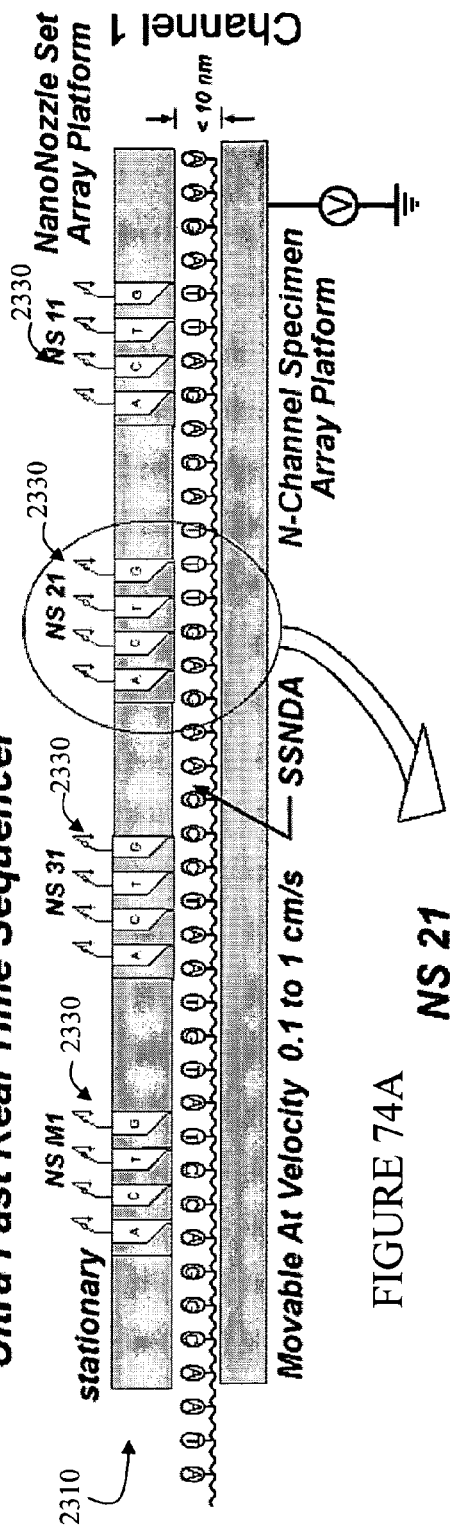
FIGS. 74A-74C show a system having a series of probe sets, a probe set including nozzles or probes, and an enlarged view of probe, respectively, according to certain embodiments of the present invention.
Figure 74C:
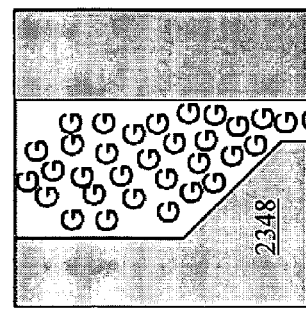
Figure 74B:
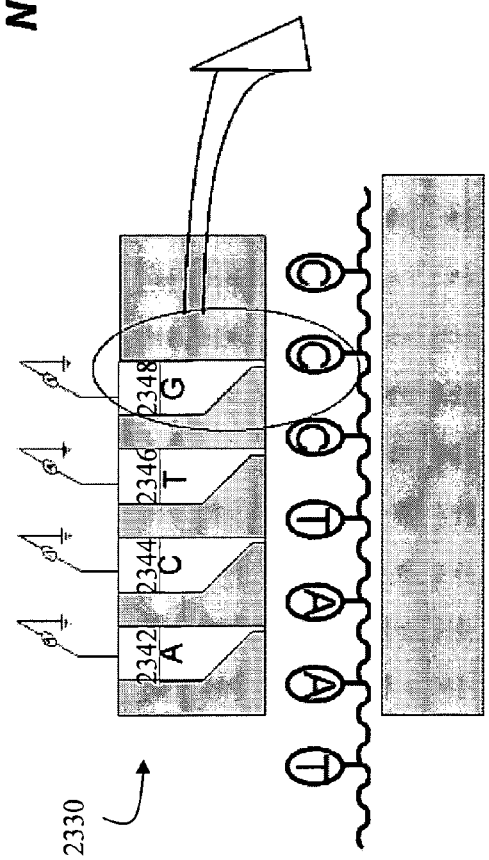

Referring now to FIGS. 74A-74C, a system 7400 including series of probe sets 7430, a probe set 7430 including nozzles or probes 7442, 7444, 7446 and 7448, and an enlarged view of probe 7448, respectively, are shown. The nanonozzle set array platform 7400 includes nanonozzles with wells, or nucleotide reservoirs, of A, C, T and G molecules. The strands are moved along the channel and molecules from the nucleotide reservoirs interact with the molecules of the strand through the nozzle. These molecules hybridize with one other molecule (e.g., A with T, C with G). In general, the hybridization event (e.g., as shown in FIG. 74C) produces measurable and detectable current pulses, thereby allowing identification of the molecule.

Figure 75:
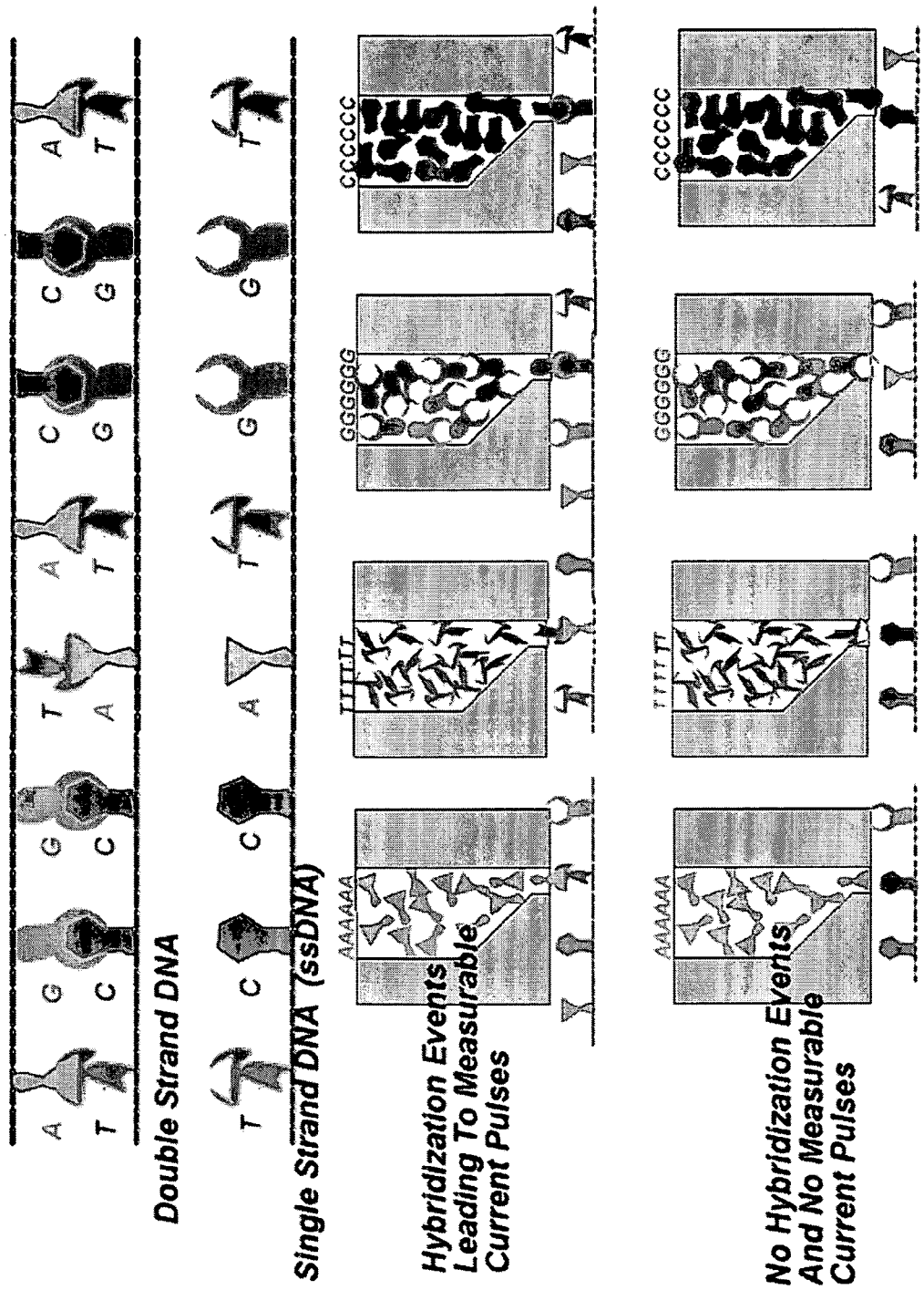
FIG. 75 shows detailed views of hybridization events within systems according to certain embodiments of the present invention.

Referring now to FIG. 75, detailed views of hybridization events are shown. In certain detection schemes described herein, a hybridization event at the nanonozzle results in a measurable current pulse.

Figure 76:
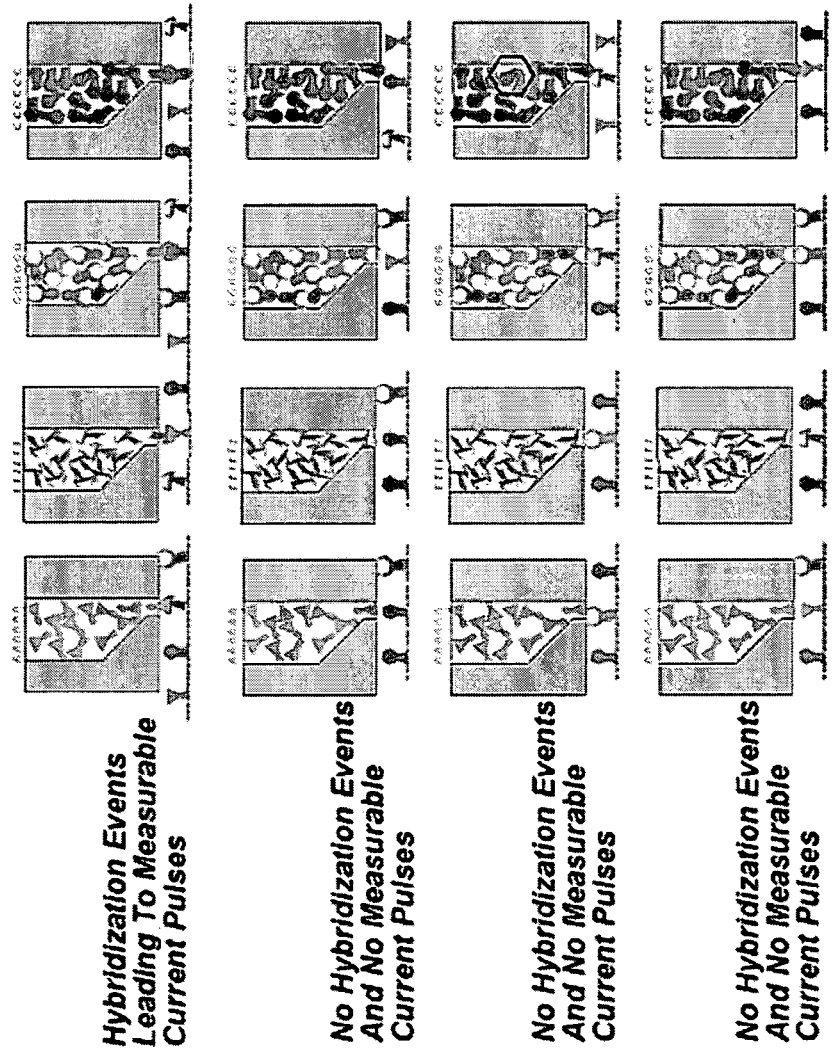
FIG. 76 shows all possible 16 combinations of A, T, G and C for sequencing.

Referring now to FIG. 76, it is shown that, of all possible 16 combinations of A, T, G and C, only four produce desired current pulses upon a hybridization event.

As mentioned above, only a hybridization event produces a measurable (nanoseconds) current pulse at the nozzle. For optimized operation, the following principles apply.

All excitation sources, detectors and stepped motion are synchronized.

Synchronized steps should be a fraction of the nozzle opening size (e.g., on the order of 5 nanometers).

Nozzle locations should be known with nanometer or subnanometer precision in relation to a known reference position.

Nanometer alignment is very important to optimal operation.

Vibrations and other agitations should be minimized.

A sub-system is provided to measure very low amplitude nanosecond pulses.

For continuous real time measurement of millions, or even hundreds of millions, of base pairs, a wide dynamic range sub-nanometer stepper is preferred.

To calibrate the system, it is desirable to use known samples.

Stimuli

In a preferred embodiment, the probes in the form of electrode conductors and/or other stimuli are applied in a gated manner. This reduces the signal to noise ratio thereby allowing for increased sensitivity and ability to resolve the sequence of the specimen.

Detection of a hybridization event may be accomplished in certain embodiments by observing variations in resonant capacitance. For example, an AC bias is imposed through a probe and a grounded platform (or alternatively AC bias may be imposed through the platform and the probes are sequentially grounded). The AC bias will alternately deplete and accumulate the specimen. The change in capacitance ΔC is recorded, for example, using a lock-in technique. The measured value ΔC may be the value across the entire C-V curve when larger AC voltages are used, or measured value ΔC may be the differential capacitance dC/dV when smaller AC bias voltage is used. The variation in the load across the specimen occurs due to characteristics of the portion of the specimen to be resolved such as a monomer on a polymer strand, or due to creation of a hybridization event when the probe includes a hybrid pair counterpart. This load variation changes the resonant frequency of the system.

Electrical conductors as probes according to preferred embodiments of the present invention, formed as described above with respect to FIGS. 1A-1D above (e.g., in the configuration with a very fine tip compared to the back end, or a "knife edge") also serves to lower the resistance of the conductor.

Various embodiments of stimuli application are possible. 1) voltage only; 2) voltage plus light (AND gate) (light is a noise reduction means); 3) synchronization with gating, pulsed voltage, light, and current gate leads to substantial noise reduction; 3a) controlled stepping; 3b) apply voltage and light (AND gate)—light of different wavelengths to enhance inelastic tunneling current; 3c) apply current gate (measure with ammeter); 4) kT (thermal energy) may be reduced under low temperature operating conditions, e.g., T between 4 and 100 K.

Gated detection serves to minimize noise and allow for precise resolution of the extended object. Gated detection is necessary to ensure the detection of picoamp level currents in the presence of noise. One effective strategy is to apply all of the stimuli in the proper sequence, in the form of pulses. The pulse widths and heights are adjusted to achieve optimum results. The levels of voltage will be in the 10 s of millivolts up to about 1 volt. The pulse durations may be about 1 nanosecond to about 1000 nanoseconds, or longer if necessary.

The protocol for gated detection is described in the following steps: 1) apply a pulse to step the specimen relative to the platform to a position to measure a portion of or a nucleotide of the specimen; 2) subsequent application of an electric field to provide contact between the specimen and the probe; 3) optional application of a laser pulse; 4) application of tunneling device voltage pulse; 5) applying a pulse to open the switch to the current measure device; 6) repeating 1-5 to measure the subsequent portion of the specimen or nucleotide to sequence. These steps 1-5 are synchronized pulses synchronized to a master clock. In the event that particle beams are applied, or intensifiers, these will also have appropriately applied excitation pulses to activate them synchronized with said clock. These gated synchronized methods allow one to measure the detectable interaction with a high signal to noise ratio.

Figure 77:
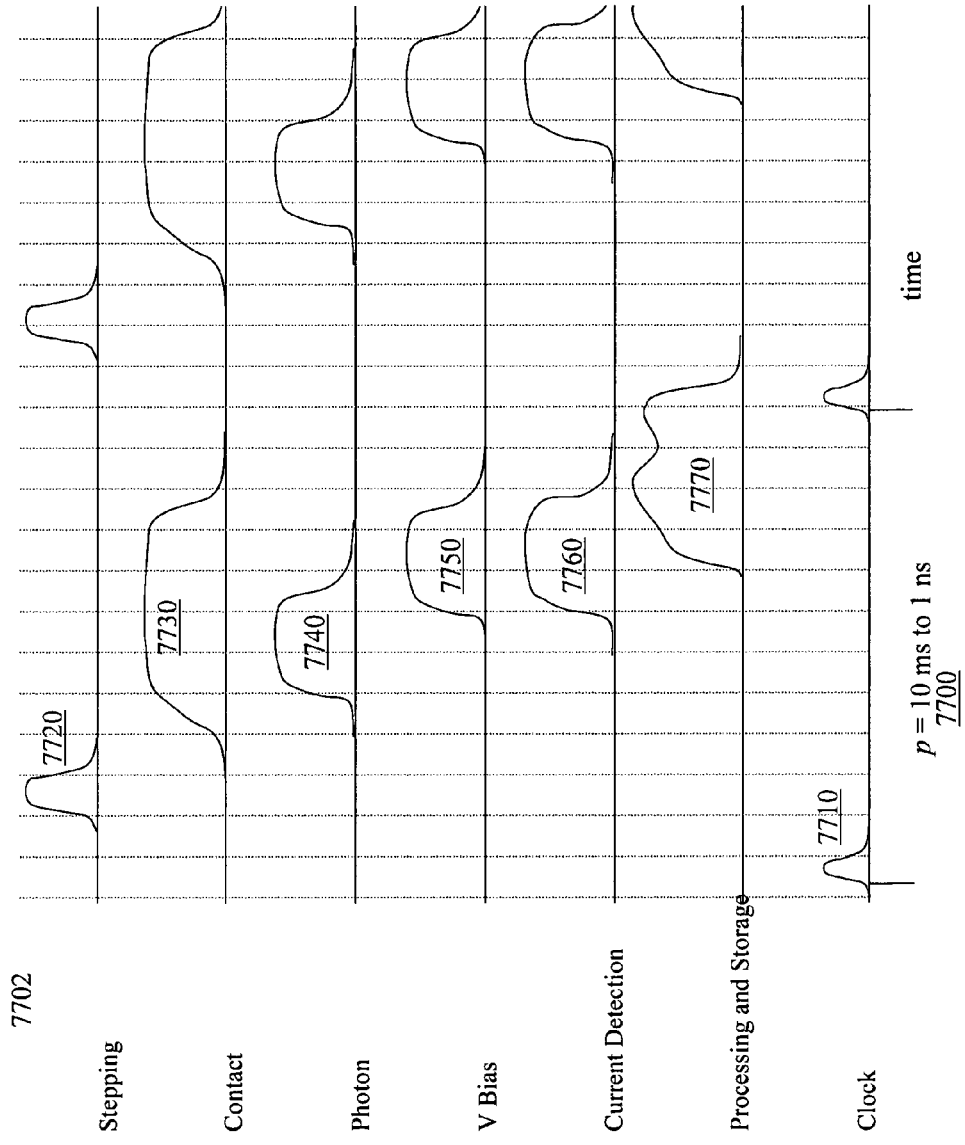
FIG. 77 plots a sampling period of a series of synchronous excitations are charted relative to clock signals according to certain embodiments of the present invention.

For example, referring now to FIG. 77, a sampling period 7700 of a series of synchronous excitations are charted on a plot 7702 relative to clock signals 7710. A stepping period is shown as a short pulse commencing at a certain time indicated on a horizontal axis 7720, e.g., at the start of the sequence. A contact period is shown as commencing after the stepping period as indicated on a horizontal axis 7730 and ending during of after measurement and/or processing and storage periods. A photon period is shown as increasing in amplitude after the commencement of the contact period as indicated on a horizontal axis 7740 and ending proximate the end of the contact period. A voltage bias period is shown as commencing during the photon period as indicated on a horizontal axis 7750 and ending proximate the end of the contact period. A current detection period is shown as commencing during the photon period and the voltage bias period as indicated on a horizontal axis 7760 and ending proximate the end of the contact period. A processing and storage period is shown as commencing near the end of the photon, voltage bias and current detection periods as indicated on a horizontal axis 7770 and ending after the end of the contact period.

Figure 78:
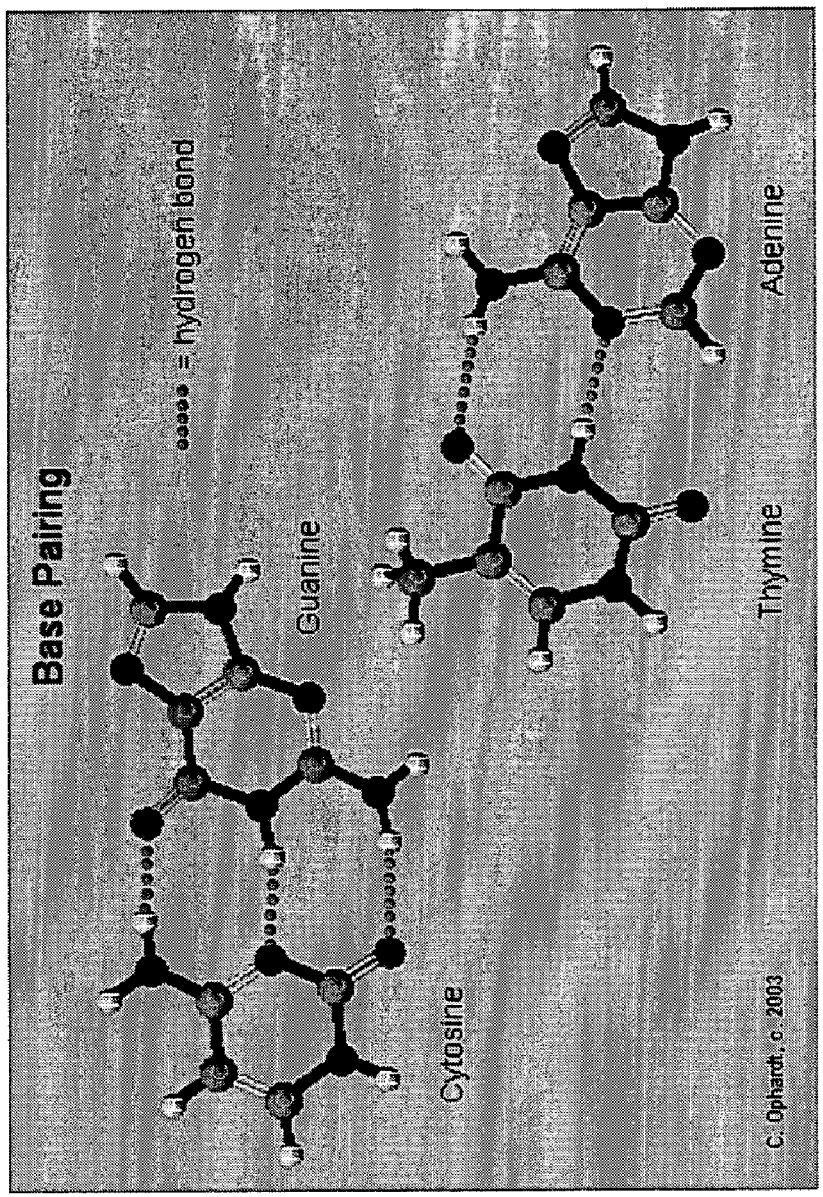
FIG. 78 shows the typical Watson and Crick base pairing model.
Figure 79:
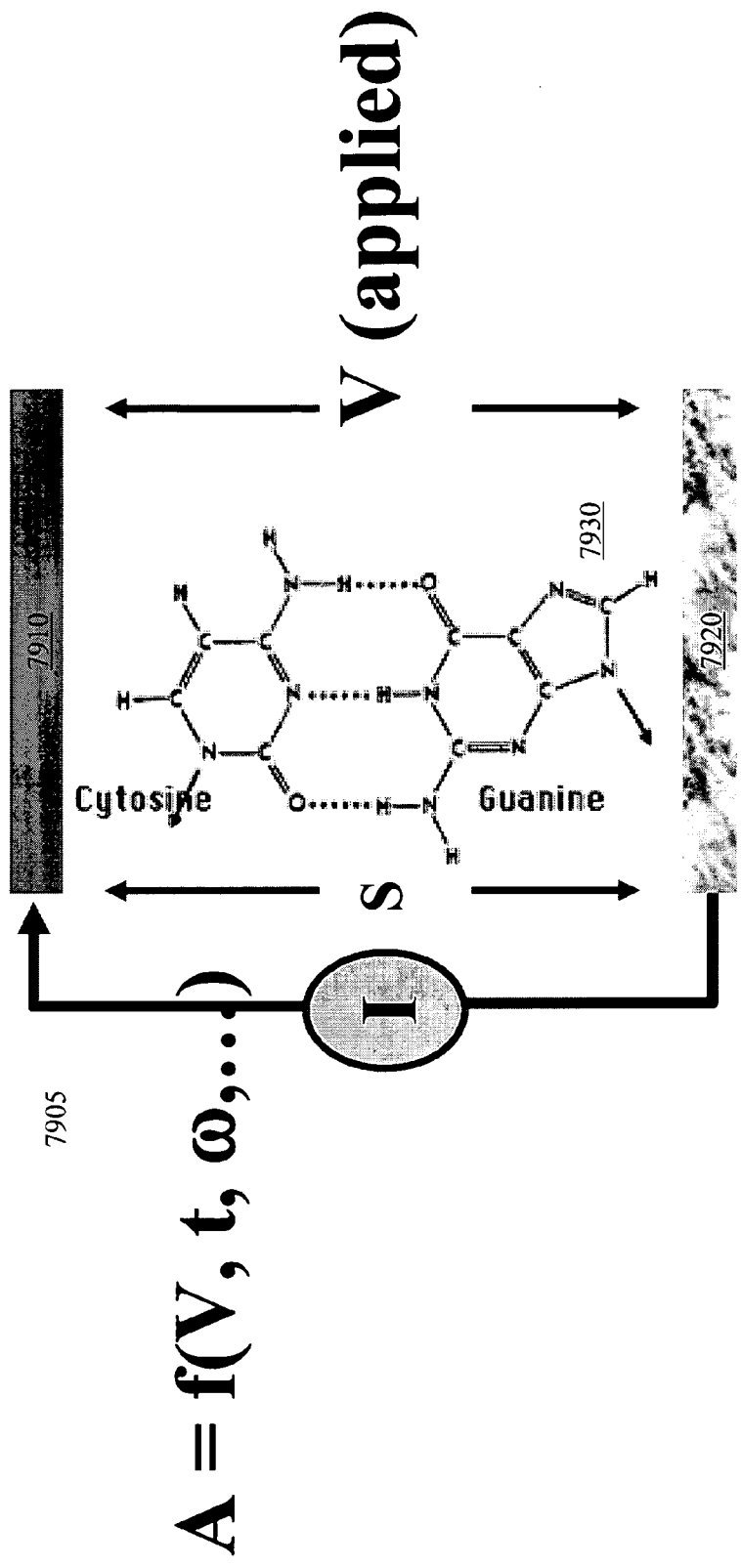
FIG. 79 shows a system including a probe a substrate having a specimen thereon, the probe being designed to induce a hybridization event to detect various quantum tunneling contributions.

Detection of the portion of the specimen under examination may occur by various contribution. In general, the detection schemes allow for molecular level (or detection of one or more monomers, or certain groups of monomers, in an extended object to be analyzed) identification of monomers within a chain. Induce a hybridization event and measure conductance variation In a single strand specimen analysis systems having probes that induce a hybridization event, detection contribution includes elastic tunneling, inelastic tunneling, resonantly enhanced tunneling, and/or capacitance. FIG. 78 shows the typical Watson and Crick base pairing model. Referring now to FIG. 79, a system 7905 schematically shown including a probe 7910 and a substrate 7920 having a specimen 7930 thereon. The probe is designed to induce a hybridization event, as described herein, by including a complementary specimen in a well, on a substrate, or by other configurations. A voltage bias is applied, for example, that corresponds to the N—H bonds and O—H bonds formed during a hybridization event.

Elastic Tunneling Contribution

The elastic tunneling contribution in systems having probes that induce a hybridization event is generally due to the tunneling interaction variations that occur due to the distance between hybridized species. When a hybridization event occurs, the distance between the hybridized monomers (nucleotides) is modulated as the bond is created. As the tunneling barrier thickness decreases, tunneling probability increases and thereby increases the tunneling contribution. This will be manifested in the increase of conductance as measured in the current-voltage characteristics of the hybrid bond. When no hybridization event occurs, the distance between the probe capable of inducing a hybridization event and the specimen nucleotide remains relatively large, and hence the elastic tunneling contribution is relatively low.

Figure 80:
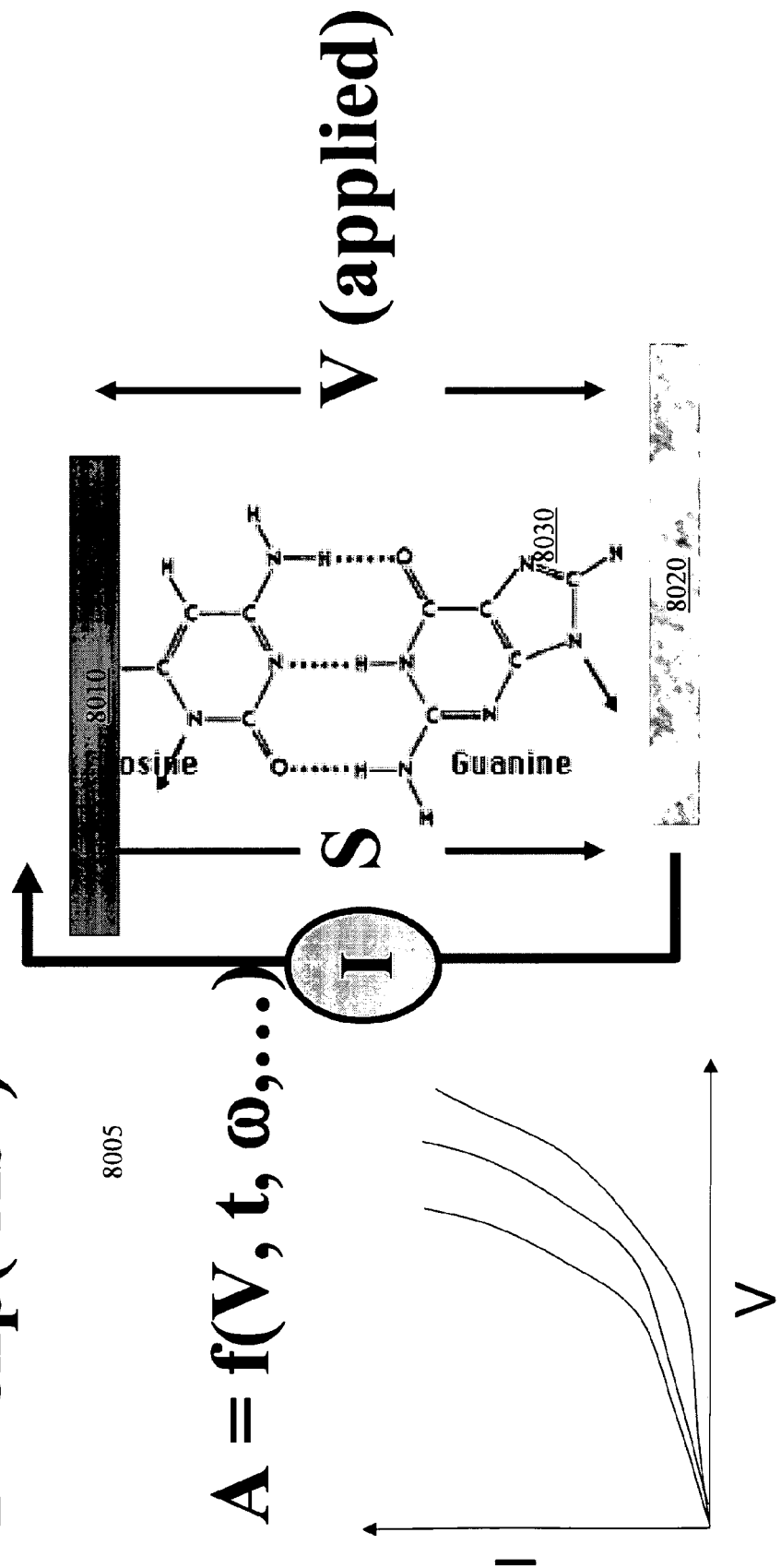
FIG. 80 shows a system including a probe a substrate having a specimen thereon, showing detection of an elastic tunneling contribution.

Referring now to FIG. 80, system 8005 schematically shown to illustrate the elastic tunneling contribution. When a bond is established as a result of the relatively shorter distance (thinner tunneling barrier) that results for the H-Bond. This manifests itself as an increase of the conductance, and hence higher current. Note this elastic tunneling contribution generally does not involve exciting a resonance.

Inelastic Tunneling Contribution

The inelastic tunneling contribution in systems having probes that induce a hybridization event is based on increased bond energies, especially hydrogen bond energies. During a hybridization event, as electrons tunnel, the electrons lose energy by exciting the hydrogen bond created as a result of the hybridization event. This leads to a tunneling contribution at a voltage correlating to the energy of the bond. When no hybridization event occurs, there is no hydrogen bond created, therefore there is no inelastic tunneling to excite such a bond, and therefore no conductance contribution should be observed.

Figure 81:
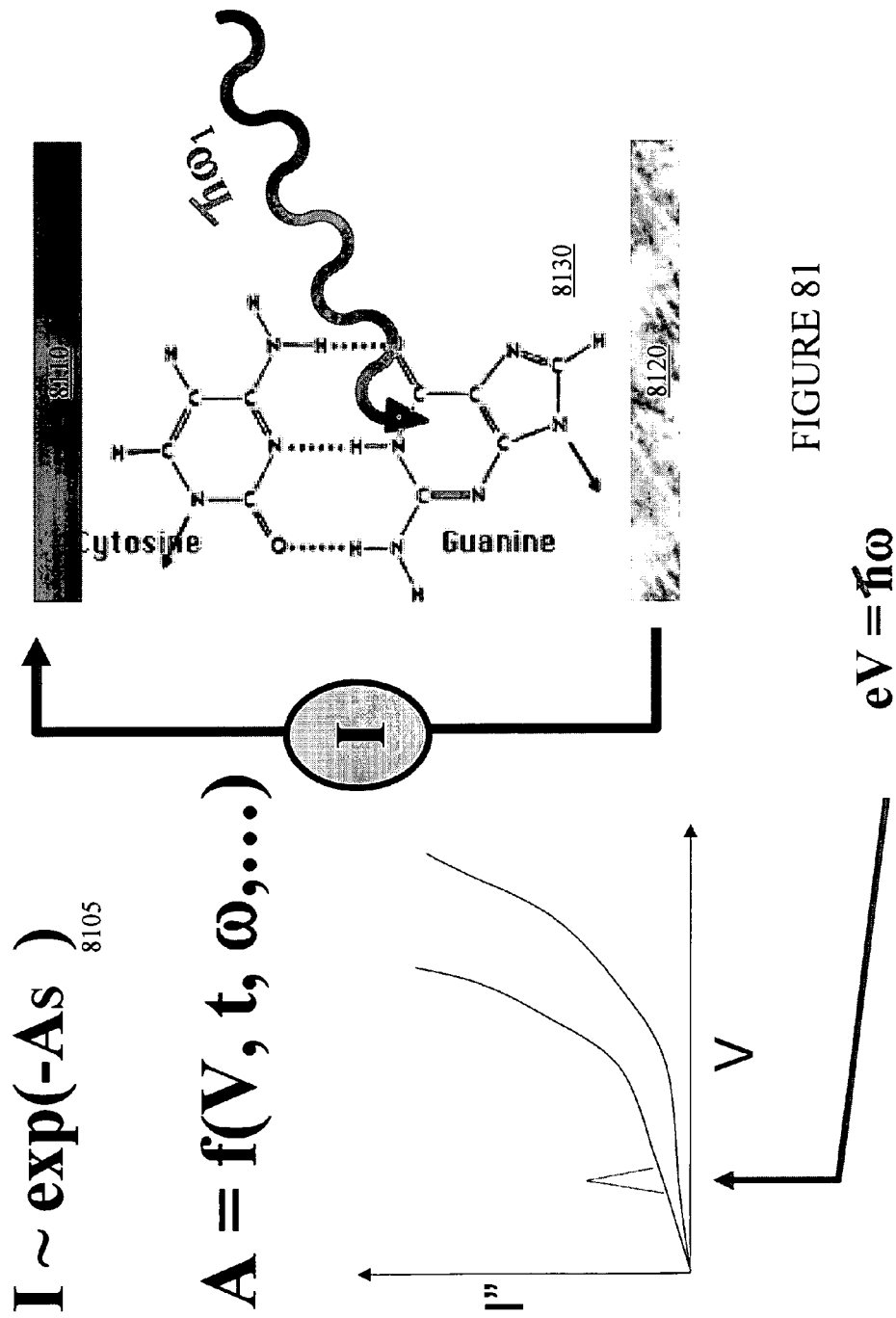
FIG. 81 shows a system including a probe a substrate having a specimen thereon, showing detection of an inelastic tunneling contribution.

Referring now to FIG. 81, system 8105 schematically shown to illustrate the inelastic tunneling contribution. In addition to the above increase in current due to the elastic tunneling contribution, another increase will be detected due to an inelastic tunneling contribution resulting from exciting the resonance of the H-Bond.

Resonantly Enhanced Tunneling Contribution

The above may enhanced by applying a source tuned to the bond frequency, thus providing an optically enhanced inelastic tunneling contribution. For example, a tuned light source may be applied in conjunction with the measurement bias. This optically enhanced inelastic tunneling component contributes to minimizing the noise effect by acting as and "AND" gate, such that current signal detection is primarily when synchronous application of the optical signal "AND" the bias voltage (both tuned to the resonance).

Figure 82:
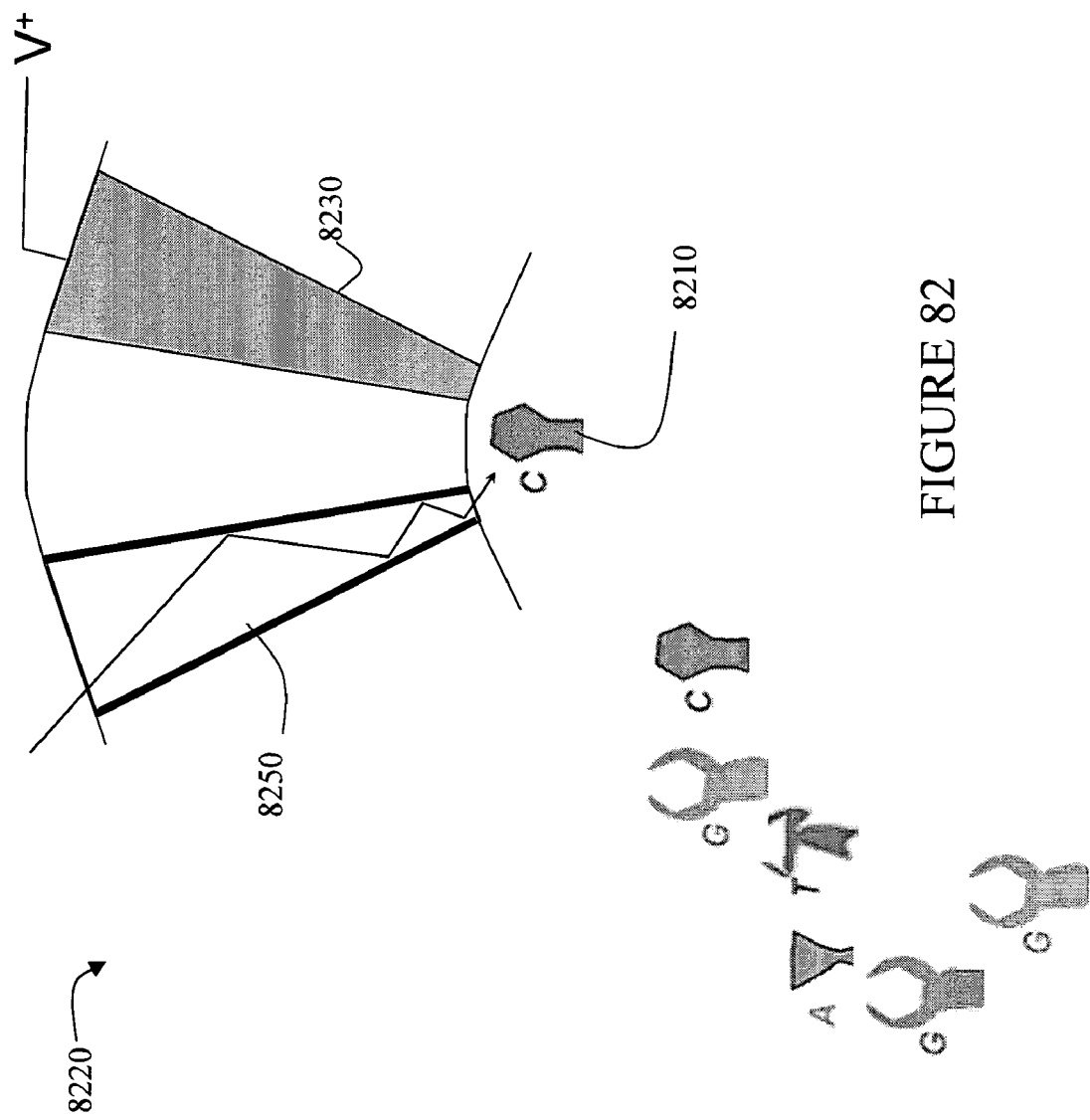
FIG. 82 shows an embodiment of the present invention whereby a probe is used in conjunction with a second probe or light nozzle.

Referring now to FIG. 82, another embodiment of the present invention is shown. A specimen portion 8210 is within a probe system 8220 including a first probe 8230 and a light nozzle 8250. The light nozzle 8250 and the first probe 8230 are activated, either sequentially, simultaneously or overlapping in time, to facilitate current detection, measurement, or other impact of the detection contribution effect, as described above. The first prove 8230 may include any one of the above referenced types of probes. Alternatively, more than one probe may be used with a light nozzle 8250, for example, for photonic application, current measurement, voltage bias, or other functionality as described herein.

The resonantly enhanced tunneling contribution in systems having probes that induce a hybridization event is based on measurement of excited bond energies, particularly hydrogen bonds. Stimuli such as light application is applied. A resonantly enhanced tunneling contribution may be observed when a light source such as a laser having a suitably tuned wavelength excites the hydrogen bond created upon hybridization. Hydrogen bonds from the hybridization events can be excited by tuning a laser beam to the same energy as the bond. This will enhance the detection of both the elastic and inelastic tunneling contribution and add a resonant enhanced tunneling contribution to the measurement current. Further, noise is minimized with suitable gating as described herein since the pulsed application of the laser light source is synchronized with application of a voltage and during the opening of the measurement current sensor. These simultaneous interactions have the effect of a logical "AND" gate.

Capacitance Contribution

The capacitance contribution in systems having probes that induce a hybridization event is based on enhanced permittivity. Since the tunneling area is very small, the application of a laser beam tuned at or near the bond energy creates a resonantly enhanced permittivity at the hybridized pair. This in effect is like a quantum capacitance. This quantum capacitance, added to a specific inductive element, an RF resonant circuit, or a RF resonant cavity, results when the hybridization even occurs. For example, the inductive element, RF resonant circuit or RF cavity are excited and can give a very large signal. Since RF frequencies are at higher frequencies than the DC voltages, there is low noise in that region (avoiding the 1/F noise).

Figure 83:
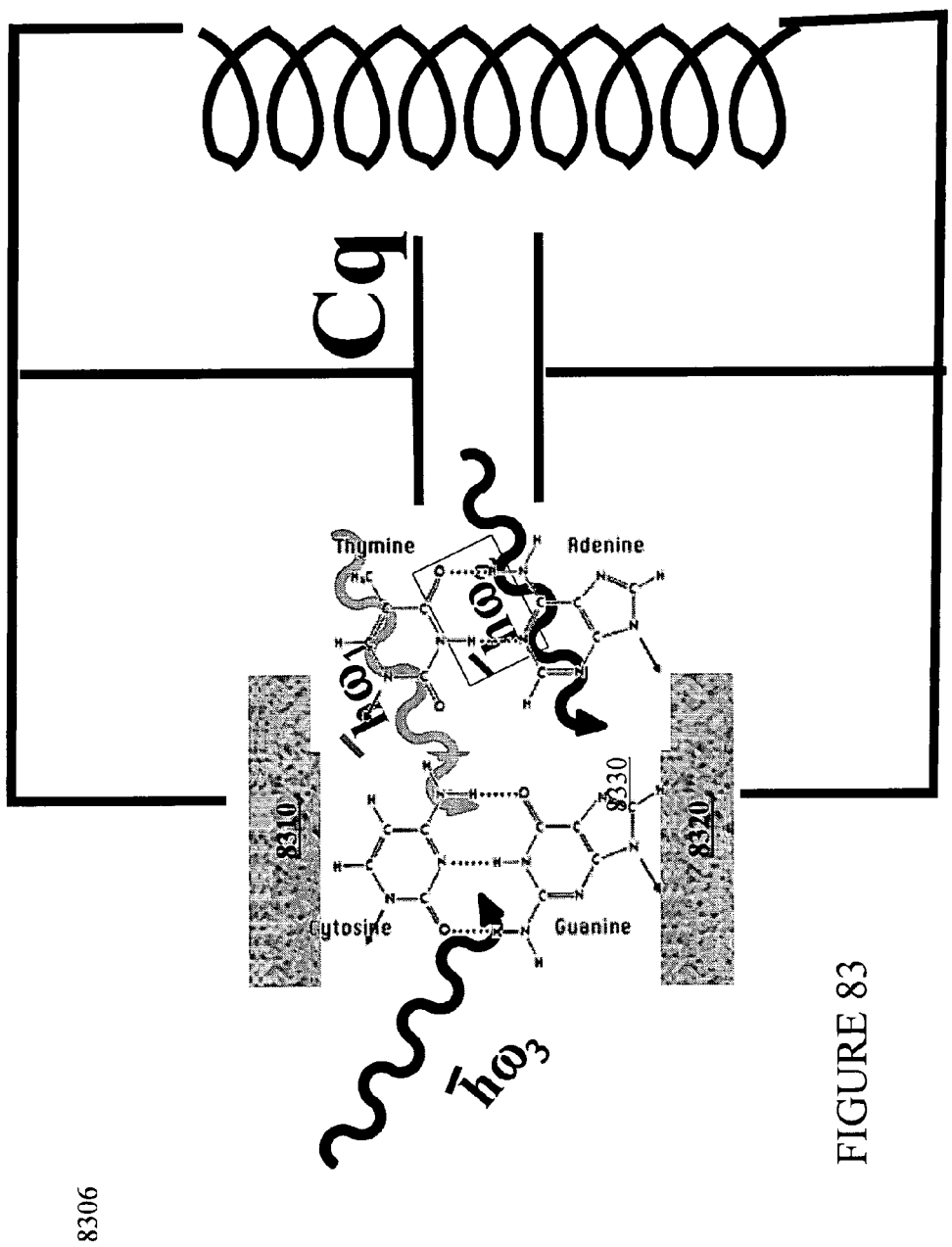
FIG. 83 shows a system including a probe a substrate having a specimen thereon, showing detection of a quantum capacitance contribution.

Referring now to FIG. 8384. system 8306 is schematically shown to illustrate the quantum capacitance contribution. The quantum capacitance contribution is a result of enhancement of polarizability of molecules by exciting suitable resonances, including O—H or N—H bonds, and further rotational, vibration, and electronic. These are represented in FIG. 83 by resonances $h\omega 1$, $h\omega 2$, and $h\omega 3$. The energy is represented by:

$$Eqc=\tfrac{1}{2}(Cq\ V2).$$

RF measurement is conducted using special resonance circuits that include "quantum capacitance" which will be enhanced when O—H or N—H resonances are excited by external radiation tuned to these resonances. This is expected because the capacitance is related to the permittivity of the interaction between the probe 8310 and the sample 8330. This permittivity has a susceptibility component which in turn is given by the polarizability at the molecular level. The value of this polarizability has many resonant contributions, including vibrational, rotational, and electronic. It is well known that if any one of these resonances—vibrational, rotational, or electronic—are excited, even away from the specific bonds, a significant increase in the polarizability, and hence the capacitance, results. The optimum tank circuit, e.g., in microwave or millimeter wave, will be excited and detected. Since these are high frequencies, we will be far away from the 1/f noise regime, thus the signal to noise ratio is large.

Probes that do not Induce a Hybridization Event and Measure Conductance Variation In a single strand specimen analysis systems having probes that do not induce a hybridization event, detection contribution includes inelastic tunneling, resonantly enhanced tunneling, and/or capacitance.

Detection based on the elastic tunneling contribution is not particularly effective without a probe that induces a hybridization event. Since the distance between the probe (in a system that does not induce a hybridization event) and the specimen nucleotide reaming relatively large, the elastic tunneling contribution is relatively low for all nucleotides. Therefore, an elastic tunneling contribution is not suitable for measurement detection system when using probes that do not induce hybridization events.

Inelastic Tunneling Contribution

However, detection of measurement current variances due on inelastic tunneling contribution may be used. Since there is no hybridization event (e.g., the probes are formed of conductors or other style that does not induce a hybridization event), we rely on the inherent resonance of each nucleotide to be analyzed.

Resonantly Enhanced Tunneling Contribution

Further, the resonantly enhanced tunneling contribution is suitable, wherein a light source (e.g., laser wavelength) is tuned to the inherent unique resonances of the nucleotides to be analyzed. The nucleotides to be analyzed are be excited by tuning a laser beam to that unique resonance, which will enhance the detection of the inelastic tunneling contribution and other contributions to the current measurement. Further, noise is minimized with suitable gating as described herein since the pulsed application of the laser light source is synchronized with application of a voltage and during the opening of the measurement current sensor. These simultaneous interactions have the effect of a logical "AND" gate.

Capacitance Contribution

The capacitance contribution in systems having probes that do not induce a hybridization event is also based on enhanced permittivity analysis. Since the tunneling area is very small, the application of a laser beam tuned at or near the inherent unique resonance energies creates a resonantly enhanced permittivity of the signature. This is in effect like a quantum capacitance. This quantum capacitance, added to a specific inductive element, an RF resonant circuit, or a RF resonant cavity, results when the signature energy occurs. For example, the inductive element, RF resonant circuit or RF cavity are excited and can give a very large signal. Since RF frequencies are at higher frequencies than the DC voltages, there is low noise in that region (avoiding the 1/F noise).

Measure AFM

In other embodiments of the present invention, instead of, or in conjunction with, measuring a current variation, a probe is used by bringing it close to a specimen, at known distance, whereby an attraction force will be detected. Rather than detect current flowing there through, detecting attractive or repulsive motion.

Knife edge AFM probe—contacts specimen, measures attractive or repulsive forces. It is well known that atomic force microscopy (AFM) is used to analyze nano-structures an atomic scale. One key element leading to the success of the AFM is attachment of a nano-tip to a cantilever that is made to deflect when the nano-tip measures forces of the interaction between said nano-tip an the structure under analysis. A laser beam reflecting from the cantilever measures the forces variations as the nano-tip scans the structure.

Measure AFM—Probe Set

Figure 84:
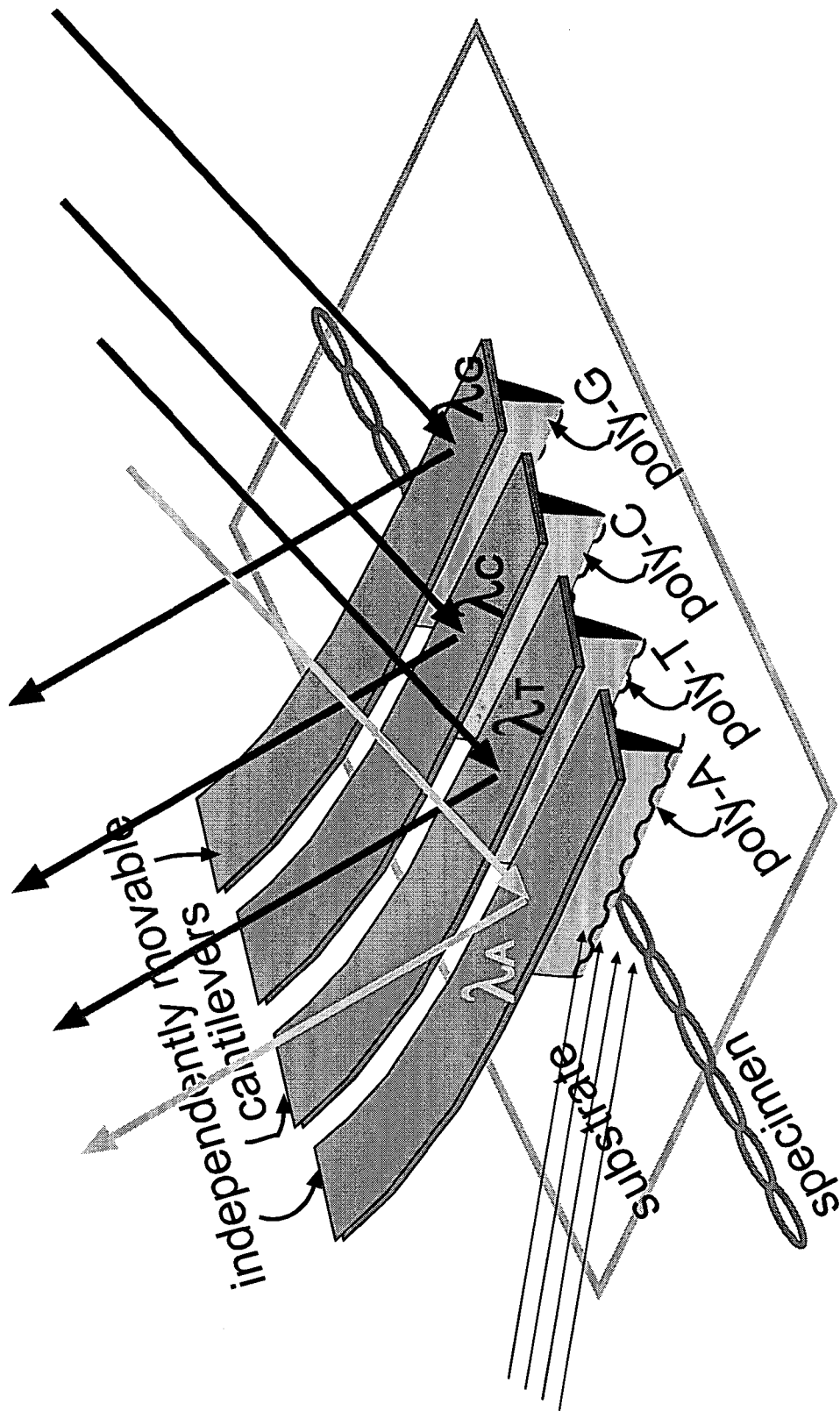
FIG. 84 shows a system according to an embodiment of the present invention whereby atomic forces are measured in a probe set or probe array system.

By utilizing the inventive embodiments taught herein, it is possible to analyze an extended object such as a DNA sequence by measuring the force as in AFM, instead of or in conjunction with the tunneling currents. This is shown in FIG. 84. Here the attractive force that results when A bonds with T and C bonds with G as a result of hybridization is relied upon to detect certain species. The specificity of the sequencing is accomplished by utilizing a probe with characteristics that allow it to attract certain species, such as by attaching poly-A, poly-T, poly-C, and poly-G oligomers to nano-edge probes, for example, as described herein. Each of the 4 nano-edge probes is attached to a different cantilever. A detector measures the deflection of each different cantilever which modulates the reflection of laser beams of a different wavelengths in the response to the interactive forces between the edge or tip nano-probe and the specimen to be analyzed.

The AFM sequencing processes and systems described herein may be further described by the following. An extended object such as a single strand DNA (SSDNA) is stretched and immobilized on a substrate. A sub-Angstrom resolution translation stage moves the specimen relative to the set of edge-nano-probes.

The edge nano-probe with the poly-A attached to it will experience and attractive force when it is proximate to or lands on the specimen with a T base. This force will modulate the reflection of the laser beam of wavelength $\lambda_A$ by the cantilever. The modulated reflected beam announces the presence of T at that location with the aid of a detector and processing electronics.

The edge nano-probe with the poly-T attached to it will experience and attractive force when it lands on the specimen with a Abase. This force will modulate the reflection of the laser beam of wavelength $\lambda_T$ by the cantilever. The modulated reflected beam announces the presence of A at that location with the aid of a detector and processing electronics.

The edge nano-probe with the poly-C attached to it will experience and attractive force when it lands on the specimen with a G base. This force will modulate the reflection of the laser beam of wavelength $\lambda_c$ by the cantilever. The modulated reflected beam announces the presence of G at that location with the aid of a detector and processing electronics.

The edge nano-probe with the poly-G attached to it will experience and attractive force when it lands on the specimen with a C base. This force will modulate the reflection of the laser beam of wavelength $\lambda_G$ by the cantilever. The modulated reflected beam announces the presence of G at that location with the aid of a detector and processing electronics.

The edge nano-probes with the poly-A, poly-T, poly-C, or poly-G will experience a weaker (no force or repulsive) force when either non complementary base, e.g. AonA, TonT, ConC, G, on G, AonC, AonG, TonC, or TonG. In these cases the beams reflected from the cantilevers will have small force modulation.

It is possible to use a single laser beam that is divided into 4 beam-lets, each is focused on different cantilever at certain positions, to minimize interference. This detector will specially resolve the positions of the beam-lets so as to differentiate and ensure specificity.

Auxiliary laser beams may optionally be focused on the specimens, for example, that are tuned to certain frequencies that interact with the specimen. This can enhance the specificity and reduce errors of ambiguity.

Multiple Pass Edge Nano-Probe Sequencer

Figure 85:
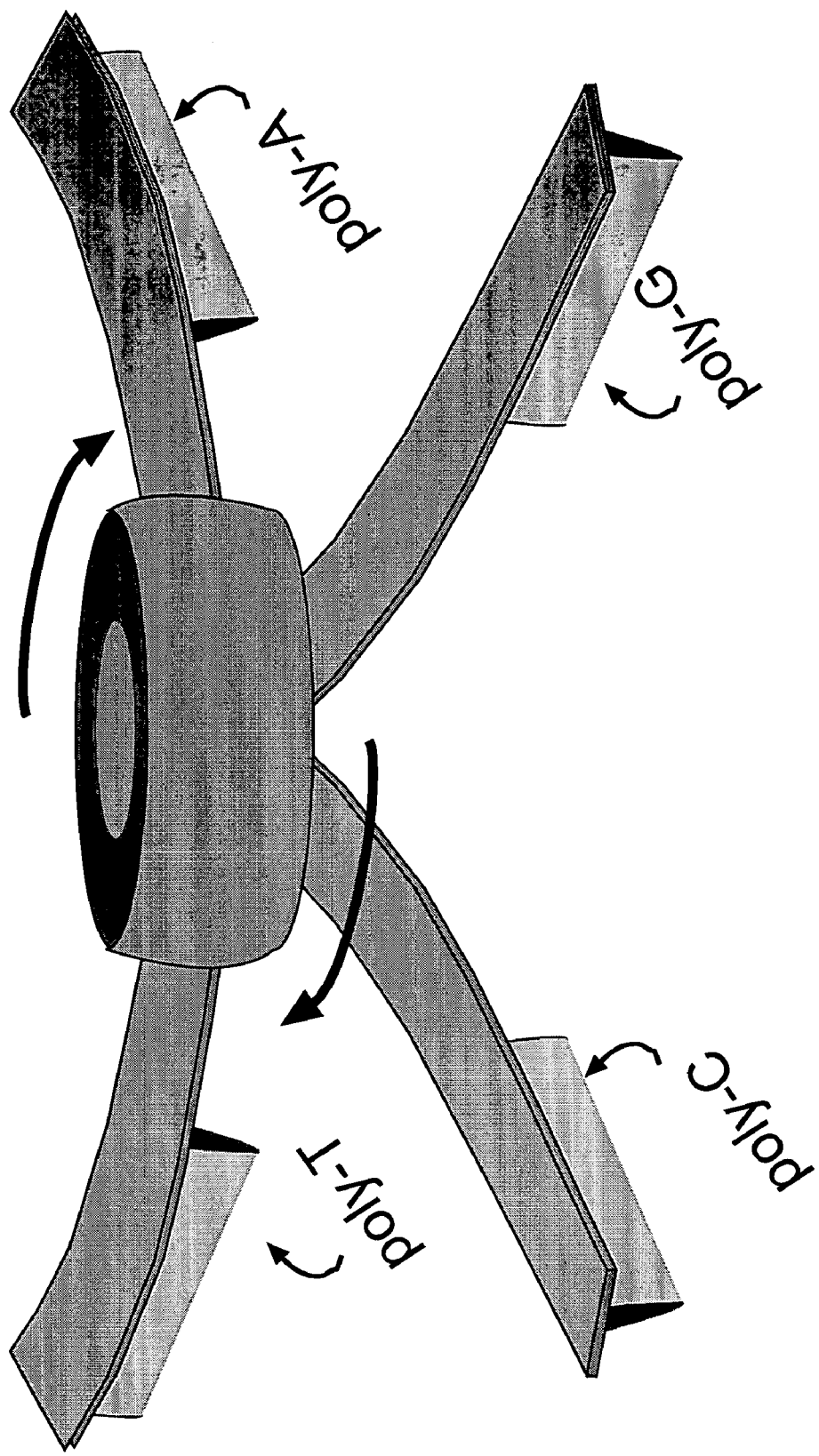
FIG. 85 shows a system according to another embodiment of the present invention whereby atomic forces are measured in a sequential manner using probes attached to a rotating mechanism.
Figure 86:
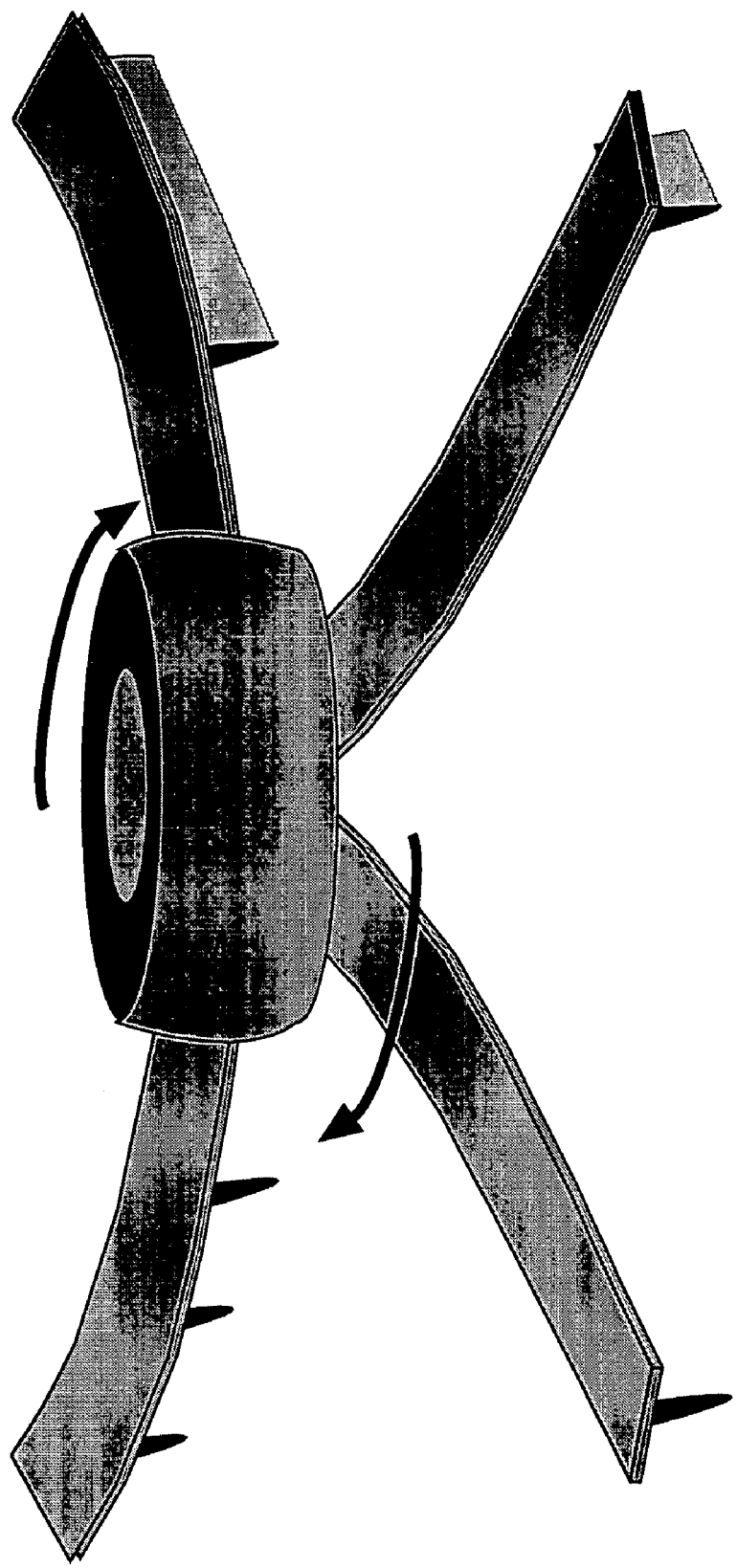
FIG. 86 shows a system according to a further embodiment of the present invention whereby plural probes are attached to a rotating mechanism.

Instead of using 4 nano-probes in parallel whereby each reflects its own laser beam or beam-let, it is possible to have nano-probes that are inserted or activated sequentially. For example, an embodiment is this system is illustrated in FIG. 85. Here the probes are attached to a rotating mechanism (e.g., "daisy wheel style") which rotates to expose the probe to the specimen one at a time. To sequence a DNA specimen, the probe functionalized with the poly-A oligomers is inserted (rotated in) and will scan the specimen. Then the poly-T is inserted to record the positions of the A nucleotide. This is repeated for the C and G nucleotides until the entire specimen is scanned with the four probes and the sequencing is completed. As shown in FIG. 86, this apparatus may be made more general and versatile by attaching to the daisy wheel a plurality of probes with different shapes, knife edge, single point, multiple tips, different functional group to recognize specific species, and nano-crystals of specific composition designed to search for and locate a specify material. This versatility is particularly useful as it affords the opportunity to use the system as an imaging tools first, as in normal AFM, then as a sequencing tool or more generally a chemical analysis tool.

It is appreciated that instead of a daisy wheel arrangement, there may other more advantageous arrangements. In order for these apparatuses with sequential insertion of probes to function properly, precise alignment subsystem may be required located with precision a spatial reference point, relative to which all spatial information is recorded. This will minimize errors and ambiguity. Additional nano-probes may be attached to function as the locators of alignment marks purposely written on the substrate.

Error Reduction Sub-Systems

Arrays

As descried herein, array of probes sets in 2d or 3d arrays can measure and re-measure the same sample. This is possible due to the low cost techniques. Further, multiple channels for parallel systems may be used.

Mixed Probe Types

As descried herein, array of probes sets in 2d or 3d arrays can measure and re-measure the same sample. This is possible due to the low cost techniques. Further, multiple channels for parallel systems may be used.

Differential; Detection

Figure 87:
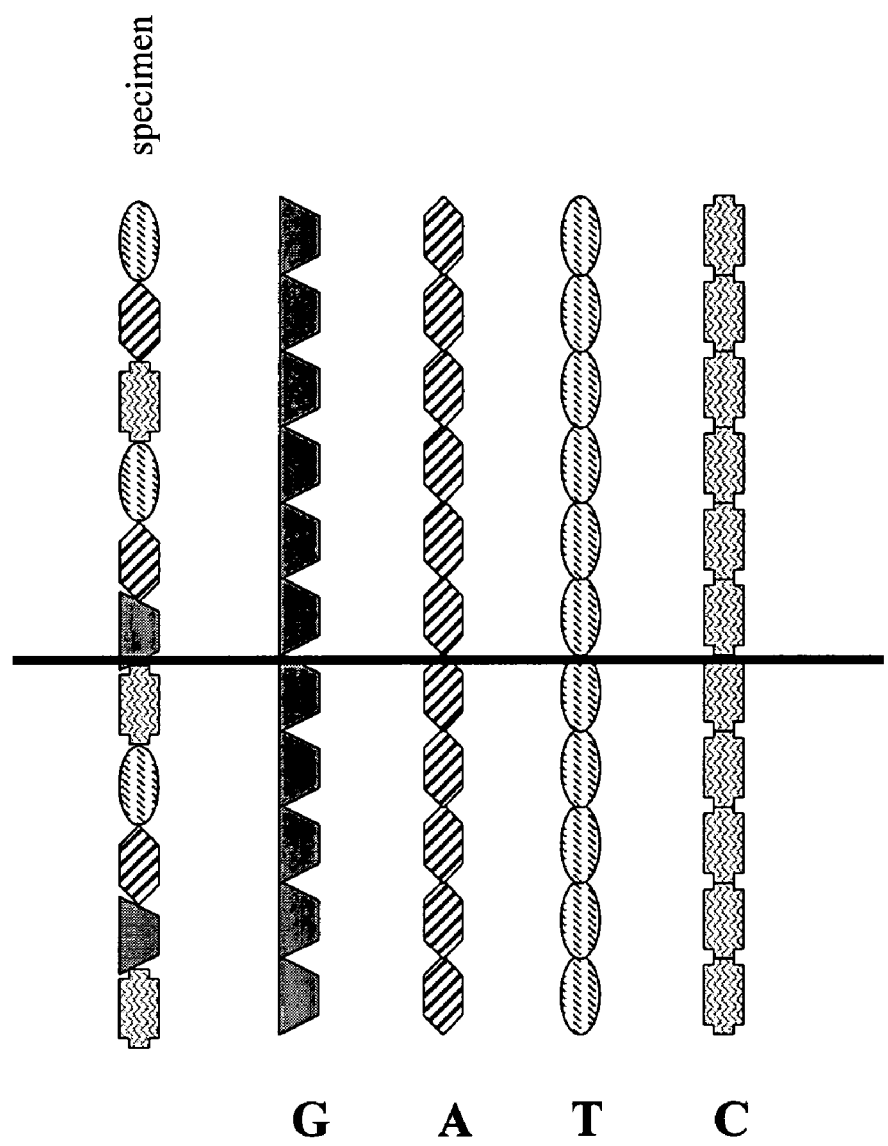
FIG. 87 shows a system according to an embodiment is provided of the present invention using differential detection to minimize errors in analyzing a specimen.

In another embodiment, and referring now to FIG. 87, a system is provided to use differential detection to minimize errors in reading the sequence. Arrays of nano probes/nozzles affords the opportunity, inexpensively, to consider repeated measurements to minimize the noise. For example, differential detection strategies may be used whereby system noise may be subtracted in real time. One or more probes or probe sets read the specimen and known samples A, C, T, G. Accuracy may be increase by performing differential detection, whereby noise may be determined and subtracted from the specimen reading. For example, we may read synonyms with the specimen analysis a current of a known sample (e.g., Arrays of A, C, T, and G). This gives us noise and the contribution of T at a particular instant of time. At the same instant of time, if a T is apparently determined to be the base of the specimen, the noise may easily be subtracted to confirm that the reading of T is accurate.

Therefore, the following apply:

Current (known sample)=noise+contribution of T (apply positive pulse)

Current (specimen)=noise−contribution of T (apply negative pulse)

The contribution of the signal is detected at certain modulation frequency, whereas the noise is random AAA, GGG, TTT, CCC also could be known AGAGAGAG, TCTCTCTC, so long as it is known.

Various Sensing Techniques and Sub-Systems

Many sensing techniques for determining a hybridization event include elastic quantum mechanical tunneling; inelastic quantum mechanical tunneling; resonantly enhanced tunneling; resonantly enhanced quantum capacitance in a tank circuit to boost the signal of hybridization events; fast cooling techniques to reduce noise (for example, such as the system that utilized liquid He or liquid $N_2$ droplet cooling); ionic conductivity; quantum mechanical tunneling electron emission; photon emission, which can be amplified by photon multiplier techniques. Any one or more of these techniques may be used in conjunction with the herein described high spatial resolution (e.g., nucleotide monomer level resolution) probes, probe sets or probe arrays as a novel direct sequencing system.

Knife Edge Configuration

Another aspect of the present invention to minimize error is the extended configuration (e.g., "knife edge") as described above with respect to FIGS. 1A-1D.

In systems herein where metal contacts or probes are used to measure currents and voltages from small structures such as the monomers of the specimen, four probe tunneling devices may be used (e.g., shown in FIG. 109) to minimize contact and lead resistance. Also, preferred probe configuration provide for a larger end opposite the tip, for example, as shown with respect to FIG. 1A. Further, all contacts the probe are preferably much larger than the tip. This can, for example, reduce electrical resistance of the probe when end serves as a contact region.

Increasing Electron Interactions

Optimum specimen resolution and speed may be achieved by optimizing the detection system to increase the measurable signal, namely, ensuring that enough electrons are involved, and minimizing the ambient noise. The tunneling current densities involved, in such small tunneling areas (e.g., 0.5 square nanometers), makes it possible to involve 10 s of electrons and 10 s of picoamps. This is achieved by allowing the time aperture to excite and detect each nucleotide in the order of 1-1000 nano-seconds. This can achieve the desired result of sequencing the whole Human Genome of $3\times10^9$ base pair in a time of about 1 second to a few minutes.

We have allowed for even higher speed and fewer electrons to be involved whereby intensification/amplification sub-systems are used to intensify few electrons or photons into a measurable signal.

Gated Detection

Gated electronic techniques are also used herein with a pulse protocol that is applied to ensure minimize noise. This is desirable to ensure the detection of picoamp level currents in the presence of noise. One effective strategy is to apply all of the stimuli in the proper sequence, in the form of pulses. The pulse widths and heights are adjusted to achieve optimum results. The levels of voltage will be in the 10 s of millivolts up to about 1 volt. The pulse durations may be about 1 nanosecond to about 1000 nanoseconds, or longer if necessary.

The protocol for gated detection to minimize noise is described in the following steps: 1) apply a pulse to step the specimen relative to the platform to a position to measure a portion of or a nucleotide of the specimen; 2) subsequent application of an electric field to provide contact between the specimen and the probe; 3) optional application of a laser pulse; 4) application of tunneling device voltage pulse; 5) applying a pulse to open the switch to the current measure device; 6) repeating 1-5 to measure the subsequent portion of the specimen or nucleotide to sequence. These steps 1-5 are synchronized pulses synchronized to a master clock. In the event that particle beams are applied, or intensifiers, these will also have appropriately applied excitation pulses to activate them synchronized with said clock. These gated synchronized methods allow one to measure the detectable interaction with a high signal to noise ratio.

Array of Repeated Species

In another embodiment, referring now to FIG. 14B, a plurality of nano-probe sets are provided, wherein each nano-probe set is specific to a certain species (e.g., nucleotide). The specimen is measure several times (by each probe within the probe set) and stored by a the first single species probe set. The specimen is then sequentially measured with a second single species probe set, a third single species probe set, and a fourth single species probe set to obtain data from each group of probe sets and obtaining at least one hybridization event or other detection event, preferably duplicate events to ensure accuracy of determination. Each probe set may and the computer analysis provides a consensus of the identity of the species, after averaging or other suitable statistical analysis. Each species is measured several times by one group, then another, then the 3rd, then the 4th. For example, if a probe set is optimized to detect an event with a T species, the following detection readout may be determined at that probe set for that base: TTCT. As the specimen and hence a particular base is moved across the array of 4 probe sets, A/T/C/G, the following detection readout may be determined at that probe array for that base: TTCT/- -G -/C- - -/- - A -. Thus, some of the individual probes within the sets may provide erroneous results (e.g., the C within the first TTCT, the G within the second group, the C within the third group and the A within the fourth group), statistical analysis will determine that the particular base is indeed a T base. Note that more or less probes that four may be in each probe set. Further a scheme may be provided with various degrees of redundancy, including differing numbers of probes within the probe sets, combinations of homogeneous and heterogeneous probe sets, combinations of probe type for various detectable Interactions (e.g., nucleotide filled wells, solid state nucleotides, metal conductor, metal plus known nucleotide stand, open well or funnel for particle beams, electron beam emission, ion beams, x-rays or the like, or flexible membrane probes.

Signal-to-Noise Ratio

One important factor of these method and strategies for error reduction is obtaining a sufficient signal to noise ratio. The system is preferably gated and synchronized such that the ammeter will only detect a signal when a nucleotide is directly below a nozzle. The bias applied may be positive, negative, or even alternating, as to maximize the change in conductivity. Cooling may be desirable to reduce the thermal noise. Alternatively, each DNA or protein strand may be passed under several arrays of nozzles, thereby averaging out the noise. Certain embodiments show array configurations, e.g., that may average out noise and increase SNR. These features will help in assuring an excellent SNR.

However, if we assume a 10 picoamp current change under one applied volt, and 10 nanoseconds for detection, the signal is orders of magnitude larger than the thermal noise, even at room temperature. The sequencing speed would be enormous. Allowing 30 nanoseconds to move a nozzle from one nucleotide to the next (a speed of about 1 cm/sec), it would take only 40 nanoseconds to sequence one base pair, which is equivalent to 1.5 Billion base pairs a minute.

Cooling Sub-System

Figure 88:
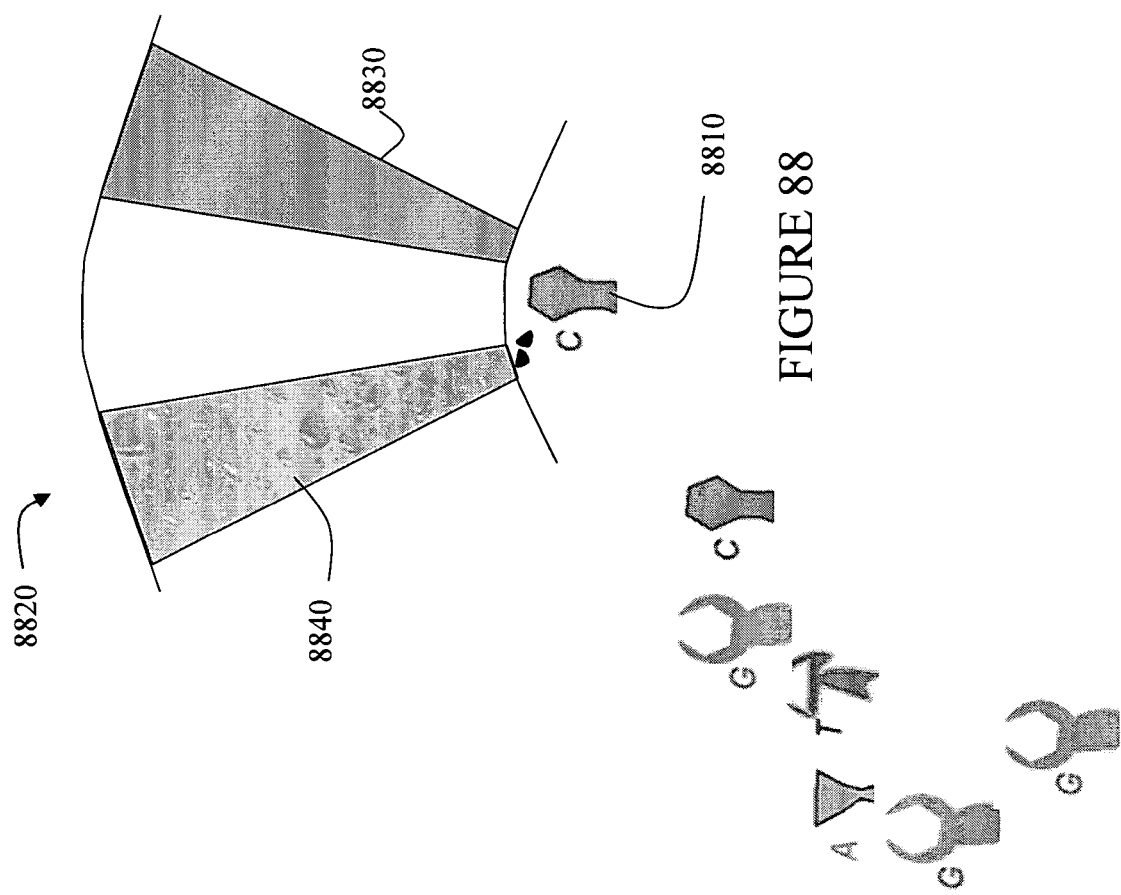
FIG. 88 shows a probe system according to certain embodiments of the present invention including a first probe and a cooling droplet supply nozzle.

In certain embodiments, fast cooling techniques may be incorporated. As shown in FIG. 88, for example, a specimen portion 8810 is within a probe system 8820 including a first probe 8830 and a cooling droplet supply nozzle 8840. The cooling droplet supply nozzle 8840 may include liquid He, liquid N2, or other suitable coolant suitable for fast cooling application. The first probe may include any one of the above referenced types of probes. Alternatively, more than one probe may be used with a cooling droplet supply nozzle 8840, for example, for photonic application, current measurement, voltage bias, or other functionality as described herein.

AND Gate

Referring now to FIG. 82, another embodiment of the present invention is shown. A specimen portion 8210 is within a probe system 8220 including a first probe 8230 and a light nozzle 8250. The light nozzle 8250 and the first probe 8230 are activated, either sequentially, simultaneously or overlapping in time, to facilitate current detection, measurement, or other impact of the detection contribution effect, as described above. The first probe 8230 may include any one of the above referenced types of probes. The light nozzle 8250 may provide various types photonic energy, for example, visible, UV, X-Ray, THZ, IR, or FRIR.

Specimen/Probe Orientation

In other embodiments described herein, and referring back to FIGS. 12A-126F, the probes may be oriented at various angles with respect to the specimen. Referring to FIGS. 12A and 12B, all probes and probe sets described herein may be configured with respect to the specimen at various angles. For example, referring to FIG. 12A, a probe set 1230 may be oriented generally perpendicular (in the length direction) to a specimen 1250. Further, referring to FIG. 12B, a probe set 1230 may be oriented (in the length direction) generally at an angle θ with respect to a specimen 650. Referring to FIG. 12C, a system 1260 is presented whereby the orientation of plural probe sets 1230 relative a specimen 1250 varies. Because the objects of the specimen 1250 (e.g., bases within a DNA strand) may have different orientations, it may be desirable to sequence with a plurality of probe sets 630. The plurality of probe sets 1230 may have different angles $\theta_1$, $\theta_2$, $\theta_3$, $\theta_4$, $\theta_5$, ... $\theta_n$ (e.g., 20° to 160° in suitable increments, arranged sequentially, randomly or in another desirable arrangement. During measurement as described further herein, a controller may determine which orientation of the probe set yields the best signal for a particular base at its inherent orientation. This allows one to measure the data from the probe sets of the array, and determine the optimum signal for certain bases or groups of bases. In another embodiment, and referring to FIGS. 12D-12F, the angles of orientation in the height direction may also be varied. For example, referring to FIG. 6D, probe set 630 may be oriented in the height direction generally perpendicular (90°) with respect to the specimen 650. Further, as shown in FIG. 12E, probe set 1230 may be oriented in the height direction generally at an angle c with respect to the specimen 1250. Referring to FIG. 12F, a system 1270 is presented whereby the orientation in a height direction of plural probe sets 1230 relative a specimen 1250 varies. Because the objects of the specimen 1250 (e.g., bases within a DNA strand) may have different orientations, it may be desirable to sequence with a plurality of probe sets 1230. The plurality of probe sets 1230 may have different angles $\omega_1$, $\omega_2$, $\omega_3$ ... $\omega_n$ (e.g., 20° to 160° in suitable increments, arranged sequentially, randomly or in another desirable arrangement. By measuring at these various angles, the opportunities for errors and misreading are minimized or eliminated.

Contacting

In another embodiment, and referring now to FIGS. 89A and 89B, a bendable membrane material 8910 having a nano-scale probe attached thereto is provided. The nano-scale probe 8912 may one of the aforementioned probes such as a known nucleotide strand, functionalized group, or other molecular probe. Preferably the bendable membrane material 8910 include a metallic surface with the probe 8912 attached thereto to facilitate current measurement. Using a suitable MEMS device or other plunger 8920, a flexible metal membrane 8916 is pulsed to make contact with the specimen 8940 to resolve it.

As with the other probe types described herein, a 2D or 3D array may be provided. Further, these arrays may include homogeneous or heterogeneous probe types.

Furthermore, in general, the probe may make contact with the assistance of other known devices such as angstrom or sub-angstrom precision actuators, MEMs devices, or other mechanical devices.

Sample Preparation and Manipulation

Figure 90:
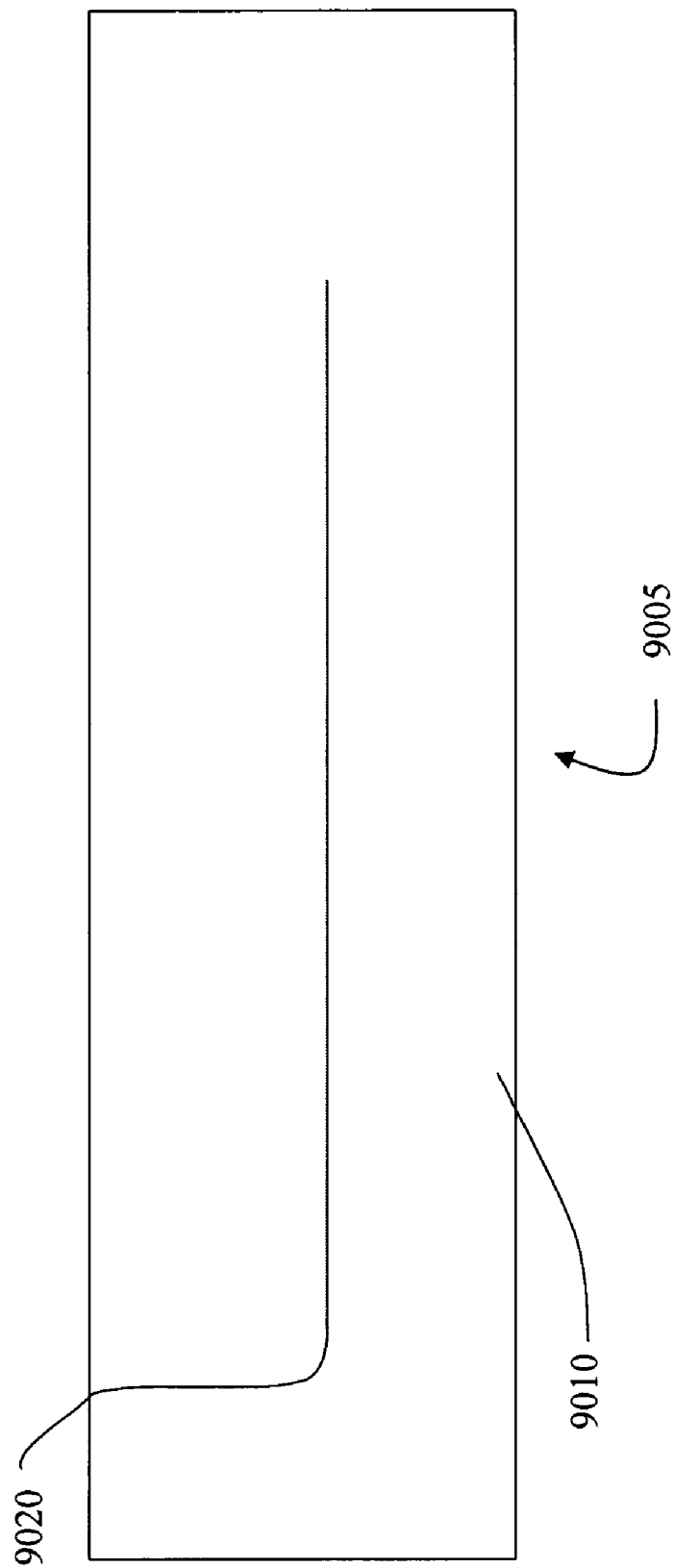
FIG. 90 shows a structure that facilitates attraction and transport of specimen in accordance with certain embodiments of the present invention including a coaxing line.

Referring now to FIG. 90, a structure 9005 is shown that facilitates attraction and transport polymeric structures such as DNA fragments, RNA molecules, proteins, or other polymeric structure. A substrate 9010 is provided with one or more coaxing lines 9020. These coaxing lines or regions may be in the form of channels, channels including a suitable coaxing material, lines or regions of the surface of the substrate 9010 treated with a suitable coaxing material, a ridge or other protrusion defining the one or more coaxing lines 9020, or a ridge or other protrusion defining the one or more coaxing lines 9020 treated with a suitable coaxing material. A coaxing material may include materials such as amino-silane, biotin, other known bonding materials, charged conductive particles such as platinum, gold or other suitable material.

In general, a the specimens may include magnetic portions, or suitable chromophores or fluorophores to help guide and manipulate the specimens.

Note that the substrate 9010 may be in the form of a glass slide, e.g., on the order of 1-2 cm by 3-5 cm. Alternatively, the substrate 9010 may be in the form of a disc or wafer. The form factor of the slide will generally be a function of the analysis tools and/or manipulation tools used to work with the specimen.

This structure 9005 may be used with DNA sequencing tools, for example, described in conjunction with U.S. patent application Ser. No. 10/775,999 filed on Feb. 10, 2004 entitled "Micro-Nozzle, Nano Nozzle and Manufacturing Methods Therefor", U.S. Provisional Patent Application Ser. No. 60/669,029 filed on Apr. 7, 2005 entitled "DNA Sequencing Method and System", and U.S. Provisional Patent Application Ser. No. 60/699,619 filed on Jul. 15, 2004 entitled "Molecular Analysis Probe, Systems and Methods, including DNA Sequencing", all of which are incorporated by reference herein.

Further, these structures 9005 may be used with various other types of analytical tools such as optical imaging tools. Certain useful optical imaging tools that may benefit from the structures 9005 described herein are described in U.S. patent application Ser. No. 10/800,148 filed on Mar. 12, 2004 entitled "Microchannel Plates And Biochip Arrays, And Methods Of Making Same" and U.S. Provisional Patent Application Ser. No. 60/674,012 filed on Apr. 22, 2005 entitled "Microchannel Plate And Method Of Making Microchannel Plate", all of which are incorporated by reference herein.

Figure 91:
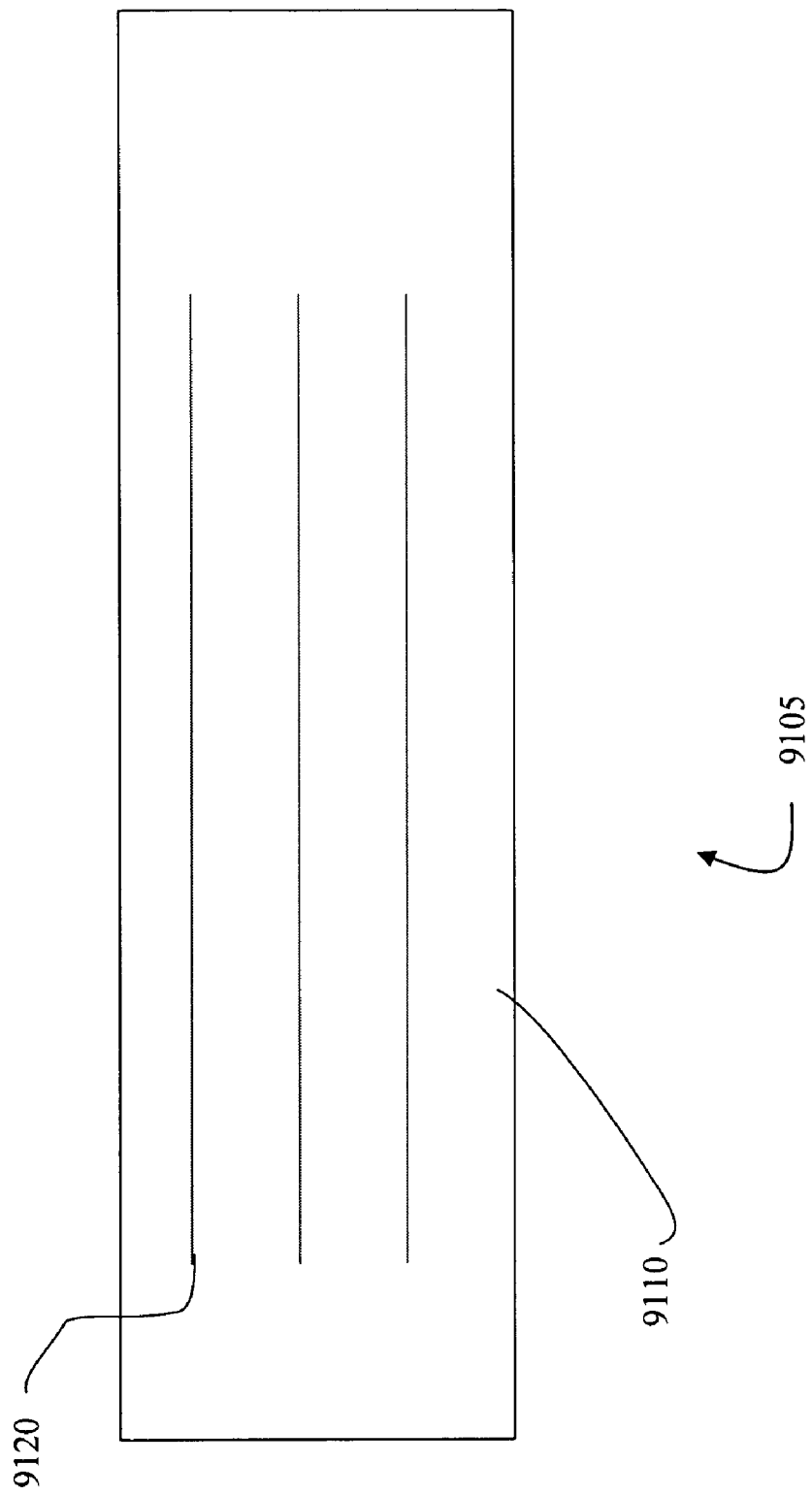
FIG. 91 shows a structure that facilitates attraction and transport of specimen in accordance with other embodiments of the present invention including plural coaxing lines.

Referring now to FIG. 91, a structure 9105 is shown that facilitates attraction and transport polymeric structures such as DNA fragments, RNA molecules, proteins, or other polymeric structure. A substrate 9110 is provided with a plurality of coaxing lines 9120.

Figure 92:
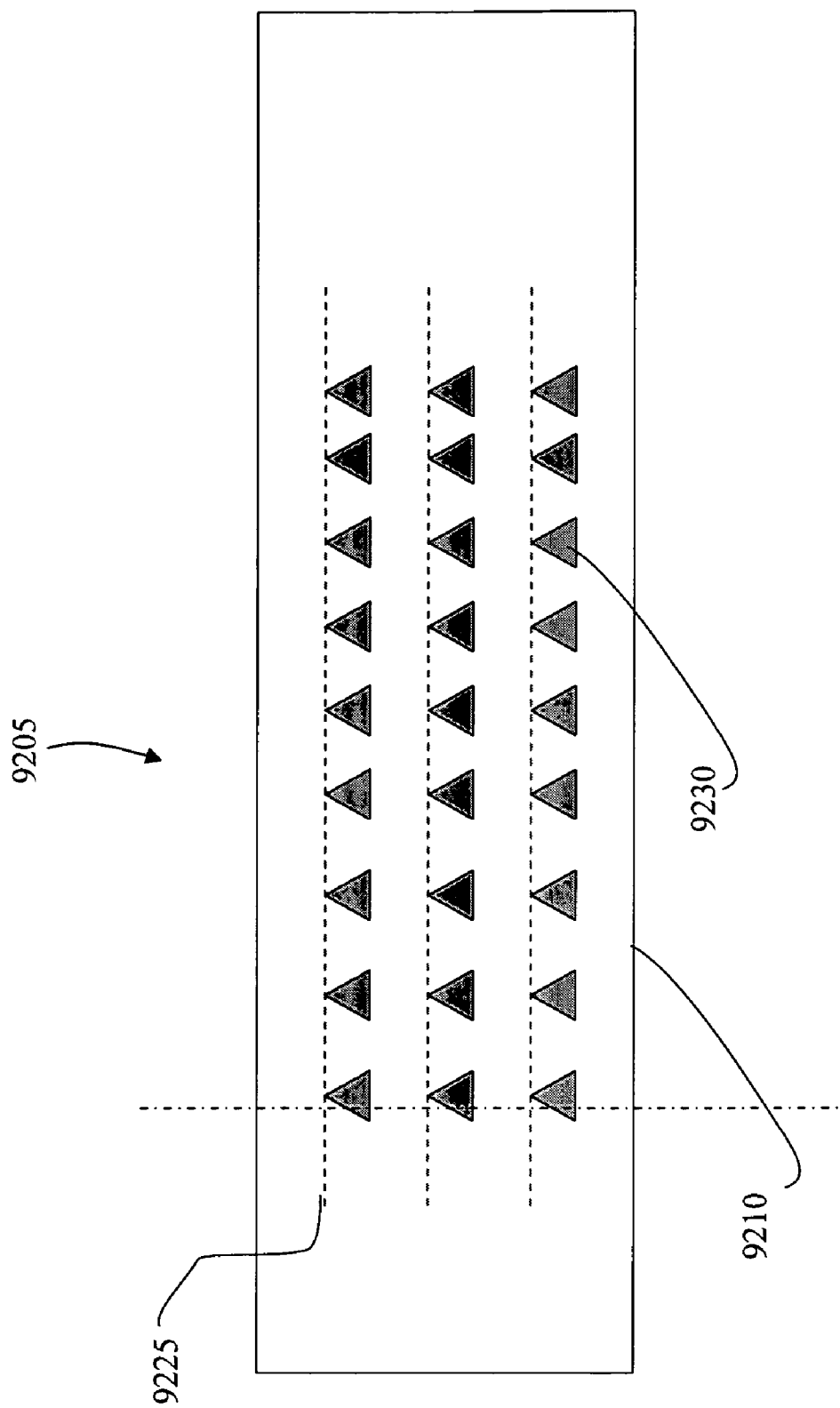
FIG. 92 shows a structure that facilitates attraction and transport of specimen in accordance with other embodiments of the present invention including virtual coaxing lines defined by an electrode path.

Referring now to FIG. 92, a structure 9205 is shown that facilitates attraction and transport polymeric structures such as DNA fragments, RNA molecules, proteins, or other polymeric structure. A substrate 9210 is provided with one or more virtual coaxing lines 9225 defined by plural electrodes 9230 therealong. These virtual coaxing lines or regions may be in the form of channels with suitable electrodes 9230, virtual lines or regions on the surface of the substrate 9210 with suitable electrodes 9230, a ridge or other protrusion defining the one or more virtual coaxing lines 9220 with suitable electrodes 9230. Accordingly, with plural discontinuous electrodes 9203, the virtual coaxing line 9225 is defined. The electrodes in these embodiments may include pre-charged particles, include an on-board battery, or include electrodes that are activated by suitable devices with the system reader.

Figure 93:
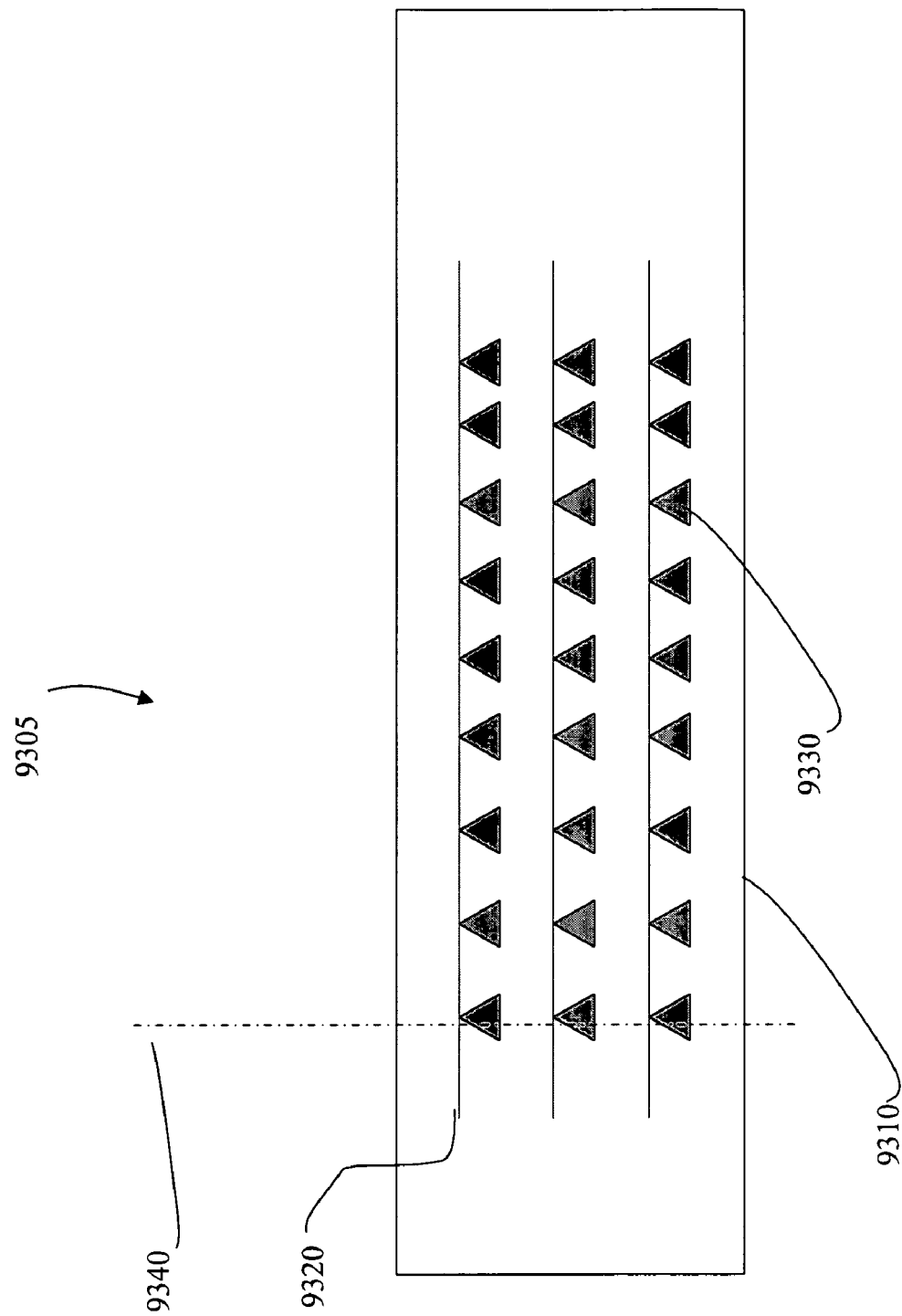
FIG. 93 shows a structure that facilitates attraction and transport of specimen in accordance with other embodiments of the present invention including coaxing lines and an electrode path.

Referring now to FIG. 93, a structure 9305 is shown that facilitates attraction and transport polymeric structures such as DNA fragments, RNA molecules, proteins, or other polymeric structure. A substrate 9310 is provided with one or more coaxing lines 9320 having plural electrodes 9330 therealong. These coaxing lines or regions may be in the form of channels, channels including a suitable coaxing material, lines or regions of the surface of the substrate 9310 treated with a suitable coaxing material, a ridge or other protrusion defining the one or more coaxing lines 9320, or a ridge or other protrusion defining the one or more coaxing lines 9320 treated with a suitable coaxing material, wherein the coating material may be the same as those described above, or alternatively may include materials that have attraction forces when subjected to the electric fields created by the electrodes 9330.

In certain embodiments, an electric field may be applied at a desired start position 9340 on the structure 9305. Further, in the various embodiments of the structures that facilitate attraction and transport of specimens, various features may be aligned to other system features described herein.

Figure 94A:
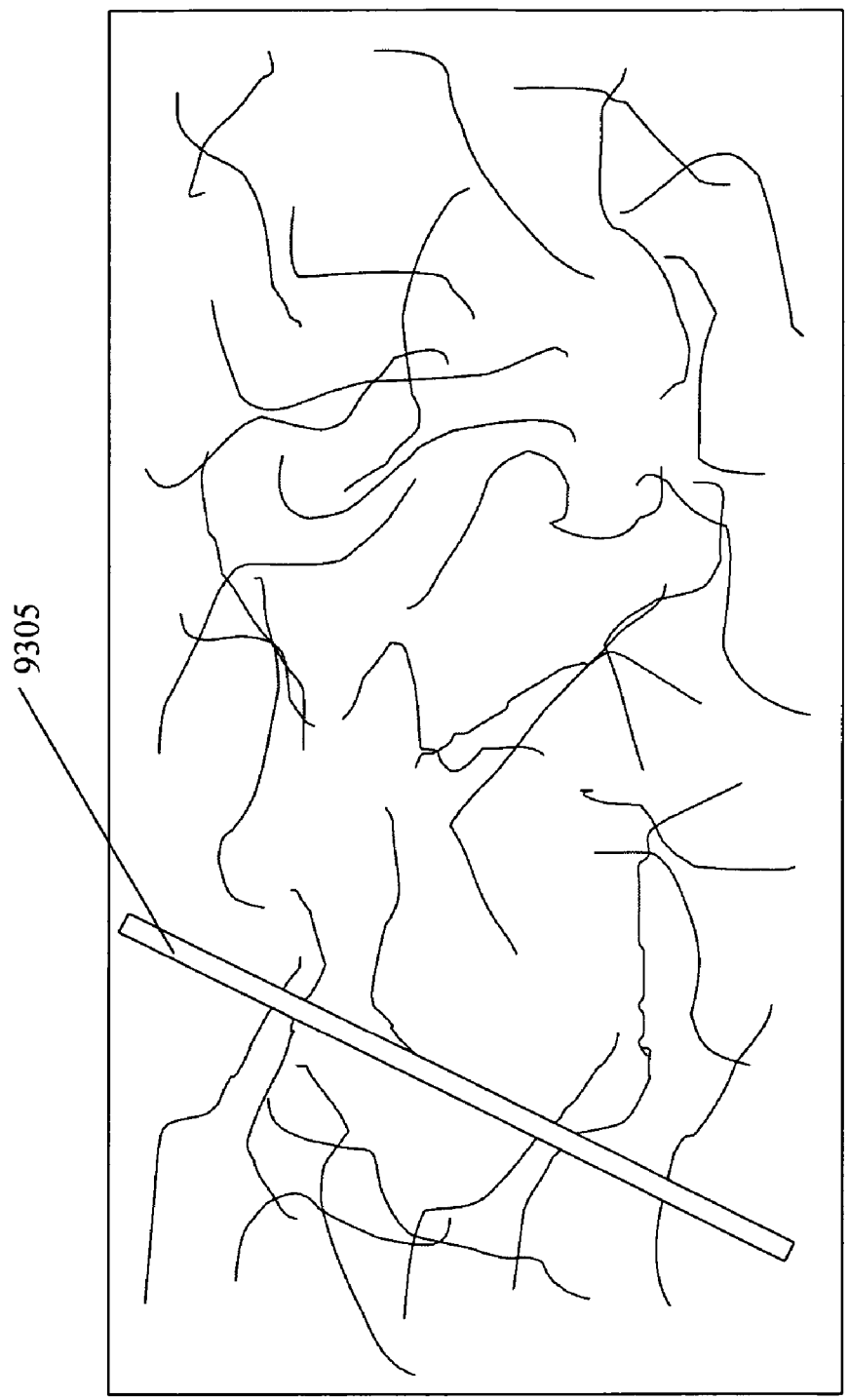
Figure 94D:
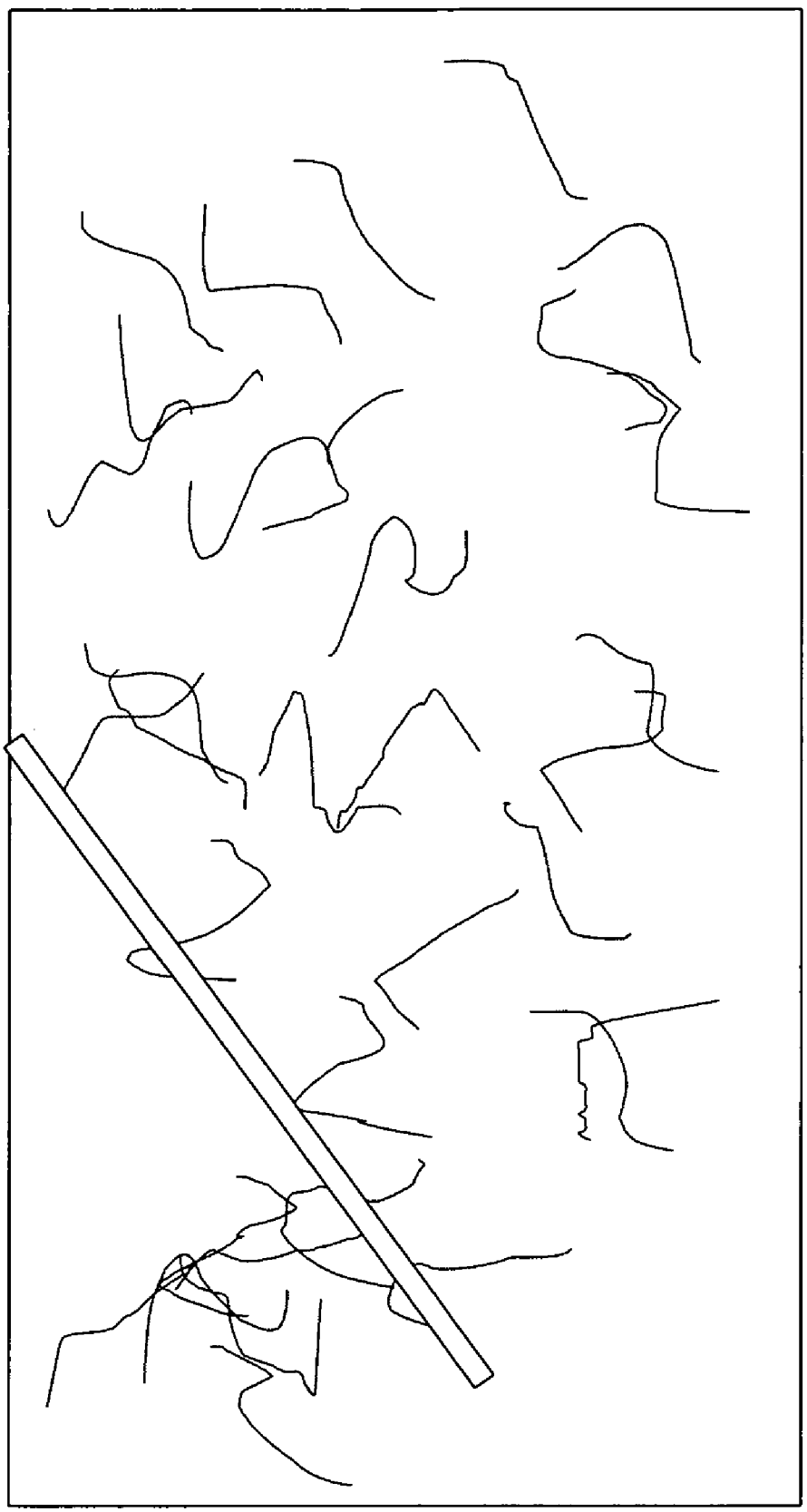

For example, and referring now to FIGS. 94A-94F, a method of coaxing strands onto a structure 9005, 9105, 9205 or 9305. A structure 9405 is inserted into a solution containing one or more polymeric structures such as DNA strands or fragments. One or more fragments will attach to said structure 9405 as shown by arrows in FIG. 94C. Referring to FIGS. 94D-F, structure 9405 having one or more polymeric strands attached thereto is then pulled out of the liquid. Preferably, the structure 9405 is removed in a direction along the axis of the coaxing line such that the liquid flow direction and gravity also contribute to the attractive forces of the coaxing lines. Accordingly, since the liquid flow forces, gravitational forces and the contribution of the coaxing line are in substantially the same direction, the strands are coaxed toward alignment. In certain embodiments, an electric field may be applied at a desired start position on the structure 9405.

Stretching

To assist the denaturing in conjunction with the precise stepwise motion, the DNA strand can be straightened bay various methods. In one embodiment, electrostatic fields may be used to attract the negatively charged strands. In another embodiment, a magnetically attractive bead may be applied to an end of the DNA strand, and the strand pulled with magnetic force. In a further embodiment, viscosity optimization may be employed, such that while dragging the strand through a liquid proximate or in the channel, it will straighten upon optimal dragging velocity and fluid viscosity conditions. Further, hydrophilicity may be used, e.g., by suitable material treatment at or in the nozzles and channel walls, to attract nucleotides. In other embodiment, hydrophobicity may be used, e.g., by suitable material at or in the nozzles and channel walls, to maintain the fluid within the channel.

Coarse Shuttle

Figure 95:
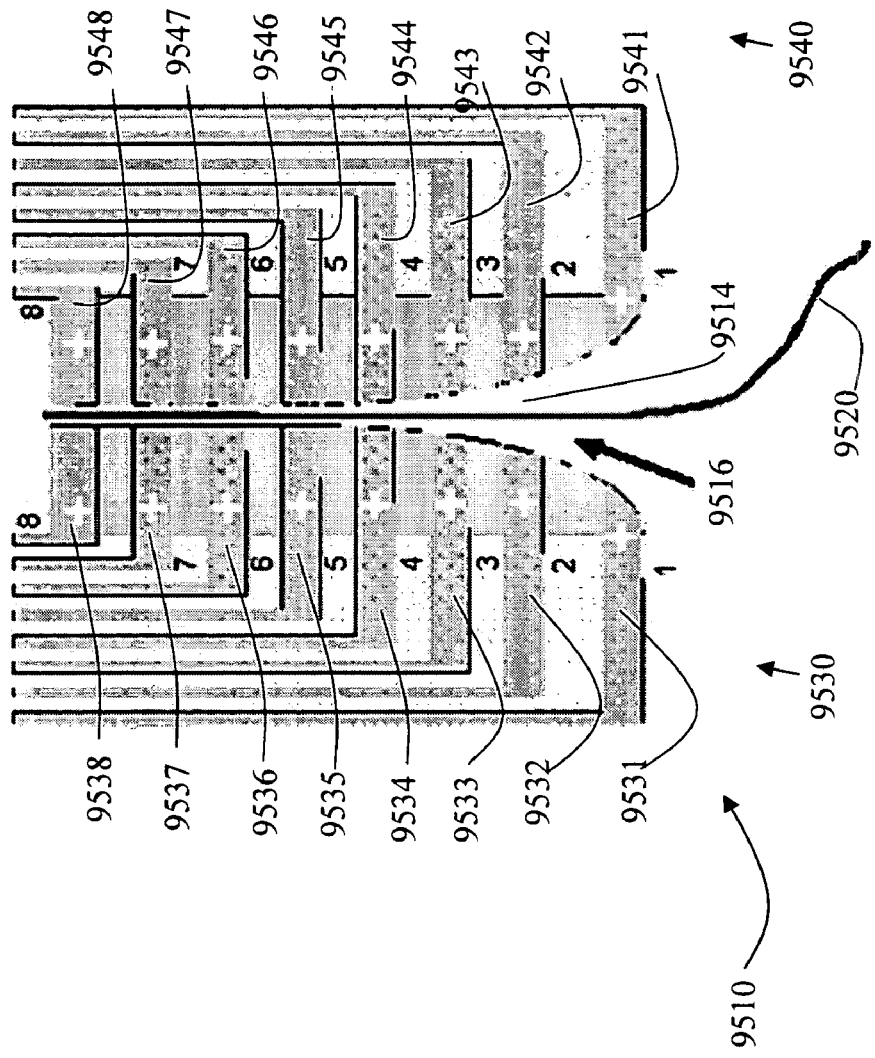
FIG. 95 shows a coarse shuttle system according to an embodiment of the present invention.

Referring now to FIG. 95, an overview of a coarse shuttle system 9510 is shown. System 9510 serves to facilitate displacement of the extended object 9520, and in particular to move and stretch an extended object 9520 such as a DNA or RNA strand or fragment through a path 9514 (which may be a channel or along the surface of a substrate) between two sides 9530, 9540.

In general, each side 9530, 9540 has a plurality of electrode pairs arranged about the path 9514. For example, as shown in FIG. 95, the channel 14 includes a wider opening area 9516, for example, to increase the likelihood of extended object 9520 encountering the channel 9514. Electrode pairs 9531, 9541 through 9538, 9548 are arranged on the sides 9530, 9540. In the example where the extended object 9520 is a negatively charged extended object, such as a DNA strand, positive charges are applied across the Electrode pairs 9531, 9541 through 9538, 9548, thereby coaxing the extended object 9520 into and through the path 9514.

Note that the path 9514 may be in the form of a channel, e.g., having partially enclosed walls such as a concave groove, V-shaped groove, U-shaped groove, or other suitable shape. Alternatively, the path 9514 may instead be defined by suitable surface treatment, as described further herein. Alternatively, the path 9514 may be an elevated ridge treated or pattered with electrodes, either along the sides as shown with respect to the molecular shuttle herein or along all or portions of the length of the path 9514.

Fine-Shuttle

Figure 96A:
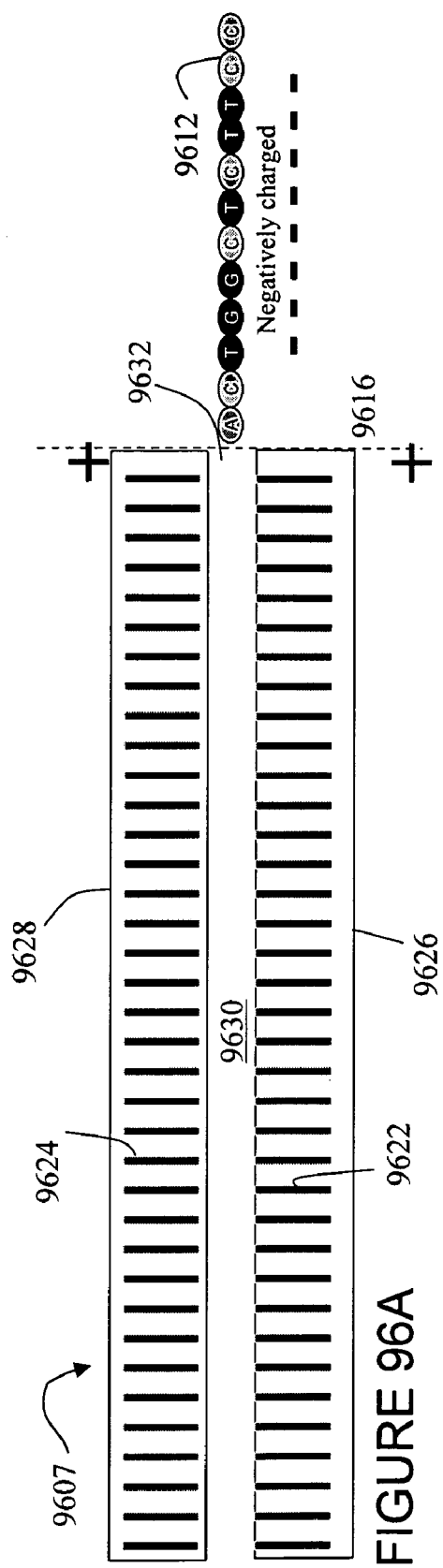
FIGS. 96A-96C show a molecular shuttle and its operation, for example, for fine displacement, according to an embodiment of the present invention.
Figure 96B:
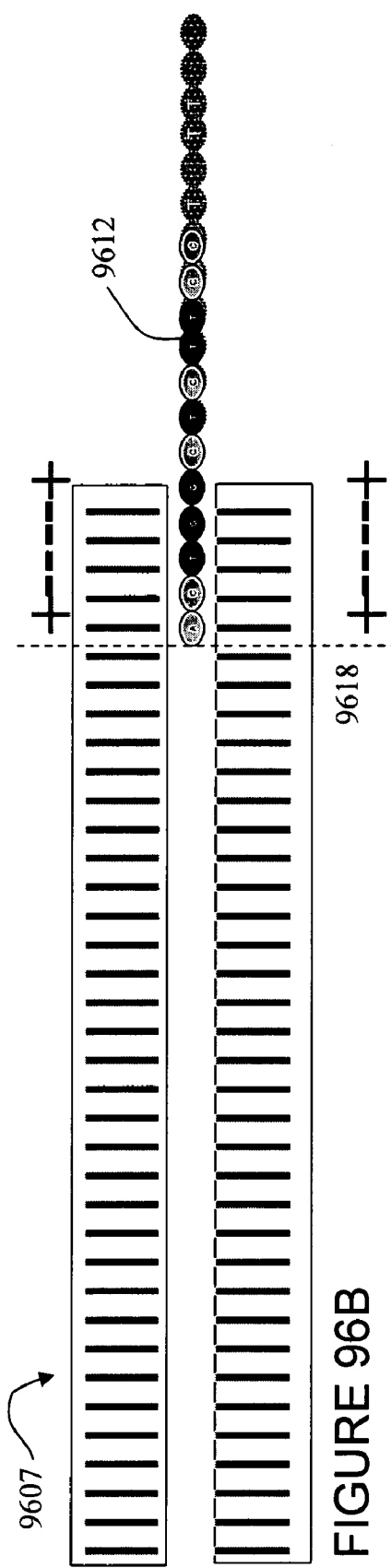
Figure 96C:
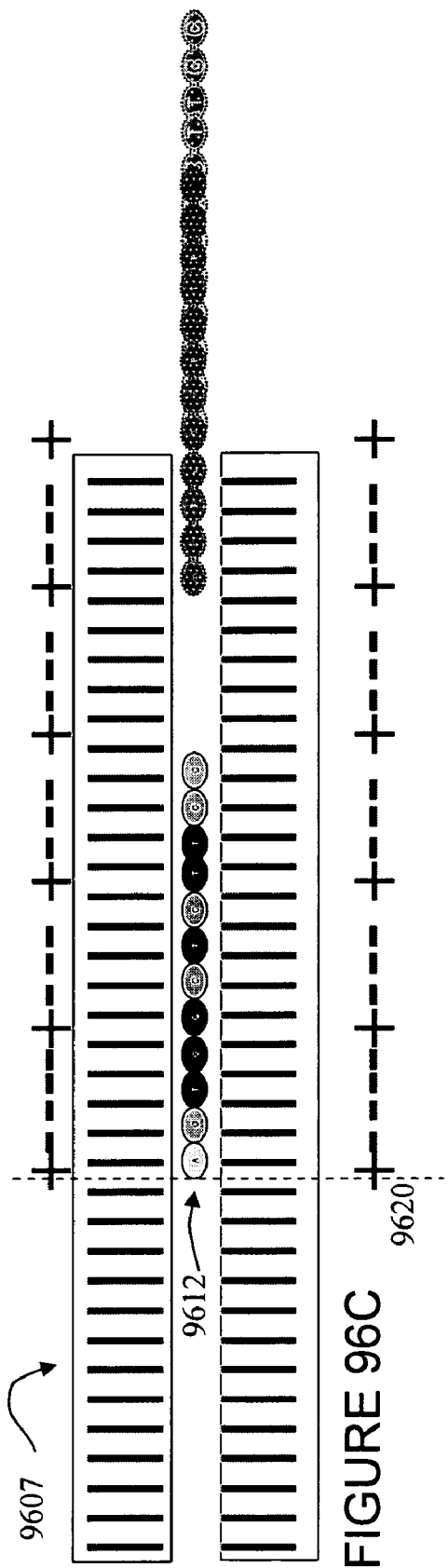
Figures 97A, 97B:
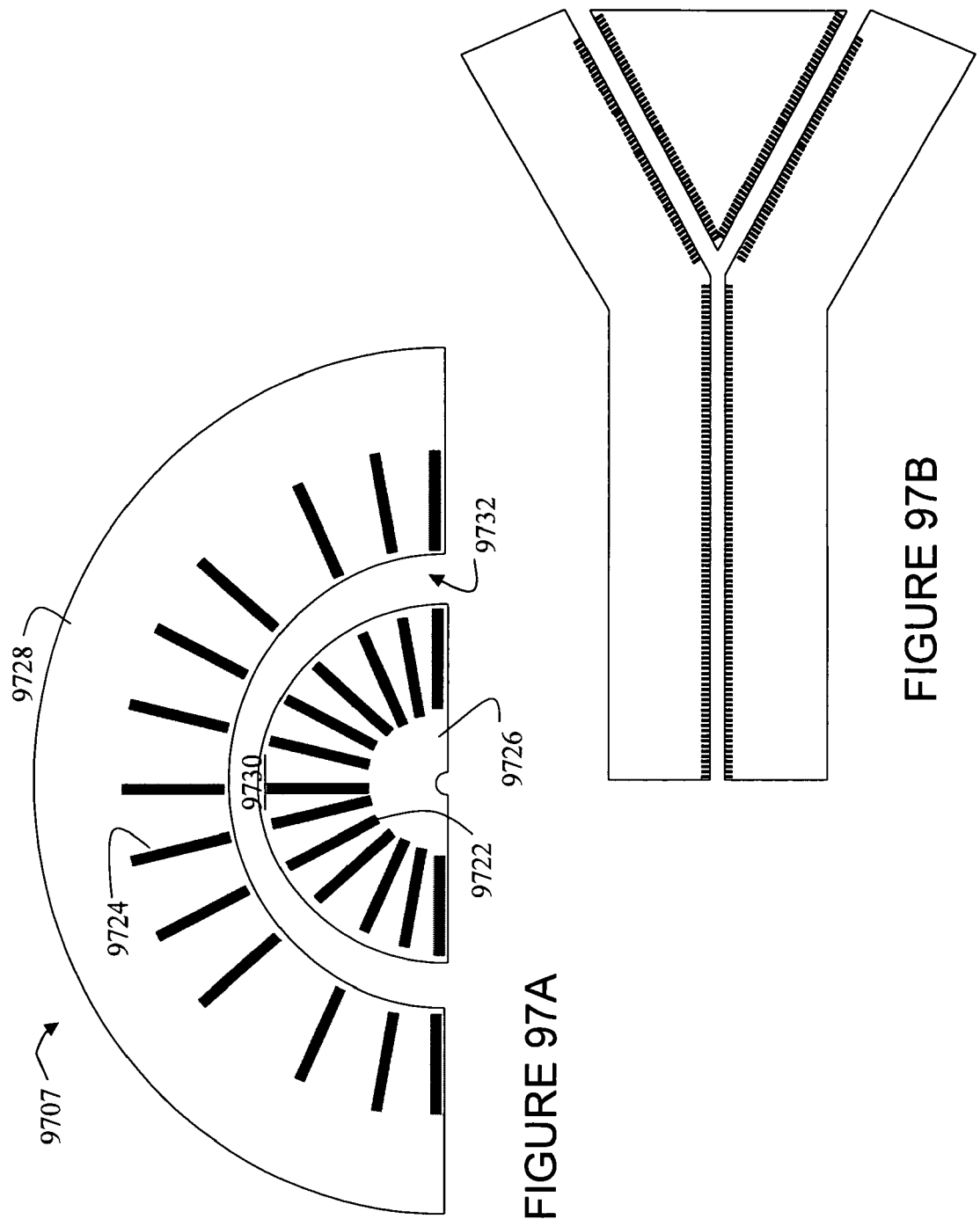
FIGS. 97A-97D show various embodiments of molecular shuttles according to the present invention formed of various shapes and providing different paths.
Figure 97C:
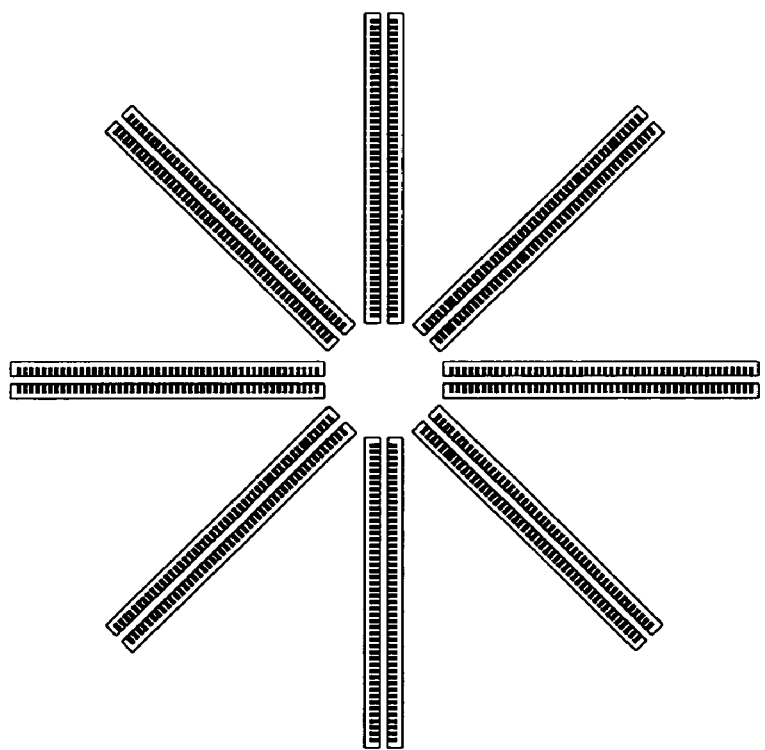
Figure 97D:
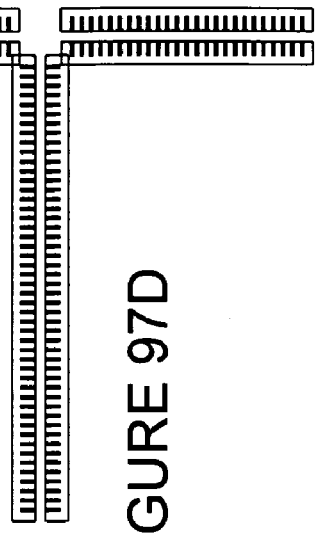

FIGS. 96A-96C show an embodiment of a molecular shuttle 9607, for example, for fine displacement of an extended object 9612. In general, the molecular shuttle 9607 may be used to controllably displace an extended object 9612, for example, from a first location 9616 to a second location 9618 to a third location 9620, and so on. The extended object 9612, such as a DNA strand, DNA fragment, RNA molecule, protein molecule, or various other types of polymer and extended object, is typically charged, in this case shown as negatively charged. The molecular shuttle 9607 includes a plurality of spatially opposing probes 9622, 9624 within or upon substrates or substrate regions 26, 28 thereby defining a path 9630 therebetween. In certain preferred embodiments, these probes 9622, 9624 are formed as probes as described herein. As shown in FIG. 96A, the extended object 9612 is outside of the path 9630. By applying a positive charge at probes 9622, 9624 at the end of the molecular shuttle 9607 (as indicated by "+" signs in FIG. 96A), the extended object 9612 will be attracted to an opening 9632 of the path 9630.

Referring to FIG. 96B, when another positive charge is applied through the probes 9622, 9624 at a location indicated by line 9618, with negative charges provided by probes or electrodes between position 9618 and the positive charge at opening 9632, the extended object 9612 will be attracted to the position 9618 within the channel path 9630. Referring to FIG. 96C, the process is continued to shuttle the extended object 9612, for example, to a position 9620 within the path 9630.

Referring now to FIGS. 97A-97D, a molecular shuttle 9707 may be formed of various shapes, including but not limited to a curved or semicircle channel (FIG. 97A), a Y-shaped channel (FIG. 97B), a series of channels directed in a radial manner to or from a central point (FIG. 97C), or T-shaped (FIG. 97D), for example.

Note that the path 9630 may be in the form of a channel, e.g., having partially enclosed walls such as a concave groove, V-shaped groove, U-shaped groove, or other suitable shape. Alternatively, the path 9630 may instead be defined by suitable surface treatment, as described further herein. Alternatively, the path 9630 may be an elevated ridge treated or patterned with electrodes, either along the sides as shown with respect to the molecular shuttle herein or along all or portions of the length of the path 9630.

Motion and Sub-Systems During Measurement

Metrology

Figure 98:
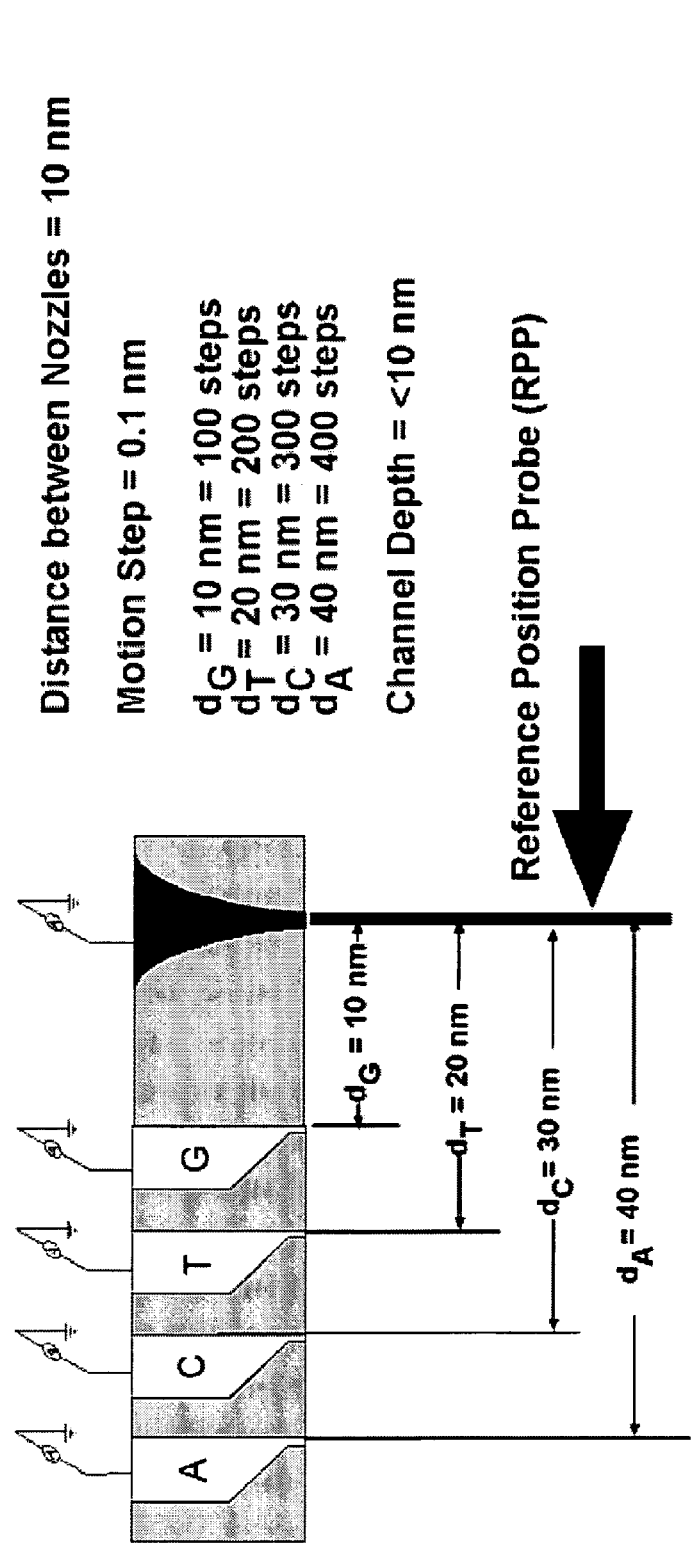
FIG. 98 shows a reference position and precision nanometer metrology prove and system.

Referring now to FIG. 98, a reference position and precision nanometer metrology system is shown. A reference position probe (RPP), e.g., formed of platinum or other suitable material, or in the form of a nano-light guide, or other excitation probe structure, is included in the probe set or nanonozzle array set. The positions of each probe or nanonozzle relative the RPP is known. This reference position probe provides a known starting point when sequencing commences for precise metrology.

Stepped Motion

Figure 99:
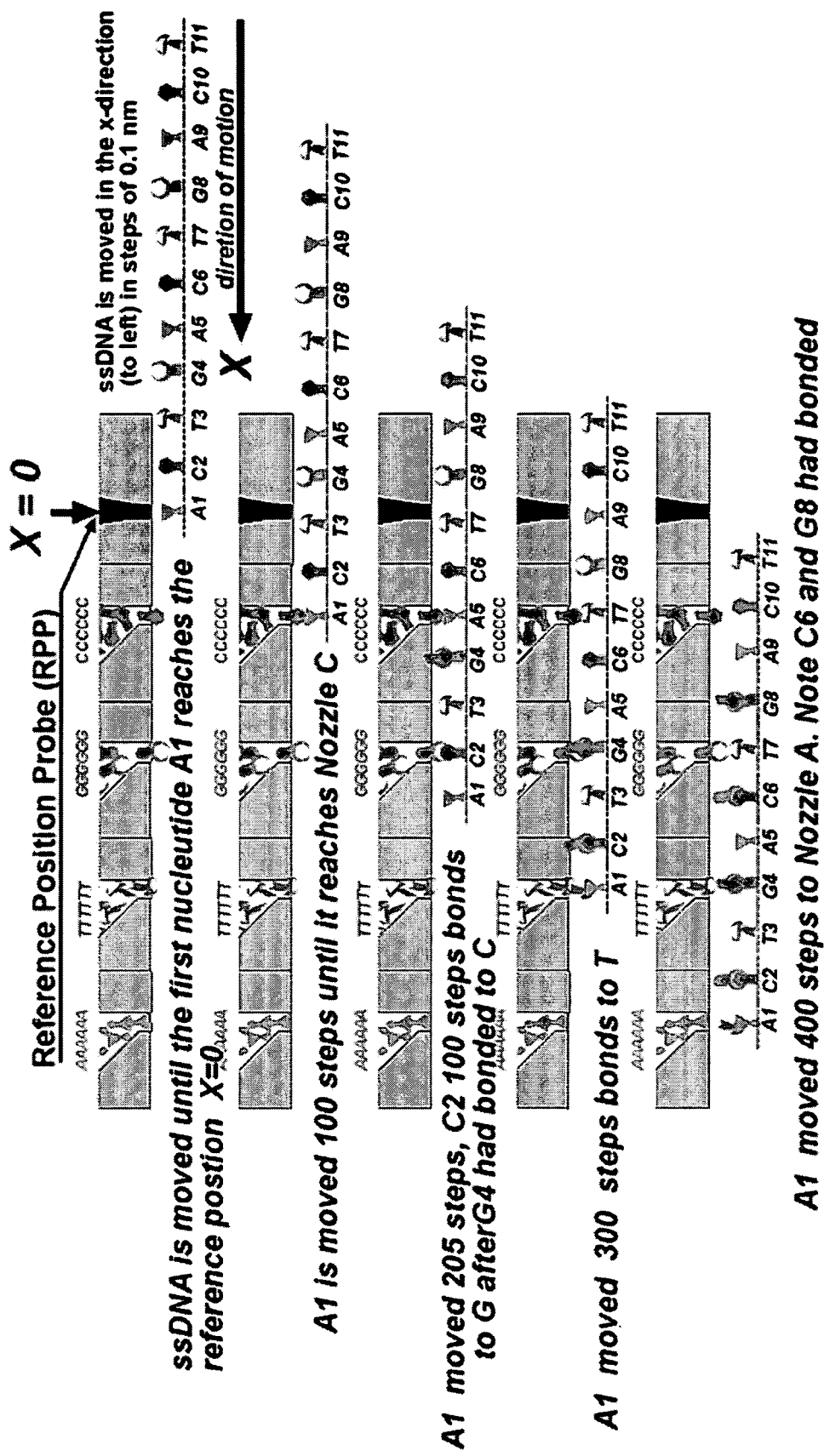
FIG. 99 shows stepped motion of a strand to be sequenced relative to the probe of FIG. 98.

Referring now to FIG. 99, the stepped motion of ssDNA is shown relative to a known position of the RPP.

Base—Specimen Configuration

In certain embodiments, the specimen may be within a channel of the base. A channel may include suitable fluid, or the specimen may be coaxed through a channel with little or no fluid.

In other embodiments, the specimens may be embedded within the base, e.g., in a biochip.

Electron Intensifier

In certain embodiments, an electron or photon intensifier such as a micro-channel intensifier may be used. For example, referring to FIGS. 100A and 100B, these embodiments are shown.

Referring to FIG. 100A, the probe emitter interacts selectively with the specimen in an elastic or inelastic manner, whereby energy is lost, and the event lead to the release of photons or electrons that have specific energy indicative of the nature of the molecule or monomer. These electrons or photons may be too few to be measured directly. Therefore, the invention herein provides for an intensification or amplification sub-system such as micro-channel plate intensifiers known in the art, e.g., night vision goggles or photo-multipliers.

Referring now to FIG. 100B, where the probe is either metallic and/or a molecular probe, interaction with the specimen may be through inelastic tunneling current. Rather than measuring this tunneling current directly, it is possible to provide a sub-system for allowing either photons or electrons to be emitted. The photons or electrons to be emitted may occur upon a hybridization event, or by applying suitable voltage energy to emit inelastic electrons indicative of the spectra of the specimen. This electron is also detected my an intensifier/amplification sub-system described above with respect to FIG. 100A.

Referring now to FIG. 100C, an array of intensifiers/amplifier sub-systems as described with respect to FIG. 100A or 100B may be provided. For example, the exciting probe beams or other probe types may be tuned or optimized from a particular monomer, for example, in a DNA sequencing system, A, T, C, G, such that the electrons or photons are emitted are signatures of each type of nucleotide to be detected.

Applications

DNA Sequencing

Sequencing extended objects including but not limited to DNA and RNA (including genomes, epigenomes and methylation codes and environmental methylation effects), proteins in general, other polymers, oligomers, and other nano-scale structures. Thus, as shown and described, the herein system including nano-nozzles and nano-nozzle arrays are very well suited for ultra fast real time DNA sequencing operations.

General Purpose Molecular Probe

In addition to sequencing or analyzing DNA strands or fragments, probes and systems according to the present invention may be used for various types of extended objects including but not limited to DNA, RNA, proteins in general, other polymers, oligomers, and other nano-scale structures.

General Purpose Manipulator

Figure 101:
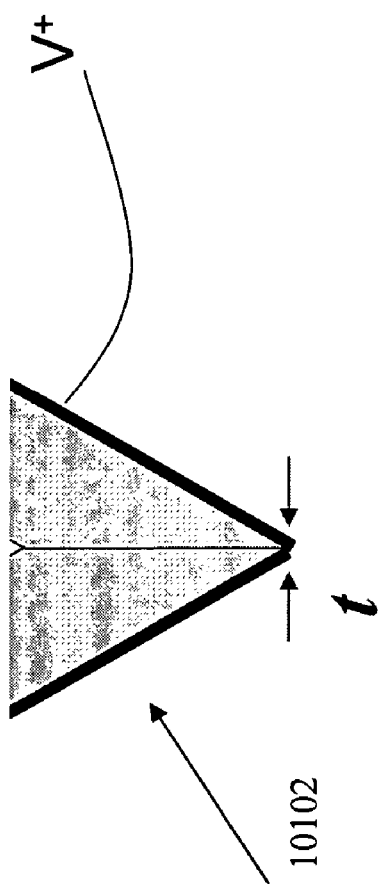
FIG. 101 shows a probe in accordance with certain embodiments of the present invention that may be used as a general purpose manipulator.

Referring now to FIG. 101, a probe 10102 having extremely small tip dimensions t (or array or set of such probes) may be used as a general purpose manipulator for manipulating materials on the molecular or atomic level. For example, using the probe 10102 provides for a high field strength, in part due to its symmetry. This high field that is advantageously localized due to the small probe dimensions will enable attraction of DNA strands, proteins, graphene layers, nanoparticles, other molecules, mono-molecular layers, or N such layers.

Nanolithography

Figure 102:
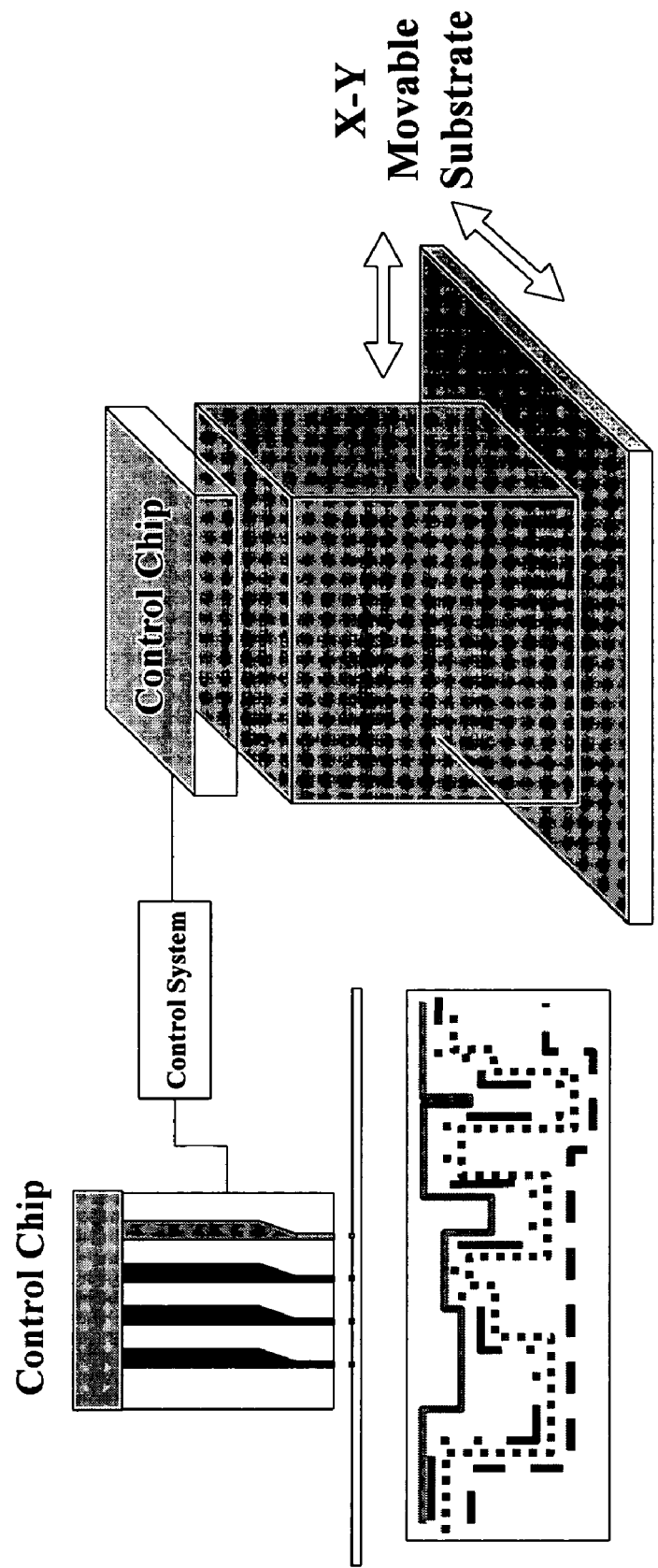
FIG. 102 shows a general system using probes in accordance with certain embodiments of the present invention for ultra high resolution nanolithography.

Referring to FIG. 102, a general system is depicted for using the herein probes for ultra high resolution nanolithography. A probe set may be provided, for example, wherein each probe includes the same or different materials. In further embodiments, three-dimensional nanostructures may be fabricated using the probes herein.

Nano Stretching DNA Shuttle

FIGS. 96A-C show an embodiment of a molecular shuttle 9607. In general, the molecular shuttle 9607 may be used to controllably displace an extended object 9612, for example, from a first location 9616 to a second location 9618 to a third location 9620, and so on. The extended object 9612, such as a DNA strand, DNA fragment, RNA molecule, protein molecule, or various other types of polymer and extended object, is typically charged, in this case shown as negatively charged. The molecular shuttle 9607 includes a plurality of spatially opposing probes 9622, 9624 within or upon substrates or substrate regions 26, 28 thereby defining a channel 9630 therebetween. In certain preferred embodiments, these probes 9622, 9624 are formed as probes as described herein. As shown in FIG. 96A, the extended object 9612 is outside of the channel 30. By applying a positive charge at probes 9622, 9624 at the end of the molecular shuttle 9607 (as indicated by "+" signs in FIG. 96A), the extended object 9612 will be attracted to an opening 9632 of the channel.

Referring to FIG. 96B, when another positive charge is applied through the probes 9622, 9624 at a location indicated by line 9618, with negative charges provided by probes or electrodes between position 9618 and the positive charge at opening 9632, the extended object 9612 will be attracted to the position 9618 within the channel. Referring to FIG. 96C, the process is continued to shuttle the extended object 9612, for example, to a position 9620 within the channel.

Referring now to FIGS. 97A-97D, a molecular shuttle 9707 may be formed of various shapes, including but not limited to a curved or semicircle channel (FIG. 97A), a Y-shaped channel (FIG. 97B), a series of channels directed in a radial manner to or from a central point (FIG. 97C), or T-shaped (FIG. 97D), for example.

Making Atomically Smooth Surface

Figure 103:
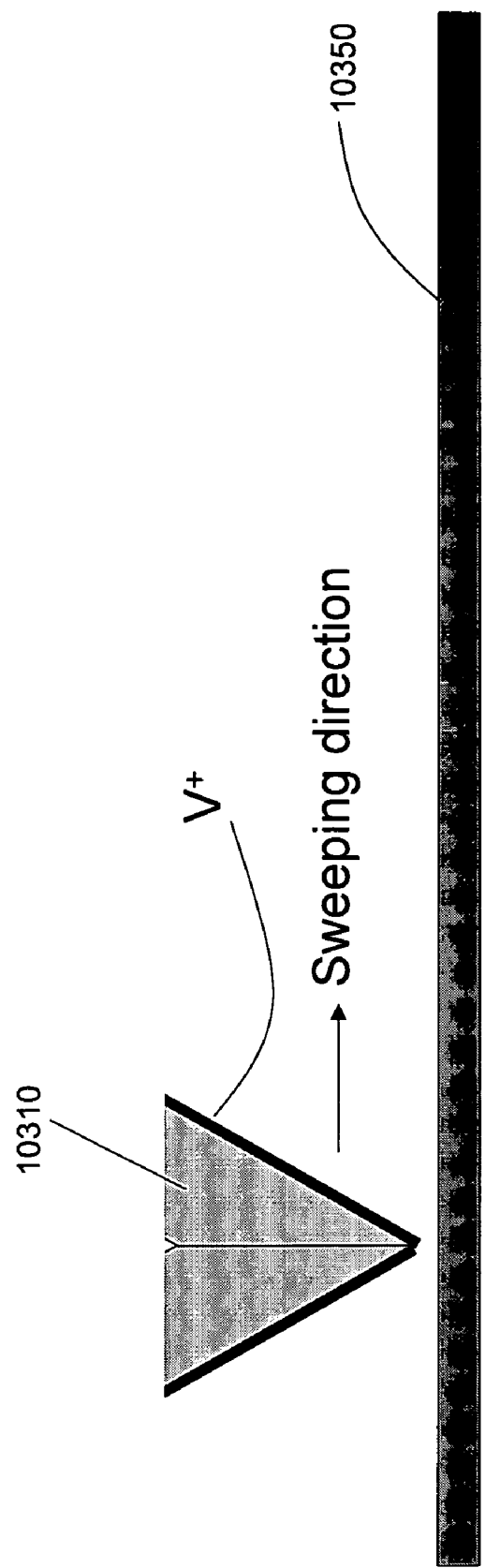
FIG. 103 shows a method using probes in accordance with certain embodiments of the present invention to create atomically smooth surfaces.

Referring to FIG. 103, a method is shown to use the probes according to the present invention to create atomically smooth surfaces. For example, a probe 10310 with an attached voltage source is swept over a surface 10350. In the configuration of the probe as shown in FIG. 103, the probe produces a very high localized field strength. This field can be used to sweep a surface to make it atomically smooth.

Atomic Force Tunneling Membrane Microscopy

Figure 104:
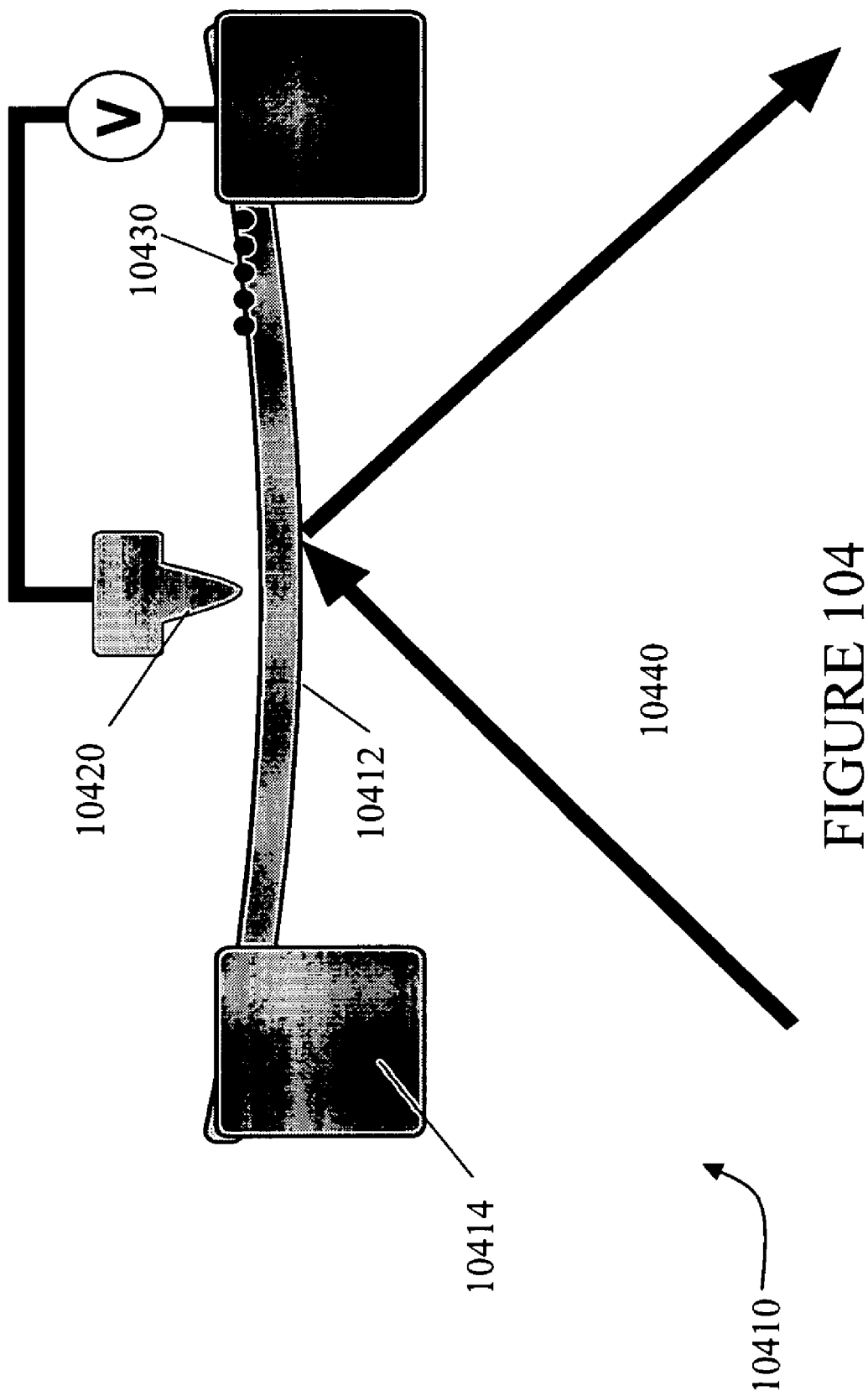
FIG. 104 shows a system in accordance with an embodiment of the present invention using a membrane between supports whereby the membrane is deflected by atomic forces between a specimen and a probe.

Another embodiment of the present invention exploits the ability to make atomically smooth ultra-thin films as taught in the present invention FIGS. 26-31 above. These films can used as flexible substrates for analyzing or sequencing unknown specimens. As shown in FIG. 104, this flexible membrane may replace the flexible cantilevers in FIGS. 84-86. FIG. 104 shows a system 10410a membrane 10412 between supports 10414. As the specimen 10430 passes under a probe 10420, atomic interactions occur, generally as described above with respect to FIGS. 84-86. However, the probes 10420 are fixed, thus the membrane 10412 is deflected by those atomic forces. The deflection of the membrane 10412, in response to atomic forces, is detected by measuring the reflection of the incident laser beam 10440 on the membrane 10412. By separating the deflection from the probe, a more general purpose apparatus results, namely, combing AFM capability with STM imaging as well sequencing tools all in one device. As shown in 104, one or more probes 10420 are connected to suitable voltage sources and the supports 10414. Other stimuli may also be provided for certain applications, such as scanning tunneling and other sequencing functionality. For specificity, the prove may be a specifically formed probe, such as a nucleotide specific probe as described above. A device particularly suited for sequencing DNA strands includes one that incorporates at least a set of 4 probes, include nucleotide specific probes for A, C, T and G, for example, in a configuration as described herein with respect to FIG. 85, with the flexible membrane 10412.

Figure 105B:
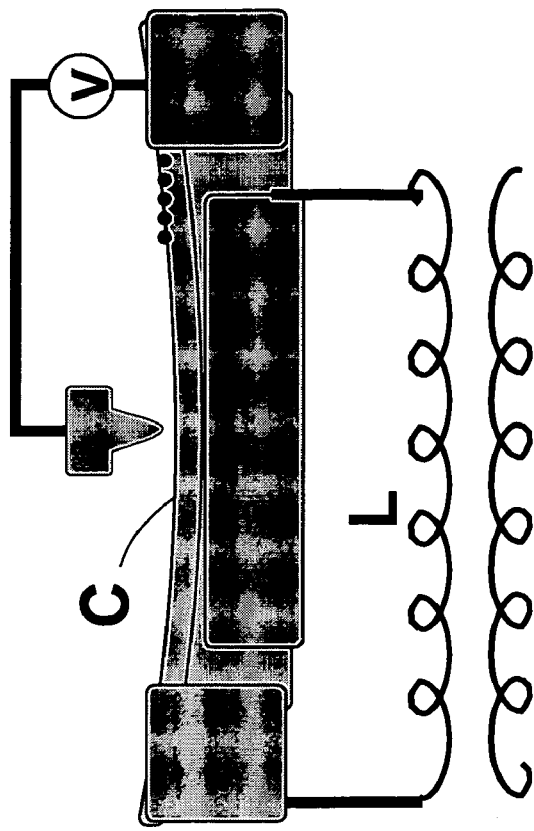
FIGS. 105A-105B show a membrane deflecting apparatus in accordance with the principles of FIG. 104 whereby a parallel conducting plate is used to this forms a capacitance that varies according to the deflection of the membrane.
Figure 105A:
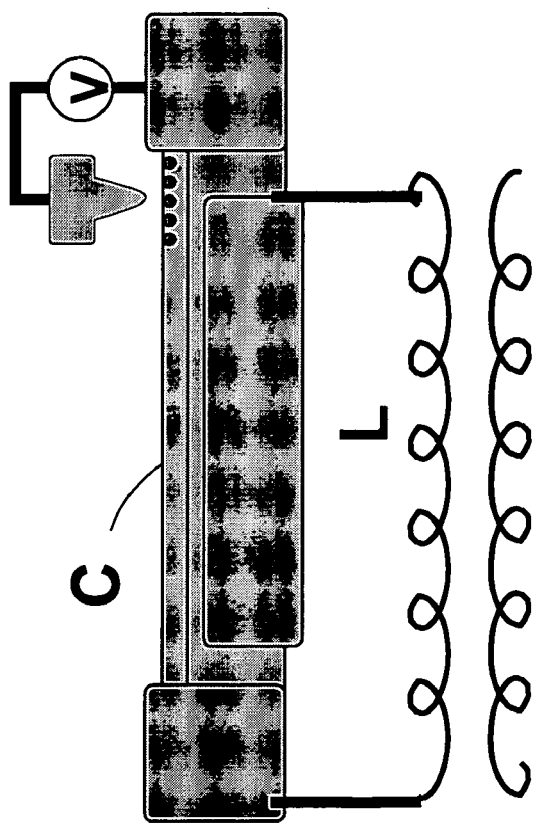

This membrane deflecting apparatus allows for the possibility of replacing the laser beam with a parallel conducting plate directly underneath the membrane separated by an appropriate distance. As shown in FIGS. 105A-105B, this forms a capacitance that varies according to the deflection of the membrane. FIGS. 105A-105B show the deflection of the substrate membrane in response to the forces at different probe positions. Therefore, the capacitance value variation or modulation can be related to the atomic forces experienced by the membrane. This happens because the fixture holding the probes is held substantially fixed, thereby forcing only the membrane to respond to the forces. Such as system could readily be used in combination, for example, whereby the membrane AFM capacitance is read and STM tunneling is read, for example, using a system of FIG. 86. Further, alignment marks may be provided to increase accuracy.

Figure 105C:
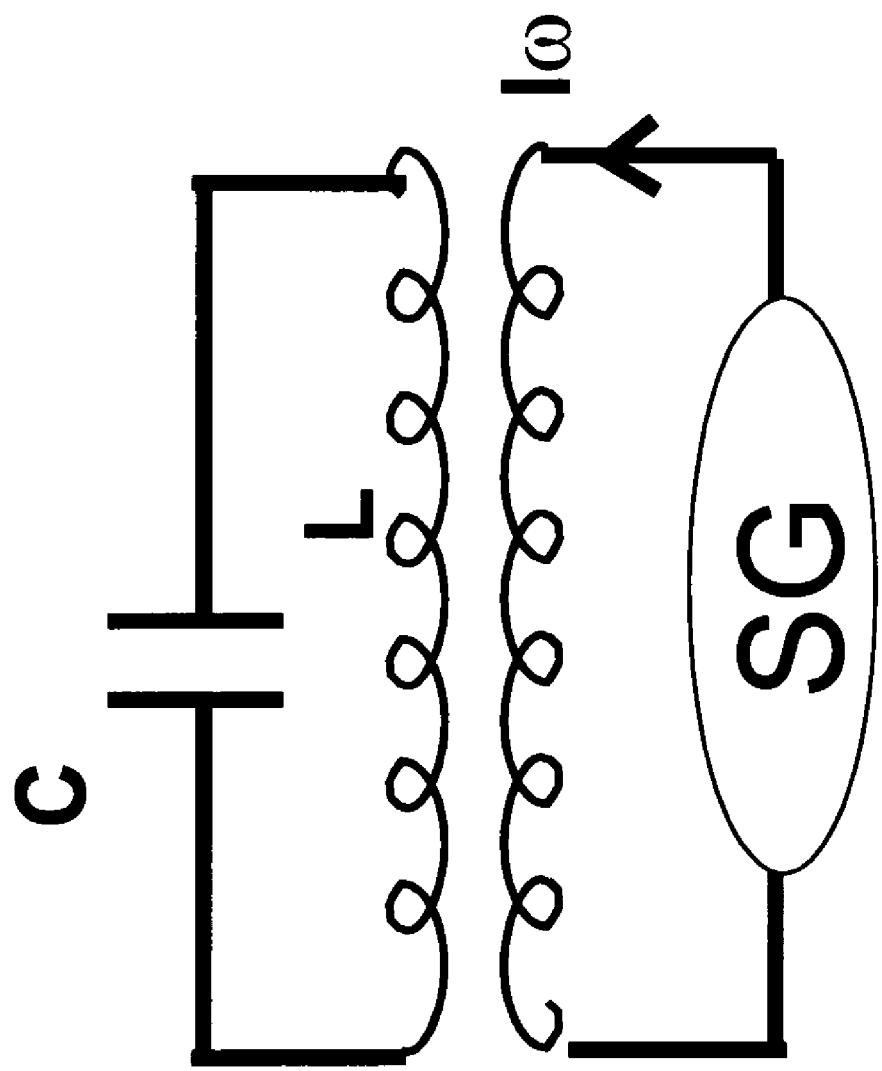
FIG. 105C shows a resonant circuit representative of the system of FIGS. 105A-105B.

The capacitance value is designed to be in the range of 0.1 to 10 nano-Farad so that it can be part of a resonant circuit, FIG. 105C, comprising an inductance to oscillate at frequencies in the ranges of 10 KHz-1 MHZ or 1 MHz to several GHz. By coupling an tunable sweep oscillator, it is possible to monitor the power absorbed by the system as a function of frequency.

Figure 105D:
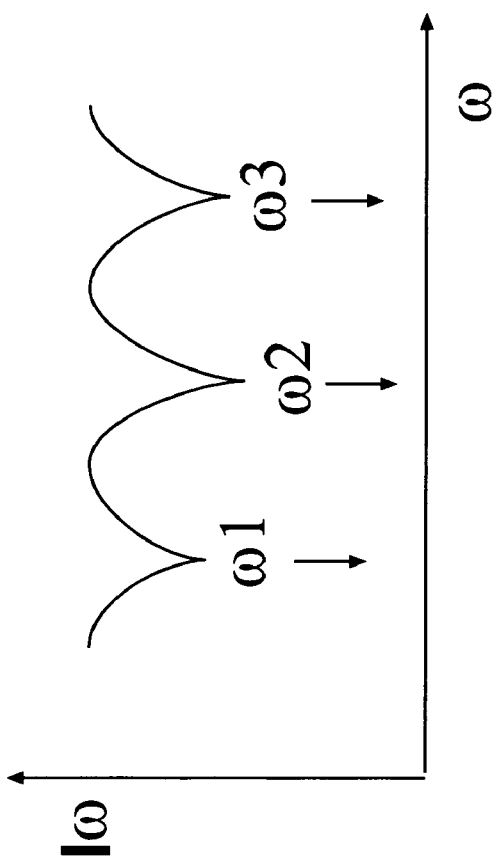
FIG. 105D shows the intensity may be plotted as a function of frequency for different probe positions.
Figure 105E:
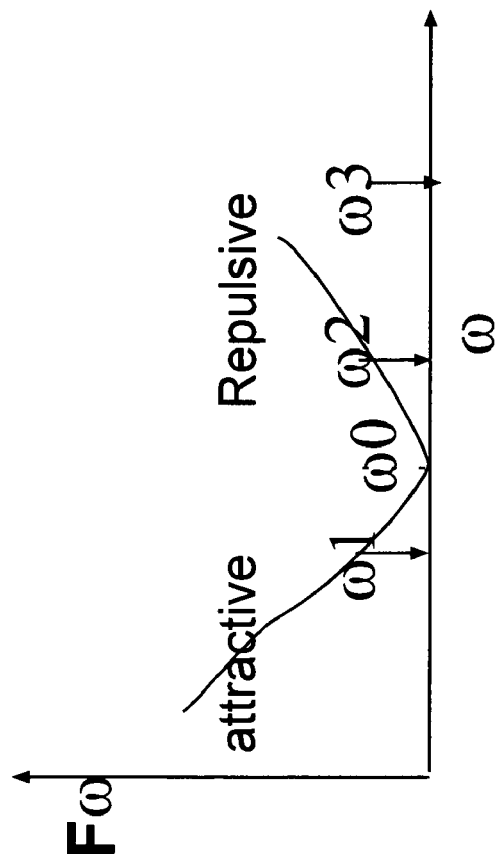
FIG. 105E illustrates the dependence of the $F_{107}$ on the frequency for attractive and repulsive forces.

FIG. 105D shows the intensity, $I_{107}$ may be plotted as a function of frequency, $\omega=(LC)^{1/2}$, for different probe positions. Measuring frequency shifts can be related to the capacitance variation that results from the varying forces $F_\omega$ at different positions. FIG. 105E illustrates the dependence of the $F_{107}$ on the frequency for attractive and repulsive forces. In a first position, the probe experiences a repulsive force, causing the capacitance to decrease, and shifting the frequency to $\omega_1$. In a second and third probe positions, the forces are attractive, shifting the requires upward to $\omega_2$ and $\omega_3$ respectively.

Versatile AFTM with Addressable 2D Nano-Probe Array

Figure 106C:
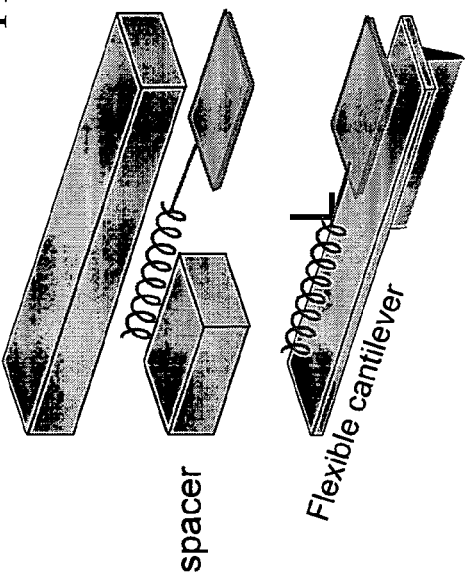
Figure 106B:
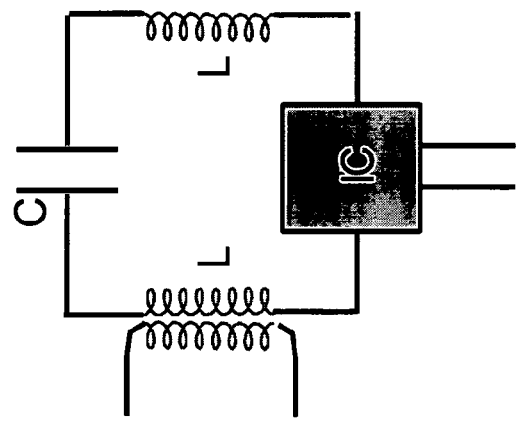
Figure 106A:
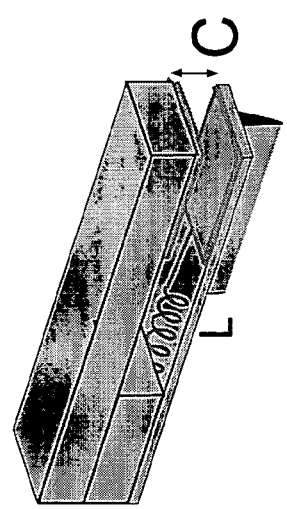

FIG. 106A illustrates yet another embodiment of the present invention whereby a tool for analyzing specimens including specific application of sequencing DNA, RNA and atomic force imaging is provided. A probe according the teachings of the present invention is attached to a flexible membrane or cantilever. According to the exploded view in FIG. 106B, a first thin film inductor connected to a first thin film plat of a capacitor are deposited on the flexible membrane on the surface opposite the probe. A second thin film inductor connected to a second thin film plate of a capacitor are deposited on a rigid member on the surface facing the flexible membrane. The rigid member and flexible membrane and attached to each other with a suitable spacer having a thickened that determines a desired capacitance value. The spacer also may contain an integrated circuit for processing and/or analyzing the signals which result from the interaction of the probe with the specimen. This signal is manifested in the variation of the capacitance as a result of the forces that cause the membrane deflection. FIG. 106C shown the circuit model for analysis and processing. Similar detection principles apply as those employed in the apparatus described FIGS. 105A to 105E.

Figure 107:
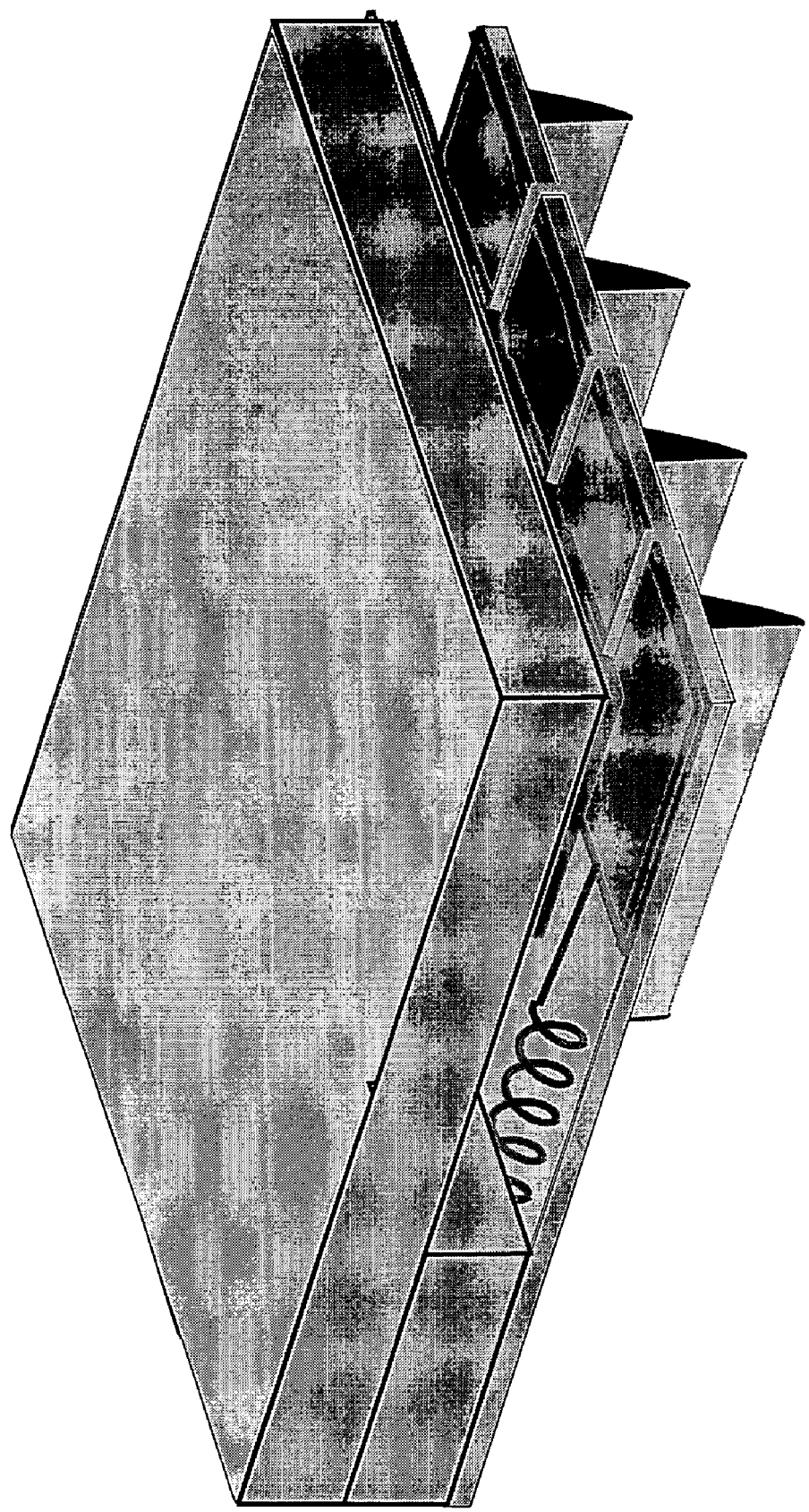

This integrated atomic force probe can be used as in conventional ATM modes, as well as for sequencing. The latter is accomplished by sequentially inserting different integrated probes functionalized to specify different nucleotides. Alternatively, it is preferred to integrate several capacitive probes in a single structure to perform parallel sequencing and analysis functions as shown in FIG. 107. This fully integrated system allows the flexibility to have probes of different shapes and functionalized to recognize predetermined certain specimens. The system can be addressed to select one of many modes, including but not limited to STM, AFM, sequencing, magnetic analysis, or other suitable functionalities, because it has a unique activation/deactivation feature. This is accomplished with an integrated circuit that supplies a DC voltage to the plates of the capacitor that is selected to deactivate. This causes the flexible membrane to be attached permanently to the upper rigid plate. The removal of the DC voltage releases the membrane and selects it and its probe for activation.

Figure 108:
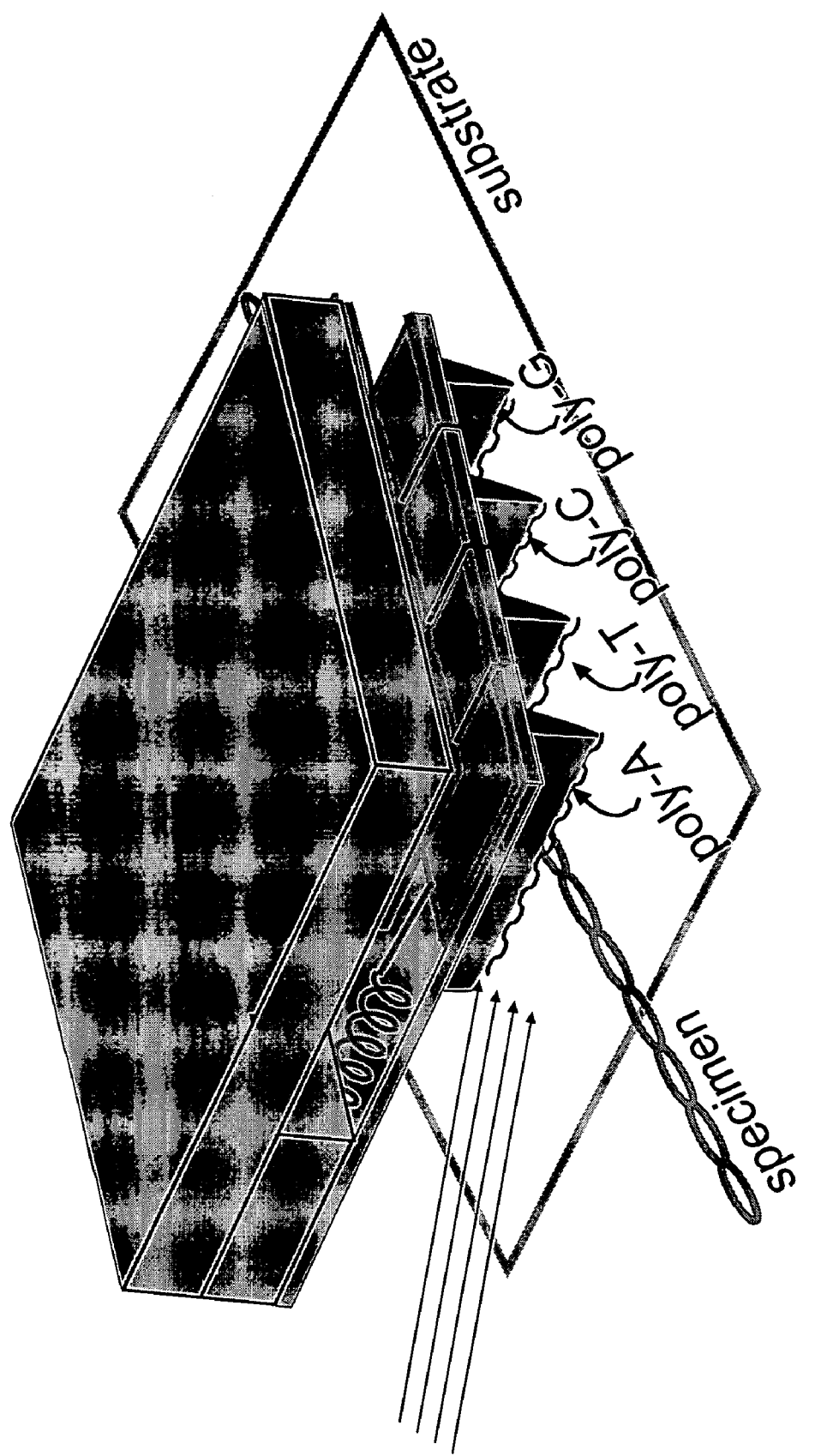
Figure 109:
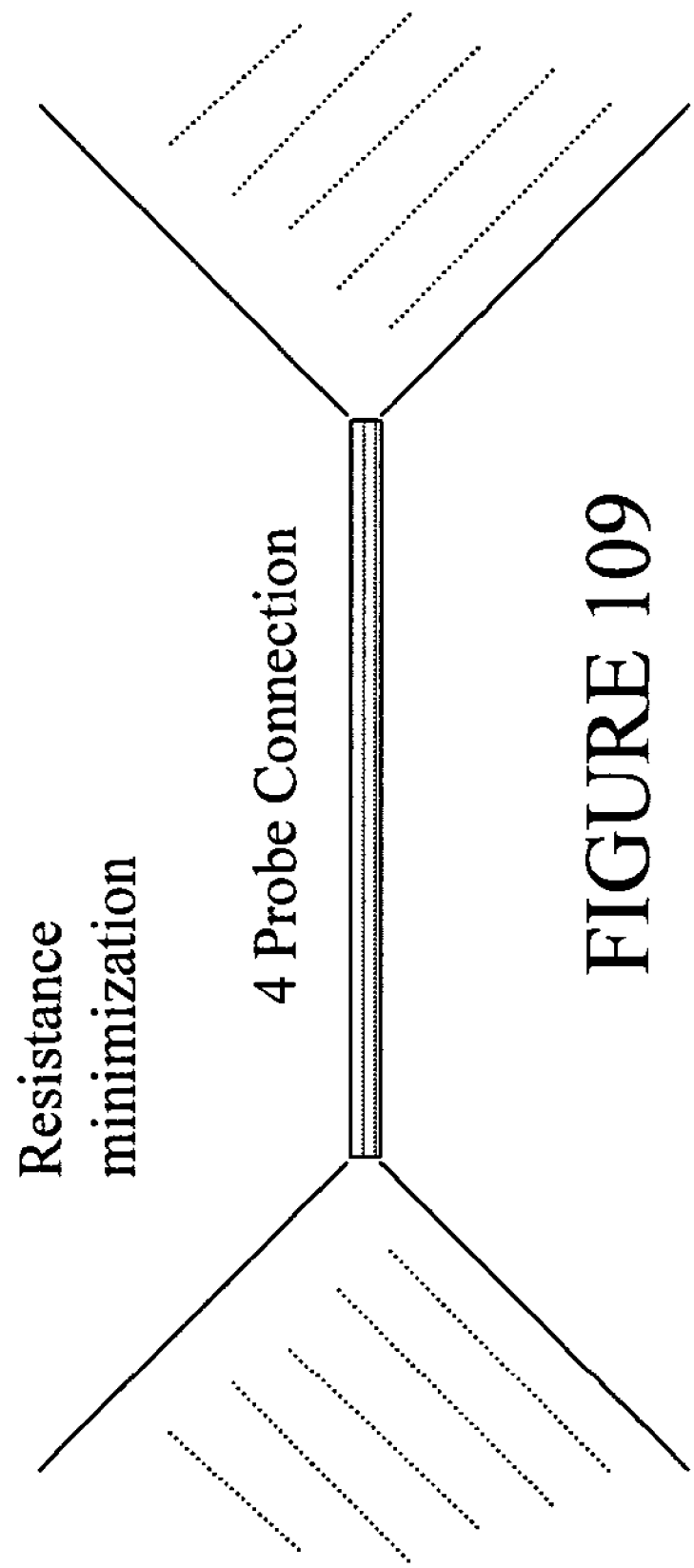

FIG. 108 illustrates the system of FIG. 107 further including nucleotide specific probes for increases specificity, for example, particularly suitable for imaging, analyzing and sequencing DNA specimens.

The fully integrated probe illustrated in FIGS. 106-108 can be advantageously manufactured by the methods and systems described in Applicant's multi-layered manufacturing methods, as described in U.S. Non-provisional application Ser. No. 09/950,909, filed Sep. 12, 2001 entitled "Thin films and Production Methods Thereof"; Ser. No. 10/222,439, filed Aug. 15, 2002 entitled "MEMs And Method Of Manufacturing MEMs"; Ser. No. 10/017,186 filed Dec. 7, 2001 entitled "Device And Method For Handling Fragile Objects, And Manufacturing Method Thereof"; PCT Application Serial No. PCT/US03/37304 filed Nov. 20, 2003 and entitled "Three Dimensional Device Assembly and Production Methods Thereof"; U.S. Pat. No. 6,857,671 granted on Apr. 5, 2005 entitled "Method of Fabricating Vertical Integrated Circuits"; U.S. Non-provisional application Ser. No. 10/717,220 filed on Nov. 19, 2003 entitled "Method of Fabricating Multi Layer MEMs and Microfluidic Devices"; Ser. No. 10/719,666 filed on Nov. 20, 2003 entitled "Method and System for Increasing Yield of Vertically Integrated Devices"; Ser. No. 10/719,663 filed on Nov. 20, 2003 entitled "Method of Fabricating Multi Layer Devices on Buried Oxide Layer Substrates"; all of which are incorporated by reference herein. However, other types of semiconductor and/or thin film processing may be employed.

While the above examples apply to the sequencing of DNA, it is appreciated that the probes can be functionalized to have the ability to recognize other molecules with precise specificity making these methods more general for the recognition and analysis on unknown chemicals. It will have applications not only as a scientific tools, but also for medical as well as for sensing hazardous materials.

Protein Conformation

Another embodiment of the present invention exploits the ability to use certain embodiments and configurations of the herein probes to control protein conformation through complex electric field applied.

Functions of proteins are closely related to their structures. Modification of protein structures allows one to modify or "tune" a function of the protein. If structure of a single protein molecule can be modified in real time using external stimuli, various application are possible. For example, real time conformation of proteins can be used as a bio-sensor with tunable detection characteristics which has low false positives and high detection probability. It can also lead to developing improved countermeasures against chemical or biological attack where the design of proteins suited against harmful bio-agents or chemical agents can be done very rapidly. Fundamentally real time conformation of proteins can advance study of relationships between function and structure of protein molecules. Mechanical or optical methods of achieving this task are too cumbersome and/or not adequate. Herein described is a probe device that can facilitate such real time protein conformation.

In conventional approaches, to modify protein structure mechanically, plural nano-probe tips need to be attached to protein molecule and moved in complex fashion to achieve the desired structure modification. Attaching tethers and beads to molecule and then stretching the beads is possible but too cumbersome. In optical methods one can trap a biomolecule or stretch a micro-particle [J. Guck et al, "Optical Deformability of Soft Biological Dielectrics," Phys. Rev. Lett. 84, 5451(2000)]. However, this technique cannot be used to stretch a nanometer size molecule.

Proteins are complex distributions of electric charges, dipoles and multi-poles. Protein structure modifications happen through electrostatic stimuli. Thus electric field stimulus may be used to modify the structure of a protein molecule. Electric fields in proteins are of the order of $10^7$ V/m [S. Dao-pin et al, "Electrostatic fields in the active sites of lysozymes,", PNAS Biophysics, 86, 5361 (1988)]. Protein structures may be modified if electric fields of this magnitude can be applied [A. Budi et al, "Electric Field Effects on Insulin Chain-B Conformation," J. Phys. Chem. B., 109, 22641 (2005)]. However, to achieve desired modification of conformation, a complex electric field of such magnitude needs to be applied. This may be achieved using various devices of the present invention.

Figure 110:
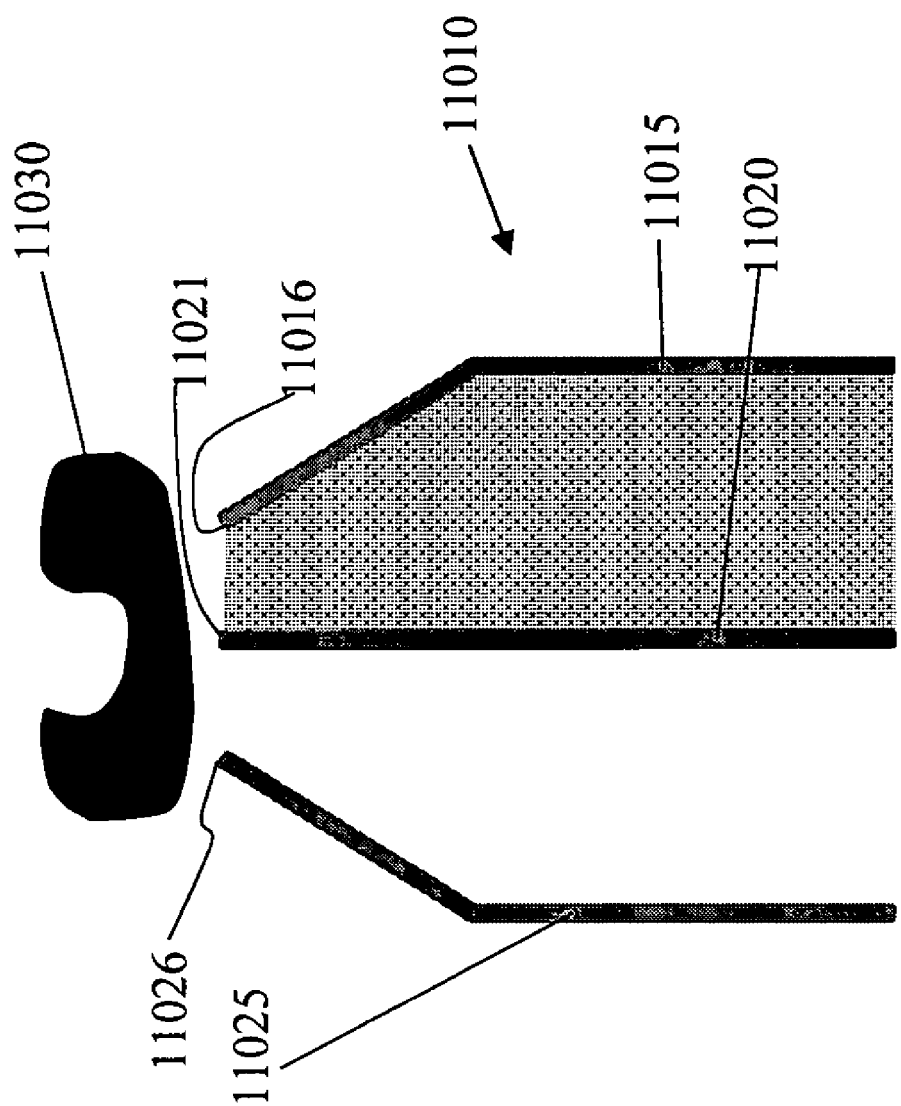

FIG. 110 shows a sectional view of a device 11010 positioned relative a protein molecule 11030. The device 11010 includes plural electrodes 11015, 11020 and 11025. Device 11010 may be manufactured according to various embodiments described hereinabove, with probe tip active areas on the order of 0.1 to about 10 nanometers thick, with an edge of any suitable dimension, such as on the order of microns or millimeters, e.g., to provide a "knife edge" configuration as described herein. Using the device 11010, complex electric field stimuli may be applied to a protein molecule alter its characteristics in real time. The probes may be spaced apart by suitable molecular dimensions, for example, so that the plural probes may all be applied to a single molecule or cell as desired. Accordingly, the probes may be spaced apart by a distance of about 0.5 to about 25 nanometers. In certain embodiments, it may be desirable to space the probes apart by greater distances, for example, wherein the structure to be probed is larger. Notably, each probe may have different potentials (in terms of magnitude and polarity), and these potentials may vary as desired, for example, by control of a suitable controller device.

Figure 111A:
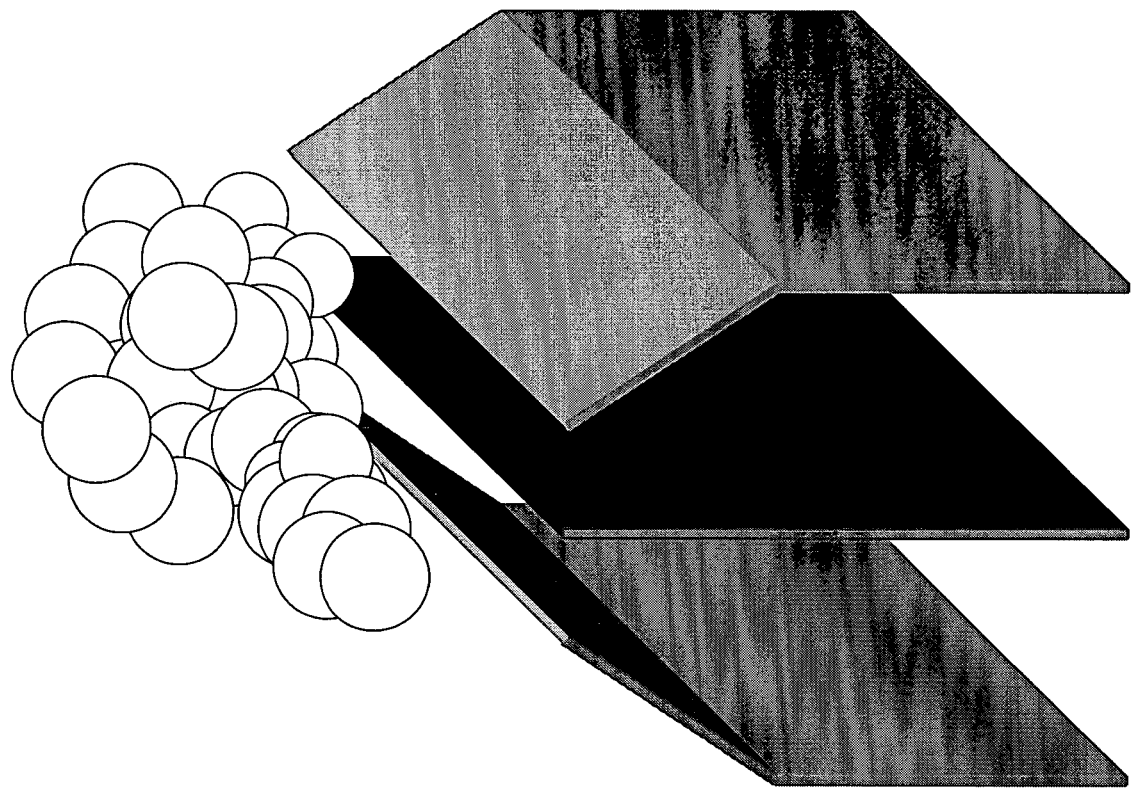
Figure 111B:
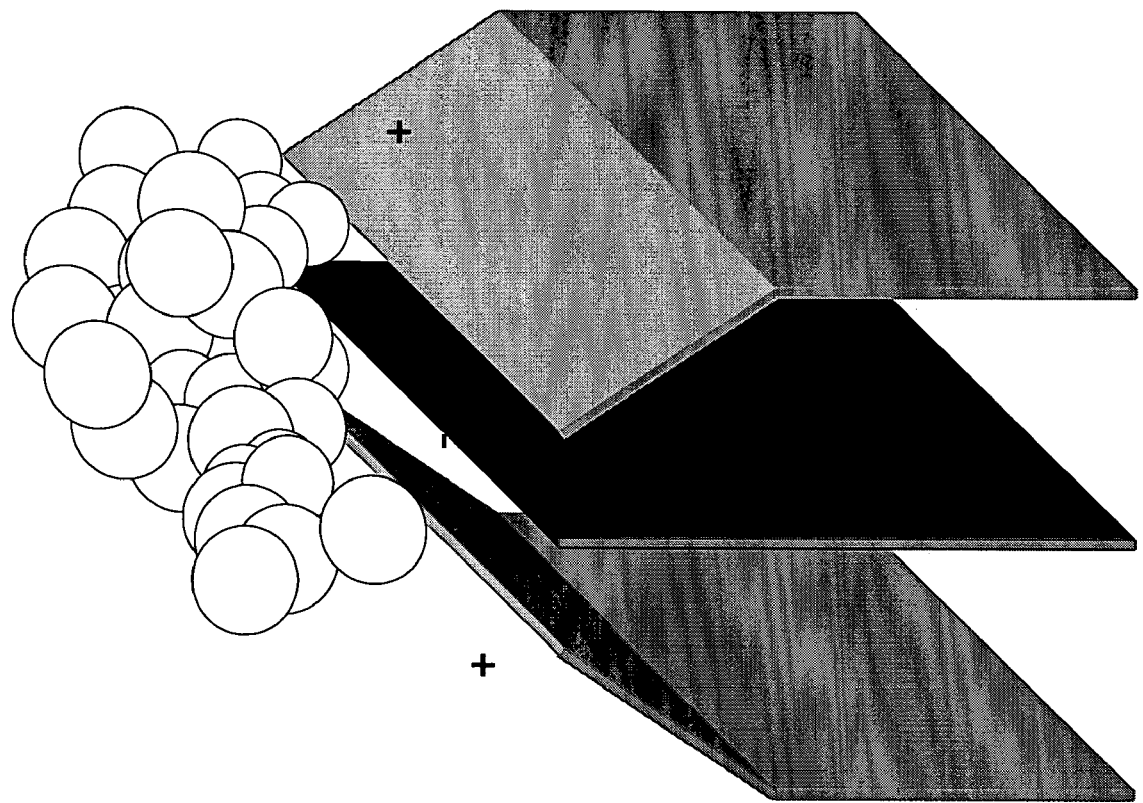
Figure 111C:
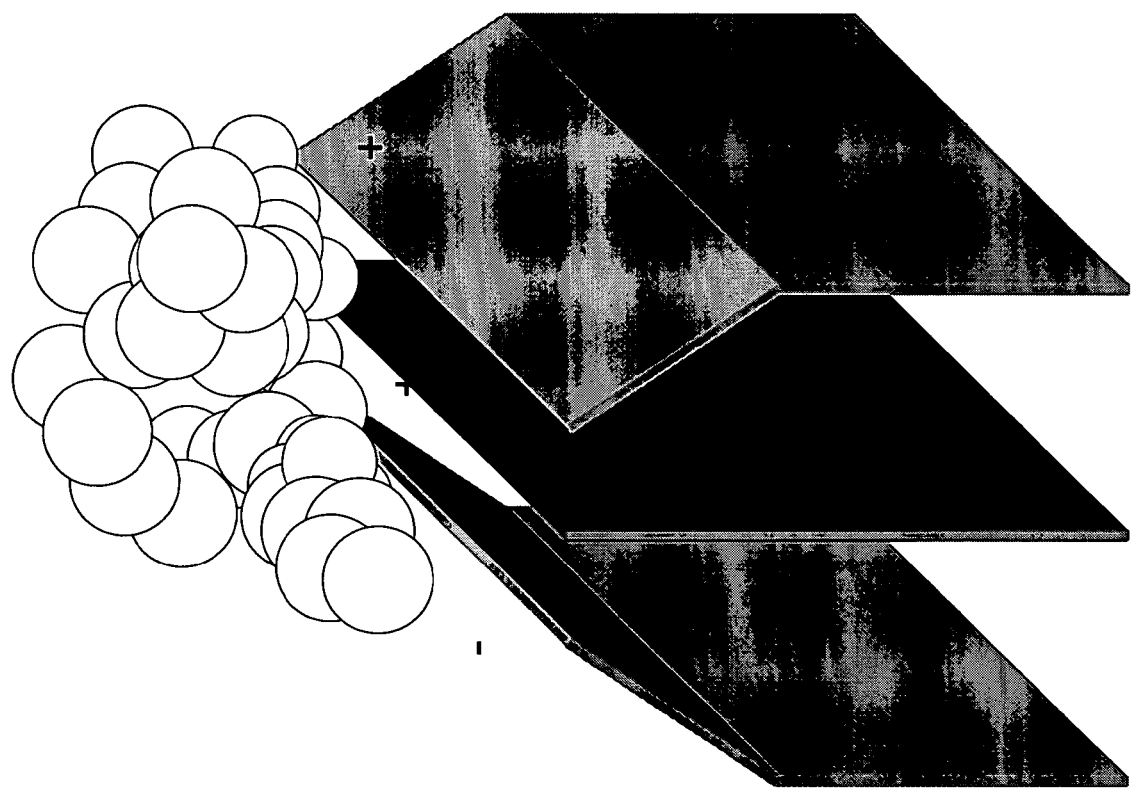

For example, referring now to FIGS. 111A-111C, isometric views (with the substrate between probes not shown for clarity of exposition) are shown of a protein structure with no voltage applied (FIG. 111A), with a positive voltage applied at the outer probes and a negative voltage applied at the middle probe (FIG. 111B), and with a negative voltage applied at the left probe as viewed in the figure and positive voltages applied at the middle and right probe as viewed in the Figure (FIG. 111C). Note the variation of the protein structure as shown in the different FIGS. 11A-11C.

Furthermore, the electrodes or probes can be charged at different combination of electric potentials to create complex electric fields between them to modify the structure of single protein molecule in vicinity and thus tune its function, for example, as shown in FIGS. 112A-112H. Thus various magnitudes of electric fields with various directions can be applied to protein molecule to modify its function and thus its properties. Thus with tens of nanometer distance between electrodes voltages of few volts can be applied to electrodes to modify the structure of protein molecule.

While the various embodiments described above related to molecular conformation describe proteins, other molecular structures may be probed according to the described methods to induce confirmation, for detection, for imaging, or other applications as described herein. Furthermore, while various embodiments depict a multi-probe device with three probe tips, one may accomplish the various molecular confirmations or multi-probe tip imaging, detection or other application with a multi-probe device with two tip areas, three tip areas, or any desired greater number of tip areas may be provided depending, for example, on the desired complexity of the confirmation structure or combinations of fields to be applied to the molecular structure.

Double Stranded

It is known that the replication and transcription of DNA involves the separation of the two strands to reveal the base sequence of the single stand to be replicated or transcribed. This is accomplished with a helicase enzyme which causes the complementary strands to separate in a first position to complete the transcription or replication processes. When this is completed, the two complementary strands bind again and the helicase separates them at a second adjacent position to repeat the process. This is repeated along the entire DNA length until the replication or transcription is done.

The present invention which teaching the analysis of an extended object in general, and a single DNA strand sequence in particular, may be extended to also sequence double strand specimens. This may be accomplished according the embodiments of the present invention by causing the nano-probe to interact with the nucleotide bases in the major and minor groves of the helical structure of the DNA strand or fragment. This process may optionally be facilitated further by the use of a suitable catalyst or enzyme such as helicase to cause local separation of the complementary strands to reveal the bases to be sequenced and to cause them to interact optimally with the nano-probe as described herein. The catalyst or enzyme may be attached to or dispensed from the analyzing nano-probe or attached to or dispensed from an auxiliary nano-probe or nano-funnel in close proximity to the analyzing nano-probe. Except for this additional step using the catalyst, the procedure to analyze the double stranded DNA is carried out using the embodiments taught herein for analyzing the single strand DNA.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of making a nano-tool having a probe tip in a knife edge configuration comprising the steps of:
forming a composite including a tool layer less than 10 nm thick on a substrate layer having a thickness, thereby exposing a tool layer surface and a substrate layer surface opposite the tool layer surface and defining an interface between the tool layer and the substrate layer;
subtracting a region of the substrate layer at least partially through the thickness of the substrate layer, thereby exposing a well surface; and
folding the composite so that portions of the tool layer surface converge and portions of the well surface diverge, wherein an outer crease of the folded tool layer is tip region that forms a nanotool tip active area.

2. The method as in claim 1, further comprising mechanically or chemically altering the tip region to expose the tip active area.

3. The method as in claim 1, wherein the region subtracted is partially through the thickness of the substrate layer, further comprising removing material of the original substrate layer at a region proximate the fold crease to expose tool layer material at the outer crease of the folded tool layer.

4. The method as in claim 1, wherein the folding is to an angle theta greater than 0 degrees and less than or equal to 180 degrees.

5. The method as in claim 1, wherein the folding is to an angle of about 180 degrees, wherein a nano-tool is provided having an active area dimension of about 2 times the thickness of the tool layer.

6. The method as in claim 1, further comprising providing a flexible layer on the substrate layer surface and the well surface.

7. The method as in claim 1, further comprising providing mechanical force with an edge probe tool at the outside of a desired fold line on the well surface.

8. The method as in claim 1, further comprising providing vacuum suction with an edge probe tool at the outside of a desired fold line on the well surface.

9. The method as in claim 1, further comprising applying a second tool layer at the substrate layer surface opposite the tool layer surface after the well has been subtracted, and exposing the tip active areas.

10. A method of making an array of nano-tools comprising:
forming a plurality of nano-tools as in claim 1; and
aligning the nano-tool active areas of the plurality of nano-tools along a desired shape into an aligned position; and
bonding the plurality of nano-tools in said aligned position.

11. The method as in claim 10, wherein said desired shape is planar.

12. The method as in claim 10, wherein said desired shape includes at least one nano-tool active area offset from at least one other nano-tool active area.

13. A method of making a nano-tool having a probe tip in a knife edge configuration comprising the steps of:
forming a composite including a tool layer less than 10 nm thick on a substrate layer having a thickness, thereby exposing a tool layer surface and a substrate layer surface opposite the tool layer surface and defining an interface between the tool layer and the substrate layer;
subtracting a region of the substrate layer at least partially through the thickness of the substrate layer, thereby exposing a well surface; and
folding the composite so that portions of the tool layer surface diverge and portions of the well surface converge, wherein an outer crease of the folded tool layer is tip region that forms a nanotool tip active area.

14. The method as in claim 13, further comprising mechanically or chemically altering the tip region to expose the tip active area.

15. The method as in claim 13, further comprising mechanically or chemically altering the tip region to expose the tip active areas.

16. The method as in claim 13, further comprising providing a flexible layer on the tool layer.

17. The method as in claim 13, further comprising providing mechanical force with an edge probe tool at the outside of a desired fold line on the well surface.

18. The method as in claim 13, further comprising providing vacuum suction with an edge probe tool at the outside of a desired fold line on the well surface.

19. The method as in claim 13, further comprising applying a second tool layer at the substrate layer surface opposite the tool layer surface after the well has been subtracted, and exposing the tip active areas.

20. A method of making an array of nano-tools comprising:
forming a plurality of nano-tool as in claim 13; and
aligning the nano-tool active areas of the plurality of nano-tools along a desired shape into an aligned position; and
bonding the plurality of nano-tools in said aligned position.

21. The method as in claim 20, wherein said desired shape is planar.

22. The method as in claim 20, wherein said desired shape includes at least one nano-tool active area offset from at least one other nano-tool active area.

* * * * *